(12) United States Patent
Mazur et al.

(10) Patent No.: US 7,566,385 B2
(45) Date of Patent: Jul. 28, 2009

(54) APPARATUS ADAPTED FOR MEMBRANE-MEDIATED ELECTROPOLISHING

(75) Inventors: Stephen Mazur, Wilmington, DE (US); Charles E. Jackson, Jr., Middletown, DE (US); Gary W. Foggin, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 549 days.

(21) Appl. No.: 10/986,048

(22) Filed: Nov. 12, 2004

(65) Prior Publication Data

US 2007/0051619 A1    Mar. 8, 2007

Related U.S. Application Data

(60) Provisional application No. 60/546,198, filed on Feb. 23, 2004, provisional application No. 60/546,192, filed on Feb. 23, 2004, provisional application No. 60/570,967, filed on May 14, 2004, provisional application No. 60/611,699, filed on Sep. 22, 2004.

(51) Int. Cl.
*C25F 3/02* (2006.01)
*C25F 7/00* (2006.01)
(52) U.S. Cl. .................. 204/224 M; 204/237; 204/238; 204/239; 204/252
(58) Field of Classification Search .......... 205/202–305
See application file for complete search history.

(56) References Cited

U.S. PATENT DOCUMENTS 3,862,893 A * 1/1975 Gilchrist ...................... 204/482
4,176,215 A   11/1979 Molnar et al.
4,360,572 A * 11/1982 Chua et al. .................... 429/53

(Continued)

FOREIGN PATENT DOCUMENTS

EP          1 079 003 A2    2/2001

(Continued)

OTHER PUBLICATIONS

Daniel E. Ward, D. Electropolishing, Electroplating Engineering Handbook, 4th Edition, 1984, pp. 100-120.

(Continued)

*Primary Examiner*—Harry D Wilkins, III
(74) *Attorney, Agent, or Firm*—Gail D. Tanzer

(57) ABSTRACT

This invention provides a membrane-mediated electropolishing apparatus for polishing and/or planarizing metal workpieces. The work-piece is wetted with a low-conductivity fluid. The wetted work-piece is contacted with a first side of a charge-selective ion-conducting membrane, wherein the second side contacts a conductive electrolyte solution in electrical contact with a electrode. Current flow between the electrode and the work-piece electropolishes metal from the work-piece. This invention also provides a half-cell adapted for use in membrane-mediated electropolishing having a fully or partially enclosed volume, a conductive electrolyte which partially or essentially fills the enclosed volume, an electrode which is in contact with the electrolyte, and a charge-selective ion-conducting membrane which seals one surface of the enclosed volume, cavity or vessel in such a way that the internal surface of said membrane contacts the electrolyte solution or gel and the external surface is accessible to contact the work-piece.

7 Claims, 40 Drawing Sheets

U.S. PATENT DOCUMENTS

| | | | |
|---|---|---|---|
| 4,545,889 A | 10/1985 | Franx | |
| 4,556,623 A | 12/1985 | Tamura et al. | |
| 4,909,912 A | 3/1990 | Oda et al. | |
| 4,983,264 A | 1/1991 | Miyake et al. | |
| 6,203,684 B1 * | 3/2001 | Taylor et al. | 205/103 |
| 6,368,493 B1 | 4/2002 | Mori et al. | |
| 6,527,920 B1 | 3/2003 | Mayer et al. | |
| 6,602,396 B2 | 8/2003 | Mori et al. | |
| 6,632,335 B2 | 10/2003 | Kunisawa et al. | |
| 6,646,083 B2 | 11/2003 | Hirano et al. | |
| 6,653,226 B1 | 11/2003 | Reid | |
| 6,689,257 B2 | 2/2004 | Mishima et al. | |
| 6,716,330 B2 | 4/2004 | Hongo et al. | |
| 6,743,349 B2 | 6/2004 | Mori et al. | |
| 6,746,589 B2 | 6/2004 | Mishima et al. | |
| 7,208,076 B2 * | 4/2007 | Kobata et al. | 205/652 |
| 7,211,186 B2 * | 5/2007 | Basol et al. | 205/84 |
| 2002/0000379 A1 | 1/2002 | Matsuda et al. | |
| 2002/0033339 A1 | 3/2002 | Kimura et al. | |
| 2002/0042246 A1 | 4/2002 | Togawa et al. | |
| 2003/0013817 A1 | 1/2003 | Lu | |
| 2003/0052310 A1 | 3/2003 | Michot et al. | |
| 2003/0132103 A1 | 7/2003 | Kobata et al. | |
| 2003/0136668 A1 | 7/2003 | Kobata et al. | |
| 2003/0219640 A1 | 11/2003 | Nam et al. | |
| 2003/0230493 A1 | 12/2003 | Mori et al. | |
| 2004/0035782 A1 | 2/2004 | Muller | |
| 2004/0195109 A1 | 10/2004 | Mori et al. | |
| 2004/0209560 A1 | 10/2004 | Togawa et al. | |
| 2005/0016857 A1 * | 1/2005 | Kovarsky et al. | 205/98 |
| 2005/0029121 A1 * | 2/2005 | Monzyk et al. | 205/633 |
| 2007/0051639 A1 * | 3/2007 | Mazur et al. | 205/666 |

FOREIGN PATENT DOCUMENTS

| | | |
|---|---|---|
| EP | 1 293 481 A2 | 3/2003 |
| GB | 516 898 | 1/1940 |
| WO | WO 03/030223 A2 | 4/2003 |
| WO | WO 03/046263 A1 | 6/2003 |
| WO | WO 03/064734 A1 | 8/2003 |
| WO | WO 03/092891 A1 | 11/2003 |
| WO | WO 03/098676 A1 | 11/2003 |
| WO | WO 2005/083159 A2 | 9/2005 |

OTHER PUBLICATIONS

S. H. Glarum et. al., The Anodic Dissolution of Copper Into Phosphoric Acid, J. Electrochem. Soc., 1985, vol. 132:2872-2877.

Carl Warner, Contribution to the Theory of Electropolishing, Journal of the Electrochemical Society, 1954, vol. 101:225-228.

M. Legras et. al., Sorption and Diffusion Behaviors of Water in Nafion 117 Membranes With Different Counter Ions, Desalination, 2002, vol. 147:357.

* cited by examiner

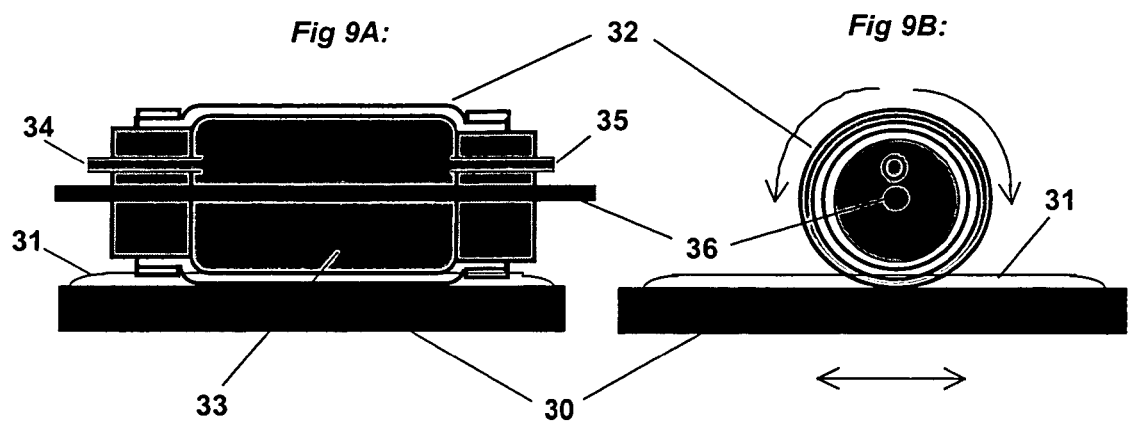
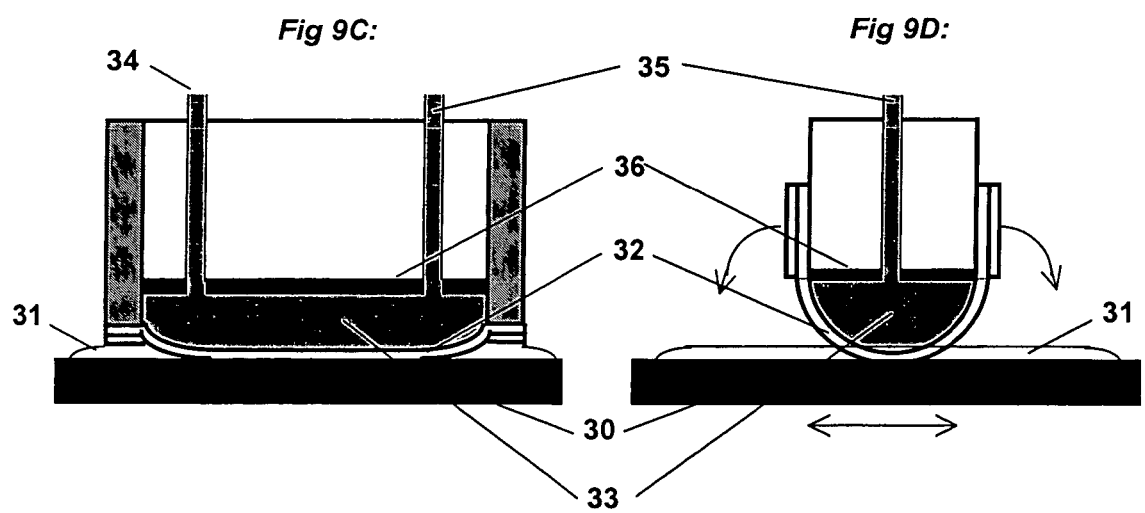

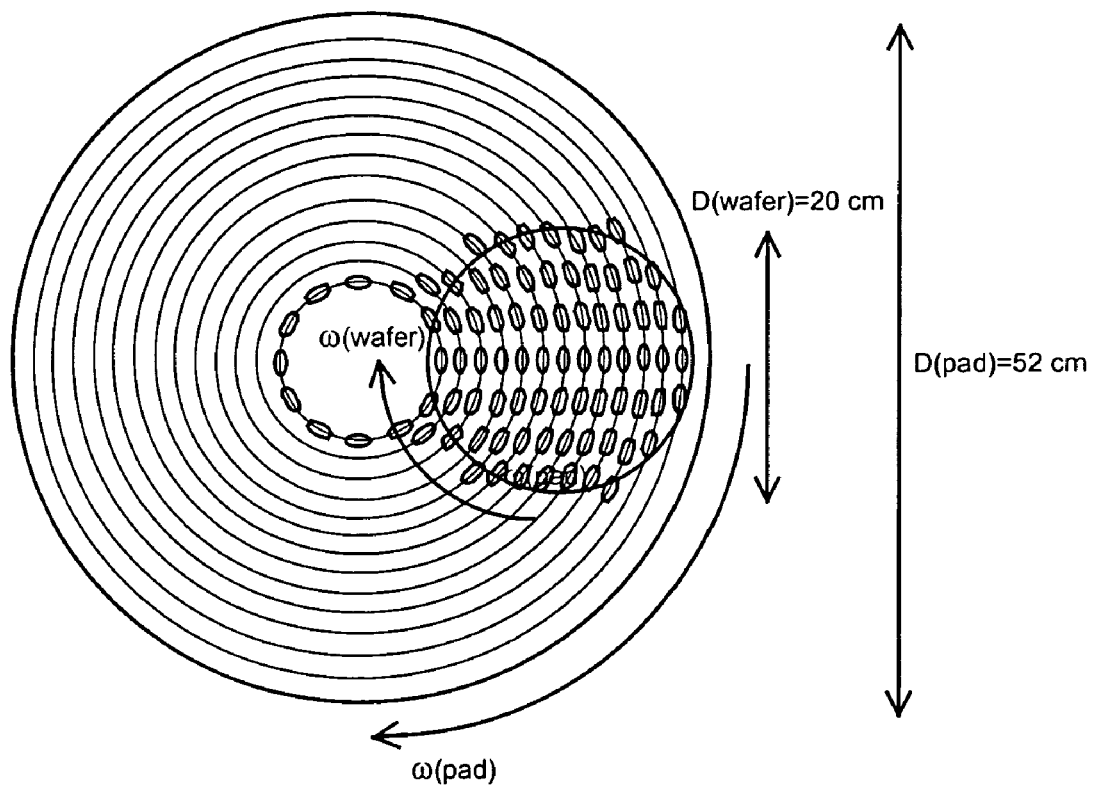
*FIGURE 14*
*FIGURE 15*
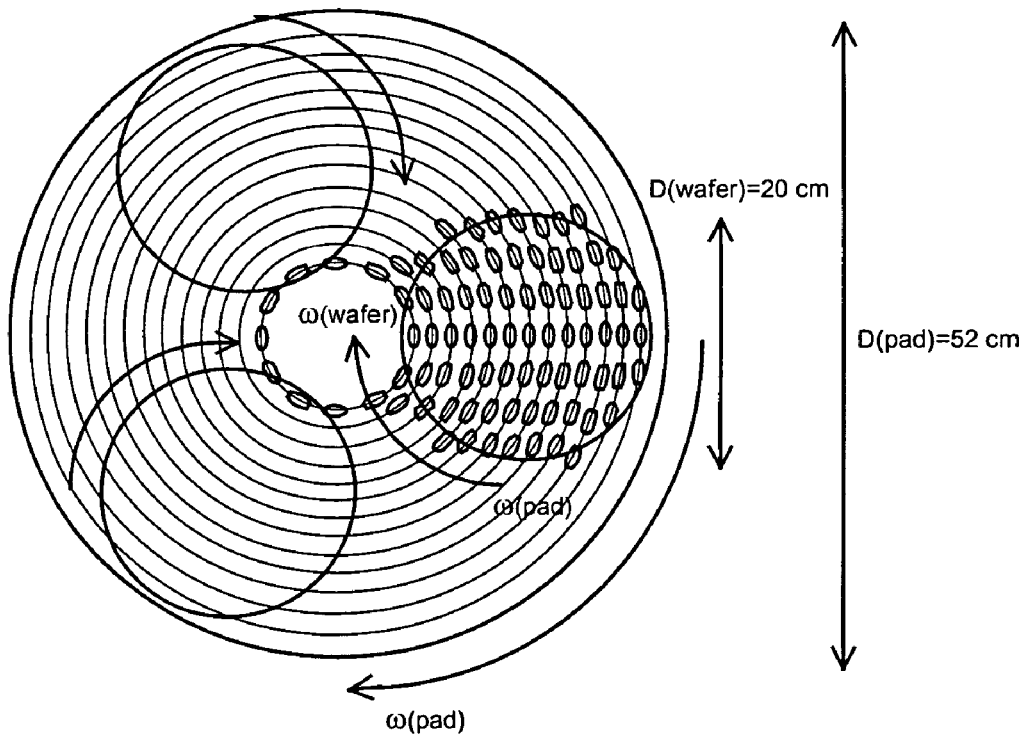

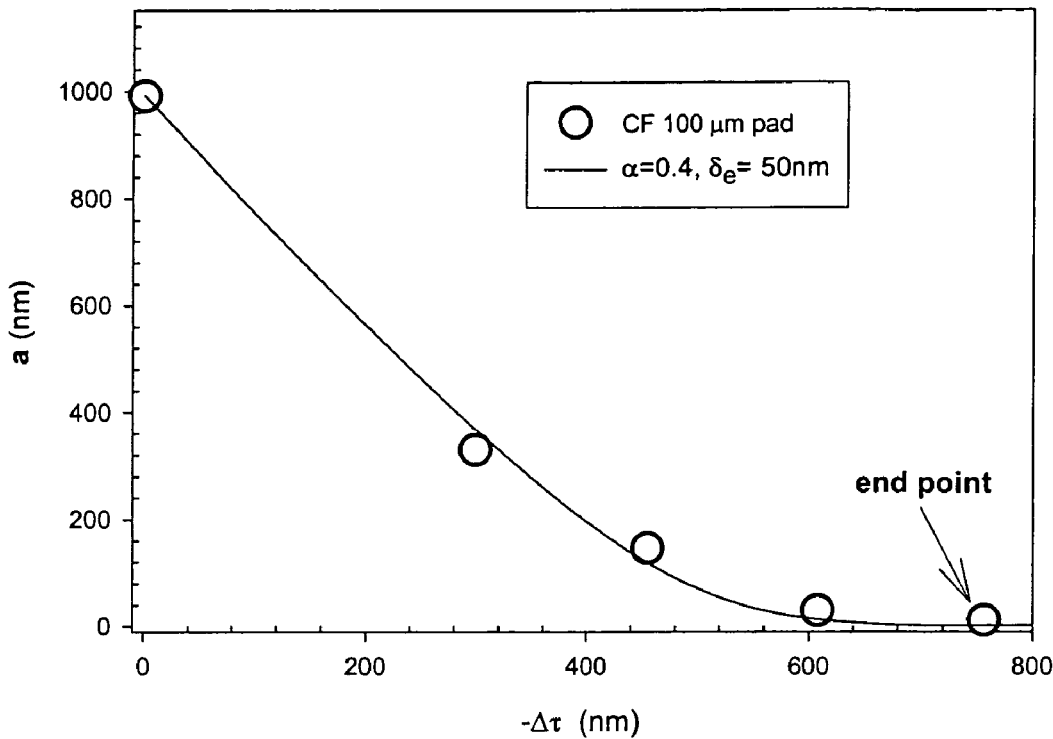
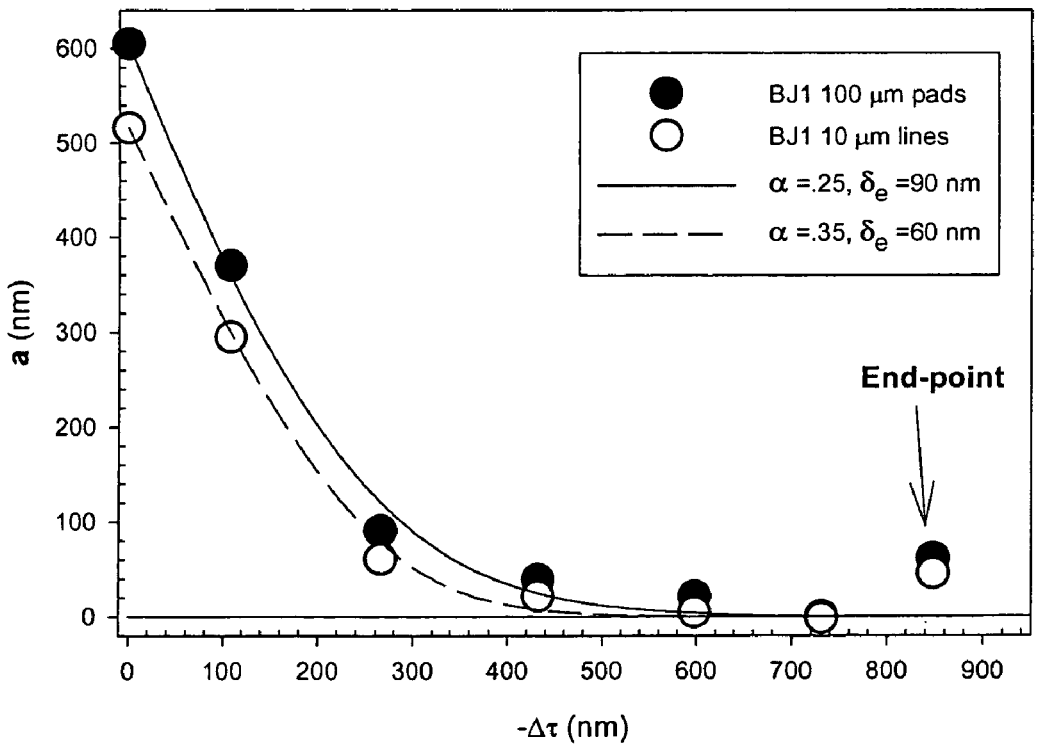
FIGURE 19A
FIGURE 19B

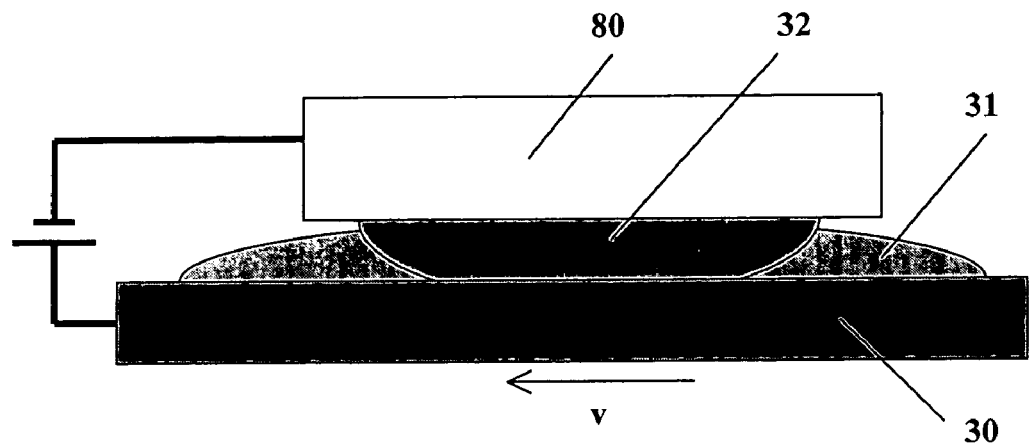
*Figure 22A*
30 - Work-piece (anode)
31 - De-ionized water or other low-conductivity fluid
32 - Membrane "blister"
80 - Cathode half-cell
FIGURE 22B
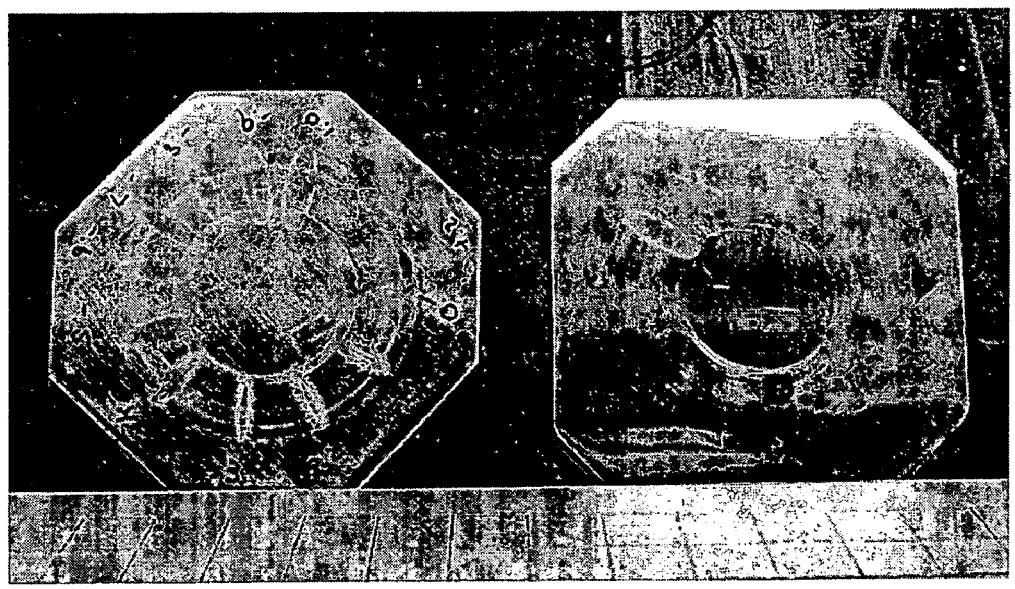

*Geometric Parameters*
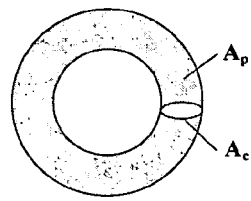
$RR = V_m/F \, (A_p/A_c)(I/n)$
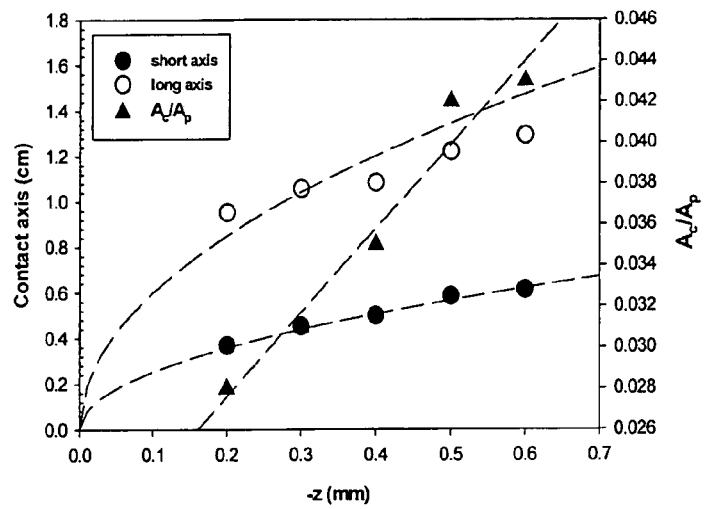
FIGURE 23A
FIGURE 23B
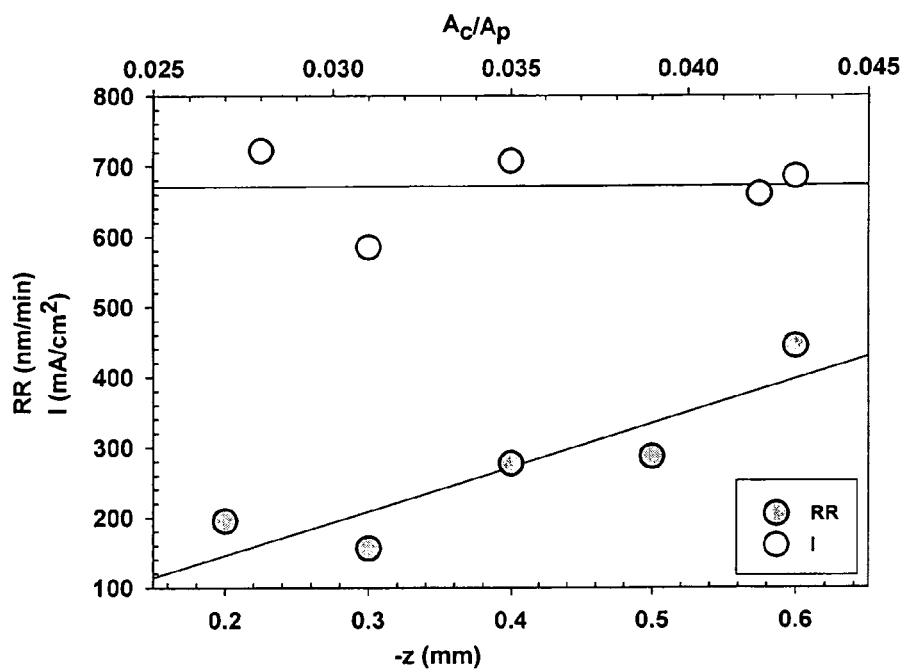
FIGURE 23C Horizontal cantilever
deflection measures normal load.

Vertical cantilever
deflection measures drag load.

*Figure 39*
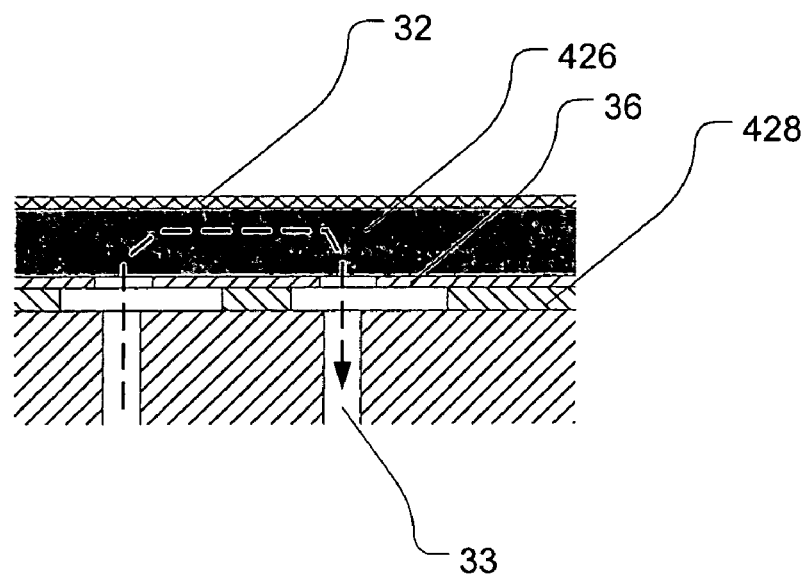
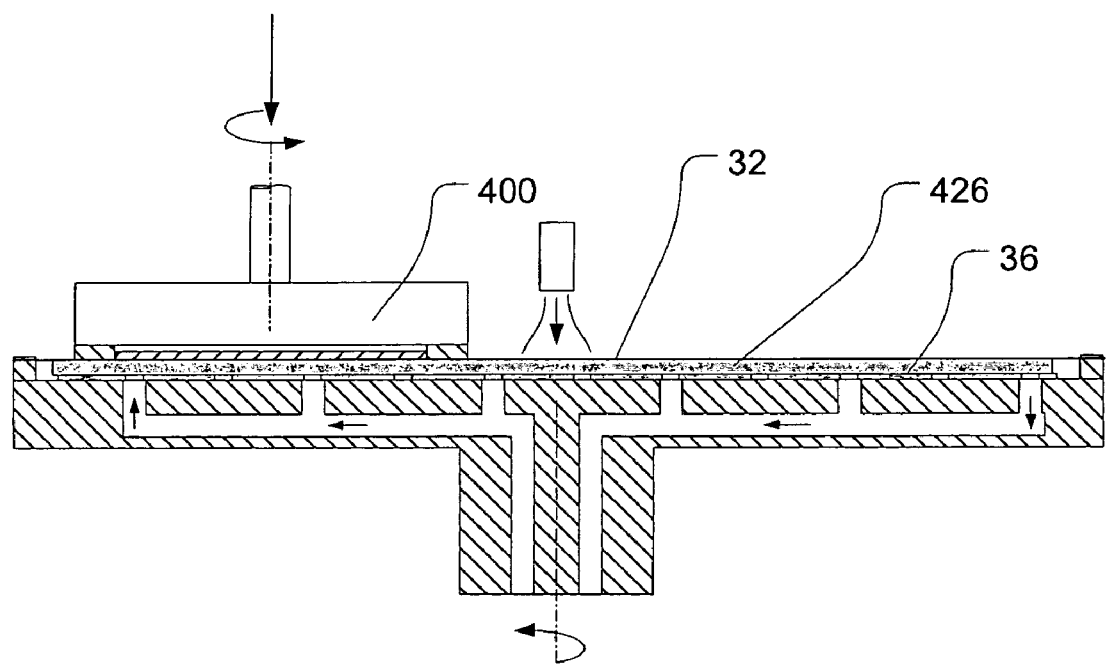

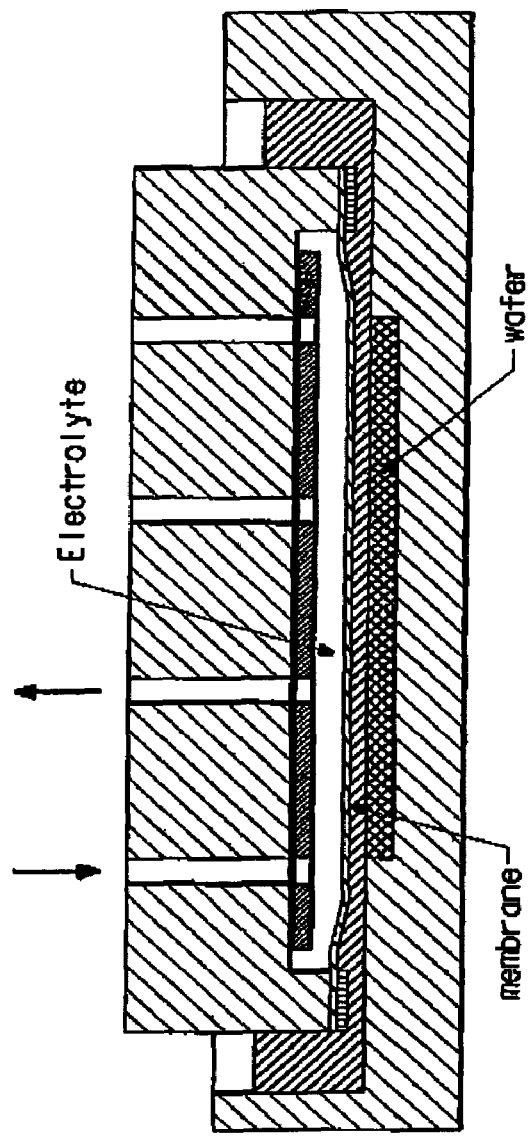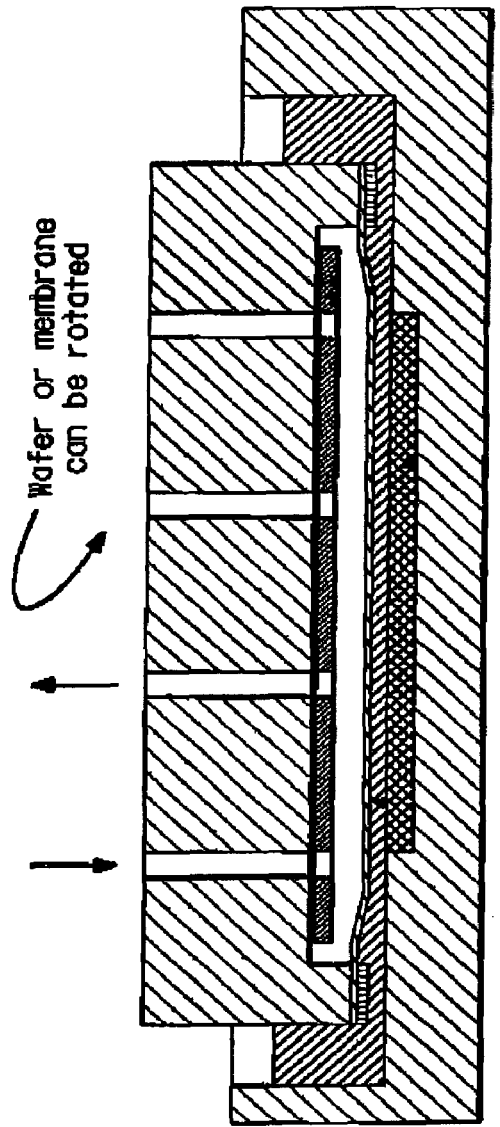
FIG. 40A
FIG. 40B

APPARATUS ADAPTED FOR MEMBRANE-MEDIATED ELECTROPOLISHING

RELATED APPLICATIONS

This application claims priority to the following pending provisional applications: Appln. No. 60/546,198 by Stephen MAZUR and Charles E. JACKSON filed on Feb. 23, 2004; Appln. No. 60/546,192 by Stephen MAZUR and Charles E. JACKSON filed on Feb. 23, 2004; Appln. No. 60/570,967 by Stephen MAZUR and Charles E. JACKSON filed on May 14, 2004; and Appln. No. 60/611,699 by Stephen MAZUR and Charles E. JACKSON filed on Sep. 22, 2004, the disclosures of which are each incorporated herein by reference thereto for all purposes.

STATEMENT REGARDING FEDERALLY SPONSORED OR DEVELOPMENT

N/A

INCORPORATION-BY-REFERENCE OF MATERIAL SUBMITTED ON A COMPACT DISC

N/A

SEQUENCE LISTING

N/A

FIELD OF THE INVENTION

This invention relates to an apparatus for polishing metal surfaces, and more specifically an apparatus adapted to perform an electropolishing process, wherein a portion of metal is removed from the surface by means of electrochemical anodic oxidation. More particularly, this application relates to an apparatus, adapted to perform an electropolishing process on a metal substrate, that includes a cathode and a conductive electrolyte contacting both the cathode and a first side of the charge-selective ion-conducting membrane, wherein the second side of the charge-selective ion-conducting membrane contacts and polishes a metal substrate wetted with a low-conductivity fluid.

BACKGROUND OF THE INVENTION

Conventional electropolishing (EP) is a common metal finishing process in which the metal object to be polished (the "work-piece") is connected to the positive terminal of a DC electrical power supply as the anode. The surface of the work-piece or some portion of that surface is brought into contact with an electrolyte solution which, in turn, also contacts a second electrode (the cathode) which is connected to the negative terminal of the power supply. When a suitable voltage difference is applied between the two electrodes, or a suitable current density is established at the anode, then the work-piece undergoes anodic oxidation forming solvated metal ions that dissolve into the electrolyte. Within a certain range of operating conditions this occurs in such a way that rough areas of the surface become smoother (current density is defined as the electrical current per unit surface area of anode in contact with the electrolyte and has units such as $mA/cm^2$).

EP is capable of producing a mirror-like reflective finish on many different kinds of metals and is especially useful for polishing metal parts with curved surfaces and complicated shapes. As described by D. E. Ward (pp. 100-120 in *Electroplating Engineering Handbook*, $4^{th}$ Edition, L. J. Durney, Ed., Van Nostrand Co., NY, 1984), the optimum electrolyte composition and current density varies with the composition of the work-piece. The rate of the EP process is limited by mass transport of molecules and/or ions in the electrolyte close to the anode surface and is generally optimized by convection of the electrolyte.

Recent interest has focused on the use of EP to selectively remove excess copper in the fabrication of integrated circuits via the copper damascene process. In a typical copper damascene process, a silicon wafer is uniformly covered with a dielectric layer, for example ~0.5 microns of $SiO_2$. A pattern corresponding to the conductive circuit elements is then etched through the dielectric layer by photo-lithographic methods, and the entire surface is coated with a thin "barrier" layer, for example <10 nm tantalum or tantalum nitride. A layer of copper is then grown over the entire surface of the wafer by means of electroplating. This copper "blanket" must be sufficiently thick to fill the etched circuit features (~0.5 microns), but is generally not thicker than about 1 micron in total thickness. The external surface of the copper blanket generally retains topographic features that conform to the larger features in the underlying etched pattern. The next step in the process requires removing all excess copper from the surface of the barrier-coated dielectric while leaving the etched circuit elements filled with copper. In addition, the final surface must be left planar to within very narrow tolerances in order to permit subsequent fabrication of addition layers of circuitry. The cross-section of a typical copper damascene wafer before and after polishing/planarization is shown schematically in FIG. 1.

Many different processes are capable of chemically or mechanically removing material from the surface of a metal work-piece, but such processes differ in their ability to polish or planarize, that is to reduce the roughness of the surface. By planarization is meant the ability to preferentially remove topographic high points (plateaus or ridges) of both large and small lateral dimensions so that the polished surface progressively approaches an ideal plane. Planarizing conventionally plated Cu damascene wafers requires especially high efficiency.

Planarization and removal of excess copper from Cu damascene wafers is currently achieved by means of chemical-mechanical polishing (CMP), involving mechanical abrasion and chemical reactions with oxidizers and other chemicals. However, CMP is a costly process, generates hazardous waste products, and is incompatible with the mechanically fragile materials currently under development for improved dielectric layers.

EP has been considered as an alternative to overcome the limitations CMP. Many different processes are capable of chemically or mechanically removing material from the surface of a metal work-piece, but such processes differ in their ability to polish or planarize, i.e., to reduce the roughness of the surface. By planarization is meant the ability to preferentially remove topographic high points (plateaus or ridges) of both large and small lateral dimensions so that the polished surface progressively approaches an ideal plane. Planarizing conventionally plated Cu damascene wafers requires especially high efficiency.

"Planarization efficiency" may be defined quantitatively by reference to FIG. 2. Consider a surface topography where the vertical distance between high points and low points is measured by amplitude "a," the lateral distance between these points is represented by $\lambda$, and the average thickness of the work-piece is $\tau$. The planarization efficiency of a polishing process is defined by the derivative $da/d\tau$, namely the differential change in amplitude of a topographic feature with the change in average thickness. Depending upon the planarization mechanism $da/d\tau$ may vary with various processing conditions and with the magnitude of a and $\lambda$. Measurements of planarization efficiency are important for practical purposes and also useful for distinguishing different planarization mechanisms.

Planarizing conventionally plated Cu damascene wafers requires that initial topographic features, with initial amplitude $a_o$~0.5 microns and $\lambda$=10 to 100 microns, must ultimately be reduced to a <25 nm, while removing only ~1-1.5 microns of material overall ($\Delta\tau$=−1 micron). Conventional EP can be highly efficient at planarizing surface features where $\lambda$<1 micron, but is much less efficient for larger features ($\lambda$>10 micron). Thus use of EP to planarize Cu damascene wafers requires the use of additional technologies. For example, the SFP tool (ACM Research, Inc.) is only useful for polishing wafers which have been produced by a specialized "hump-free, dishing-free" plating process which minimized the initial topography. Similarly, in electromechanical polishing methods, the EP process is augmented with a more selective mechanical abrasion process.

Fundamental studies have shown that the rate and planarization efficiency of EP vary with a, $\lambda$, and with convective transport in the electrolyte solution. Electrolyte convection increases the rate of EP by enhancing mass transport of solubilizing molecules such as water to the surface of the work-piece (see for example S. H. Glarum, J. H. Marshall, *J. Electrochem. Soc.*, 132, 2872 (1985)). More efficient mixing of the electrolyte produces a thinner convective boundary layer resulting in faster mass transport. C. Wagner (*J. Electrochem. Soc.*, 101, 225 (1954)) showed that for " . . . an ideal electropolishing process," where the thickness of the convective boundary layer is greater than a and $\lambda$, the planarization efficiency is given by the relation: $da/d\tau=2\pi a/\lambda$. However, when $\lambda$ is larger than the convective boundary layer thickness, then $da/d\tau \rightarrow 0$, and no planarization will occur. Accordingly, to planarize features with large $\lambda$ by EP, the efficiency of convective mixing and rate must be restricted, and even in the "ideal" limit planarization efficiency decreases with increasing $\lambda$.

There remains a need for an EP process that is capable of planarizing in an efficient, low-waste manner the topographic features on semiconductor substrates, e.g., Cu damascene wafers produced by the current plating technology, which is advantageously capable of producing commercially acceptable products without the use of additional planarizing steps, means such as specialized plating technologies, masking, degrading polishing materials giving changing performance, and requiring frequent regeneration, or mechanical abrasion.

SUMMARY OF THE INVENTION

The invention is an apparatus adapted to perform membrane-mediated electropolishing of a substrate, including half-cell modifications that facilitate membrane-mediated electropolishing.

The present invention comprises a new type of EP process called membrane-mediated electropolishing (MMEP). MMEP is primarily distinguished from EP in that in MMEP the work-piece does not contact the electrolyte. Rather, the work-piece is in contact, and is preferably wetted by, a low-conductivity fluid. The MMEP apparatus has a conductive electrolyte composition, e.g., solution or gel, in contact with a cathode. A charge-selective ion-conducting membrane disposed between the electrolyte and the work-piece comprises first and second sides, wherein on the first side the membrane contacts the conductive fluid electrolyte composition and is thereby in electrical contact with the cathode, and on the second side the membrane contacts a work-piece having a thin layer low-conductivity fluid disposed thereon. A layer of low-conductivity fluid is disposed between the charge-selective ion-conducting membrane and the work-piece, though in preferred embodiments the membrane sensibly contacts the surface of the work-piece, and the layer of low-conductivity fluid is exceedingly thin. Current flow from the cathode to the work-piece passes through the half-cell fluid, the membrane, and the low-conductivity fluid. When the work-piece is substantially coated by a low-conductivity solvent such as pure water, a suitable voltage difference is applied, and the surface of the work-piece is brought into contact with the external surface of the membrane. Metal ions generated at the work-piece become solvated by the low-conductivity solvent, migrate through the membrane and electrolyte solution and are advantageously electroplated onto the cathode. The planarization efficiency of the MMEP process for features with lateral dimensions $\lambda \geq 10$ microns is much greater than EP and also much greater than a theoretically ideal EP process [as described by C. Wagner, *J. Electrochem. Soc.*, 101, 225 (1954)]. Moreover, under suitable conditions the MMEP process is capable of planarizing such features on typical Cu plated damascene wafers to final amplitudes (residual dishing) a of less than 0.02 micron. Accordingly MMEP offers unique practical advantages for planarizing typical Cu plated damascene wafers without need for specialized masking or mechanical abrasion. A substantial portion of the metallic material electropolished from the work-piece permeates through the membrane toward the cathode. In the preferred embodiments, virtually all (e.g., greater than 95%, for example greater than 98%) of the metal ions generated in MMEP are captured by the cathode half-cell, i.e., pass through the membrane and into the electrolyte composition. These metal ions, or alternatively the same or other metal ions already supplied in the electrolyte, are advantageously plated onto the cathode, so that the amount of metal salts in the electrolyte remains constant. Consequently, Membrane-Mediated Electropolishing consumes little or no chemicals and generates virtually no waste products. The work-piece in MMEP never directly contacts the electrolyte solution, and essentially all metal ions produced by anodic dissolution are transferred across the membrane and into the cell. Thus the work-piece remains free of contamination by toxic, damaging, and/or corrosive chemicals typical of electropolishing electrolytes and traditional CMP formulations, and is also free of mobile ion contamination.

The arrangement of various components of an MMEP apparatus are shown in FIGS. 12 and 16. One aspect of the invention is an apparatus for use in membrane-mediated electropolishing of a work-piece having a surface comprising metal, said apparatus comprising:

A. a substantially DC electric power source 21,609 having positive and negative terminals and typically capable of supplying a substantially DC electric current density of between at least 20 to about 4000 or more mA/cm$^2$, based on the area of membrane contacting the substrate;

B. a half-cell 1 (wherein typical components of a half-cell are shown in FIG. 3) comprising:
1. a fully or partially enclosed volume;
2. a conductive electrolyte solution or gel 33 having a conductivity at least about 100 times greater, preferably about 1,000 times greater or more, more preferably about 10,000 times greater or more, than the conductivity of a low-conductivity fluid 31, e.g., the conductive electrolyte solution has a conductivity of above about 5 mS/cm, preferably above about 10 mS, more preferably above 100 mS/cm, which partially or essentially fills the enclosed volume, cavity or vessel;

3. a cathode 36, which is in contact with the electrolyte solution or gel 33 and is electrically connected to the negative terminal of the power source 21, 609;

4. a charge-selective ion-conducting membrane 32 which seals one surface of the enclosed volume, cavity or vessel, the membrane having an internal surface contacting the conductive electrolyte solution or gel and an external surface adapted to be contact-able with the work-piece surface;

5. a base 102 attachably connected to the membrane; and 6. optionally a window-frame-like structure disposed between the membrane and the work-piece and having holes where the membrane contacts the work-piece surface;

C. a first connector 20, 605 electrically connecting the work-piece surface 30, 605 to the positive terminal of the substantially DC electric power source 21, 609 and a second connector 60 electrically connecting the cathode 36 to the negative terminal of the substantially DC electric power source 21, 609;

D. a low-conductivity fluid supply source 103, 602 adapted to place low-conductivity fluid 31, e.g., a fluid capable of solvating metallic ions polished from the work-piece, and also having a conductivity at least 100 times lower than the conductivity of the conductive electrolyte solution or gel, preferably about 1,000 times or more lower, more preferably about 10,000 times or more lower, than the conductivity of the conductive electrolyte solution or gel, e.g., the low-conductivity fluid conductivity is below about 1000 µS/cm, preferably below about 500 µS/cm, more preferably below about 200 µS/cm, for example between about 0.5 µS/cm and about 150 µS/cm, typically below about 100 µS/cm, even more preferably below 50 µS/cm, for example between about 0.1 µS/cm and about 10 µS/cm, alternately between about 1 µS/cm and about 10 µS/cm, on the work-piece surface; and E. a mechanism 604, 606, 101 for moving the half-cell base and/or the work-piece to obtain the desired movement of the membrane across the surface of the work-piece and maintaining the desired pressure of the membrane against the substrate surface.

The basic components of an MMEP half-cell apparatus are shown in FIG. 3. The work-piece 30 is covered with a low-conductivity fluid 31. The work-piece is in electrical contact via a connector 20 with a positive outlet of a substantially DC electrical power source 21 having positive and negative power outlets, and the cathode 36 is similarly connected with a connector (not shown) to a negative outlet. Another aspect of the invention is an apparatus for use in membrane-mediated electropolishing of a work-piece having a surface comprising metal, said apparatus comprising:

A. a layer of low-conductivity fluid having a conductivity below about 500 µS/cm, preferably below about 100 µS/cm, more preferably below about 20 µS/cm, disposed on the work-piece surface;

B. a half-cell comprising:
  1. a cathode;
  2. a conductive electrolyte solution or gel having a conductivity at least 100 times, preferably at least 1000 times, more preferably about 10000 or more times greater than the conductivity of the low-conductivity fluid, wherein the conductive electrolyte solution or gel contacts the cathode;
  3. a charge-selective ion-conducting membrane having an internal surface contacting the conductive electrolyte solution or gel and an external surface adapted to be contact-able the work-piece surface having low-conductivity fluid thereon;

C. a substantially DC electric power source having positive and negative terminals and a first connector electrically connecting the work-piece to the positive terminal of the substantially DC electric power source and a second connector electrically connecting the cathode to the negative terminal of the substantially DC electric power source; and D. a mechanism for moving the membrane relative to the work-piece to obtain the desired movement of the membrane across the surface of the work-piece.

In another aspect of the invention, a half-cell adapted for use in membrane-mediated electropolishing of a work-piece is provided, said half-cell comprising:

1. a fully or partially enclosed volume, cavity or vessel;
2. a conductive electrolyte solution or gel which partially or essentially fills the enclosed volume, cavity or vessel, wherein the conductive electrolyte or gel comprises at least 0.01 M, preferably at least 0.1 M, of reducible-metal salts;
3. a cathode which is in contact with the electrolyte solution or gel; and
4. a charge-selective ion-conducting membrane which seals one surface of the enclosed volume, cavity or vessel in such a way that the internal surface of said membrane contacts the electrolyte solution or gel and the external surface is accessible to contact the work-piece. The work-piece has a layer of low-conductivity fluid disposed thereon. The conductivity of the low-conductivity fluid can range between about 0.01 µS/cm and 5000 µS/cm. The conductivity of the low-conductivity fluid advantageously ranges between about 0.1 µS/cm and 1200 µS/cm. In one embodiment, the electrical conductivity of the low-conductivity fluid is between about 0.5 µS/cm and about 300 µS/cm, for example between about 1 µS/cm and about 10 µS/cm if the λ is greater than 10 microns, and between about 10 µS/cm and about 50 µS/cm if the λ is between 1 and 10 microns. In another embodiment, the low-conductivity fluids have a conductivity of about 200 µS/cm or lower, for example between about 50 µS/cm and 200 µS/cm, alternatively between about 5 µS/cm and 50 µS/cm.

A variation of any of the above-mentioned apparatus includes the embodiment wherein the half-cell base comprises an inlet 34 and an exit 35 adapted to allow conductive electrolyte solution or gel to be circulated through the partially or fully enclosed volume. Another variation of this apparatus includes the embodiment wherein the half-cell base comprises an opening, the apparatus further comprising a pressure source 22 to adapted to control pressure within the half-cell volume, e.g., to a pressure within 10% or within about 0.3 psi of a pre-selected value between about 0.1 psig to about 60 psig, more typically to a pressure between about 0.1 psig to about 12 or to about 20 psig. A preferred variation of this half-cell includes the embodiment wherein the enclosed volume, cavity or vessel is subject to a positive hydrostatic pressure greater than the ambient atmospheric pressure, and wherein the internal surface of the membrane is concave and is in contact with the electrolyte and the external surface forms a convex surface which extends beyond the adjacent surfaces of the half-cell.

A variation of any of the above-mentioned apparatus includes the embodiment wherein the half-cell base further comprises the low-conductivity fluid supply source attached thereto. Advantageously, the low-conductivity fluid supply source is adapted to supply low-conductivity fluid to a cavity, said cavity being located within an area defined by the outer periphery of the contact area of the membrane against the work-piece surface during electropolishing. Alternatively, the low-conductivity fluid source may be adapted to supply low-conductivity fluid to a region between two membranes.

The MMEP apparatus may further include a substantially sealed enclosure surrounding the work-piece and/or half-cell, wherein substantially sealed enclosure contains an inert gas at a pressure above atmospheric pressure. It is important to control the exposure of low-conductivity fluid to the atmosphere prior to use to exclude unwanted dissolved gases and unwanted particulate contamination. A clean room in a integrated circuit fabrication plant generally keeps the level of particulates and volatile solvents in the air to pre-determined acceptable levels, but do not keep levels of carbon dioxide to sufficiently low levels to not adversely affect the performance of the most preferred embodiments of this invention, e.g., where the conductivity of the low-conductivity fluid is less than about 5 µS/cm. At such low-conductivity, atmospheric carbon dioxide can readily dissolve into the low-conductivity water and can thereby substantially increase the conductivity of the low-conductivity fluid, e.g., water. This substantially sealed enclosure surrounding the work-piece and half-cell can exclude gases such as carbon dioxide which can readily dissolve into low-conductivity fluid after the low-conductivity fluid is applied to the substrate, and can exclude particulates. Additionally, the enclosure can simplify safe handling of molecular oxygen generated (by electrolysis of water) near the work-piece and molecular hydrogen generated (by electrolysis of water) near the cathode, for example by applying sufficient gas flow that these components do not form a combustible mixture, or by keeping the majority of the molecular hydrogen from contacting the majority of generated oxygen, or combination thereof.

A variation of any of the above-mentioned apparatus further includes a window-frame-like structure disposed between the charge-selective ion-conducting membrane and the work-piece, wherein said a window-frame-like structure has holes therethrough which allow the membrane to contact the work-piece, wherein the size of the holes will depend on among other requirements on the thickness of the protective membrane. Exemplary window-frame-like structures have a shape similar to a gauze, a screen, or window frames, i.e., regularly shaped frames about contact areas. Such structure can reduce wear on a membrane, increase contact area between a membrane and the work-piece, assist in the distribution of low-conductivity fluid across the area being polished, assist in removing oxygen gas generated by the electrolysis of water, assist in providing electrical contact from the power supply to the surface of the work-piece, or any combination of the above.

A variation of any of the above-mentioned half-cells includes the embodiment wherein the half-cell further comprises a base 102, 601 forming a side of the enclosed volume, cavity or vessel, wherein the base comprises an opening 34, 35 in fluid contact with the conductive electrolyte fluid or gel 33 and a pump 22, 608 fluidly connected to the opening and adapted to circulate the conductive electrolyte solution or gel between the partially or fully enclosed volume and the pump. For example, the base may comprise an opening in fluid contact with the conductive electrolyte fluid or gel and further comprises at least one of a pressure source, a filter, a de-gasser 607, a heat exchanger, or combination thereof, fluidly connected to the opening.

In all preferred embodiments of this invention, substantially no active ion exchange material, having ability to substantially capture and retain metal-containing ions, is disposed within the partially or fully enclosed volume. That is, the membrane comprises ion exchange capacity no greater than 1% of the metal ions electropolished from the work-piece. Further, in the preferred embodiments of the invention there is no active ion exchange material, i.e., material having ability to substantially capture and retain the metal-containing ions originating from the metal or from other sources, disposed into the electric current pathway between the cathode and the work-piece surface. An "ion-exchange" material is a functional term implying the membrane captures an ion, at the same time releasing another type of ion. For the membranes of the current invention, 1) in some embodiments the membrane does not have a substantial number of functional moieties to capture metal ions as required by an ion exchange material, 2) in most embodiments the membrane is nearly saturated with metal ions, and thus has little or no residual "ion-exchange" capacity as is known in the art, and finally, in all embodiments the "ion-exchange" capability is too low to be useful in functioning as such during electropolishing. Rather, the membrane in the current invention is an ion-conductive material, and is typically a charge selective ion-conductive material. Removing 1 micron of Cu from a single 20 cm Cu damascene wafer generates $4.4 \times 10^{-3}$ moles of $Cu^{+2}$. This may be accomplished via MMEP using for example only 5 $cm^2$ of membrane contact area. A preferred membrane for use in the MMEP process are any of the commercially available Nafion® membranes, and a 5 $cm^2$ layer of the thickest Nafion® membrane (N117, with Equivalent weight 1100), has a total exchange capacity of only $81 \times 10^{-6}$ moles of $Cu^{+2}$. The membrane would be saturated with Cu after polishing about only a few percent of the required depth. This is, incidentally, a major difficulty with prior art polishing processes that utilize ion exchange material in the polishing. In contrast, using an MMEP process where the membrane is ion-conducting as opposed to ion-capturing, not only can an entire wafer be polished with a 5 $cm^2$ membrane, but also the same membrane can be used to polish many wafers without regenerating the ion-exchange capacity.

The preferred variation of any of the above-mentioned apparatus includes the embodiment wherein the charge-selective ion-conducting membrane is a cation-conducting membrane. For example, the charge-selective ion-conducting membrane may comprise a polymeric ionomer functionalized with strong acid moieties, e.g., having $pK_a$ less than 5, preferably moieties having $pK_a(s)$ less than 3. In a preferred embodiment, the charge-selective ion-conducting membrane comprises a perfluorosulfonic acid/PTFE copolymer. In another preferred embodiment, the charge-selective ion-conducting membrane comprises a perfluorocarboxylic acid/PTFE copolymer. In another preferred embodiment, the charge-selective ion-conducting membrane comprises a polymeric ionomer functionalized with both sulfonic acid groups and carboxylic acid groups. Typically the charge-selective ion-conducting membrane is between about 20 to about 500, more typically about 40 and about 200, microns in thickness. The membrane can be laminated material, consisting of a plurality of membranes laminated together.

Alternatively, for use where the electropolished metal ions are solvated by ligands such that the solvated complex has a net negative charge, the charge-selective ion-conducting membrane is an anion-conducting membrane, for example, where the membrane comprises a polymeric ionomer functionalized with basic moieties, e.g., with quaternary ammonia groups.

One side reaction intrinsic to electropolishing is the electrolysis of water, which can produce molecular hydrogen, molecular oxygen, or both. We have found that it is very advantageous in any form of electropolishing to maintain a high enough concentration of reducible ("plate-able") metal ions in the electrolyte in the vicinity of the cathode to substantially reduce the formation of hydrogen gas, wherein this reducible-metal-containing electrolyte and any metallic particles that may form on reduction of the metal ions do not contact the work-piece. Therefore, a unique additional invention is an apparatus adapted to electropolish or electro-mechanically polish Cu damascene wafers wherein the solution contacting the cathode contains a sufficient concentration of reducible-metal salts to substantially suppress the formation of molecular hydrogen at the cathode, but where the electrolyte or fluid contacting the work-piece has substantially less reducible-metal salts. Preferred reducible-metal ions are Cu(I), Cu(II), Ni(II), Ag(I), Fe(II), Cr(III), and/or complexes of these ions. The most preferred reducible-metal ions are Cu(I) and Cu(II). Depending on the current density, generally a concentration of between 0.001 M to about 1 M of a reducible-metal salt is sufficient, and in preferred embodiments the electrolyte contacting the cathode comprises about 0.01 M to 0.5 M, for example about 0.05 M to about 0.3 M, alternately from about 0.1 M to about 0.3 M, of a reducible-metal salt.

The same criteria apply to any of the above-mentioned MMEP apparatus, and in MMEP the reducible-metal-containing electrolyte solution or gel is rigorously kept away from the Cu damascene wafer work-piece. Therefore, in preferred embodiments of any of the above described MMEP apparatus, the conductive electrolyte solution or gel comprises a reducible-metal salt, wherein the amount of reducible-metal salt is sufficient to substantially reduce the formation of hydrogen gas. Another variation of any of the above-mentioned apparatus includes the embodiment wherein the conductive electrolyte solution or gel comprises from about 0.001 M to about 1 M, preferably about 0.01 M to 0.5 M, for example about 0.05 M to about 0.3 M, or alternately from about 0.1 M to about 0.3 M, of reducible-metal salt.

Another variation of any of the above-mentioned apparatus includes the embodiment wherein the conductive electrolyte solution or gel comprises or consists essentially of one or more nitrogen-containing ligands capable of stabilizing $Cu^{+1}$ ions, e.g., acetonitrile, propionitrile, monoethanolamine, diethanolamine, triethanolamine, diglycolamine, othylenediamine and/or ammonia. A variation of this apparatus includes the embodiment wherein the conductive electrolyte solution or gel comprises any of the above compounds in an amount sufficient to give a electropolishing efficiency when electropolishing copper metal of between one copper atom per 1 to 1.99 electrons of current flow. Another variation of any of the above-mentioned apparatus includes the embodiment wherein the low-conductivity fluid supply source supplies a low-conductivity fluid consisting essentially of water, and acetonitrile, propionitrile, ethylene carbonate, propylene carbonate, glycol, ethylene glycol, propylene glycol, diethlyene glycol, or mixtures thereof, and optionally an acid. Another variation of any of the above-mentioned apparatus includes the embodiment wherein the low-conductivity fluid supply source supplies a low-conductivity fluid consisting essentially of water and at least one of acetonitrile, an alcohol having from 1 to 8 carbon atoms, glycol, ethylene glycol, propylene glycol, diethlyene glycol, proplylene glycol monomethyl ether, propylene carbonate, ethylene carbonate, and dimethylformamide. Another variation of any of the above-mentioned apparatus includes the embodiment wherein the low-conductivity fluid supply source supplies a low-conductivity fluid consisting essentially of water, acetonitrile, or mixtures thereof, and between about 1 and about 300 ppm surfactants.

A variation of any of the above-mentioned apparatus includes the embodiment wherein the substantially DC electric power source provides a pulsed DC current alternating between a high current value and a low current value that is less than about 70%, preferably less than about 50%, and typically less than 20%, of the high current value. For example, the substantially DC electric power source may advantageously provide a pulsed DC current alternating between a high current value and a low current value that is less than about 70%, preferably less than about 50%, and typically less than 20%, of the high current value, wherein the low current value is maintained for a period of time between 10 microseconds and 2 seconds, for example between 1 millisecond and 0.1 seconds, and the high current value is maintained for a period of time between about 10 microseconds and 5 seconds, for example between 1 millisecond and 0.1 seconds.

We identified a phenomenon in that the half-cell polished efficiently when the membrane is in sliding contact with the work-piece surface. Generally, there are a plurality of points where the membrane may contact the work-piece, but typically not every portion of the work-piece is contacted at any one time. Therefore, the movement of the membrane relative to the work-piece should have a pattern to insure adequate polishing of the entire product portion of the wafer without undue overpolishing of any area. Such polishing procedures are within the skill of one of ordinary skill in the art having benefit of this disclosure. In any of the above mentioned apparatus, advantageously the mechanism to move the membrane relative to the work-piece surface is sufficiently designed to maintain a relative velocity v between the membrane and the work-piece surface of 20 cm/sec or greater, preferably 30 cm/sec or greater, for example between about 40 cm/sec and about 60 cm/sec. The membrane will dehydrate (or de-solvate) unless a supply of water (or other solvent) is supplied to the active portion of the membrane. In one preferred embodiment the membrane comprises one or more windows, where a low-conductivity fluid can exist in the areas between windows of a membrane. FIG. 21 shows cathode half-cells with one and two membrane "windows" for polishing 4"×4" metal wafer samples on a spin-polishing tool. In both cases, electrolyte solution is continuously circulated through the half-cell cavity by means of a peristaltic pump. Unless otherwise noted, most experiments were conducted at a recirculation pumping rate of 118 ml/min at a hydrostatic back pressure, i.e., pressure within the half-cell, of approximately 14 psi. The membranes were N117 Nafion® with a thickness of 7 mil. The windows are approximately 25×17 mm. Alternatively, a plurality of small membranes in an array can be used instead of one large membrane sub-divided into windows. In another embodiment, the membrane is shaped and adapted to at least partially roll over the work-piece surface, as opposed to complete sliding as is done with a flatter membrane surface. A variation of these half-cells includes the embodiment wherein the enclosed volume, cavity or vessel is subject to a positive hydrostatic pressure greater than the ambient atmospheric pressure, and wherein the internal surface of the membrane is concave and is in contact with the electrolyte and the external surface forms a plurality of convex surfaces which extend beyond the adjacent surfaces of the half-cell. Other variants described herein use one or more physical or electrical methods of extending the membrane forward. Additional refinements include various methods of allowing the membrane to re-hydrate, by for example pulsing the current, or moving the membrane forward and back from the work-piece surface, or other mechanisms as described herein. There is, however, one operable embodiment of this invention where there need not be movement between the membrane and the work-piece. This embodiment can have sequential polishing steps, each followed by a non-polishing interval of time wherein the low-conductivity fluid layer is re-established.

A variation of any of the above-mentioned half-cells includes the embodiment further comprising a low-conductivity fluid supply source adapted to supply low-conductivity fluid to the external surface of the charge-selective ion-conducting membrane. In one such embodiment, the low-conductivity fluid supply source is adapted to supply low-conductivity fluid to a cavity, said cavity being located within an area defined by the outer periphery of the contact area of the membrane contacting the work-piece surface during electropolishing.

Generally, and within a predefined set of parameters, the removal rate of metal from a substrate is primarily dependent on the voltage (V) and on the fraction of the area to be polished that is contacted by the membrane at a single instant ($A_c/A_p$), and is secondarily dependent on the contact pressure ($P_c$) exerted by the membrane against the surface of the work-piece, on the relative velocity (v) between the membrane and the substrate surface, and on the amount of continuous time (dwell time) an average area being polished is contacted by the membrane before the membrane moves off that particular area.

MMEP is useful for polishing and planarizing work-pieces of various compositions, including both pure metals and alloys. Accordingly MMEP has utility for many of the same metal finishing applications currently addressed by conventional EP. MMEP can provide several practical advantages over EP for those applications and also for other applications such as planarization of copper damascene wafers where conventional EP suffers from intrinsic limitations as previously discussed. One advantage of MMEP over EP is its superior ability to reduce roughness and to planarize a surface. As detailed above, for features of large lateral dimensions ($\lambda > 10$ microns) the planarization efficiency of MMEP is intrinsically much greater than that of EP under typical conditions with convected electrolyte, and is also much greater than for an ideal EP process with no convection. Moreover, convection is essential for most applications of EP because in the absence of convection, polishing is too slow and non-uniform to be of practical value. Moreover, under certain conditions MMEP is capable of planarizing Cu damascene wafers featuring humps and dishing in the plated topography without the use of additional means such as masking, or mechanical abrasion.

At the same time, MMEP provides the advantage over EP and electromechanical polishing processes in that strong acid electrolytes and metal salts never contact the wafer work-piece. Moreover, the work-piece in MMEP never directly contacts the electrolyte solution, and essentially all metal ions produced by anodic dissolution are transferred across the membrane and into the cell. Thus the work-piece remains free of contamination by toxic and/or corrosive chemicals typical of EP electrolytes.

In MMEP, anodic dissolution occurs only at locations in contact with, or in close proximity to the cathode half-cell membrane so that polishing can be easily restricted to selected portions of the work-piece. MMEP also requires only a small volume of electrolyte sufficient to fill the cell, and this may be much smaller than the volume required to polish an equivalent area of work-piece by coating or immersion in conventional EP.

Under suitable operating conditions, virtually all of the metal ions generated in MMEP are captured by the cathode half-cell and plated onto the cathode, so that the amount of metal salts in the electrolyte remains constant. Consequently, MMEP consumes little or no chemicals and generates virtually no waste products.

In some variations of the invention, the cathode half-cell is modified to have a size similar to that of conventional CMP polishing pads. FIGS. 35 to 39 show variations on this theme. One concern is that the large expanses of membrane may distend (even under slight pressure) too much when not contacting a substrate, and there are solutions presented to that problem.

In one embodiment, however, the membrane is sufficiently thick to allow the membrane to have considerable strength such that the membrane may contact the substrate without having any pressure exerted on the backs of the membrane. In such an embodiment, the thickness of the membrane may range from about 400 µm to about 6000 µm. The layer of electrolyte can be thin, e.g., about 0.1 cm or more, for example, and/or the electrolyte can be contained within a resilient, porous, permeable structure such as shown in FIGS. 35 and 39. Such embodiments can be particularly advantageous because the cathode can also be resilient, which would provide a cathode half-cell that can look, feel, and have properties similar to conventional CMP polishing pads. Such a pad could advantageously have a thin window frame-like structure thereon, or can have thin grooves cut therein, as is shown by FIG. 38.

Each aspect of the standard half-cell used for MMEP will be discussed, and then specific half-cell designs will be presented. It is understood that any and every combination of the embodiments listed herein can advantageously, and usually should be combined with other non-conflicting embodiments described above and in the detailed description below, i.e., to the extent the recitations in the embodiments do not conflict one with another.

BRIEF DESCRIPTION OF THE DRAWINGS

Many embodiments of the invention, and results of experiments, are described in reference to the following figures:

FIG. 9A shows a schematic cross-section along the long axis of a cylindrical cathode half-cell;

FIG. 9B shows an end view of the cylindrical cathode half-cell of FIG. 9A;

FIG. 9C shows a schematic cross-section along the long axis of a hemi-cylindrical cathode half-cell;

FIG. 9D shows a schematic cross-section along the short axis of the hemi-cylindrical cathode half-cell of FIG. 9C;

FIG. 14 is a schematic illustration of a co-rotating 52 cm cathode half-cell having a plurality of spaced windows, sized proportionately to existing CMP equipment, polishing a 20-cm wafer;

FIG. 15 is a schematic illustration of a co-rotating 52 cm cathode half-cell, having a size similar to that of conventional CMP polishing pads, for simultaneously polishing three 20-cm wafers;

FIG. 19 shows results of MMEP spin-polishing of Cu damascene wafers;

FIG. 22A shows a very simplified schematic illustration of MMEP operation;

FIG. 22B shows an examples of a Cu coupon showing variations in elliptical contact areas obtained after static polishing at values of z ranging from 0 to −1.0 mm;

FIG. 23A shows an exemplary schematic illustration of the relationship between contact area $A_c$ and process area $A_p$ for a single-window half-cell;

FIG. 23B shows a graph of the effects of normal displacement z of an exemplary elliptical half-cell from the substrate, such as made the marks of FIG. 22B, on the both the long and short axis of the ellipse, and on the area contacted $A_c$;

FIG. 23C shows the effect of normal displacement z of an exemplary elliptical half-cell from the substrate on current density and removal rate at 10V, for v=55 cm/sec;

FIG. 39 shows a side view of a compliant porous permeable pad 426 disposed within a half-cell between a cathode 36 and the membrane 32, and also showing channels for circulating electrolyte 33, and part of a base 428;

FIGS. 40A to 40D show an MMEP apparatus adapted to polish a wafer, where there is little or no movement between the wafer and the membrane, but rather where electrolyte solution or gel 33 presses the membrane 32 firmly against a work-piece 30, wherein a pump and a reservoir of electrolyte solution 432 are present, the supply of electrolyte being controlled by a variable orifice 430 and/or pressure transducer 428 (not equivalent to item 428 in FIG. 39);

DEFINITIONS

Figure 1:
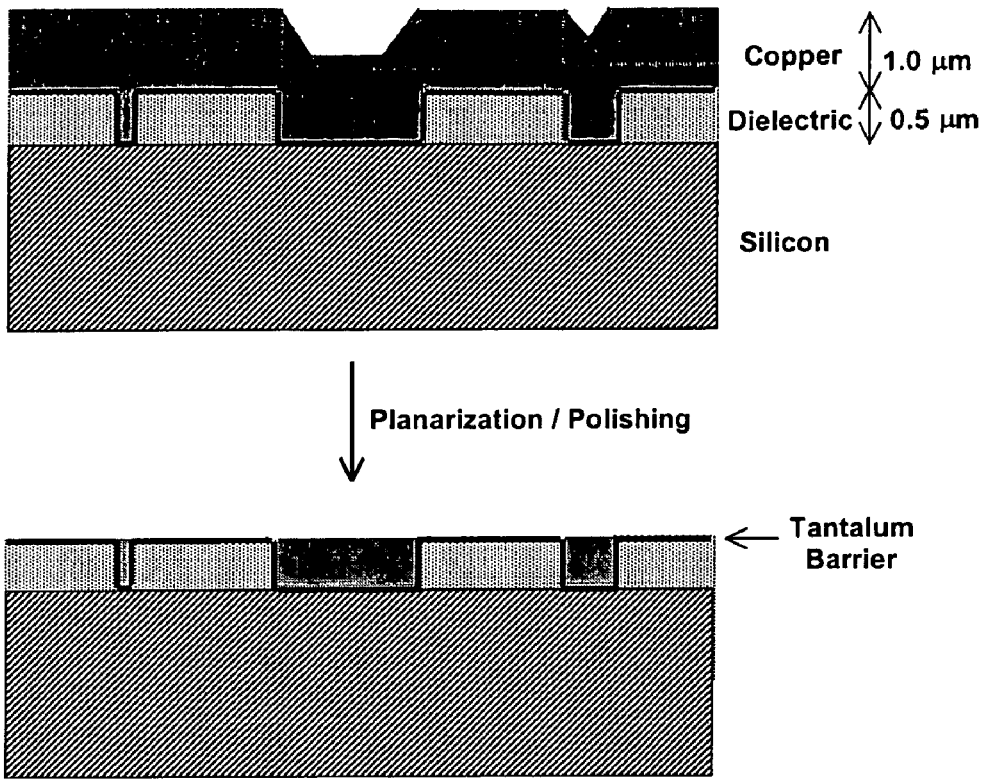
FIG. 1 is a schematic cross-section of a typical copper damascene wafer.

The following abbreviations are used in this disclosure:

$P_c$, in psi, is the contact pressure $F_z/A_c$;

n, in e$^-$/Cu, is the number of electrons consumed by the process to polish an atom of copper from a substrate surface;

i, in amps, is the current between the cathode and the substrate

I, in amps/cm$^2$, is the current density equal to $i/A_c$;

V, in volts, is the voltage applied between the cathode and the substrate;

v, in cm/sec, if the velocity of the membrane relative to the substrate surface;

dwell time, in milliseconds, is the average width of the contact area $A_c$ measured in the direction of v, divided by the velocity v;

$P_T$, in psi, also called the tool pressure, is the force exerted by the cathode half-cell normal to the wafer divided by the total area to be polished, equal to $F_z/A_p$;

$P_h$, in psi, is the hydrostatic pressure of the electrolyte within the cathode half-cell, which is approximately equal to $P_c$;

$P_c$, in psi, is the normal force exerted by the cathode half-cell on the substrate per unit area of contact, equal to $F_z/A_c$.

$A_c$, in cm$^2$, is the contact area between the membrane and the substrate surface;

$A_p$, in cm$^2$, is the total polished area of the substrate surface;

z, in mm, is the displacement of the half-cell body from the substrate surface, where at z=0 corresponds to the limit at which the membrane first contacts the substrate surface;

$F_z$ in gm, is the normal force exerted by the membrane on the substrate;

$F_d$ in gm, is the drag force exerted by the membrane on the substrate;

COF is the coefficient of friction, COF=$F_d/F_z$;

RR, in nm/min, is the metal removal rate resulting from the membrane mediated electropolishing process, averaged over the entire polished area;

Δm, in g, is the mass lost from the substrate for any given period of polishing;

ρ is the density, which for Cu is 8.92 g/cm$^3$;

$V_m$, in cm$^3$/mole, is the molar volume, which for Cu is 7.135 cm$^3$/mole;

F is Faraday's constant (9.65×10$^4$ coulomb/mole); and

Q in coulombs, is the total amount of charge passed for a given period of polishing. The various embodiments of the invention are described herein with reference to the figures, as appropriate.

DETAILED DESCRIPTION OF THE INVENTION

The invention is an apparatus for membrane-mediated electropolishing of a substrate, as well as the method of using the described apparatus. Membrane-mediated electropolishing apparatus have the following characteristics. With respect to FIG. 3A, the work-piece 30 is in contact, and is preferably wetted by, a low-conductivity fluid 31, while the cathode 36 within the half-cell is in electrical contact with a conductive electrolyte composition 33, typically an electrolyte solution, suspension, gel, or composition, or combination thereof, collectively called a "solution or gel," wherein the conductivity of the conductive solution or gel is at least 100 times greater than the conductivity of the low-conductivity fluid. Second, an ion-conducting, charge-specific membrane 32 is disposed between the cathode 36 and the work-piece 30. This membrane 32 comprises first and second sides, wherein the first side contacts the electrolyte solution or gel 33, and the second side contacts the low-conductivity fluid 31 and/or the work-piece 30. Current flow from the cathode 36 to the work-piece 30 therefore passes through the electrolyte composition 33, the membrane 32, and the low-conductivity fluid 31. Third, removal of material from the work-piece is caused principally, usually completely, by electrolytic dissolution of the work-piece which is the result of current flow between the cathode and the work-piece. Forth, with respect to FIG. 16, there is a mechanism 103 to supply low-conductivity fluid to the contact area of the membrane against the work-piece surface. Finally, a substantial portion of the ionic metallic material electropolished from the work-piece permeates through the membrane 32 and into the conductive electrolyte solution or gel 33 toward the cathode 36.

Figure 21A:
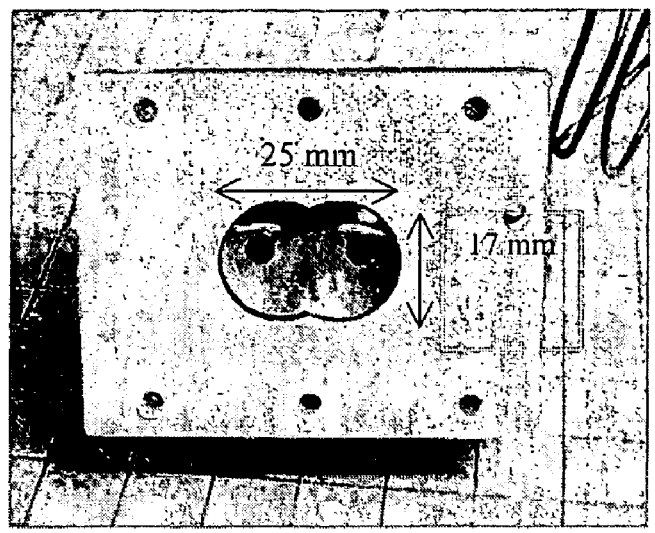
FIG. 21A shows a bottom view of a single-window cathode half-cell.
Figure 35:
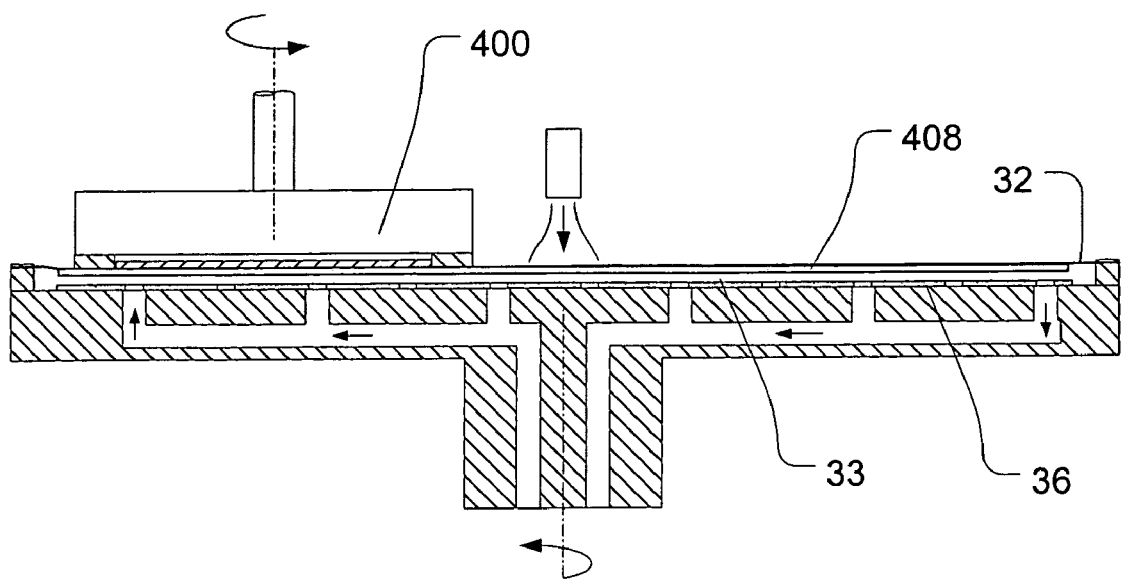
FIG. 35 shows a porous material 408 which forms structures to stiffen the membrane 32, which may be attached to the membrane by for example welding, disposed inside a large diameter half-cell.

The key to the invention is the half-cell. With respect to FIGS. 3A and 16, the present invention comprises a cathode half-cell 1 for use in a membrane-mediated electropolishing process whereby the work-piece 30 is physically separated from the electrolyte 33 and cathode 36 by an ion-conducting membrane 32, for example a charge-selective ion-conducting membrane, wherein the membrane is essentially impermeable to the conductive solutes and salts of the electrolyte but is readily permeable to the ions produced by electropolishing, e.g., anodic oxidation of the work-piece. The method achieved its greatest planarization efficiency when the membrane 32 contacts or approaches arbitrarily close to the substrate 30. Therefore, various design criteria relate to methods of encouraging contact between the membrane and the surface of the work-piece. In one embodiment this is achieved in part by use of pressure, wherein the electrolyte 33 in the half-cell is maintained at a hydrostatic pressure greater than ambient atmospheric pressure, and the membrane 32 is sufficiently flexible to expand (be urged toward the work-piece) under the influence of this pressure to establish a convex external surface (a "bulge" or "blister") extending beyond adjacent surfaces of the half-cell to contact the work-piece. In another embodiment the membrane is urged toward the work-piece by for example materials disposed behind the half-cell. For example, FIG. 35 shows a porous (or alternatively a non-porous) stiffening support disposed between the cathode and the membrane, while FIG. 39 shows a compliant porous permeable material disposed between the cathode and the membrane. In another embodiment the membrane is urged forward by its naturally convex or curved shape in response to a small positive pressure within the half-cell, where the membrane is large, e.g., about the size of a conventional CMP polishing pad. See, for example, the photos in FIGS. 21A and 21B, as well as the membranes curvature in FIG. 3B. In some embodiments the membrane is urged forward by electrostatic forces. Embodiments combining two or more of the above are encompassed in the invention.

Figure 12:
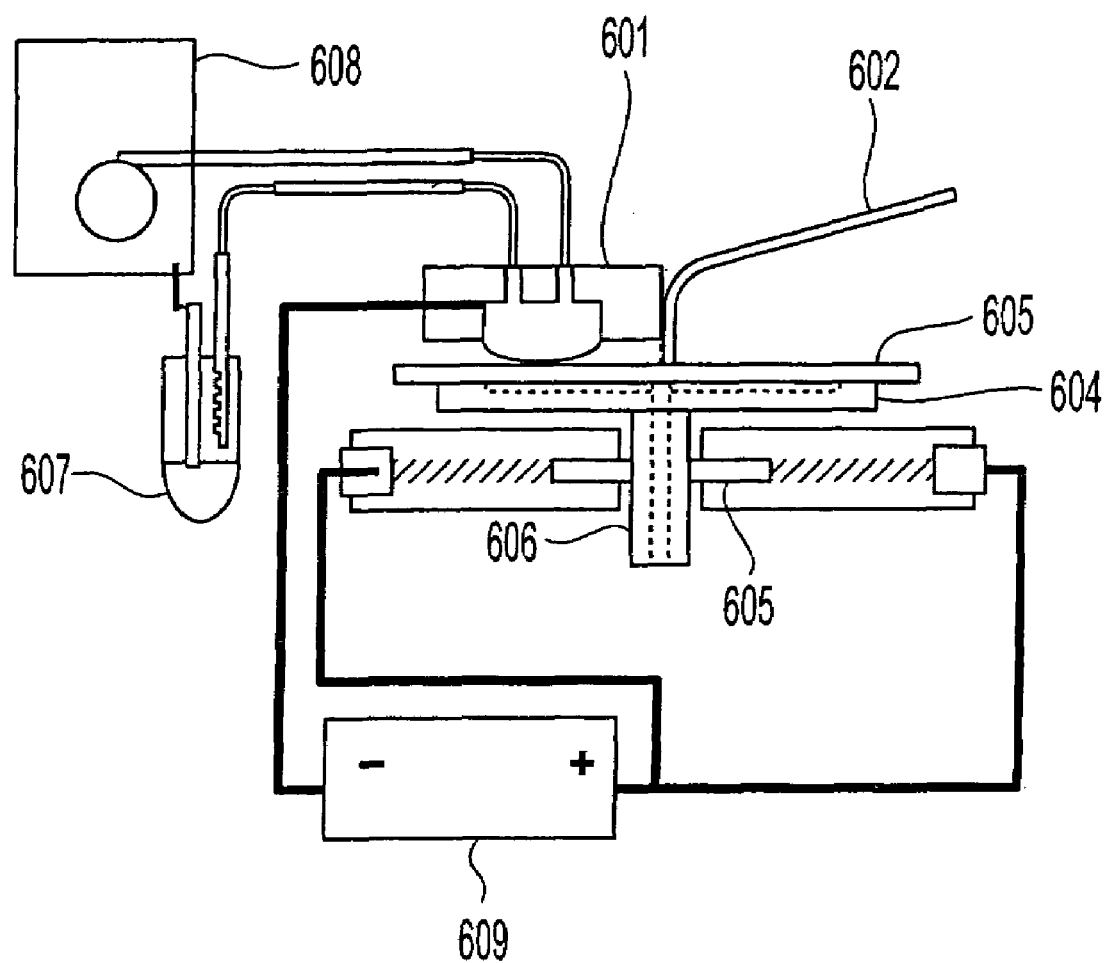
FIG. 12 shows a schematic showing positions of pieces of MMEP apparatus, where 608 is a peristaltic pump, 607 is a conductive electrolyte reservoir and de-gasser, 602 is the half-cell, 602 is a source of low conductivity fluid, 605 is a copper damascene wafer, 604 is a support, e.g., a vacuum chuck, 606 is a spinning shaft, 605 is a spring-loaded carbon brush electrical connector, and 609 is a power source.
Figure 16:
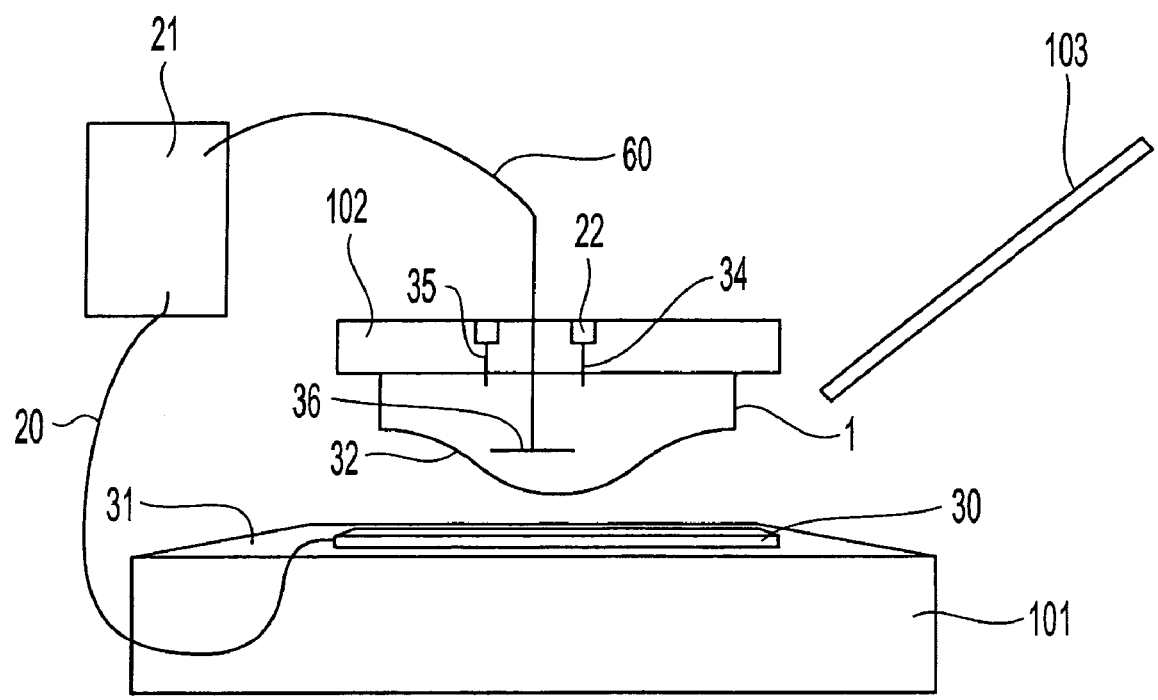
FIG. 16 is an additional schematic illustration of the typical components of a spin-polishing apparatus used for MMEP on Cu damascene wafers.

Apparatus adapted for MMEP is best understood in relation to the process of MMEP. With reference to FIGS. 16 and 12, the method of membrane-mediated electropolishing of a work-piece 30, 605 having a surface comprising a metal, comprises or consists essentially of:

A) providing the work-piece 30, 605 at least partially covered with a low-conductivity fluid supplied by low-conductivity fluid supply 103, 602, wherein the work-piece is in electrical contact via connector 20 (in FIG. 16) with a positive outlet of a substantially DC electrical power source 21, 609 having positive and negative power outlets;

B) substantially and movably contacting (via the rotation of platen 604, for example) the work-piece 30, 605 having low-conductivity fluid disposed thereon with a first side of an ion-conducting membrane 32, wherein a second side of the ion-conducting membrane contacts a conductive electrolyte composition;

C) electrically contacting the conductive electrolyte composition with a cathode 36, wherein the cathode is electrically connected via connector 60 (in FIG. 16) to the negative outlet of the substantially DC electrical power source 21; and D) imposing an electric current between the work-piece and the cathode, wherein the current flows through the conductive electrolyte composition, the membrane, and the low-conductivity fluid, thereby electropolishing metal-containing ions from the surface of the work-piece, and wherein at least a majority of metal-containing ions permeate through the ion conductive membrane and into the conductive electrolyte composition.

SUBSTANTIALLY DC ELECTRICAL POWER SUPPLY: A source of DC electrical power 21 is connected between the work-piece 30, 605 (which functions as the anode) and the cathode 36 in the cell (which functions as the cathode). Generally any DC electric supply that provides a steady DC voltage or current is useful. Advantageously, the voltage is varied for various metals and polishing parameters, but a voltage between 1V and 50V is generally useful, a value between 1V and 40 is preferred, and for low-n copper polishing regimes, a value between 1V and 15 V, e.g., between 1V and about 10V, is preferred. For high-n copper polishing regimes copper, e.g., for MMEP of copper-coated damascene wafer used in the manufacture of integrated circuits where n is greater than about 3, preferably greater than about 3.5, and typically greater than 4, the voltage is advantageously varied between about 10 and about 40 V. Voltage-limited supply is preferred, as resistances increase as the polishing nears the endpoint, wherein some areas on the work-piece surface may be devoid of polishable metal.

We have found that by interrupting the voltage, or varying the voltage between a first level and a second level, at suitable intervals during the MMEP process, it is possible to increase the planarization efficiency. The power supply is advantageously variable and reversible. It is therefore advantageous for the power supply to be able to supply short-lived variations or pulses in the supply voltage. In particular, reducing the voltage from the designed efficient voltage to a value near zero at regular but short-lived intervals increases planarization efficiency. A variation of this apparatus includes the embodiment wherein the substantially DC electric power source provides a pulsed DC current alternating between a high current value and a low current value that is less than 70%, preferably less than about 50%, for example less than about 20% of the high current value. For example, the substantially DC electric power source may advantageously provide a pulsed DC current alternating between a high current value and a low current value that is less than 50% of the high current value, wherein the low current (or no current) value is maintained for a period of time $t_{off}$ between about 10 microseconds and about 2 seconds, preferably from about 50 microseconds to about 0.4 seconds, for example from about 100 microseconds to about 0.1 second. A $t_{off}$ less than 10 microseconds is probably dominated by charging current (capacitor effects), and a $t_{off}$ time greater than 2 seconds is wasteful as little effect is noted with increasing $t_{off}$. Indeed, for polishing rates we believe commercial, substantial benefit is seen when $t_{off}$ is less than 0.5 seconds. The high current state can be advantageously maintained at an interval $t_{on}$ between about 10 microseconds and about 5 seconds. Again, $t_{on}$ time less than 10 microseconds are dominated by charging current and $t_{on}$ times greater than 5 seconds start approaching steady state behavior. For polishing rates we were using, $t_{on}$ was preferably between 0.05 seconds and 1.5 seconds. In a preferred embodiment, the electrical power source advantageously provides a pulsed DC current alternating between a high current value and a low current value that is less than 70%, preferably less than about 50%, for example less than about 20% of the high current value, wherein the low current value is maintained for a period of time $t_{off}$ between 0.1 msec and 0.1 seconds and the high current value is maintained for a period of time $t_{on}$ between about 0.1 msec and 0.3 seconds. The low current value is preferably no current.

For example, an MMEP process using a continuously "pulsed" voltage comprising 0.2 seconds at 7 V, followed by 0.2 sec at 0 V, successfully planarized features on a Cu damascene wafer with λ=100 and ao=1.0 micron. In this way, MMEP can be used to planarize large features on Cu damascene wafers to within typical industry specifications, without the need for specialized plating technology or mechanical polishing. However, in an example where the $t_{off}$=8 msec and the $t_{on}$=55 msec, more efficient planarization was noted. With times of 0.10 msec for both high and low voltage the process still works well and may be more selective than at longer times.

In some embodiments the "low current value" can even be made negative, e.g., by providing a short-lived reversal of the imposed voltage, for extremely short periods of time. Such practice is discouraged, however, as resultant solid material accumulating in the membrane will shorten membrane life and may scratch the work-piece. However, because the current can be reversed for short periods of time without significant damage, the electric power source is preferably a "substantially DC electric power source", which is a power source adaptable to provide a DC current when the current is integrated over a sufficient time, so a "substantially DC power supply" encompasses a DC power source, a pulsable DC power source, and a pulsable DC power source wherein pulses may be of the opposite polarity. The important point is that polishing is an anodic process which only occurs when the voltage difference between the work-piece and cathode is positive. Brief excursions to negative voltage may be possible, but this can cause dendrites to grow into the membrane, so this practice is not recommended.

Figure 18:
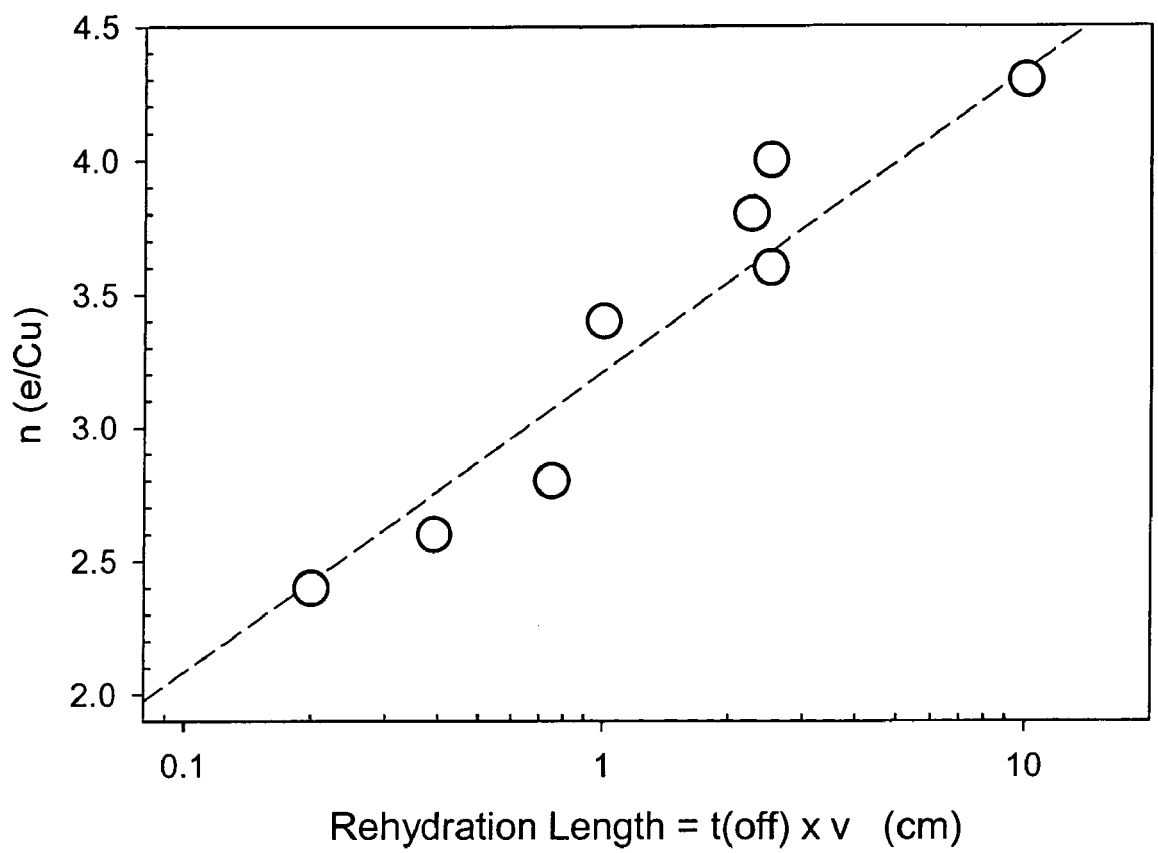
FIG. 18 shows the variation in stoichiometric number (n, electrons per metal atom polished) with MMEP process parameters $T_{off}$ and V, where the product is called the rehydration length, where the width of contact area is 0.2 cm.

There is a relationship, clearly shown in FIG. 18, between the $t_{off}$, the velocity of the membrane across the work-piece, and the planarization efficiency. The efficiency appears to increase, that is, n approaches 2 electrons per copper atom, as the product of the $t_{off}$ and the velocity equals the width of contact of the membrane to the work-piece. The product of $t_{off}$ times the interfacial velocity represents the length of new surface brought into contact during the recovery period between polishing periods. This "rehydration length" was found to have a systematic effect on the coulombic efficiency of electropolishing. The coulombic efficiency is the fraction of the total current manifest in oxidation of Cu for which the stoichiometric number n=2 electrons/Cu, a polishing process where n=2 has an efficiency of 100%, while n=4 the coulombic efficiency is only 50%. When water is present at the interface it can be anodically oxidized in competition with oxidation of Cu, resulting in n>2 electrons/Cu and lower coulombic efficiency. As shown in the Examples and in FIG. 18, n was found to converge to 2 as the product of $t_{off}$ and interfacial velocity approached the width of the contact area. This indicates that the relative motion of work-piece and membrane is the primary mechanism for re-hydrating the interface during $t_{off}$ under pulsed operation. Additionally, the time of reduced current (or no current) allows the membrane to more readily move relative to the work-piece surface, and as the membrane moves across low-conductivity fluid coated surfaces, the membrane re-hydrates.

The source of low-conductivity fluid can be modified to take advantage of this phenomenon. While the supply of low-conductivity fluid to the work-piece surface can be uniform, for example pumped or gravity feed system as exemplified by pipes 103 and 602 in FIGS. 16 and 12, it may be possible to pulse the source of low-conductivity fluid so that a short-lived excess is present during the $t_{off}$, allowing faster re-hydration of the membrane, and the supply of low-conductivity fluid can be reduced accordingly during the $t_{on}$ when partial dehydration of the membrane provides greater planarization efficiency. A pulsed source can be obtained from any pump providing a timed pulse, and the duration of the pulsed supply of low-conductivity fluid can be matched to the $t_{on}$ and $t_{off}$ of the electric power supply.

Similarly, the movement of the membrane against the work-piece surface, while typically continuous, can be made somewhat more intermittent and also be timed to $t_{on}$ and $t_{off}$ of the substantially DC power supply. Such movement can be obtained for example by utilizing stepper motors to drive the movement mechanism.

Alternatively or additionally, much of the same benefits can be realized by intermittently causing contact between the membrane and the work-piece surface to be broken for short intervals of time. Breaking contact can be done by for example changing pressure within the half-cell, by physically moving at least a portion of the membrane vertically away from the work-piece surface, by moving a screen- or window frame-type device disposed between the membrane and the work-piece, by pulsing an amount of low-conductivity fluid over areas surrounding the area of contact between the membrane and work-piece surface, or even by natural rotation such as is common in traditional CMP with an over-sized (relative to the wafer size) polishing pad.

Any combinations of the physical and/or electrical pulse methods can be employed as needed to get sufficient membrane re-conditioning while maximizing productive high current time.

STANDARD HALF-CELL DESIGN: FIGS. 3, 16, 12, 17A, 17B, 17C, and 17D represent only a few of many possible configurations that can be used in the process of this invention. For use in the first embodiment of this invention, a cathode half-cell is provided which can be a fully or partially enclosed volume, cavity or vessel. The half-cell contains a cathode 36 in contact with an electrolyte solution or gel 33, and is sealed on at least one surface with a charge-selective ion-conducting membrane 32. Preferably, the electrolyte 33 in the half-cell is maintained at a hydrostatic pressure greater than ambient atmospheric pressure, and the membrane is sufficiently flexible to expand under the influence of this pressure to establish a convex external surface (a "bulge" or "blister") extending beyond adjacent surfaces of the half-cell to contact the work-piece. See FIG. 3B. Polishing is accomplished when a portion 37 of the external surface of the ion-conducting membrane is brought into contact with a portion of the work-piece 30 otherwise covered by the low-conductivity solvent, and this area of contact is moved across the surface of the work-piece. Polishing can take place without movement, but once a contact between a membrane and the work-piece is too dehydrated polishing will cease. It is to be understood that in many applications of this process, the work-piece can be held stationary and the membrane moved across its surface, or the half-cell can be held stationary and the work-piece moved, or both the work-piece and the half-cell can be in motion, provided that the area of contact is not static. When a suitable voltage is applied between the anode and cathode under these conditions, some of the metal becomes oxidized to form solvated metal ions that migrate across the membrane into the half-cell.

Figure 3A:
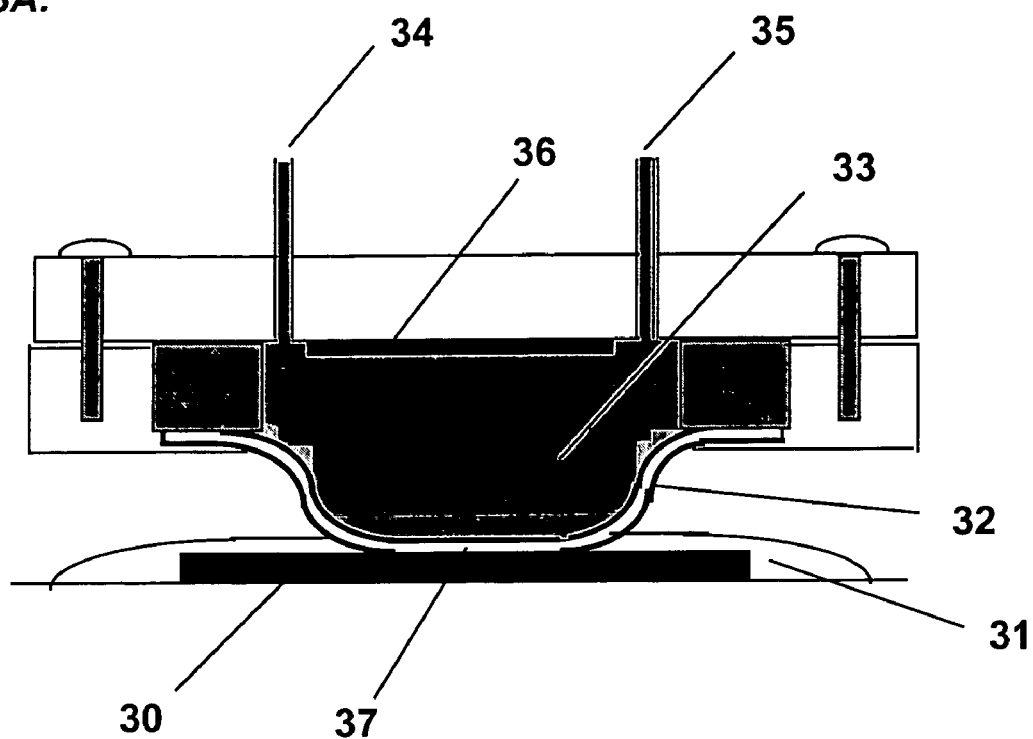
FIG. 3A is a schematic cross-section of an MMEP cathode half-cell in contact with a work-piece immersed in a low-conductivity solvent.
Figure 3B:
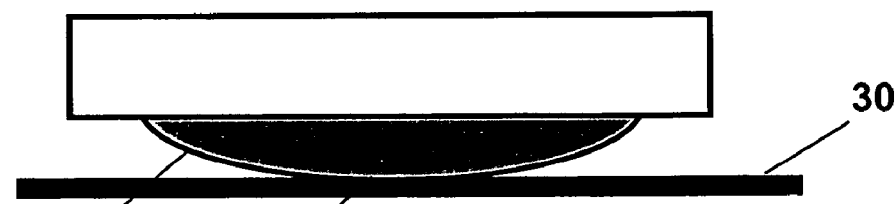
FIG. 3B is a side elevation of a cathode half-cell with a single membrane-sealed window in contact with a work-piece.
Figure 3C:
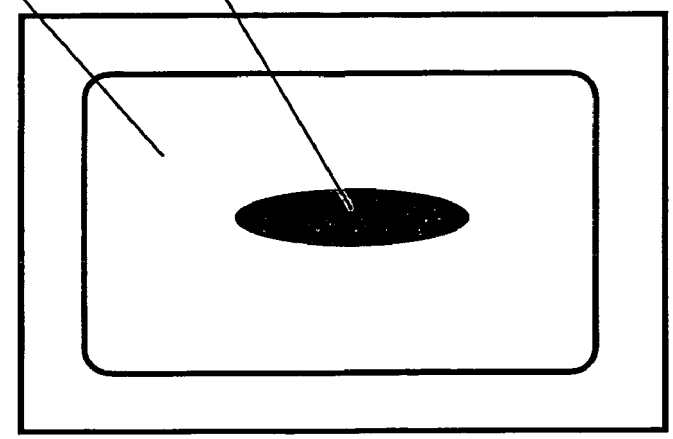
FIG. 3C is a plan view showing the membrane-sealed window of FIG. 3B and indicating the area of contact 37 between the membrane and the work-piece.

A representative configuration of cathode half-cell and work-piece is illustrated schematically in FIG. 3 and described in Example 1. FIGS. 3A-C represent only some of many possible configurations that can be used in the process of this invention, though these standard configuration allows easy visualization of the respective locations of the half-cell components. The work-piece 30 has a surface that is substantially covered with low-conductivity fluid 31. A typical cathode half-cell for use in membrane-mediated electropolishing comprises:

- a fully or partially enclosed volume, cavity or vessel 33;
- an electrolyte solution or gel 33 (where in the Figures the electrolyte solution or gel fills the available volume of the vessel and is therefore given the same number) which partially or substantially fills the enclosed volume, cavity or vessel;
- a cathode 36 which is in contact with the electrolyte solution or gel 33;
- a charge-selective ion-conducting membrane 32 which forms at least one surface of the enclosed volume, cavity or vessel, wherein the internal side of the membrane is in contact with the electrolyte solution or gel 33, and the external side is positioned to be contactable to the work-piece 30;
- a base (102 in FIG. 16) which forms least one surface of the enclosed volume, cavity or vessel;
- optionally an opening, e.g., an inlet 34 and outlet 35 for circulating the electrolyte solution or gel, controlling pressure in the half-cell, heating or cooling; filter, de-gassing, and the like;
- optionally an additional charge-specific or ion-specific ion-conducting membrane disposed between the cathode and the membrane forming a surface of the half-cell; and
- optionally a window-frame-like structure (see, for example, structure 82 in FIG. 8C) disposed over the at least a portion of the external surface of the membrane forming a surface of the half-cell; and
- optionally a source of low-conductivity fluid, e.g., a DI water stream.

The half-cell for use in MMEP includes a fully or partially enclosed volume, cavity or vessel. The half-cell in FIG. 3 is partially enclosed. The interior of the half-cell is filled by electrolyte 33 via ports 34 and 35. The metal cathode 36 is sealed inside the same cavity. In some embodiments the cell is substantially sealed. The membrane is 32 seals a single opening (window) on one surface of the half-cell.

BASE: The half-cell comprises a base 102. See, for example, FIG. 17C, where the half-cell body advantageously comprises a base 102, which in one embodiment comprises a backplate 1, sides 3, and a compression element adapted to compress, hold, and seal the membrane against the sides. Generally, the sides 3 and base 1 are advantageously strong insulators, and several plastic or elastic material can be used in the manufacture thereof.

An essential feature of the cathode half-cell is that some portion of the external surface of the membrane must be accessible to make contact with the work-piece. For a work-piece which is substantially flat, this requirement may be satisfied by maintaining the electrolyte within the half-cell under sufficient hydrostatic pressure to partially expand the membrane so as to create a bulge or blister which extends beyond the surrounding surfaces of the half-cell. The pressure inside the half-cell during polishing is advantageously greater than about 0.05 psig, so that the membrane is able to exert a pressure on the wafer that is substantially uniform. The pressure may be as high as 30 psig or higher, but is usually between about 0.5 psig and 15 psig. In some embodiments, the pressure inside the half-cell is about zero psig when the cell is not contacting a work-piece, and the contacting of the membrane to the surface results in a change of shape or volume to provide pressure. Alternatively, the material in the half-cell can be maintained at some predetermined positive pressure. Internal pressure can in some embodiments be generated by osmotic pressure of low-conductivity fluid trying to migrate through the membrane and into the electrolyte.

In some embodiments of the half-cell, the base may have additional components and structures attached thereto, including one or more of: gas vents to vent hydrogen; pumps to control pressure and/or circulate electrolyte; electromechanical transducers to impart slight movement to the half-cell or to change pressure in a half-cell; electrolyte conditioners such as filters, temperature controllers, and de-gassers; and/or may have additional components allowing a supply of low-conductivity fluid to be provided to the membrane. Such embodiments will be discussed infra.

The pressure in the half-cell may be established, for example, by pumping the electrolyte at appropriate rates through the ports 34 and 35 located in the base. In many embodiments the half-cell base has an opening, advantageously having a valve or other flow restrictor attached to regulate and/or encourage flow into and/or out from the half-cell as desired. If the interior half-cell pressure is set by flow through a restriction in the electrolyte solution or gel outlet, then advantageously the pressure will always approach the same value regardless of movement of the half-cell towards or away from the work-piece. As illustrated in FIGS. 3A, 3B, and 3C, when the work-piece is positioned parallel to the membrane-sealed window of the cathode half-cell, a small area 37 of the membrane in the center of the window may be brought into contact with the surface of the work-piece 30. It will be appreciated that the area of contact 37 will be governed by a number of parameters including the dimensions of the membrane-sealed window, the electrolyte pressure, the normal force between the work-piece and the half-cell, membrane thickness and modulus, and intrinsic adhesive forces between the membrane and the work-piece. For example, using cathode half-cells with single membrane-sealed windows of 1 to 3 cm$^2$, the planarization of Cu damascene wafers may be achieved using MMEP with electrolytes at hydrostatic pressures from 5-20 psi, hydrostatic pressure less than 10 psi, and normal forces less than 100 gm. The resulting contact area was less than 0.2 cm$^2$ corresponding to a normal stress of less than 1 psi.

In various embodiments of the invention, the half-cell can have equipment associated therewith to for example maintain half-cell pressure, circulate the electrolyte, filter the electrolyte, add or subtract components of the electrolyte that may be generated or depleted during use, and to de-gas the electrolyte. Advantageously, in most embodiments of the invention described herein, there is an inlet and an outlet on the cathode half-cell allowing the conductive electrolyte composition to be circulated, e.g., by use of a pump, through the cathode half-cell. The apparatus of the invention may therefore further comprise a pump connected to an inlet and an outlet of the half-cell and adapted to circulate at least a portion of the electrolyte solution or gel between the enclosed volume, cavity or vessel and a second apparatus, wherein the second apparatus is adapted to change one or more of the temperature of the electrolyte composition, the composition of the electrolyte composition, or the pressure of the electrolyte composition within the enclosed volume, cavity or vessel. To simplify the apparatus, one or more of the pump and/or these ancillary systems can be incorporated on or into the base 1, the polishing head 102, or some distribution there between. One problem with maintaining movable, rotatable machinery is that reliable fluid connections are difficult to maintain. However, systems built into the base 1 or polishing head 102 do not move relative to the half-cell, and connections are more easily made and maintained. Additionally, such systems would be useful in performing maintenance on the half-cells, and would allow quick modular replacement of a unit that was inoperative or that was not meeting specifications. For example, a pump 608 in FIG. 12 (not drawn to scale) used to circulate the half-cell electrolyte may be located on or in the base or the polishing head 102, 601, as the fluid volume and pump are both very small, e.g., a few ccs of electrolyte fluid. Similarly, any filters, de-gassers 607, composition adjusting devices, and heat exchangers can be located on or in the base or the polishing head 102, making this part of the system compact and easy to change out. Of course, pressure sensors and pressure source can be incorporated in or on the base or polishing head 102, and temperature sensors and heater/coolers can also be incorporated into the polishing head assembly. This unitary assembly is extremely advantageous if any part of the system, including the membrane, needed maintenance, as the polishing head having all supporting systems can be connected to the rotational and movable arms holding the polishing head by connecting as little as one or two electrical contacts.

CATHODE: The cathode 36 is generally a metal that is stable in the electrolyte composition. Some cathode materials are more prone to holding reduced metal, while some are more prone to allowing reduced metal particles to slough off. Generally, the cathode is located within the cavity, and is a planar (or cylindrical element) that extends at least substantially across the area wherein the membrane contacts the surface of the work-piece. Plates and/or screens are useful cathodes. In MMEP, the cathode must not contact the membrane (for any substantial period of time during polishing). The cathode may be located outside the "cavity" providing the electrolyte is sufficiently conductive of current and of metal ions.

The cathode can be made from any electrically conductive material that is chemically stable in the electrolyte. For many typical anode compositions suitable for use in MMEP, corresponding suitable choices for cathode and electrolyte compositions can be found in "Electroplating Engineering Handbook", 4th Edition, pp. 100-120, by D. E. Ward, L. J. Durney, Ed., Van Nostrand Co., NY, 1984. In one embodiment the cathode comprises the same metal(s) as are on the anode work-piece. For example, a copper cathode is useful for polishing copper, as copper ions reduced to metal at the cathode will typically stably plate onto such cathode. If the electrolyte contacting the cathode has a high conductivity, then the plated material adhering to the cathode will have little effect on current flow to the membrane.

In an alternate embodiment, the cathode is a material which has poor adherence to the plated material can be used. In such a case, the metal ions removed from the work-piece are reduced to metal at the cathode, but this metal readily falls off the cathode and is advantageously carried from the half-cell by the circulation of electrolyte. A non-plating cathode can comprise tantalum, titanium, 304 stainless, 306 stainless, chromium, or other non-depositing metal, so that the metal ions produced from the anode will not adhere to the cathode.

Generally, the shape of the cathode is a plate extending in a plane roughly parallel to the membrane. In preferred embodiments, the cathode is planar and comprises a plate or screen, and the cathode extends over substantially an entire area equal to and laterally displaced from the "membrane contact area", defined as the area in which the membrane substantially contacts or is kept in close proximity to the work-piece. For highly conductive electrolytes, the shape of the cathode is less important. By substantially contacting it is meant that the membrane is contacting the work-piece, although an arbitrarily thin layer of low-conductivity fluid, such as de-ionized water, may exist between the membrane and the work-piece. However, polishing may be more efficient in areas where only a very thin layer or no layer of free water remains between the membrane and work-piece, and/or where there exists an "effective" boundary layer within the membrane which is partially or entirely dehydrated relative to volume elements further from the work-piece.

In some embodiments, the cathode comprises holes therethrough adapted to allow electrolyte flow from the front of the cathode and through said holes to the volume between the cathode and the base. Alternatively or additionally, in some embodiments the cathode may comprise channels adapted to facilitate flow of electrolyte across the surface of the cathode. Such flow is advantageously maintained to remove gas that may form near the cathode, as well as to remove the electrolyte for treatment as needed.

In embodiments where the electrolyte has high conductivity, then the resistance between the cathode and the membrane is usually negligible. In embodiments where the electrolyte is itself of lower conductivity, for example having a resistance greater than about 0.1 M-ohm-cm, then the shape and the distance between the work-piece and the cathode becomes critical. In alternate embodiments the cathode comprises a flat plane extending over the "membrane contact area", and is disposed less than 10 mm from the membrane, e.g., less than about 5 mm or between about 1 and about 3 mm from the membrane. In such embodiments, maintaining the distance at a stable amount becomes important, and non-conducting support structures extending from cathode to the membrane may be employed.

In some embodiments, the cathode comprises holes therethrough adapted to allow electrolyte flow from the back of the cathode and through said holes to the volume between the cathode and the membrane. Alternatively or additionally, in some embodiments the cathode may comprise channels adapted to facilitate flow of electrolyte across the surface of the cathode. Such flow is advantageously maintained to remove gas that may form on the cathode, as well as to remove one or more components of the electrolyte.

ELECTROLYTE SOLUTION OR GEL: In every embodiment of the invention, an electrolyte solution or gel is disposed between the cathode and the interior surface of the membrane. The functions of the electrolyte solution or gel are to 1) conduct current between the cathode and the membrane, 2) solvate the electropolished metal ions migrating through the membrane, advantageously to solvate and carry out of the half-cell gas, low-conductivity fluid, and other contaminants and/or diluents that enter in or are generated in the half-cell volume, 4) advantageously to carry out of the half-cell excess heat generated by electropolishing, and 5) advantageously to substantially suppress formation of hydrogen gas at or near the cathode. The term "electrolyte solution or gel" is meant to encompass suspensions, gels, dispersions, colloids, emulsions, crosslinked gels, mixtures, solutions, or any combinations thereof.

The electrolyte carries current between the cathode and the membrane. Preferred electrolyte compositions have sufficiently high conductivity to carry current densities up to several thousand $mA/cm^2$ without introducing significant voltage drop or heating. Conductivities of electrolytes is advantageously at least 30 mS, and conductivities of at least 100 mS, for example at least about 1000 mS, alternatively between about 1000 mS and about 10000 mS, are preferred. For these higher conductivity electrolytes, the voltage drop from the cathode to the membrane is substantially negligible, greatly simplifying the cathode half-cell design.

One side reaction intrinsic to electropolishing is the electrolysis of water, which can produce molecular hydrogen, molecular oxygen, or both. As discussed infra, in some embodiments it is preferred to operate at high rates and high values of n, e.g., n greater than 3, usually greater than 4, so that a sufficient amount of hydronium ions are formed to solvate the electropolished metal ions and prevent deposition of metal oxides, hydroxides, and/or carbonates. These operating conditions and this reaction will produce undesired molecular oxygen, which is a trade-off for eliminating precipitates at higher polishing rates.

However, there is no circumstances where the generation of hydrogen gas at or near the cathode has favorable consequences. In prior art EP, the amount of metal ions in the electrolyte was generally kept low to minimize metal ion contamination of the substrate. Under those conditions hydrogen molecules are typically generated at the cathode. Further, when metal ions react with the dissolved hydrogen they are reduced to metallic particles which could damage the substrate. Further, if metal ions contacted the cathode, they could be reduced to metallic particles which could damage the substrate. We have found that it is very advantageous in any form of electropolishing to maintain a high enough concentration of reducible ("plate-able") metal ions in the electrolyte in the vicinity of the cathode to substantially reduce the formation of hydrogen gas, wherein this reducible-metal-containing electrolyte and any metallic particles that may form do not contact the work-piece. Generally, the reducible-metal-containing electrolyte can be kept separate from the work-piece even in traditional EP by use of an ion-selective membrane, and/or by maintaining a quasi-steady-state barrier of metal poor electrolyte fluid between the reducible-metal-containing electrolyte and the work-piece surface.

Therefore, a unique additional invention is an apparatus adapted to electropolish or electro-mechanically polish Cu damascene wafers wherein the solution contacting the cathode contains a sufficient concentration of reducible-metal salts to substantially suppress the formation of molecular hydrogen at the cathode, but where the electrolyte or fluid contacting the work-piece has substantially less reducible-metal salts. By "reducible-metal salts" we mean any salt of a reducible transition metal that has sufficient solubility in the electrolyte and that can be reduced to metallic form a the cathode. As discussed infra, the metal salts in the electrolyte near the can comprise or consist essentially of the metal being polished. Generally, divalent metals are preferred over monovalent metal salts. Preferred reducible-metal ions are Cu(I), Cu(II), Ni(II), Ag(I), Fe(II), Cr(III), and/or complexes of these ions. The most preferred reducible-metal ions are Cu(I) and Cu(II). A preferred reducible metal salt is a copper salt, where the anion is the same as the anion of the acid component of the electrolyte, e.g., copper sulfate. By "substantially reduce the formation of hydrogen gas" we mean that at least one metal ion is reduced for every hydrogen molecule generated by the electrolysis of water at or near the cathode. Preferably, the amount of reducible metal ions in the "reducible-metal-containing" electrolyte contacting the cathode is sufficient so that 2 or more metal ions are reduced, more preferably 4 or more metal ions are reduced, and most preferably 8 or more metal ions are reduced, for example 15 to 100 metal ion are reduced, for every hydrogen molecule generated by the electrolysis of water at or near the cathode. By "substantially less reducible metal salts" we mean the molar concentration of reducible metal in fluid contacting the work-piece is less than about 50% of the molar concentration of reducible metals in the electrolyte fluid contacting the cathode, and preferably is less than 10%, more preferably is less than about 1%, for example is less than about 0.1%, of the molar concentration of reducible metals in the electrolyte fluid contacting the cathode. Depending on the current density, generally a concentration of between 0.001 M to about 1 M of a reducible-metal salt is sufficient, and in preferred embodiments the electrolyte contacting the cathode comprises about 0.01 M to 0.5 M, for example about 0.05 M to about 0.3 M, alternately from about 0.1 M to about 0.3 M, of a reducible-metal salt.

The same criteria apply to any of the above-mentioned MMEP apparatus, and in MMEP the reducible-metal-containing electrolyte solution or gel is rigorously kept away from the work-piece. Therefore, in preferred embodiments of any of the above described MMEP apparatus, the conductive electrolyte solution or gel comprises a reducible-metal salt, wherein the amount of reducible-metal salt is sufficient to substantially reduce the formation of hydrogen gas. A preferred variation of any of the above-mentioned MMEP apparatus includes the embodiment wherein the conductive electrolyte solution or gel comprises water, an acid, and a reducible-metal salt, and wherein the amount of reducible metal salt is sufficient to substantially reduce the formation of hydrogen gas. Another variation of any of the above-mentioned apparatus includes the embodiment wherein the conductive electrolyte solution or gel comprises from about 0.001 M to about 1 M, preferably about 0.01 M to 0.5 M, for example about 0.05 M to about 0.3 M, or alternately from about 0.1 M to about 0.3 M, of reducible-metal salt. Yet another variation of any of the above-mentioned apparatus includes the embodiment wherein the conductive electrolyte solution or gel comprises water, an acid, and from about 0.001

M to about 1 M, preferably about 0.01 M to 0.5 M, for example about 0.05 M to about 0.3 M, or alternately from about 0.1 M to about 0.3 M, of reducible-metal salt. In yet another variation of any of the above-mentioned apparatus includes the embodiment wherein the half-cell further comprises an inner membrane, e.g., a membrane specific to hydronium ions, disposed between the cathode and the charge-selective ion-conducting membrane, said inner membrane partitioning the conductive electrolyte solution or gel into first and second parts, wherein the first part contacts the charge-selective ion-conducting membrane and comprises less than half of the reducible metal salt concentration compared to electrically contacting the cathode, e.g., less than about 0.01 M of reducible metal salts, and wherein the second part contacts the cathode and comprises between 0.01 M to about 1 M of reducible metal salts.

Electrolysis with low metal ion concentration will result in hydrogen gas production at the cathode. This hydrogen can react with metal ions to precipitate metal ions. Therefore, it is highly advantageous to include plate-able metal ions in the electrolyte composition, in the form of soluble reducible-metal salts, metal complexes, metal-neutralized hydrophilic polymers such as metal-neutralized polyacrylates, or combinations thereof. A high concentration of metal ions is maintained in the electrolyte to suppress hydrogen generation and can also, by selection of the reducible metals, reduce formation of metal particles. It is preferred that the electrolyte comprise between 0.01M and 2.5 M of metal ions, preferably reducible-metal ions. The metal concentration may exceed 2.5 M, as more metal ions is not deleterious but may not be necessary. Not all of the metal ions may be readily reduced at the cathode. For example, metal ions in a metal-neutralized hydrophilic polymer may not be readily reduced at the cathode. Simple dissociated salts are the most readily reducible metal ions, and therefore it is preferred that at least 0.1 M of reducible-metal ions, preferably 0.3 M to 0.5 M of reducible metal ions, in the electrolyte are substantially dissociated salts that are easily reduced at the cathode.

The electrolyte is chosen to provide stability and high solubility for the solvated metal ions or coordinated metal ions produced by oxidation of the anode. The capacity of the electrolyte to solubilize the metal ion/coordinated metal ion will depend on the targeted polishing rates and the effective migration rates from the membrane to the cathode. Generally, the electrolyte solution or gel comprises a plurality of components, e.g., a conductive electrolyte solvent such as an acid, a "non-conductive" electrolyte solvent such as water, and one or more additives (typically additives which dissociate to form charged species) including for example buffers, salts, reducible-metal salts, ionized compounds, coordinating ligands, chelators, surfactants, and/or viscosifiers. For many typical anode compositions suitable for use in MMEP, corresponding suitable choices for cathode and electrolyte compositions can be found in "Electroplating Engineering Handbook", 4$^{th}$ Edition, pp. 100-120, by D. E. Ward, L. J. Durney, Ed., Van Nostrand Co., NY, 1984.

Generally, the viscosity of the electrolyte is between about 0.4 centipoise (cp) to about 10,000 cp, for example between about 0.8 cp to about 100 cp, though viscosities of 50,000 or more can be operable for some electrolyte compositions. More viscous electrolytes can inhibit ion transfer from the membrane to the cathode. The electrolyte should be able to move metal ions from the membrane to the cathode, unless there is another mechanism such as circulating the electrolyte that allows the electrolyte composition to be re-conditioned/replaced. Electrolyte compositions that are gels are useful in some embodiments.

The electrolyte solution or gel is typically a multicomponent composition comprising at least a "non-conducting" solvent, e.g., water. The various "non-conducting" electrolyte solvents can not support the desired current flow. Exemplary "non-conducting" electrolyte solvents typically present in an electrolyte solution or gel are water, polar organic solvent, a nitrile-containing solvent such acetonitrile, a copper-coordinating solvent such as ethanolamine or ethylene diamine, ethylene carbonate, propylene carbonate, and/or a glycol, or a mixture thereof. In most preferred embodiments of this invention, the electrolyte composition comprises water as a "non-conducting" solvent.

The "non-conducting" electrolyte solvents can be the same as the solvents selected for the low-conductivity fluid, e.g., water, nitrile-containing solvents, amines including the preferred alkanolamines, amides, sulphones/sulfoxides, glycols (including glycols having alkyl and/or alkene components, and glycol ethers), or mixtures thereof. This allows, for some embodiments, the membrane to be at least semipermeable to the solvent/low-conductivity fluid, without creating undesirable concentration gradients and without being permeable to the ionized portion of the electrolyte composition. This "non-conducting" solvent may be added initially to the electrolyte solution or gel, or the "non-conducting" solvent concentration may be the result of transport of low-conductivity fluid which is solvating the electropolished metal ions through the membrane.

When electropolishing copper using a low-conductivity solution that does not contain sufficient quantities of nitriles or specific amines which can stabilize $Cu^{+1}$ ions, the removed copper metal is substantially completely converted to $Cu^{+2}$ ions. Without being bound by theory, virtually all of the current-carrying cations are believed to be supplied by the following reactions:

$Cu+6H_2O \rightarrow Cu(H_2O)_6^{+2}+2e^-$

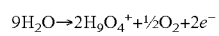
$9H_2O \rightarrow 2H_9O_4^+ + \tfrac{1}{2}O_2 + 2e^-$

The top reaction is the desired electropolishing process, and it shows the solvation of copper requires about 6 water molecules. The second reaction shows the anodic oxidation of water to produce Oxygen gas and two protons in the form of solvated hydronium ions, such as $H_9O_4^+$ species, which contains 4 water. It is possible to oxidize Cu at potentials low enough to avoid the second reaction. The relative extent of reactions 1 and 2 can be measured by comparing the total amount of charge passed Q with the weight of Cu removed Δm, expressed as the stoichiometric number n, namely: n=(Q/F Δm)×(63.5 g/mole Cu). When n=2 e$^-$/Cu then the top reaction is the only anodic process, whereas values of n in excess of 2 e$^-$/Cu indicate a corresponding contribution from the second reaction. But planarization of Cu at high removal rates by the Membrane-Mediated Electropolishing process requires sufficiently high voltages that both reactions occur in varying degree.

It can be seen that, in addition to cations, the faradaic current also transports water molecules across the membrane. This is believed to be a principal reason for depletion of low conductivity fluid from between the membrane and the workpiece. The total number of water molecules coordinated or consumed per electron by these combined faradaic reactions may be estimated at: $H_2O/e^-=(9n-6)/(2n)$. For n equals 4, water loss is about 3.75 molecules per electron, while at n equals 6, the water loss is about 4 molecules per electron. The water molecules lost per copper atom electropolished is estimated at (9n−6)/2, so 15 $H_2O$ are lost per Cu atom at n=4, and 24 H$_2$O are lost per Cu atom at n=6. Generally, the extent of a dehydration problem versus the extent of a oxygen buildup problem can be best expressed by looking at volumes of material that are removed from or added to the volume between the membrane and the substrate surface.

| n | Cu RR μm/sec | Water RR μm/sec | O$_2$ generation μm/sec* |
|---|---|---|---|
| 2 | 0.01 μm/sec | 0.15 μm/sec | 0 μm/sec |
| 4 | 0.01 μm/sec | 0.37 μm/sec | ~32 μm/sec |
| 6 | 0.01 μm/sec | 0.6 μm/sec | ~63 μm/sec |

*At ambient temperature and pressure. It can be seen that as n increases, water depletion is accelerated, but gas generation can quickly become an issue. For this reason it is often advantageous to have a low dwell time, so that oxygen buildup does not become so severe. Alternatively, structures to remove oxygen gas, such as channels adapted to gather and transport gas from under the membrane, are advantageously employed. The above equation also provides an indication of the rate of dilution of the electrolyte composition within the cathode half-cell. The potential for significant buildup of low-conductivity fluid, e.g., water, in the electrolyte composition is such that preferred embodiments of the invention comprise one or more mechanisms for removing water from an electrolyte. It should be recognized that even in the absence of electrical current water may be carried into the cathode half-cell by simple osmosis, or may be forced out of the half-cell by the hydrostatic pressure (reverse osmosis).

One class of conductive solvents typically included in the electrolyte solution or gel are acids, preferably wherein the acids have high dissociation constants for at least one hydrogen, to provide substantially dissociated acid. Acids can include for example phosphoric acid, pyrophosphoric acid, nitric acid, hydrochloric acid, sulfuric acid, carboxylic acids, e.g., acetic acid, or mixtures thereof.

The most common conductive solvents in the electrolyte solution or gel are concentrated aqueous solutions of strong acids. Examples 1-5 illustrate the use of various aqueous strong acid electrolytes. Chloride ion has been found to be effective in maintaining the solubility of Sn$^{+2}$ and Al$^{+3}$. A few representative examples of electrolytes that can be used for MMEP are listed in Table 2.

In one embodiment the invention encompasses electrolyte solutions or gels made with sufficient, i.e., at least 3%, preferably at least 10%, e.g. at least 20%, of an acid, and is substantially free of added salts. In one such embodiment, the electrolyte consists essentially of water and an acid such as phosphoric acid, nitric acid, sulfuric acid, hydrochloric acid, strong organic acids, e.g., acetic acid, or mixture thereof. In another embodiment, the electrolyte consists essentially phosphoric acid, nitric acid, sulfuric acid, hydrochloric acid, strong organic acids, e.g., acetic acid, or mixture thereof. These electrolyte solvents can provide sufficient conductivity between a cathode and a membrane, and also provide sufficient solvating capability for most metals that are electropolished from the work-piece. The electrolyte composition will of course contain metals that are electropolished from the work-piece, but this concentration can be small, e.g., less than 0.01 molar, for example.

There are electrolyte compositions, however, that do not necessarily have high concentrations of mineral acids. The solubility of a copper-amine complex can be substantially reduced at a pH near 5-7, where said pH can be attained by addition of acid to an aqueous copper amine solution. The following embodiments can be used when the electrolyte solvent is the same as the low-conductivity fluid, and of course can also be used when the low-conductivity fluid is different than the electrolyte solvent.

Typically, one or more non-acid, ionizable compounds are added to the electrolyte composition. The most common embodiments of this invention include in the electrolyte solution or gel concentrated aqueous solutions of strong acids in addition to added salts. Of course, the various components of the electrolyte composition must be compatible, though compatibility of various combinations is usually predictable by of one of ordinary skill in the art with little or no experimentation. In an alternate embodiment the charged compounds further comprises a buffer sufficient to maintain a pH during electropolishing of within about 0.1 pH units of the initial pH.

As discussed herein, the invention as discussed is designed to polish copper, and an acidic pH is preferred, unless there are sufficient nitrogen-containing material present to solvate the copper at elevated pH. Of course, the invention is applicable to a wide variety of metals, and some metals, as is known in the art, require a basic pH to be electropolished and solvated by the low-conductivity fluid and/or electrolyte composition. In each of these cases, where acids are suggested, a base may be used. Useful bases include ammonium salts, as well as soluble halide hydroxides and other compounds known to give a highly basic solution. Useful pH ranges include 7.1-10 for the low-conductivity fluid and 7.1 to greater than 14 for the electrolyte.

The following embodiments can be used when an electrolyte solvent is the same as the low-conductivity fluid or when the low-conductivity fluid is different than the electrolyte solvent.

In one embodiment the electrolyte solvent comprises or consists essentially of water, acetonitrile, ethylene carbonate, propylene carbonate, glycol, ethylene glycol, propylene glycol, diethlyene glycol, or mixtures thereof. The electrolyte composition may further include salts and other additives. Optionally, there can be a small amount of acid, e.g., an amount sufficient to give pH 2 to p 7. MMEP polishing of Cu in water in the absence of nitrogen-containing ligands, requires an acidic environment at the surface of the anode because at pH>4 Cu$^{+2}$ precipitates from water as CuO. In another embodiment the electrolyte solvent comprises, consists essentially of, or consists of water and at least one of acetonitrile, a glycol, an alcohol having from 1 to 8 carbon atoms, ethylene glycol, propylene glycol, diethlyene glycol, proplylene glycol monomethyl ether, propylene carbonate, ethylene carbonate, and dimethylformamide, and again, optionally, a small amount of acid, e.g., an amount sufficient to give pH 2 to p 7.

In another embodiment, the low-conductivity fluid and the electrolyte solvent each comprise, or for the low-conductivity fluid only consist essentially of, or consist of acetonitrile, proprionitrile, butyronitrile, or mixture thereof, wherein the amount of nitrile is sufficient to coordinate and stabilize metal single-charged ions, e.g., Cu$^{+1}$, give a electropolishing efficiency of between one metal atom, e.g., one copper atom, per 1 to 1.99 electrons of current flow.

In one embodiment, electrolyte solvent includes water, acetonitrile, or mixture thereof. Typically, however, the electrolyte solvent will also include an acid, and/or the electrolyte composition will further comprise salts, to provide the desired conductivity of the electrolyte composition. The electrolyte composition may further include salts and other additives. In one preferred embodiment of the above described composition, the electrolyte solvent comprises, consists essentially of, or consists of water, acetonitrile, and optionally an acid. In another embodiment, the low-conductivity fluid and the electrolyte solvent each comprise, or for the low-conductivity fluid only consist essentially of, or consist of, acetonitrile, wherein the amount of acetonitrile is sufficient to give a electropolishing efficiency of between one normally divalent metal atom, e.g., one copper atom, per 1 to 1.99 electrons of current flow.

In one embodiment the electrolyte solvent comprises or consists essentially of a polar organic solvent. Typically, however, the electrolyte solvent will also include an acid, and/or the electrolyte composition will further comprise salts, to provide the desired conductivity of the electrolyte composition. Examples of polar organic solvents include substituted sulfoxides including dimethyl sulfoxide; glycols including glycol, ethylene glycol, diethlyene glycol, triethlyene glycol, ethylene glycol alkyl ether, diethylene glycol alkyl ether, triethylene glycol alkyl ether, propylene glycol, dipropylene glycol, propylene-ethylene glycols, and propylene glycol alkyl ether, e.g., proplylene glycol monomethyl ether, N-substituted pyrrolidone such as N-methyl-2-pyrrolidone (NMP), sulfolanes, substituted sulfones including 2,4-dimethylsulfone, substituted amides including dimethylacetamide, or any combination thereof. In another embodiment the polar solvent can be a nitrogen-containing ligand which can complex with particular metal species, e.g., acetonitrile or other water-soluble nitriles, monoethanolamine or other alkanolamines, ammonia, or ethylene diamine. In another embodiment the electrolyte solvent comprises a polar organic solvent and at least one of acetonitrile, propylene carbonate, ethylene carbonate, and dimethylformamide. In another embodiment the electrolyte solvent comprises a non-nitrogen-containing polar organic solvent and at least one of acetonitrile or other water-soluble nitrites, monoethanolamine or other alkanolamines, ammonia, or ethylene diamine.

In one embodiment, the low-conductivity fluid and the electrolyte solvent are selected so that they are substantially immiscible. For example, 2,4-dimethylsulfolane is only slightly miscible with water, and for such a combination, the electrolyte solvent can comprise or consist of 2,4-dimethylsulfolane and the low-conductivity fluid can comprise or consist essentially of water, or alternatively the electrolyte solvent can comprise or consist of water and the low-conductivity fluid can comprise or consist essentially of 2,4-dimethylsulfolane. Another example is butyronitrile, which has limited solubility in water.

Salts For The Electrolyte Composition: The various electrolyte solvents can not, with the exception of a few strong acids, support the desired current flow. Generally, one or more salts are added to the electrolyte composition to obtain the desired conductivity. The electrolyte is typically a composition comprising at least a solvent, e.g., water, an acid, or mixture thereof, and one or more non-acid, ionizable compounds, e.g., salts, dissolved therein the increase the conductivity of the electrolyte. Generally, these salts are added to aqueous acid and are also added to aqueous/acetonitrile/acid formulations. If metal salts are added to an acetonitrile-containing formulation, or to any formulation containing nitrogen-containing compounds that for complexes with divalent metal ions such as copper, advantageously the metal ions from the metal salt will not compete with electropolished ions, e.g., copper, that require the nitrogen-containing compounds to remain solvated.

In an alternate embodiment the charged compounds comprises a buffer of acids and salts sufficient to maintain a stable pH during electropolishing, e.g., within about 0.1 pH units of the initial pH. With the benefit of this disclosure, the selection of the appropriate acid(s) and salts is well within the skill of one with ordinary skill in the art of electropolishing.

While electrolytes useful in standard electropolishing (EP) can be used, some specialized electrolytes provide additional advantages. During polishing one or more reduction reactions may occur at the cathode. For example, aqueous acids these may include electrolysis of water to liberate hydrogen and the reduction or plating of metal ions derived from the anode. One side reaction intrinsic to electropolishing is the electrolysis of water, which can produce molecular hydrogen, molecular oxygen, or both. As discussed infra, in some embodiments it is preferred to operate at high rates and high values of n, e.g., n greater than 3, usually greater than 4, so that a sufficient amount of hydronium ions are formed to solvate the electropolished metal ions and prevent deposition of metal oxides, hydroxides, and/or carbonates. These operating conditions and this reaction will produce undesired molecular oxygen, which is a trade-off for eliminating precipitates at higher polishing rates.

However, there is no circumstances where the generation of hydrogen gas at or near the cathode has favorable consequences. In prior art EP, the amount of metal ions in the electrolyte was generally kept low to minimize metal ion contamination of the substrate. Further, if metal ions react with dissolved hydrogen, they are reduced to metallic particles which could damage the substrate. We have found that it is very advantageous in any form of electropolishing to maintain a high enough concentration of reducible ("plateable") metal ions in the electrolyte in the vicinity of the cathode to substantially reduce the formation of hydrogen gas, wherein this reducible-metal-containing electrolyte (and any metallic particles that may form on reduction of the metal ions at the cathode) do not contact the work-piece. Generally, the reducible-metal-containing electrolyte can be kept separate from the work-piece even in traditional EP by use of an ion-selective membrane, and/or by maintaining a quasi-steady-state barrier of metal poor electrolyte fluid between the reducible-metal-containing electrolyte and the work-piece surface.

Therefore, a unique additional invention is an apparatus adapted to electropolish or electro-mechanically polish Cu damascene wafers wherein the solution contacting the cathode contains a sufficient concentration of reducible-metal salts to substantially suppress the formation of molecular hydrogen at the cathode, but where the electrolyte or fluid contacting the work-piece has substantially less reducible-metal salts. By "reducible-metal salts" we mean any salt of a reducible transition metal that has sufficient solubility in the electrolyte and that can be reduced to metallic form a the cathode. As discussed infra, the metal salts in the electrolyte near the can comprise or consist essentially of the metal being polished. Generally, divalent metals are preferred over monovalent metal salts. Preferred reducible-metal ions are Cu(I), Cu(II), Ni(II), Ag(I), Fe(II), Cr(III), and/or complexes of these ions. The most preferred reducible-metal ions are Cu(I) and Cu(II). A preferred reducible metal salt is a copper salt, where the anion is the same as the anion of the acid component of the electrolyte, e.g., copper sulfate. By "substantially reduce the formation of hydrogen gas" we mean that at least one metal ion is reduced for every hydrogen molecule generated by the electrolysis of water at or near the cathode. Preferably, the amount of reducible metal ions in the "reducible-metal-containing" electrolyte contacting the cathode is sufficient so that 2 or more metal ions are reduced, more preferably 4 or more metal ions are reduced, and most preferably 8 or more metal ions are reduced, for example 15 to 100 metal ion are reduced, for every hydrogen molecule generated by the electrolysis of water at or near the cathode. By "substantially less reducible metal salts" we mean the molar concentration of reducible metal in fluid contacting the work-piece is less than about 50% of the molar concentration of reducible metals in the electrolyte fluid contacting the cathode, and preferably is less than 10%, more preferably is less than about 1%, for example is less than about 0.1%, of the molar concentration of reducible metals in the electrolyte fluid contacting the cathode. Depending on the current density, generally a concentration of between 0.001 M to about 1 M of a reducible-metal salt is sufficient, and in preferred embodiments the electrolyte contacting the cathode comprises about 0.01 M to 0.5 M, for example about 0.05 M to about 0.3 M, alternately from about 0.1 M to about 0.3 M, of a reducible-metal salt.

The same criteria apply to any of the above-mentioned MMEP apparatus, and in MMEP the reducible-metal-containing electrolyte solution or gel is rigorously kept away from the work-piece. Therefore, in preferred embodiments of any of the above described MMEP apparatus, the conductive electrolyte solution or gel comprises a reducible-metal salt, wherein the amount of reducible-metal salt is sufficient to substantially reduce the formation of hydrogen gas. A preferred variation of any of the above-mentioned MMEP apparatus includes the embodiment wherein the conductive electrolyte solution or gel comprises water, an acid, and a reducible-metal salt, and wherein the amount of reducible metal salt is sufficient to substantially reduce the formation of hydrogen gas. Another variation of any of the above-mentioned apparatus includes the embodiment wherein the conductive electrolyte solution or gel comprises from about 0.001 M to about 1 M, preferably about 0.01 M to 0.5 M, for example about 0.05 M to about 0.3 M, or alternately from about 0.1 M to about 0.3 M, of reducible-metal salt.

In conventional EP, where the work-piece is totally immersed in electrolyte, metal salts generally are not added because the cost of formulating, recovering and/or disposing of such large volumes of material, would be prohibitive. Additionally, the high concentration of metal salts would introduce contamination to the work-piece. By contrast, a single MMEP cathode half-cell contains only a few ml of electrolyte and can be used to polish work-pieces many times larger in volume. We have found that generally compositions used in commercial electroplating processes are preferred electrolytes in the MMEP process, as opposed to electrolyte compositions traditionally used in electropolishing processes. Such electroplating compositions may include brighteners, biocides, and additives to stabilize a cathode which are useful to maintain a clean efficiently operating half-cell.

In one embodiment the electrolyte composition comprises one or more metal salts, wherein at least one metal salt comprises the metal that is being removed from the anode work-piece. The concentration of these metal salts can range for example from 0.001 M to 5 M, or typically from 0.05 M to 2.5 M. The salts can be selected by one of ordinary skill in the art having benefit of this disclosure. By metal salts we mean the commonly known dissociable (soluble) metal salts as well as metal salts of acidic polymers, e.g., polycarboxylic compounds such as polyacrylates and polysulfonates. We have found that higher metal salt concentrations in the electrolyte reduce hydrolysis of water and make the system more efficient. The following are exemplary, and most will benefit from additional salts.

For polishing silver, an aqueous nitric acid is preferred, having for example 0.1 M to 4 M nitric acid in water, e.g., 1 M to 2 M nitric acid in water. Other electrolyte ions such as sodium nitrate, and/or reducible metal salts such as copper nitrate and/or silver nitrate may be added in an amount between 0.001 M to 3 M, for example 0.001 M to 1 M, or typically from 0.05 M to 0.3 M.

For polishing nickel, an aqueous sulfuric acid is preferred, having for example 5% to 50% sulfuric acid in water, e.g., 10% to 30% sulfuric acid in water. Other electrolyte ions such as sodium sulfate, and/or reducible metal salts such as copper sulfate and/or nickel chloride may be added in an amount between 0.001 M to 3 M, for example 0.001 M to 1 M, or typically from 0.05 M to 0.3 M.

For polishing cobalt, an aqueous sulfuric acid/acetonitrile composition is preferred, having for example 3% to 30% sulfuric acid/10% to 50% water/40% to 75% acetonitrile is useful. Other electrolyte ions such as sodium sulfate, and/or reducible metal salts such as copper sulfate and/or cobalt chloride may be added in an amount between 0.001 M to 3 M, for example 0.001 M to 1 M, or typically from 0.05 M to 0.3 M.

For polishing tin, an aqueous sulfuric acid/hydrochloric composition is preferred, having for example 0.5 M to 5M HCl, 10% to 40% sulfuric acid/40% to 80% water is useful. Other electrolyte ions such as sodium sulfate, and/or reducible metal salts such as copper sulfate and/or tin chloride may be added in an amount between 0.001 M to 1 M, or typically from 0.05 M to 0.3 M.

For polishing tantalum, small amounts of HF may be beneficial. For polishing tungsten, chelators may be particularly beneficial. Other electrolyte ions such as sodium sulfate may be added in an amount between 0.001 M to 3 M, for example 0.001 M to 1 M.

For polishing steel (type 316 SS), an aqueous sulfuric acid composition is useful, having for example 5% to 50% sulfuric acid/50% to 90% water is useful. Other electrolyte ions such as sodium sulfate, and/or reducible metal salts such as copper sulfate and/or ferrous sulfate may be added in an amount between 0.001 M to 3 M, for example 0.001 M to 1 M, or typically from 0.05 M to 0.3 M.

For polishing aluminum, an aqueous sulfuric acid/hydrochloric composition is preferred, having for example 1M to 6M HCl, 5% to 30% sulfuric acid, and 60% to 90% water. Other electrolyte ions such as sodium chloride and/or sodium nitrate, and/or reducible metal salts such as aluminum nitrate, copper chloride, copper sulfate, or the like may be added in an amount between 0.001 M to 3 M, for example 0.01 M to 1 M, or typically from 0.05 M to 0.3 M.

In one preferred alternative the electrolyte composition comprises one or more hydrophilic polymers that act as both an acid (or base) and as a salt. For example, a (co)polymer having a sufficient plurality of acid groups, e.g., carboxylates (e.g., acrylates), sulfonates, sulfates, phosphates, phosphites, borates, and the like thereon, a portion of which are neutralized by associated metal ions, will function as an acid and as a salt. Hydrophilic monomers can be selected from for example acrylic acid, methacrylic acid, hydroxybutyric acid, itaconic acid, (sodium) vinylbenzenesulfonate, (sodium) methallylsulfonate, (sodium) allylsulfonate, functionalized amines, amine substituted organo acids, amino acids, and the like. The polymer should be selected to provide stability in the electrolyte and ability to carry and exchange selected metal ions.

While not every monomer need be hydrophilic, the amount of hydrophilic monomer sites should provide greater than 250 meq/kg of polymer, for example greater than about 1000 meq/kg. Examples of suitable electrolytes include metal salts of poly(acrylic acid), poly(methylacrylic acid), poly(styrene sulfonic acid), lightly cross-linked derivatives and copolymers thereof. Light cross-linking refer to a low percentage of the monomers of one backbone linking to other polymer backbones or monomers with the same backbone for example from about 0.001% to about 5%, alternatively from about 0.001% to about 1%, alternatively from about 0.01% to about 2%. These polymers are beneficially at least partially saturated with metals to neutralize at least some, for example at least 10%, of the available acid site. The polymers are advantageously at least 30% neutralized, for example at least 60% neutralized, with metal, e.g., with ions of the metal being polished.

A preferred electrolyte polymer is a polymeric polycarboxylic acids having three or more carboxylate groups thereon, for example having six or more carboxylate groups thereon. For example, poly(meth)acrylate that has been at least partially neutralized with copper ions is a preferred polymer. The upper limit of size of the polymer is dependent on the viscosity of the desired formulation and on the desired concentration of polymer, and whether the polymer is solvated by an electrolyte solvent. The polymeric electrolyte can have much higher viscosities than are normally used as electrolytes. For example, the electrolyte can be a gel or a very high viscosity formulation (grease-like), or can be solvated to have the properties of a fluid. Additionally or alternatively, the polymeric acid/salts can be affixed to the exterior of small particles or structures, e.g., particles or structures having at least one diameter between about 0.05 microns and 30 microns, where movement or rotation of the structure moves metal ions from the membrane to the cathode. The size and the charge on the polymeric compound will prevent permeation through the membrane. An electrolyte composition comprising one or more polymeric components are preferred when using size exclusion membranes, but are of course equally effective with other membranes.

In preferred embodiments of the invention, the MMEP electrolyte comprises metal ions equivalent to those generated at the anode, and at a concentration sufficient to allow metal ions to be plated onto the cathode at a rate equal to the rate of metal removal from the work-piece, such that a steady state is maintained and the salt content of the electrolyte remains constant. However, solvent (usually water) typically is transferred across the membrane by osmosis, electro-osmosis, and/or pervaporation, causing the salt concentration of the electrolyte to vary with time unless this solvent is removed. Adjustment for such variations may be readily made by adding or removing the appropriate amount of pure solvent. When the rate of production of new metal ions from the anode is exactly balanced by the rate at which the metal ions in the electrolyte composition migrate toward and are reduced at the cathode, then no hydrogen is generated and, in principle, the same quantity of electrolyte can be re-used indefinitely. If the process is operated at high current density and high n, then in addition to metal ions, substantial quantities of protons and solvent (water) will pass through the membrane. Therefore, there will be a gradual decline in the ratio of dissolved metal salt to acid in the electrolyte. It may be necessary to monitor or routinely adjust the electrolyte composition, though some fairly straightforward actions like having the electrolyte be in equilibrium with one or more solid metal salts may sufficiently stabilize the electrolyte composition that no more action need be taken.

In another embodiment the electrolyte can comprise one or more metal salts, wherein the metal salts comprise metal other than those metals that are being removed from the anode. The concentration of metal salts that comprise metal other than those metals that are being removed from the anode work-piece ranges for example from 0.001 M to 1 M, or typically from 0.05 M to 0.3 M.

In some embodiments, the counter-ion of the metal salt is identical to the counter-ion in the acid. This is not necessary, however, and any counter-ion can be selected so long as the counter-ion does not form a precipitate with metal electropolished from the anode work-piece. Counter-ions can be sulfates, phosphates, halides, e.g., chlorides, an organic acid salt such as acetate, salicylate, benzoates, citrates, and the like, provided the metal salt produces charged ions capable of facilitating current flow. Some counter-ions are preferred in certain circumstances, e.g., chlorides are preferred in some instances if the metal being polished is aluminum or iron. Preferably, the salts do not react with and thereby cause the metal ions entering the electrolyte solution through the membrane to precipitate. The salts can be selected by one of ordinary skill in the art having benefit of this disclosure.

In one embodiment, metal ions from metal salts comprises a charge of at least positive two, for example an ion having a charge of positive three or positive four. Exemplary ions include aluminum and iron ions. The highly charged ion will allow current flow with less ions, and will further not readily diffuse through an ion-selective membrane and thereby become a contaminant in the low-conductivity fluid.

Generally, the metal ions must be soluble and stable in the electrolyte, and advantageously are reducible at the cathode. However, in other embodiments the metal ions from the metal salts are not reducible at the cathode. The advantage is that while these salts provide conductivity, they do not plate on and contaminate a cathode. Exemplary salts include halides, e.g., sodium or potassium ions, which will not tend to be reduced at a voltage where for example a copper ion is reduced. The disadvantage is that if an insufficient concentration of reducible metal ions are at the cathode, there may be electrolysis of the solvent, e.g., the water.

In another embodiment of the MMEP process, the metal ions in the electrolyte are partially, substantially, or fully complexed with one or more chelators, ligands, or organic acids. These include those carboxylic acid-containing compounds normally found in the art, e.g., EDTA, DPTA, citric acid, di-functional organic acids including for example dicarboxylic acids such as oxalic acid, malonic acid, succinic acid, glutamic acid, adipic acid, maleic acid, fumaric acid, phthalic acid, isophthalic acid, terephthalic acid and the like; tricarboxylic acids such as citric acid, aconitic acid, trimellitic acid and the like; hydoxycarboxylic acids such as glycolic acid, gallic acid, lactic acid, 2-hydroxybuteric acid, tartaric acid, malic acid, salicylic acid, and the like; ketocarboxylic acids, such as acetoacetic acid, ketoglutaric acid and the like; di- or multi-hydroxybenzene-type compounds, e.g., such as catechol, butylated hydroxytoluene ("BHT"), and the like; nitrogen-containing compounds including alkanolamines, aminocarboxylic acids such as aspartic acid, glutamic acid and the like; aminopolycarboxylic acids such as EDTA, DPTA, and the like; amino-carboxylic acids; diamines, e.g., such as ethylene diamine; or a combination of any such chelating agents. Preferably, in an electrolyte composition having chelators present, if the complexed metal is one that is beneficial to be reduced at the cathode, then the chelator-metal complex must be able to release the metal ion at the cathode, or otherwise permit the metal ion to be reduced. In this case, chelators are generally dis-favored over solubilizing ligands. However, if the complexed metal ion is of a type where reduction at the cathode is not desired, then a stronger chelator can be used, and the complexing agent can inhibit the ability of the cathode to reduce those metal ions.

In one embodiment, for example, a source of strong base or cyanide ion can be used in the electrolyte or in the low-conductivity solution in an anodic generation of complex metal anions such as $Al(OH)_6^{-3}$, $Fe(CN)_6^{-3}$ or $Cu(CN)_3^{-2}$. Generally, bases are discouraged in an aqueous environment, as the metal ions passing through the membrane may form undesirable precipitates at the membrane. Similarly, cyanide can create handing problems, even within the small confines of a cathode half-cell. As discussed infra, other preferred complexing compounds are acetonitrile, and less preferably propionitrile, butyronitrile, or any mixture thereof.

Large chelating moieties have an adverse affect that they reduce, relative to un-complexed metal ions, the rate of the complexed ion migration toward the cathode. However, such chelators can also prevent ion migration through selected membranes, for example by size exclusion. For this reason, in some embodiments of the invention, the electrolyte comprises one or more larger yet releasing chelators, including for example salicylic acid, benzoates, naphthanoates, and the like. Such a large metal-complex will not readily diffuse through a membrane, and the membrane can act by means of ion exclusion, size exclusion, or a combination thereof.

Specific, i.e., metal-specific, large chelating materials, in particular crown ethers and nitrogen analogues thereof, including hydrophilic derivatives thereof, can be used in combination with certain electrolyte solvents. As crown ethers and analogues and derivatives can hold certain metal ions tenaciously and not allow reduction thereof at the cathode, so embodiments that use such crown ethers to chelate metal electropolished from the surface may have the electrolyte be circulated in the half-cell so that the complexed metal ions can be extracted from the electrolyte outside the cathode half-cell.

Of course, if the electrolyte solvent is not water, many traditional metal salts are not sufficiently soluble, and other highly polar compounds and some "salts" may have counterions to enhance solubility. For example, if pure acetonitrile is the solvent electrolyte, tetramethylammonium hexafluorophosphate is soluble enough to provide at least minimally sufficient conductivity. In addition, the polymeric backbone of any metal-neutralized polymer can be modified from for example polyacrylate to instead incorporate hydrophobic or aromatic moieties, using monomers known in the art, to achieve sufficient solubility of the metal-neutralized polymers in the non-aqueous solvent.

Continuous Treatment Of Electrolyte Composition: The half-cell can be a closed system, but generally problems such as contamination, gas generation, heat generation, declining ratio of metal to acid, and/or dilution can be dealt with by circulating the electrolyte composition in and out of the half-cell and treating the electrolyte. Such circulation can be accomplished by for example a closed pump. While the electrolyte material is outside of the half-cell, it can be treated as necessary. Electropolishing generates heat, so the electrolyte may be cooled as necessary to maintain the desired temperature. The reaction at the anode may result in gas generation, for example from the electrolysis of water. The system can include a separator or scrubber to remove gas. The electrolyte may carry entrained particulates, e.g., precipitates or reduced metal. Filtering is generally sufficient to remove these particulates. The polishing process may consume one or more components of electrolyte composition, and these components can be added to rejuvenate the electrolyte composition. As previously noted, during polishing solvent may be lost from or gained by the electrolyte due to transport across the membrane. Appropriate adjustments to electrolyte concentration may be made by addition or removal of solvent from the pumping reservoir. Finally it is desirable to maintain a small positive pressure in the half-cell, and the electrolyte fluid can be added or withdrawn in a manner to maintain the desired pressure.

MEMBRANE: The membrane is a critical component of the MMEP process. MMEP requires that a charge-specific ion-conducting membrane be disposed between the electrolyte solution or gel and the wetted work-piece. The ion-conducting membrane is permeable to the metal ions electropolished from the work-piece, in whatever form they exist. To limit the degree of standard electropolishing that may occur between the membrane and in depressions in the work-piece (where to efficiently planarize no polishing is desired), the conductivity of the fluid exterior to the membrane is kept very low. Therefore, it is important that the ion-conducting membrane be substantially impermeable to the counter-ions in the electrolyte composition. To achieve this, the composition of the electrolyte is such that the membrane is impermeable to either the cations or the anions in the electrolyte. Without being bound by theory, we believe that because the ion-conducting membrane can transfer only anions OR cations, but not both, the ion-conducting membrane will provide a barrier to the salts in the electrolyte.

That is, in order to maintain the low-conductivity of the solvent or solution covering the anode, the membrane must be essentially impermeable to the electrolyte, or at least to the solutes responsible for the conductivity of the electrolyte. On the other hand, in order to maintain electrical current required for the polishing process, the membrane must, in preferred embodiments of this invention, be permeable by the solvated or complexed metal ions produced in anodic oxidation of the work-piece. In most of the preferred embodiments of this invention, the exterior membrane comprises a membrane that is at least partially permeable to the metal ions electropolished from the work-piece, but is substantially less permeable, e.g., by at least a factor of 5, preferably by a factor of 10 or more, more preferably a factor of 100 or more, for example a factor of 1000 or more, to the oppositely charged ions in the electrolyte. That is, under an applied current and during the process of electropolishing of metal for a period between 2 to 5 minutes at a current density greater than 100 ma/cm$^2$, more than 5 moles, preferably more than 10 moles, more preferably more than 100 moles, for example a 1000 moles or more, of metal ions will pass through the membrane and into the half-cell for every mole of the oppositely charged counter-ion in the electrolyte solution or gel that migrate out of the half-cell through the membrane.

They can be any nominal thickness, for example from about 1 to about 10 mils thick, e.g., from about 2 mils to about 7 mils thick, or what is particularly preferred from a cost standpoint is having the membrane be the thickness which Nafion® membranes are commercially sold. Generally, however, the membranes can be thicker or thinner, ranging for example from about 5 µm thickness to about 5000 µm thickness, preferably from about 20 µm thickness to about 1000 µm thickness. The distribution of charged moieties in the pores need not be uniform, and the membrane can comprise one or more separate membranes laminated one to another. Advantageously the exterior of the membrane comprises a PTFE polymer, to provide toughness, "slipperiness, and chemical inertness.

There are four general classes of useful membranes that can be used on the outer portion of the half-cell, to contact the surface of the work-piece to be polished. These are 1) cation-conducting membranes, 2) anion-conducting membranes, size-exclusion membranes, and 4) polarity exclusion membranes. A size-exclusion membrane which has no intrinsic charge-selective capability may nevertheless be useful if only the cations or only the anions in the electrolyte are small enough to pass through such a membrane. A membrane can have features of one, two, or three classes, but can not be permeable by both cations and anions in the electrolyte solution.

Advantageously, in every embodiment of the invention described herein, there is no ion exchange material disposed between the cathode and the work-piece that substantially captures the metal-containing ions. Ion exchange material, as is known in the art, has a limited capacity to captures ions, and can become saturated with the ions. In contrast, the ion-conducting membrane is beneficially kept in a condition of being partially exchanged with selected metal ions, and therefore allows selected ions to pass therethrough, but the membrane does not substantially capture and hold these ions.

Charge-Selective Ion-Conducting Membranes: Generally, the preferred membranes are charge-selective ion-conducting membranes, described below. These are preferably formed of fluoropolymers, for example, which contribute to membrane inertness and to slide-ability of the membrane over the work-piece. A preferred variation of this apparatus includes the embodiment wherein the charge-selective ion-conducting membrane is between about 40 and about 200 microns in thickness.

In the preferred embodiments of this invention, substantially all of the solvated or complexed metal ions produced in anodic oxidation of the work piece pass through the membrane into the electrolyte. This condition, corresponding to a cation transference number of 1, can be achieved by assuring that no ions of opposite charge are capable of permeating the membrane. Under neutral or acidic conditions in the absence of anionic ligands, the anodic oxidation of metals such as copper, iron, nickel and the like produces positively charged cations. For the positively charged ions to pass through, then the membrane must be a cation-conducting membrane, as is the case in Examples 1-5. Similarly, anodic oxidation may also be carried out under basic conditions in the presence of negatively charged ligands such as $CN^-$. In that situation, the solvated metal ion may be a negatively charged complex anion and MMEP would require an anion-conducting membrane. Of course, the overall charge is the key, and charged ligands (if any) complexed with a metal can result in a negatively charged complex.

In contrast, if as in the method taught in U.S. Pat. No. 6,653,226, these metals solvated or complexed metal ions produced in anodic oxidation are reduced at the membrane, then undesired solids will scratch and damage the work-piece.

Charge-selective ion-conducting membranes generally consist of solid organic polymers that bear covalently bound ionic functional groups. The bound ions constitute fixed charges that are balanced by unbound, mobile counter-ions of the opposite charge. The latter may diffuse within the membrane or migrate under the influence of an electric field to carry electric current. Small ions in adjacent solutions with the same sign as the mobile counter-ions exchange readily with those in the membrane. By contrast, ions in adjacent solution with the same charge as the fixed ions in the membrane tend to be excluded from such membranes due to electrostatic repulsion. Thus, charge-selective ion-conducting membranes that allow passage of only anions or cations, but not both, if contacting on one side a low-conductivity fluid, will be more or less impermeable to electrolyte solutions (or at least to the ionic components therein) due to exclusion of ions that share the same sign as the fixed charges.

A preferred class of membranes are cation-conducting membranes, especially those formed from polymeric ionomers functionalized with strong acid groups, with a pKa of less than 5, preferably less than 3. Suitable charge-selective ion-conducting membranes include film-forming ionic polymers that are stable under the conditions of the electropolishing process. A cation-conducting membrane, for example, preferably contains sulfonic acid groups bound thereto. Carboxylic acid groups are also functional. Generally, a carboxylic acid type membrane has a greater electric resistance when compared with the sulfonic acid type fluoropolymer membrane. Sulfonic acid groups are preferred strong acid groups. Preferred polymeric ionomers are copolymers of fluorinated and/or perfluorinated olefins and monomers containing strong acid groups.

In one embodiment the membrane is layered, and comprised fluoropolymer membrane comprising at least two integrally laminated layers including a first layer made of a perfluorocarbon polymer having carboxylic acid groups as its dominant ion exchange groups, and a perfluorocarbon polymer having sulfonic acid groups as its dominant ion exchange groups. It is important that each membrane be able to maintain the desired flux of solvated metals. Alternately, there can be a plurality of layers can be separated with fluid therebetween. Again, each membrane, plus the electrolyte composition or gel disposed between membranes, must be capable of maintaining the desired flux of solvated metal ions.

In another embodiment the membrane can be a single layer having both sulfonic and carboxylic groups, e.g., those made by the copolymerization of a carboxylic acid type monomer with a sulfonic acid type monomer, or by the copolymerization of a carboxylic acid type monomer with a sulfonic acid type monomer, or by impregnating a sulfonic acid type fluoropolymer membrane with a carboxylic acid type monomer, followed by polymerization. Another membrane can be formed from a blend comprising a sulfonic acid group-containing polymer and a carboxylic acid group-containing polymer, is laminated on a sulfonic acid group membrane, as described in U.S. Pat. No. 4,176,215. Methods for manufacturing suitable membranes without undue experimentation can be obtained by modifying the methods of, for example, U.S. Pat. Nos. 4,983,264, 4,545,889, and 4,909,912. These disclosures describe cation exchange membranes, with higher levels of polar moieties that allow the film to capture and hold ions. As discussed, the membranes of the current invention are distinguished from cation exchange materials in that the membranes of the current invention do not capture and hold ions, but rather allow an ion to diffuse/be driven by electric forces to the other side of the membrane. Generally, this distinction has real operational differences. A cation exchange membrane can aggressively strip metals from a solution, but would as it absorbed metal ions gradually lose its effectiveness (thereby changing polishing efficiency with time) and will eventually need to be regenerated, after the cation exchange membrane is so depleted of active sites that metals do not absorb thereon but rather stay in solution and contaminate the work-piece.

Perfluorocarboxylate ionomer membranes or Nafion® perfluorosulfonate ionomer membranes (E.I. du Pont de Nemours, Inc., Wilmington, Del.) are composed of fluorocarbon chains bearing highly acidic carboxylic and sulfonic acid groups, respectively. On exposure to water, the acid groups ionize, leaving fixed sulfonate anions and mobile hydrated protons. The protons may be readily exchanged with various metal cations. Nafion® is particularly well suited for use in MMEP due to its strong common-ion exclusion, high conductivity, strong acidity, chemical stability and robust mechanical properties. MMEP polishing of Cu in water requires an acidic environment at the surface of the anode because at pH>4 $Cu^{+2}$ precipitates from water as CuO or $Cu(OH)_2$. Nafion® provides the necessary acidic environment to solubilize $Cu^{+2}$. Nafion® PFSA membranes N112 having 51 μm thickness, N115 having 127 μm thickness, N117 having 178 μm thickness, and NE1135 having 89 μm thickness were all found to be useful and robust.

To the extent that such charge-selective ion-conducting membranes transport only ions of one sign, this provides two unique advantages for MMEP over EP. Firstly, it prevents contaminating the work-piece and low-conductivity solvent by electrolyte. Secondly, since the only source of mobile ions on the anode side of the membrane is the anodic oxidation reaction, all of the current will be carried by these ions. Consequently, these ions must be absorbed and transported through the membrane and removed from work-piece at exactly the same rate as they are produced, thereby eliminating a second source of contamination. In processes where this functionality is not desired, the process can include both anion and cation conducting functionalities in a membrane, as described for example in WO 03/098676. For MMEP, however, such a dual function membrane is totally inoperative, as it would allow conductive ions to pass from the electrolyte, through the membrane, and into the low-conductivity solution.

The membrane is advantageously formed at least in part with flourinated polymers, e.g., a PTFE polymer, to provide toughness, "slipperiness, and chemical inertness. In a preferred embodiment, the charge-selective ion-conducting membrane comprises a perfluorosulfonic acid/PTFE copolymer. In another preferred embodiment, the charge-selective ion-conducting membrane comprises a perfluorocarboxylic acid/PTFE copolymer. In another preferred embodiment, the charge-selective ion-conducting membrane comprises a polymeric ionomer functionalized with both sulfonic acid groups and carboxylic acid groups. Other acid moieties can be attached to the membrane, as an alternative to or in addition to the carboxylic acid moieties and/or the sulfonic acid moieties, including for example a sulfanilamide moiety, a phosphonate moiety, a sulfonyl moiety, or any combination thereof, wherein the acidic moieties can independently be substituted with for example a $C_1$ to $C_4$ alkyl group.

The membrane can comprise a layer of expanded PTFE web, which is impregnated with a perfluorosulfonic acid polymer material similar to that used in Nafion® type membranes. The PTFE membrane would reduce friction, and would also increase wear, relative to Nafion® membranes. A successful experiment was performed with a 2 mil experimental expanded PTFE web impregnated with perfluorosulfonic acid polymer material. The 2 mils thickness is compared to the 7 mil thickness of Nafion® membranes used in the majority of Examples.

In one embodiment a thin layer of expanded PTFE web can be laminated to a Nafion® membrane. This expanded PTFE web would be a tough, slidable protective cover over the Nafion® membrane. If the expanded PTFE web is so thick that it impairs MMEP, the expanded PTFE web material can be partially or fully impregnated with perfluorosulfonic acid polymer material. Other useful membranes are described in for example U.S. published applications 2004/0035782, 2003/0219640, and 2003/0013817. The above disclosure is not intended to be exhaustive, but is illustrative, of useful charge-selective membranes.

Under conditions where oxidation produces a negatively charged metal complex ion, MMEP would require an anion-conducting membrane. The charge-selective ion-conducting membrane is an anion-conducting membrane where the membrane comprises a polymeric ionomer functionalized with at least one type of basic moieties, for example quaternary ammonia groups. The membrane is advantageously formed at least in part with fluorinated polymers, e.g., a PTFE polymer, to provide toughness, "slipperiness, and chemical inertness. This embodiment is useful when the metal ion is negatively charged, for example as a result of being complexed with negatively charged ligands. A variation of this apparatus includes the embodiment wherein the charge-selective ion-conducting membrane is between about 40 and about 200 microns in thickness.

An anion-conducting membrane, for example, preferably contains for example quaternary ammonium groups bound thereto. Protonated tertiary or lower amino groups are also functional. Strongly basic styrenic ion-conductive membranes can be formed from for example crosslinked copolymers of styrene and divinylbenzene, to thereby synthesize a crosslinked poly-styrene-divinylbenzene, then chloromethylating this crosslinked polymer using a Lewis acid and causing a tertiary amine or the like to add thereto. Such strongly basic resins can be used in ion-conductive membranes in the whole pH range and therefore are utilized in a wide range of applications. Methods for making anion-conducting membranes can be adapted from methods to make anion-conductive membranes with little experimentation. See for example U.S. Pat. No. 6,646,083. Such membranes are commercially available.

Size Exclusion Membrane: In yet another embodiment, the membrane is a size-restriction membrane that may have or may not also have charge-selective properties. In this embodiment, the electrolyte composition advantageously has the either the positive ions or the negative ions that constitute the conductive material in the electrolyte be in the form of large soluble and/or suspended molecules sized so that the fine filter membrane will not allow passage of these large bodies through the membrane openings. By large acids we mean preferably larger organic acids having a size larger than the average size of pores in the membrane, such that the acid and/or the metal-neutralized acid will not pass through the pores of the membrane. Therefore, the operative size of acids (the anion of the acid, optionally at least partially neutralized with a metal) in the electrolyte is a function of membrane pore size. Generally, an organic acid having a molecular weight greater than 200 is useful, while a molecular weight greater than about 500 is preferred. To utilize cheaper membrane materials (having less control on pore size and therefore having some larger pores) the preferred acids are polymeric acids having molecular weights of greater than about 300, for example having molecular weights between about 500 and about 5000. The electrolyte solution or gel may alternately comprise hydrophilic polymers having a molecular weight of between about 1000 and about 50,000, for example between about 2000 and about 20,000. While higher molecular weight acids can be used, most commercially available small pore filter membranes will not allow an organic acid molecule with a weight greater than 5000 to pass there-through. Examples of polymeric acids useful for the electrolyte include those having carboxylic acid groups thereon, e.g., polyacrylic acid, poly(meth)acrylic acid, polyacrylates, poly(metha)crylates, and the like, and/or ionomers having for example sulfonate groups attached thereto, or combination thereof, or mixtures thereof. Some large monofunctional acid can alternatively be used in the electrolyte, but generally large molecules have impaired diffusion, so a high functionality will bind a plurality of metal ions thereto and therefore facilitate conduction of charged ions between the cathode and the membrane.

It is advantageous to have some charged moieties within the membrane, for the purpose of conducting current through the membrane and for maintaining an acidic environment within the membrane to inhibit precipitation of certain uncomplexed metal ions. The use of metal-neutralized hydrophilic polymers such as polymers having carboxylate, sulphonate, and/or other acidic moieties attached to that polymeric chain, is particularly amenable to supplemental size exclusion embodiments. Additionally, the membrane is advantageously formed at least in part with fluorinated polymers, e.g., a PTFE polymer, to provide toughness, "slipperiness", and chemical inertness. Any common micro-porous membranes sold by Millipore, Pall, and the like will be operable. In one embodiment, the size exclusion membrane may be treated to increase the acidity of the pores within the membrane, by for example impregnating the membrane with a small amount of fluid comprising an acidic low molecular weight polymeric material. Generally, size exclusion is less effective than the charge-exclusion membranes, however, as size of pores can change with stress.

Polarity Exclusion Membrane: A variant of any of the above membranes is a polarity exclusion membrane, wherein the exclusion of passage of anionic or cationic conductive portions of the electrolyte is impaired in part because the electrolyte portion is immiscible in the low-conductivity fluid. That is, one of the low-conductivity fluid and the electrolyte composition is polar, and the other is non-polar. Exemplary acids that are insoluble in water include, for example, oleic acids, e.g., tall fatty acids such as linoleic acid. Here, increasing the functionality of an acid increases its solubility in water. While in large part polarity exclusion depends on the selection of the electrolyte compositions and the low-conductivity fluid compositions, it is known in the art to make highly hydrophobic membranes and also highly hydrophilic membranes. For polarity exclusion, the membrane most beneficially repels the ions forming the conductive portion of the electrolyte. The membrane is advantageously formed at least in part with fluorinated polymers, e.g., a polytetrafluorethylene (PTFE) polymer, to provide toughness, "slipperiness, and chemical inertness. Generally, a hydrophilic membrane and a polar low-conductivity fluid are preferred. However, a non-polar low-conductivity fluid can be coupled with a hydrophobic membrane, if there is materials in the low-conductivity fluid that allow metal ions to be complexed or coordinated. A variation of this apparatus includes the embodiment wherein the polarity exclusion membrane is between about 40 and about 200 microns in thickness.

Plurality Of Ion-Conducting Membranes: As described infra, in some embodiments of this invention there are a plurality of ion-conducting membranes disposed between the cathode and the work-piece. Generally, charge specific ion conducting membranes are preferred, but the internal membranes can be more or less specific. Generally, the external membrane, e.g., the membrane that contacts an electrolyte composition on one side and contacts the low-conductivity fluid/work-piece on the other side, is permeable to all metals electropolished from the work-piece.

Internal membranes that contact different electrolyte compositions on either side typically do not need to be as robust as exterior membranes. Internal membranes can be specific to one or more metals, excluding other metals. This is useful if a plurality of metals are being electropolished from a substrate, but some of these metals if they reduce at the cathode will poison a cathode. These metal-specific membranes are also useful if it is not desired to reduce one or more metals in the electrolyte for other reasons, for example the value of the metal or environmental difficulties associated with handling the metal. In one embodiment, an internal membrane is a size exclusion membrane, where the electrolyte disposed between the outermost membrane and the interior membrane comprises partially metal neutralized hydrophilic polymers, which are extremely resistant to passing through an exterior membrane but are less effective at releasing metal ions such that these ions can be reduced at the cathode. The internal electrolyte contacting the cathode can comprise acids, reducible-metal salts, and the like, as described infra. This structure is also useful, for example, where the electrolyte composition contacting the external membrane has very little of metals that are being electropolished from the work-piece, while the electrolyte composition contacting the cathode had a substantial quantity of added metal salts, e.g., an aqueous solution of sulfuric acid and copper sulfate. Generally, such an embodiment will substantially reduce metal ion leakage from the cathode half-cell, and will also provide sufficient copper ions at the cathode to prevent formation of hydrogen gas.

Membrane Contact Area: To be economically feasible, the Membrane-Mediated Electropolishing process must be simple to perform, reliable, and must provide a metal removal rate at least equivalent to that obtained with use of traditional chemical mechanical polishing slurries. To be useful for polishing mechanically fragile substrates, such as damascene wafers containing brittle low-K dielectric materials, the Membrane-Mediated Electropolishing process must also be capable of operating at low tool pressures. In the Membrane-Mediated Electropolishing process, the substrate surface is physically separated from the electrolyte and cathode by a charge-selective ion-conducting membrane, wherein the membrane is essentially impermeable to the electrolyte but permeable to the ions produced by anodic oxidation of the work piece. This Membrane-Mediated Electropolishing is distinguished from conventional electropolishing in that the work-piece does not contact the electrolyte, and is distinguished from electropolishing processes such as are described in published U.S. application 2003/0136668 in that the cathode does not touch the membrane, but rather a conductive electrolyte contacts both the membrane and the cathode. When we state the cathode must not contact the membrane, we are only discussing that portion of the membrane that is actively involved in electropolishing, that is, the membrane being substantially in contact with the low-conductivity fluid-wetted surface of the work-piece.

Planarization of Cu interconnects in the double-damascene process is commonly achieved by means of chemical-mechanical polishing with a combination of chemical oxidation and abrasive. Metal removal rate (RR) is one of the key operating specifications for planarization. While many polishing processes are done in a single step, the industry has adopted a two-step process for polishing copper damascene wafers. A first "blanket planarization" step eliminates topographic features from the plated surface and removes most of the excess copper at an RR of about 600 nm/min, while a second "soft landing" step removes remaining Cu from the surface of the barrier layer at an RR of about 200 nm/min. Industry targets for the next generation of planarization technology have specified copper RR in excess 800 nm/min for blanket planarization at a nominal tool (pad) pressure less than or equal to 5 psi, and further specifies an RR greater than about 400 nm/min for second step polishing at a nominal tool (pad) pressure less than or equal to 2 psi. Recent slurry development efforts have failed to meet the objectives. Moreover, the introduction of new fragile low-K dielectrics, requiring tool pressures $\leq 2$ psi, will introduce a major obstacle for chemical mechanical polishing to even maintain existing productivity.

One object of MMEP is to provide the conditions wherein high polishing rates can be achieved. In preferred embodiments of the invention, the process variables are controlled so that the Membrane-Mediated Electropolishing process will provide copper RR equal to or greater than 400 nm/min, preferably equal to or greater than 600 nm/min, for example equal to or greater than 800 nm/min. This polishing rate is for the entire area of the substrate to be polished, and this rate depends on a variety of factors, not in the least of which is ratio of the area of contact to the area polished ($A_c/A_p$), I, and n. Where, moreover, I and n are functions of the voltage V, velocity v, and contact pressure $P_c$. Therefore one aspect of this invention is a method to membrane-mediated electropolish a copper-containing substrate at a high current density and also at a high copper removal rate. One aspect of this invention is providing a method of MMEP where the nominal current density I is sustainable at greater than 1000 mA/cm$^2$, preferably greater than 1500 mA/cm$^2$, for example greater than 2000 mA/cm$^2$. However, the polishing system can be designed to provide the desired metal removal rates at a fraction of those current densities. The discussion above and the examples show that the primary considerations in obtaining a high current density are having sufficient voltage and having sufficient interfacial velocity. Additionally, tool pressure, contact pressure, and membrane area each have important, although secondary, effects. Under most conditions, the voltage necessary to maintain such a high current density, plus the conditions which will allow sufficient water to be present such that the membrane does not stick to the substrate surface, will also be sufficient to ensure than n is greater than 4, and is usually greater than 4.5. While such high n values do prevent copper oxide precipitates from forming, the oxygen generation at the work-piece surface can be severe. In some embodiments, it is preferred that n be below 5, for example where n is between about 3 and 4.5. This will allow require lower current densities.

While we have demonstrated current densities well above 3 A/cm$^2$, such high densities are not needed for most tool designs to realize the desired copper RR. For example, if the desired metal removal rate is 700 nm/min, then:

1) For a tool design where $A_c/A_p$=0.06, the current density needed is 0.9 A/cm$^2$ at n=3, 1.2 A/cm$^2$ at n=4, 1.6 A/cm$^2$ at n=6, and 2.1 A/cm$^2$ at n=8;

2) For a tool design where $A_c/A_p$=0.1, the current density needed is only 470 mA/cm$^2$ at n=3, 630 mA/cm$^2$ at n=4, 950 mA/cm$^2$ at n=6, and 1.26 A/cm$^2$ at n=8;

3) For a tool design where $A_c/A_p$=0.2, the current density needed is only 240 mA/cm$^2$ at n=3, 320 mA/cm$^2$ at n=4, 480 mA/cm$^2$ at n=6, and 630 mA/cm$^2$ at n=8; and 4) For a tool design where $A_c/A_p$=0.8, the current density needed is only 60 mA/cm$^2$ at n=3, 80 mA/cm$^2$ at n=4, 120 mA/cm$^2$ at n=6, and 160 mA/cm$^2$ at n=8.

We show here examples of polishing head designs having a plurality of membrane windows are available where $A_c/A_p$=0.2, and such a tool would need a current density of about 400 mA/cm$^2$ at n=5 to achieve a metal RR of 700 nm/min, which is very easy rate to achieve at voltages between 12 V and 24 V. So, while we have shown that I can be sustained at rates greater than 2 A/cm$^2$, it is rare that we would need to reach such a high current density to achieve the removal rates specified by integrated circuit manufacturers for the next generation of polishers.

To achieve a high removal rate, the process must maintain a balance between a high current density and must have a sufficiently high ratio of contacted surface area of the membrane to area polished by the process ($A_c/A_p$). The removal rate RR is calculated by measuring the mass loss $\Delta m$ for any given processing time t over a given area of polishing $A_p$:

$$RR = \Delta m / \rho A_p t \quad (5)$$

where $\rho$ is the density of Cu (8.92 g/cm. RR is related to process parameters as follows:

$$RR = V_m/F(I/n)(A_c/A_p) \quad (6)$$

where $V_m$ is the molar volume of Cu (7.135 cm$^3$/mole) and F is Faraday's constant (9.65×10$^4$ coulomb/mole). Equation 6 shows that RR is controlled by two ratios of process parameters. The ratio ($A_c/A_p$) is strictly geometric and subject to tool design. By contrast, the ratio (I/n) is intrinsically mechanistic and may vary systematically with operating parameters such as $P_c$, v and V.

Tool design provides the most direct route to optimizing RR. We anticipate that a commercial MMEP tool would incorporate multiple membrane windows in order to optimize ($A_c/A_p$). There are embodiments described herein where the ratio $A_c/A_p$ ranges from 0.02 to about 1, but in preferred embodiments $A_c/A_p$ ranges from 0.04 to about 0.98, for example from 0.06 to 0.9. For example, the large MMEP polishing head shown in FIG. 14 is a 52 cm pad having about 390 windows thereon, each 1 cm by 2 cm window having a contact area of about 0.5 cm$^2$. The ratio Ac/Ap for such a device can not exceed about 195 cm$^2$/1060 cm$^2$, or about 0.18. On the other hand, FIG. 35 shows a similarly sized pad which is primarily a large continuous pad, with some, perhaps about 10% to 20%, of the pad volume optionally containing channels and/or structures to introduce low-conductivity fluid and to remove oxygen gas that may be generated. The ratio Ac/Ap may be 0.8 to about 1 for such an embodiment. Such a polishing membrane A) should be operated at very low pressure, e.g., below 1 psig, typically below 0.3 psig, often below 0.1 psig, so the water layer trapped between the membrane and the work-piece is thicker than for most experiments described here; and B) may be operated at low current density I, e.g., less than 500 ma/cm$^2$, for example between about 40 mA/cm$^2$ and about 200 mA/cm$^2$, and preferably with a pulsed current supply or other actions to keep n equal to about 2, thereby preventing oxygen generation between the substrate and the membrane. Under these conditions the water layer will not be rapidly depleted.

Figure 27:
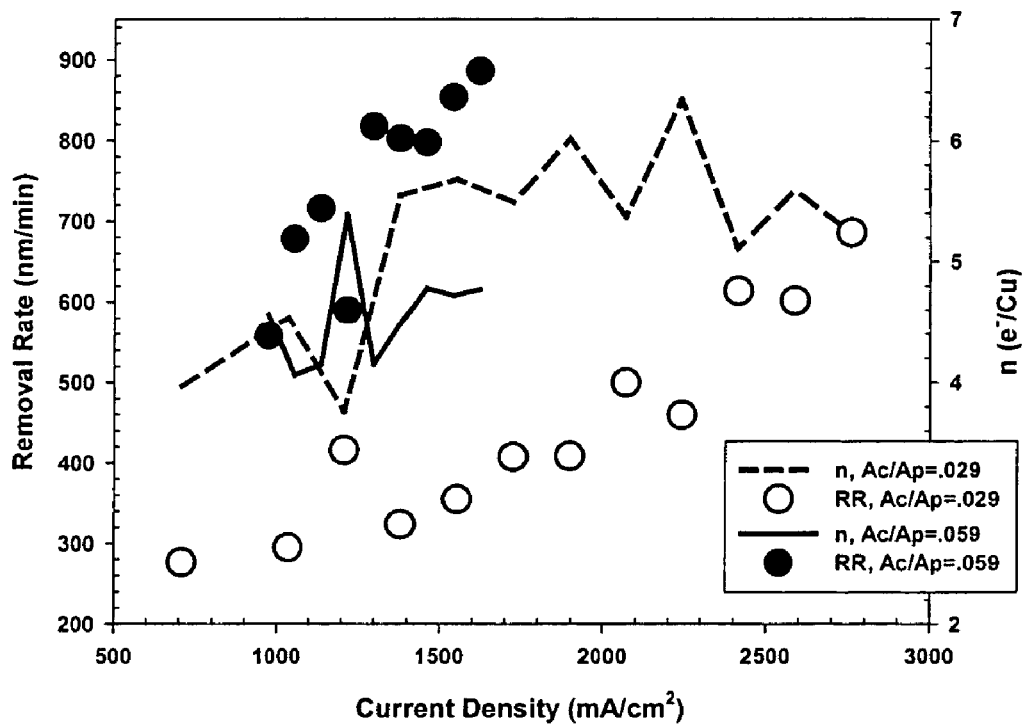
FIG. 27 shows the copper removal rate and stoichiometric number n of the single window half-cell experiment of FIG. 7 ($A_c/A_p$=0.029) and the same copper removal rate and stoichiometric number n from a dual-window half-cell experiment at z=−0.25 mm, $A_c$=0.617 $cm^2$, $A_p$=10.5 $cm^2$ ($A_c/A_p$=0.059), normal load ~320 g, and v=55 cm/sec.

For multiple window embodiments, in order to make reliable projections of the performance of such a tool it is important to confirm that each window can perform the same as a single window tool. FIG. 27 shows the results of a direct comparison of the performance of single and double-window half-cells operating in an overlapping region of I. At any given I, RR is seen to be roughly proportional to the total contact area. Most importantly, a removal rate of 900 nm/min was achieved with the double-window half-cell at a current density less than 2000 mA/cm$^2$.

LOW-CONDUCTIVITY FLUID SUPPLY: In every embodiment of the invention, a low-conductivity fluid is used to contact, e.g., cover, the work-piece. The low-conductivity fluid should wet the work-piece. The low-conductivity fluid serves to solvate the metal ions and facilitate their transport through the membrane, and also to limit the anodic dissolution reaction to areas of the work-piece in contact with, or in close proximity to, the membrane. Electrical current flow between a cathode in the half-cell and the work-piece is a function of the resistances between the cathode in the half-cell and the work-piece. As described in U.S. Pat. No. 6,653,226, if the distance between a charged body and the work-piece is both small and is filled with a low-conductivity fluid, then the distance will be a determinative guide to current flow.

Most charge-selective ion-conducting membranes, including Nafion®, require hydration (or analogous complexing) to support ion conductivity, and conductivity decreases rapidly when the water content falls below a critical value. As described in paragraph 80 et seq. above, MMEP requires the low-conductivity fluid solvate the metal ions to facilitate migration thereof through the membrane. For electropolishing copper with a low-conductivity fluid that consists essentially of water, the depletion of water can vary from about 15 volumes of water per volume of copper electropolished for a system where n=2 to 60 volumes of water per volume of copper electropolished for a system where n=6. This turns out to have important consequences for the MMEP process. MMEP was first attempted using a Cu work-piece immersed in water under static contact with a Nafion® membrane. Under these conditions it was discovered that the membrane developed a strong adhesion to the work-piece which persisted for as long as the current was allowed to flow and that the polishing process was largely restricted to the periphery of the contact area. Both of these effects are understood to be a consequence of electro-osmotic membrane dehydration. As metal ions migrate away from the interface they carry with them solvent molecules, thus creating a partially dehydrated (or de-solvated) boundary layer within the membrane. Results summarized in the Examples indicate that a thin, partially dehydrated boundary layer provides the highest planarization efficiency, but extreme dehydration can cause the current and polishing rate to decrease nearly to zero. In regions of the membrane near the center and near the receding edge of the contact area, where much of the low-conductivity fluid supplied by translation of the membrane across a wetted work-piece is exhausted, and where diffusion of water from the surrounding bath is not sufficient to replenish the water supply, the membrane may become sufficiently dehydrated to stop carrying current.

In some embodiments of the invention, the supply of low-conductivity fluid is insufficient to balance the use of the low-conductivity fluid to solvate and help transport metal ions through the membrane, such that the layer of low-conductivity fluid disposed on the work-piece is depleted and at least a portion of the membrane partially dehydrates. Such embodiments may provide greater planarization efficiency, there is no layer of low-conductivity fluid between the membrane and the cell, and moreover, the concentration of low-conductivity fluid absorbed in the membrane may be depleted within a thin boundary layer adjacent to the contact area. At the same time, the osmotic pressure gradient associated with this condition would account for the adhesive force. It was subsequently discovered that by constantly moving the area of contact across the surface of the work-piece in a "sweeping" or "rubbing" motion, the efficiency of rehydration was improved sufficiently to avoid the development of strong adhesive forces and provide uniform polishing over the contacted area of the work-piece.

Removal of water from the layer between the membrane and the substrate can exceed the available supply. If the water between the membrane and the substrate surface is completely depleted, the membrane will adhere to the substrate which may restrict movement and/or damage the membrane. Additionally, at I>2500 mA/cm² the surface appeared to develop some uniform microscopic roughening. The reason for this is not known, but is may reflect disruption of the interfacial water layer by excessive evolution of $O_2$ gas, and/ or the results of the membrane locally dehydrating. If so, various combinations of membrane window size and design and of low-conductivity fluid delivery systems, to get a more uniform layer of fluid disposed between the membrane and the substrate surface, and higher velocity should reduce the roughening.

Figure 26A:
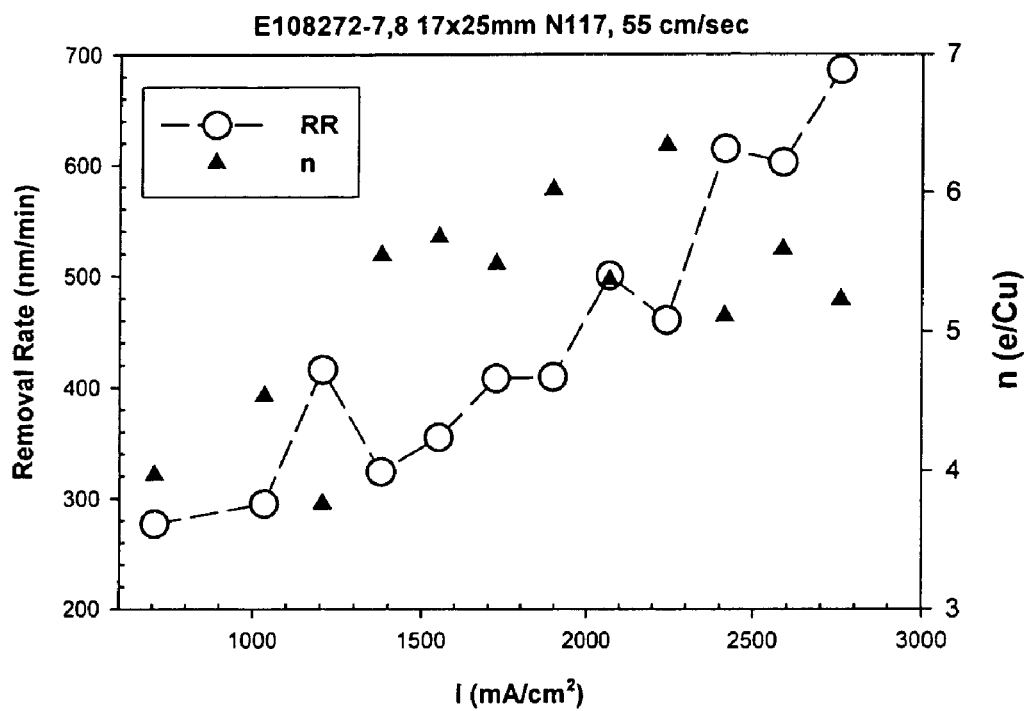
FIG. 26A shows the dependence of removal rate (RR) and stoichiometric number (n) on current density for single-window N117 Nafion® membrane half-cell at z=−0.40 mm, $A_c$=0.29 $cm^2$, $A_p$=9.9 $cm^2$, and v=55 cm/sec.
Figure 26B:
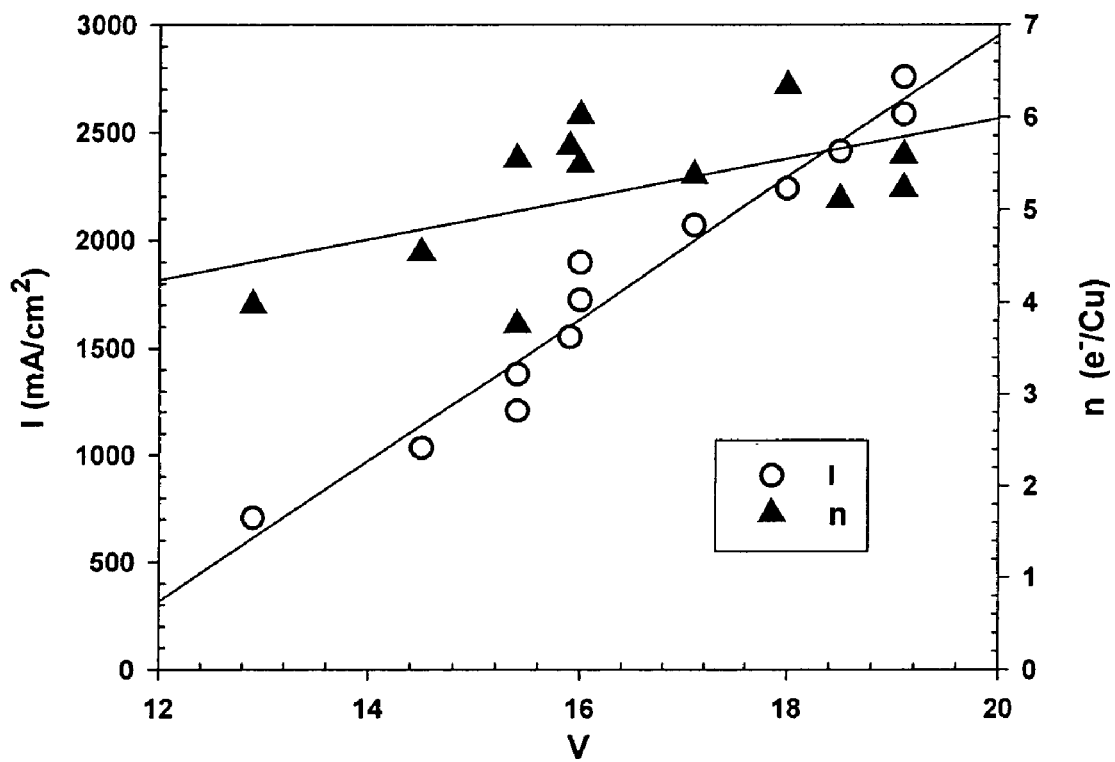
FIG. 26B shows the dependence of I and n on voltage for the single-window half-cell experiment of FIG. 27A.
Figure 26C:
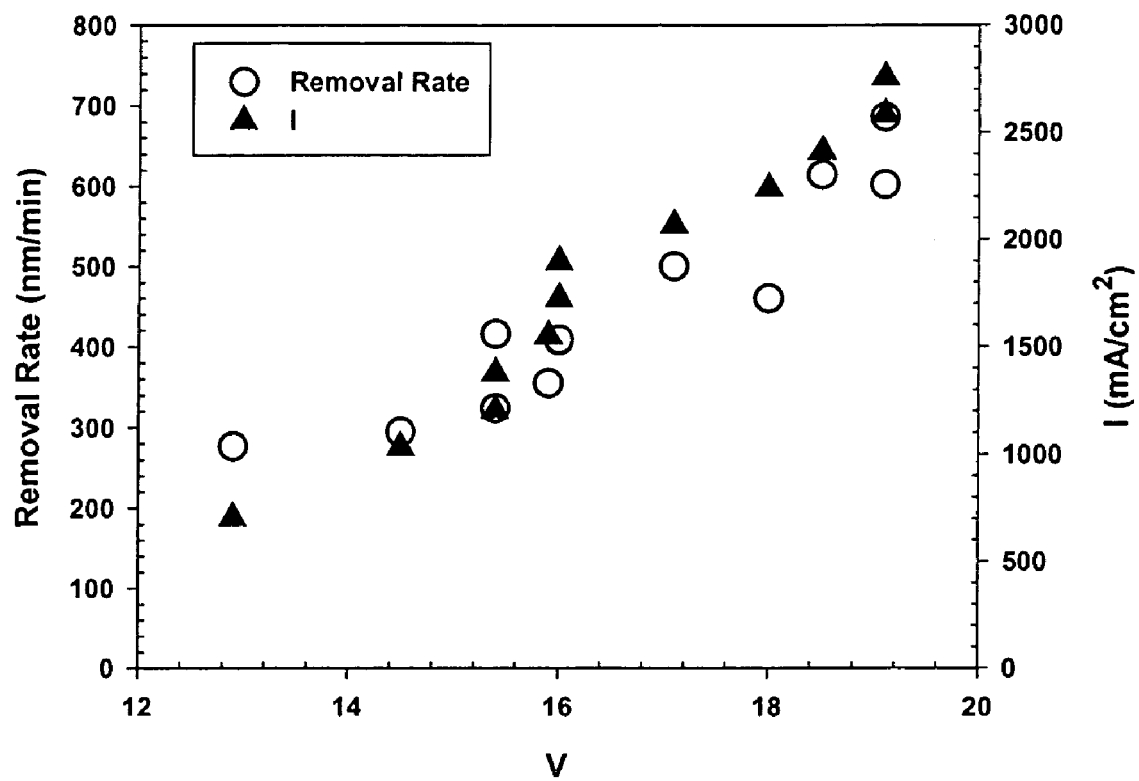
FIG. 26C shows the dependence of removal rate and current density versus voltage for the single-window half-cell experiment of FIG. 7A where Ap=9.9 $cm^2$.

The stoichiometric value n was determined in the polishing processes that are described in Examples 21 and 22. The results are summarized in FIGS. 26A, 26B, 26C, and 27. FIG. 26A shows the dependence of RR and n on current density I, where the current density varied from about 600 mA/cm² to about 2800 mA/cm²; FIG. 26B shows the dependence of I and n on voltage for the single-window half-cell experiment of FIG. 26A; and FIG. 26C shows the variation of removal rate and current density versus voltage. FIG. 27 shows the data of FIG. 26A, and also shows the dependence of RR and n on current density I for a dual window polisher described in Example 22.

FIG. 26B shows that, at voltages between about 13 V and about 19 V, that the n value ranges between about 4 to about 6. Values of n between about 2 and 3 were obtained in earlier experiments at voltages below 7V and I below 500 mA/cm². The data from FIGS. 26A and 26B suggest that for this system n will be greater than 3.9 if either the current density is greater than about 1000 mA/cm², or if the voltage is greater than about 15 volts. Further, the data from FIGS. 26A and 26B suggest that for this system n will be greater than 5 if either the current density is greater than about 1500 mA/cm², or if the voltage is greater than about 16 volts. It is important to note that these experiments were run at an interfacial velocity of 55 cm/sec, which would provide a sufficient influx of water and a sufficiently low dwell time to minimize or eliminate any tendency for the membrane to dehydrate, which may be indicated by an audible squeak coming from the membrane.

FIG. 27 shows the stoichiometric number n increased with increasing I in both experiments. There was no difference in the n value when a dual window polisher was used, as compared to the n value when a single window polisher was used. FIG. 27 also shows the copper RR increases with increasing I for both the single and the double window polishers. The results suggest that the two windows did not substantially affect one another. However, because the RR is proportional to $A_c$, and $A_c$ for the dual window polisher was twice the Ac of the single window polisher, the magnitude and rate of increase of copper RR for the dual window polisher was about twice that observed for the single window polisher.

There is a small decline in n at the very highest voltages, which may reflect an insufficient water supply, much as the audible squeaking at high rates is believed to indicate an insufficient water supply. The lower plot shows that RR also increased with V, consistent with the expectation that RR should vary with the ratio (I/n). The ratio I/n increases generally with increasing V. For these many reasons, for a substrate metal requiring 2 electrons to oxidize metal into a stable ion, such as for example copper, preferably n is greater than 3, typically n is greater than 3.5, for example n is equal to or greater than 3.9, for example about 4.0 or greater, e.g., between about 4 and about 9.0 or alternately about 4.5 and about 8.0.

The high-rate polishing process described herein is limited to polishing copper, e.g., metal comprising more than about 50% by weight Cu, preferably more than 80% by weight Cu, and typically more than 95% by weight Cu. Other metals may also be on the substrate, and some of these metals may also be polished using the methods described here. The invention and parameters described here are for conciseness limited to polishing the copper portion of the substrate surface. It shall further be understood that many metal ions other than copper also exhibit increased solubility at low pH, so that the anodic oxidation of water would have similarly beneficial effects for membrane-mediated electropolishing of such metals.

Advantageously the source of low-conductivity fluid supplies low-conductivity fluid outside the contact area such that this fluid is carried into the contact area by translation or of the contact area, by creating new areas between non-contacting areas, and/or by diffusion of fluid from the periphery of the contact area. Generally, the low-conductivity fluid supply source is any device or devices adapted to supply low-conductivity fluid to the edges of the interface between the membrane and the work-piece surface, e.g., a fixed or moving nozzle or nozzles which direct a stream of low-conductivity fluid against the work-piece surface, the membrane surface, between non-contacting areas, at or into micro- or macroscopic channels, grooves, or roughness on the membrane surface, or any combination of the above.

Typically low-conductivity fluid is placed at the advancing interface where the membrane contacts the work-piece, and movement of the membrane causes a layer of water to be contained between the membrane and the work-piece. The amount of water depends on a number of parameters, including especially the velocity the membrane is moving relative to the work-piece, the shape of the region of contact between the membrane and the work-piece, and even the pressure inside the membrane. Low-conductivity fluid depletion, on the other hand, depends primarily on the current density and the dwell time, which is the time a layer of low-conductivity fluid, e.g., water, must support the MMEP process before the membrane moves on, exposing the work-piece to a supply of fresh low-conductivity fluid. A variation of the apparatus shown in FIG. 17A includes a half-cell comprising a low-conductivity fluid supply source adapted to supply low-conductivity fluid to one or more cavities 106, said cavities being located within an area defined by the outer periphery of the contact area of the membrane window(s) contacting the work-piece surface during electropolishing. The voids can be the result of pulling the membrane in selected locations toward the base. Alternately, the window frame structure can provide along its edges channels where low-conductivity fluid can flow. Channels or tubes extending through the half-cell can provide pressurized low-conductivity fluid to the cavities and subsequently to the work-piece surface. Alternately, the window-frame-type structure can itself comprise hollow tubes or channels adapted to contain low-conductivity fluid and to supply the low-conductivity fluid to the work-piece surface. Alternatively, another source is to pump the low-conductivity fluid through a channel running along a surface of the membrane or through the membrane, so long as the channel does not overly weaken the membrane. Of course, the low-conductivity fluid must remain isolated from the electrolyte composition. Having low-conductivity fluid passing through the body of the half-cell, or through the window-frame-type structure, or alongside the window-frame-type structure, can provide a method of controlling temperature within the half-cell.

Another variation of the apparatus includes the embodiment wherein the half-cell base comprises the low-conductivity fluid supply source attached thereto, being adapted to supply low-conductivity fluid via for example nozzles directed along the periphery of the contact area between the membrane window or windows and the work-piece surface. Advantageously, in most embodiments of the invention described herein, there is source and a flow path (not shown) for introducing low-conductivity fluid into gaps existing between the contact areas of the membrane during electropolishing, and also optionally of pretreating the low-conductivity fluid to de-gas (or to remove oxygen and carbon dioxide) from the low-conductivity fluid, remove particulates from the low-conductivity fluid, and/or to control the rate of flow of the low-conductivity fluid. Generally, the electropolishing apparatus needs a mechanism to supply additional low-conductivity fluid to the area between the membrane and the work-piece surface. As discussed infra, with sufficient movement of a small membrane across a work-piece, coupled with for example spraying from nozzle 103, a sufficient amount of low-conductivity fluid can be provided from one or more stationary nozzles 103, as shown in FIG. 16. To reduce dissolution of gas into the low-conductivity fluid, the nozzles can be lowered and the flow made more laminar.

An increase in efficiency in getting fluid between the membrane and the work-piece surface can also be realized by mounting one or more nozzles 103 on the polishing head 102 or base 1, aiming the discharge near the edge of the membrane-work-piece contact area.

Alternative or additional embodiments will be useful as the size of the polishing membranes increases. For example, FIGS. 17A-D show half-cell assemblies having tubing 104 and 105 penetrating therethrough, wherein low-conductivity fluid is pumped down the tubing and escapes via passing through the gap between the membrane and the work-piece surface. By forcing low-conductivity fluid into this center cavity, the membrane alternately floats on a thin layer of low-conductivity fluid flowing outward from the tubing 104 and 105 and rests against the work-piece surface while the volume is being recharged. Alternately, small channels cut into the membrane surface can allow more steady state flow of low-conductivity fluid outward from the tubing 104 and 105.

Figure 17A:
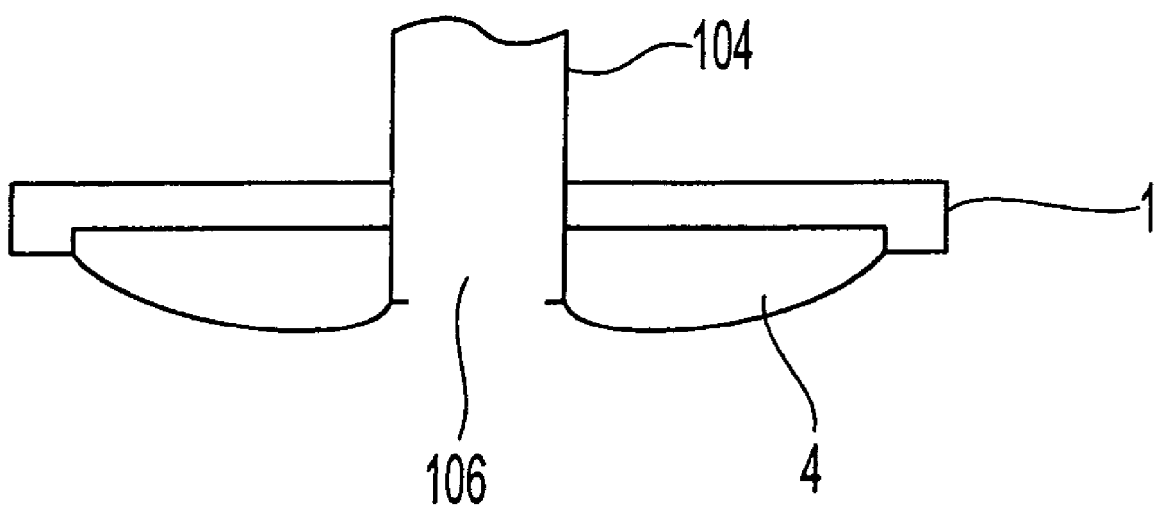
FIGS. 17A-17D show cross-sectional views of embodiments of the half-cells of this invention, where low-conductivity fluid is introduced via openings 106 within the contact area of the membrane 4 to the work-piece.
Figure 17B:
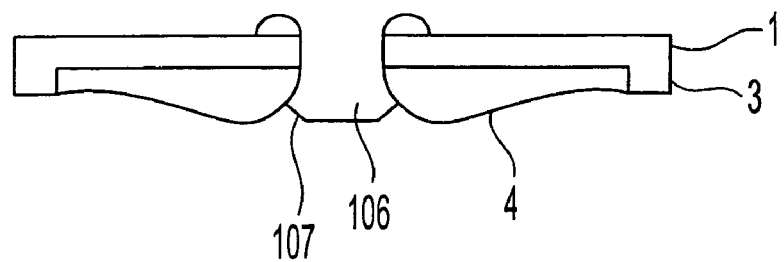
Figure 17C:
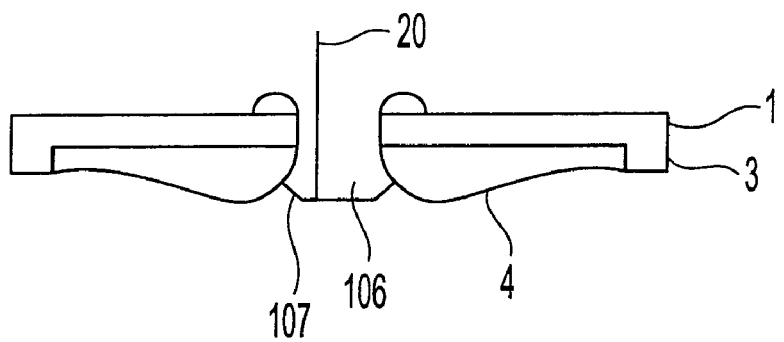
Figure 17D:
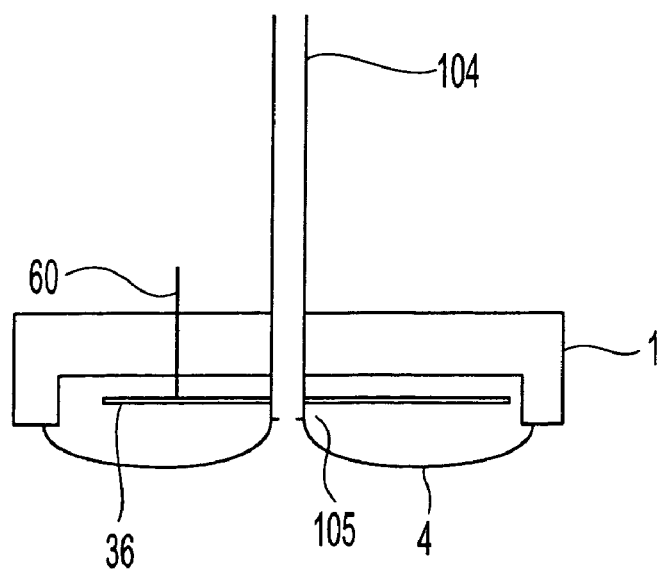

It is noted that the formation of the membrane is not unduly difficult, as the tubing 105 can be integral to and formed of the same material as the membrane, as shown in FIGS. 17A and 17D, while portion 104 can be formed of any compatible material. In its simplest form, shown in FIG. 17A, the membrane will have a donut shape and no part of the supply tube 104 need be formed from or contact the membrane. further, the opening 106 is not shown to scale, and it the total area of a plurality of openings 106 may extend across an area covered by 1 to 20% of the membrane-to-work-piece contact area. While operable, one problem with such a system is that there will be an unknown amount of gas and low-conductivity fluid in the reservoir 106, and fluid flow between the membrane and the work-piece surface will change with time as the reservoir 106 "pressures up", coupled with variable outward force as the amount of fluid changes and the outward-directed centripetal force exerted by the low-conductivity fluid changes. A window-frame structure which incorporates low-conductivity fluid transport structures, or even a structure which at some place lifts the membrane from the work-piece surface, or channels cut into the membrane surface, or combinations thereof, will help direct low-conductivity fluid from an inside reservoir 106 to the gap between the membrane and the work-piece surface.

In one embodiment, the polishing face contains low-conductivity fluid-permeable membranes or areas interspersed among the polishing membrane(s), wherein these fluid-permeable membranes do not polish but rather provide low-conductivity fluid which permeates from a source behind the fluid-permeable membranes, for example from a pressurized source of low-conductivity fluid, e.g., water. Such an embodiment can be seen for example in FIG. 17B, where the fluid-permeable membrane 107 having a source of low-conductivity fluid 106 is disposed along-side the polishing membrane 4. Channels or tubes extending through the half-cell can provide pressurized low-conductivity fluid to the back of the fluid-permeable membranes and subsequently to the work-piece surface. Alternatively or additionally, one or more sources of low-conductivity fluid can be provided. One option is to pump the low-conductivity fluid through a channel along or through the membrane. The addition of a protective covering may provide additional protection against dehydration, as discussed infra.

In one embodiment, the polishing face contains low-conductivity fluid-permeable membranes or structures interspersed among the polishing membranes, wherein these low-conductivity fluid-permeable contact an available, preferably pressurized, source of low-conductivity fluid, e.g., water. The membrane can be similar to a sponge-like or gauze-like protective coverings. Channels extending through the half-cell can provide low-conductivity fluid to the interface between the membrane and the work-piece, and additionally can provide a method of controlling temperature gain within the half-cell. In one embodiment, the membrane includes selected channels that are charge selective channels. The same membrane, however, may also contain channels that are permeable to one or more components of the low-conductivity fluid, for example water. The positive pressure in the half-cell can force water out said channels, providing a source of water and preventing dehydration of the membrane.

Mechanical transport of water to the interface area between membrane and substrate by movement of the work-piece with respect to the membrane appears to be the most important re-hydration process. In order to sustain a stable current and achieve effective polishing using the Membrane-Mediated Electropolishing process, electro-osmotic dehydration of the contact area should be balanced by diffusion of water through the membrane and by hydrodynamic transport from the reservoir of de-ionized water surrounding the contact. Advantageously method includes flushing low-conductivity fluid across the work-piece surface so that movement of the membrane across the surface re-hydrates the membrane. This requires some surface space that is not being polished, and the preferred ratio $A_c/A_p$ is preferably between about 0.03 and 0.25, for example between about 0.05 and 0.25. Preferably the source of low-conductivity fluid supplies low-conductivity fluid both outside and within any gaps within the outer periphery of the contact area between the membrane and the work-piece, e.g., gaps formed by a window frame-like structure.

Generally, low conductivity fluid can be supplied in a simple manner, for example a feed by hydrostatic pressure. If the low-conductivity fluid is being supplied via one or more small diameter conduits or such, it may be necessary to supply a pressurized low-conductivity fluid source. Generally, this can be supplied by any pump, be it steady state, pulsing, or combinations thereof. In some processes, such as when the low-conductivity fluid may be used in a static polisher to lift the membrane from the work-piece, or in the centered injectors in FIG. 7, for example, pressurized feed may be necessary to get the low-conductivity fluid to its desired location. Further discussion of improvements in the distribution of low-conductivity fluid will be discussed with reference to specific half-cell designs.

Conductivity Of The Low-conductivity Fluid: One purpose of the low-conductivity fluid is to reduce the electropolishing of a metal surface that is a greater distance from the membrane. Indeed, it is this function with is responsible for a portion of the increased planarization ability and efficiency of MMEP.

To so limit the anodic dissolution reaction, the electrical conductivity of the low-conductivity fluid advantageously is low. The most conductive low-conductivity fluid that we believe would be operable is a low-conductivity fluid having a conductivity of less than 5000 µS/cm. Such a system will not produce the smoothness required for copper damascene wafers used in the manufacture of integrated circuits. Additionally, the preferred criteria that the conductive electrolyte solution or gel have a conductivity at least 100 times, preferably at least 1000 times, more preferably about 10000 or more times greater than the conductivity of the low-conductivity fluid would be difficult or impossible to obtain with such a highly conductive "low-conductivity fluid." More realistically, a maximum conductivity for a commercially useful low-conductivity fluid is less than 1200 µS/cm, preferably less than 500 µS/cm, and even more preferably less than 200 µS/cm. Generally, the planarization efficiency of an MMEP process increases as the conductivity of the low-conductivity fluid decreases.

The electrical conductivity of the low-conductivity fluid can be as low as for example 0.1 µS/cm, e.g., the conductivity of ultrapure water. There is a tradeoff, however, as extremely low-conductivity implies greater cost of consumables, higher voltages and power consumption.

In one preferred embodiment, the low-conductivity fluid conductivity is below about 1000 µS/cm, preferably below about 500 µS/cm, more preferably below about 200 µS/cm, for example between about 0.5 µS/cm and about 150 µS/cm, typically below about 100 µS/cm, even more preferably below 50 µS/cm, for example between about 0.1 and about 10 µS/cm, alternately between about 1 µS/cm and about 10 µS/cm, on the work-piece surface. Conductivity below 0.1 µS/cm are operable but the benefits obtained by the decrease in conductivity below about 0.1 µS/cm are not cost-effective, as the cost of providing such low conductivity fluid or water increases substantially in this conductivity range. also, while very low-conductivity fluid is useful, such low-conductivity is not essential to achieve commercially acceptable planarization efficiency.

The low-conductivity fluid must have a conductivity sufficient to conduct the required current density, but the thickness of the layer of low-conductivity fluid between the membrane and the work-piece is kept low, e.g., we believe to about 0.01 to about 2 microns, so that the very low-conductivity fluids are operative. For example, at a conductivity of 1 µS/cm, areas more distant from the membrane than 100 microns would be effectively "protected" by ten kilo-ohms of resistance relative to areas that are in contact. This is sufficient to suppress the rate of oxidation of Cu at <10 V over potential.

In a preferred embodiment, the electrical conductivity of the low-conductivity fluid is between about 0.1 µS/cm and about 150 µS/cm, for example between about 0.2 µS/cm and about 10 µS/cm if the λ is greater than 10 microns, or alternately between about 11 µS/cm and about 50 µS/cm if the λ is between 1 and 10 microns. In another embodiment, the low-conductivity fluids have a conductivity of about 200 µS/cm or lower, for example between about 50 µS/cm and 200 µS/cm, alternatively between about 0.5 µS/cm and 50 µS/cm. We believe the best polishing performance, relative to cost of polishing, is provided by supplying an aqueous low-conductivity fluid having a conductivity between about 0.2 µS/cm and about 20 µS/cm.

Generally, the conductivity of the low-conductivity fluid can change substantially if dissolved carbon dioxide is present. For this reason it is preferred that the low-conductivity fluid be de-gassed and/or purged with an inert gas such as nitrogen. Maintaining a nitrogen atmosphere in the MMEP apparatus prevents air and other undesirable gases from entering therein, and at the same time prevents undesirable contaminant particulates from entering the polisher.

Generally, the viscosity of the low-conductivity fluid is between about 0.3 centipoise (cp) to about 100 cp, for example between about 0.8 cp to about 3 cp. More viscous compositions can inhibit ion transfer from the surface of the work-piece to the membrane.

Solvating Capacity Of The Low-conductivity fluid: To satisfy the solubility condition, the solvent or some component of the solution must be capable of solvating or otherwise coordinating the metal ions produced at the anode to create an ionic complex that is soluble and mobile within the membrane.

In a most preferred embodiment the low-conductivity fluid comprises, consists essentially of, or consists of water. A preferred low-conductivity fluid is pure water. However, the solubility of copper ions in pure water is very low. In Examples where low-rate polishing was performed such that n equal to 2 to 3, e.g., at <7V and I<500 mA/cm$^2$, it was not uncommon to find a thin layer of CuO over the surface or 2-5 µm dark particles presumed to be copper oxide embedded in the surface. By contrast, in the recent experiments at I>700 mA/cm$^2$ and n≧4 the surfaces appeared very clean with few or more typically no particulate defects under the microscope. Apparently under these conditions where n≧4, the production of protons via water oxidation is sufficient to prevent significant CuO and/or copper hydroxide precipitation. Therefore, while it is possible to perform membrane mediated electropolishing where the value of n is very near 2, by making the value of n be about 3 or higher, for example about 3.5 or higher, alternately about 4 (2 higher than the value needed to oxidize the metal on the substrate) a sufficient amount of protons are generated via water oxidation to prevent significant precipitation of CuO, CUCO$_3$, and/or Cu(OH)$_2$. Producing protons by electrolysis of water is a critical feature of the high-current density processes, and the protons so generated functions differently than addition of an acid reagent to the low-conductivity solvent. These protons, formed by electrolysis, are formed in a ratio with the amount of copper ions formed, and thus the amount of protons generated can be made to always be sufficient to solubilize the copper. That is, at n equals 4 e/Cu, 2 protons are produced for each Cu atom oxidized, which is approximately the amount of protons required in an aqueous system to prevent CuO precipitation. The protons formed by electro-oxidation of water have no appreciable counter-ions, and therefore do not increase the conductivity of the low-conductivity fluid as much as would an equivalent amount of acid mixed with the low-conductivity fluid. Also in the absence of counter-ions the protons pass through the membrane, maintaining the acid balance in the membrane so the copper ions formed from oxidation of the substrate do no precipitate within the membrane. Finally, since both protons and Cu$^{+2}$ ions are produced electrochemically (without counter ions) and migrate through the membrane, the conductivity of the surrounding low-conductivity fluid (i.e., in regions where the membrane is separated from the substrate surface by a layer of low-conductivity fluid in an amount sufficient to inhibit copper oxidation) remains low.

The nature of the anode reaction may also be influenced by the composition of the low-conductivity solvent in other ways. For example, when MMEP is used to polish a Cu damascene wafers in contact with deionized water, oxidation occurs via 2-electron oxidation to Cu$^{+2}$. However, when the same process is repeated using aqueous acetonitrile (and/or propionitrile and/or butyronitrile), which is known to stabilize Cu$^{+1}$, the amount of Cu removed per coulomb of charge passed increases by a factor of 2 indicating 1-electron oxidation to Cu$^{+1}$.

In one embodiment the low-conductivity fluid comprises, consists essentially of, or consists of water, acetonitrile, ethylene carbonate, propylene carbonate, glycol, ethylene glycol, propylene glycol, diethlyene glycol, or mixtures thereof. In another embodiment, which is especially useful for copper, the low-conductivity fluid comprises, consists essentially of, or consists of water, one or more soluble nitriles, for example acetonitrile, proprionitrile, and/or butyronitrile, one or more alkanolamines, such as ethanolamine, diethanolamine, triethanolamine, isopropanolamine, ethylene diamine, or mixtures thereof. Generally, if the low-conductivity fluid comprises a nitrogen-containing ligand or ligands that can complex with copper, it is advantageous if the polishing process operate at n between about 1 to at most 3, for example between 1.5 and 2.5. Oxygen will oxidize and etch a layer of bare copper at room conditions in the presence of amine solvents even in the absence of a current.

In one variant of the embodiments of the invention, the low-conductivity fluid used in MMEP that contacts both the anode (work-piece) and the external surface of the membrane can be a composition comprising one or more of water, selected solvents, and less than 300 ppm surfactants and/or viscosifying agents. The surfactants can include "passivating" surfactants or surface-active agents. Such agents may tend to plate onto the surface of the work-piece, inhibiting electropolishing at these locations, e.g., in depressions within the surface. Such a surfactant or surface active agent must be compatible with contacting the membrane, e.g., must not plug the membrane, and should be readily swept away by contact with the membrane. In another embodiment the low-conductivity fluid can be a gel.

Generally, the pH is determinative of the metal-ion solvating capacity of the low-conductivity fluid. In some instances, it is preferable to use a very dilute aqueous acid solution as the low-conductivity solution rather than deionized water, to prevent precipitation of for example copper ions or other metals which may form in the presence of water at neutral or basic pH. Optionally the low-conductivity fluid comprises water and one or more acids in an amount sufficient to provide a low-conductivity fluid pH between about 2 and 6.9. More preferably, the low-conductivity fluid is water substantially free of acid, wherein protons are created via the electrolysis of water to provide a local pH between about 2 and 4. With the electrolytic formation of protons in the low-conductivity fluid, the ability of the low-conductivity fluid to dissolve and transport copper ions is increased, and the thickness of the layer of low-conductivity fluid between the membrane and the substrate surface is beneficially reduced.

However, it is also known in the art that some metals (or metal complexes) are more stable in basic compositions, and for these metals the low-conductivity fluid further comprises base sufficient to maintain for example a pH of greater than 9, for example between about 10 and 12. Useful bases include ammonium hydroxide, halide hydroxides, ammonium sulfate, or salts of carboxylic acids. xxx In an alternate embodiment the low-conductivity fluid further comprises a buffer sufficient to maintain a pH during electropolishing of within about 0.2 pH units of the initial pH. In an alternate embodiment the low-conductivity fluid further comprises a chelator.

Specific examples of preferred water-based low-conductivity fluids include fluids that comprise, consist essentially of, or consist of 1) pure, very low-conductivity water, 2) pure, very low-conductivity water having from 0.1% to 70% acetonitrile, pure, very low-conductivity water having from 0.1% to 50% ethanolamine; and 4) pure, very low-conductivity water having from 0.1% to 70% ethylene diamine. Alternate examples of low-conductivity fluids comprise, consist essentially of, or consist of 1) acetonitrile, ethanolamine, ammonia, ethylene diamine, or mixture thereof, or any one or more of the above further including 0.01% to less than 30% by weight of pure, very low-conductivity water. In any of the above, the fluid may additionally comprise a trace of acid, e.g., less than about 0.001 weight percent acid such as sulfuric acid, phosphoric acid, nitric acid, organic acid, or combination thereof.

In one preferred embodiment of the above described composition, the low-conductivity fluid comprises, consists essentially of, or consists of water and acetonitrile. In a more preferred embodiment the amount of acetonitrile is sufficient to give an electropolishing efficiency of between one metal atom, e.g., one copper atom, per 1 to 1.99 electrons of current flow.

In another embodiment of the above described composition, the low-conductivity fluid comprises, consists essentially of, or consists of water and glycols, wherein the term glycols includes for example glycol, ethylene glycol, propylene glycol, diethlyene glycol, proplylene glycol monomethyl ether, or mixtures thereof.

In one embodiment the low-conductivity fluid comprises, consists essentially of, or consists of water and at least one of acetonitrile, proprionitrile, butyronitrile, glycol, an alcohol having from 1 to 8 carbon atoms, ethylene glycol, propylene glycol, diethlyene glycol, proplylene glycol monomethyl ether, propylene carbonate, ethylene carbonate, and dimethylformamide. In another embodiment this low-conductivity fluid further comprises acid sufficient to maintain for example a pH of between about 3.9 to about 6.5, for example between about 4.5 to about 6. Acids can include for example phosphoric acid, pyrophosphoric acid, carboxylic acids, or mixtures thereof. Other acids are specified for selected metals as discussed infra. In an alternate embodiment this low-conductivity fluid further comprises a buffer sufficient to maintain a pH during electropolishing of within about 0.2 pH units of the initial pH. In an alternate embodiment this low-conductivity fluid further comprises a chelator.

In an alternate embodiment this low-conductivity fluid further comprises a chelator. In the above embodiments chelators can optionally be added. In other embodiments, the low-conductivity fluid is substantially free of chelators, except for acetonitrile or other substantially non-polar coordinating ligands, or small quantities, e.g., 0.005% to 0.2%, of one or more of dicarboxylic acids or citric acid. In some cases, the chelators and/or chelated metal complexes have an electrical charge which helps the complex migrate toward the membrane, so long as the overall conductivity constraints of the low-conductivity fluid are met. However, the chelator-metal complex is advantageously able to either release the metal ion to the membrane, or must be able to pass through the membrane. Chelators include those chelators normally found in the art, e.g., EDTA, DTPA, citric acid, di-functional organic acids including for example di- or multi-hydroxybenzene-type compounds, e.g., such as catechol, butylated hydroxytoluene ("BHT"), and the like; dicarboxylic acids such as oxalic acid, malonic acid, succinic acid, glutamic acid, adipic acid, maleic acid, fumaric acid, phthalic acid, isophthalic acid, terephthalic acid and the like; tricarboxylic acids such as citric acid, aconitic acid, trimellitic acid and the like; hydoxycarboxylic acids such as glycolic acid, gallic acid, lactic acid, 2-hydroxybutyric acid, tartaric acid, malic acid, salicylic acid, and the like; ketocarboxylic acids, such as acetoacetic acid, ketoglutaric acid and the like; aminocarboxylic acids such as aspartic acid, glutamic acid and the like; aminopolycarboxylic acids such as EDTA, DTPA, and the like; aminocarboxylic acids; diamines, e.g., such as ethylene diamine; or a combination of any such chelating agents. Generally, if chelators are present, it is preferred that the chelator-metal complex be able to pass through the membrane, or that the chelator readily release the metal ion to allow the metal ion to pass through the membrane. Of course, any acidic chelator can be present partially or completely as a salt, e.g., an ammonium salt. In some embodiments the chelator comprises one or more of salicylic acid, gallic acid, glycolic acid, citric acid, or mixture thereof.

Additionally or alternatively, in any of the above embodiments, viscosifying agent which are typically polymeric, or viscosity reducers such for example 0.01% to 20% by weight of a small quantity a low molecular weight alcohol, can also be included.

Non-Water-Based Low-conductivity fluid: Most of the above-described low-conductivity fluid compositions described above comprise as a major ingredient water. Many low-k materials used on integrated circuit wafers are damaged by exposure to water. Damage can often be minimized if the water content of fluid contacting the low-k material has less than a certain percent water. It should be noted, however, that the invention contemplates the use of low-conductivity fluids that 1) have water as a minor component, i.e., less than 50% by weight, typically less than 30% by weight, or 2) are substantially free of water i.e., less than 10% by weight, typically less than 5% by weight of water. Generally, it is necessary for some component in the low-conductivity fluid to coordinate with and solvate the metal ions. In one embodiment, the low-conductivity fluid comprises, consists essentially of, or consists of an amine, an amide, a nitrile, or mixture thereof, and optionally water or other solvent.

In one embodiment, the low-conductivity fluid comprises, consists essentially of, or consists of a mono-alkanolamine and optionally water or other solvent. In a more preferred embodiment the alkanolamine is present in an amount sufficient to give a electropolishing efficiency of one metal atom per less that two electrons of current flow, wherein the metal ion is most stable in water as a plus-2-charged species.

In one preferred embodiment, the low-conductivity fluid comprises, consists essentially of, or consists of a nitrile-containing solvent, and optionally water or other solvent. In a more preferred embodiment the nitrile-containing solvent is present in an amount sufficient to give a electropolishing efficiency of one metal atom per less that two electrons of current flow, wherein the metal ion is most stable in water as a plus-2-charged species.

In one embodiment, the low-conductivity fluid comprises, consists essentially of, or consists of one or more soluble nitrites, for example acetonitrile, proprionitrile, butyronitrile, or mixture thereof. In an alternate embodiment this low-conductivity fluid can further comprise one or more polar organic solvents, e.g., ethylene carbonate, propylene carbonate, glycol, ethylene glycol, propylene glycol, diethlyene glycol, or mixtures thereof. The water content of this low-conductivity fluid is less than 50% by weight, preferably less than about 30% by weight, or alternately is less than 10% by weight, typically less than 5% by weight. In one embodiment, the low-conductivity fluid comprises, consists essentially of, or consists of one or more alkanolamines, such as ethanolamine, diethanolamine, triethanolamine, isopropanolamine, or mixture thereof. In one embodiment, the low-conductivity fluid comprises, consists essentially of, or consists of ethylene diamine or other copper-complexing amine. In an alternate embodiment this low-conductivity fluid can further comprise one or more polar organic solvents, e.g., ethylene carbonate, propylene carbonate, glycol, ethylene glycol, propylene glycol, diethlyene glycol, or mixtures thereof. The water content of this low-conductivity fluid is less than 50% by weight, preferably less than about 30% by weight, or alternately is less than 10% by weight, typically less than 5% by weight.

In one embodiment, the low-conductivity fluid comprises, consists essentially of, or consists of one or more diamines, such as ethylene diamine. In an alternate embodiment this low-conductivity fluid can further comprise one or more polar organic solvents, e.g., ethylene carbonate, propylene carbonate, glycol, ethylene glycol, propylene glycol, diethlyene glycol, or mixtures thereof. The water content of this low-conductivity fluid is less than 50% by weight, preferably less than about 30% by weight, or alternately is less than 10% by weight, typically less than 5% by weight.

In one embodiment, the low-conductivity fluid comprises, consists essentially of, or consists of one or more soluble nitriles, for example acetonitrile, proprionitrile, or butyronitrile, one or more alkanolamines, such as ethanolamine, diethanolamine, triethanolamine, or isopropanolamine, one or more diamines, such as ethylene diamine, or any mixture thereof. In an alternate embodiment this low-conductivity fluid can further comprise one or more polar organic solvents, e.g., substituted sulfoxides including dimethyl sulfoxide; glycols including glycol, ethylene glycol, diethlyene glycol, triethlyene glycol, ethylene glycol alkyl ether, diethylene glycol alkyl ether, triethylene glycol alkyl ether, propylene glycol, dipropylene glycol, propylene-ethylene glycols, and propylene glycol alkyl ether, e.g., proplylene glycol monomethyl ether, N-substituted pyrrolidones such as N-methyl-2-pyrrolidone (NMP), sulfolanes, substituted sulfones including 2,4-dimethylsulfone, substituted amides including dimethylacetamide or dimethylformamide, ethylene carbonate, propylene carbonate, or any combination thereof. The water content of this low-conductivity fluid is less than 50% by weight, preferably less than about 30% by weight, or alternately is less than 10% by weight, typically less than 5% by weight.

In another embodiment, which is especially useful for copper, the low-conductivity fluid comprises, consists essentially of, or consists of acetonitrile, proprionitrile, and/or butyronitrile, one or more alkanolamines, such as ethanolamine, diethanolamine, triethanolamine, isopropanolamine, ethylene diamine, or mixtures thereof. In another embodiment the low-conductivity fluid can further comprise ammonia. Surprisingly, in those formulations having sufficient soluble nitriles, ammonia, alkanolamines, and/or diamines, the value of n may be less than 2 electrons per metal atom, though efficiencies between about 2.5 to 4.5 electrons per metal ion generated is more common. These complexing solvents can stabilize a single-charged copper complex, i.e., Cu(I). In a preferred embodiment the amount of these nitrogen-containing solvents in the low-conductivity fluid is sufficient to give a electropolishing efficiency of between one copper atom per 1 to 1.99 electrons of current flow.

In a more preferred embodiment, the low-conductivity fluid and the electrolyte solvent each independently comprise, consist essentially of, or consist of acetonitrile, proprionitrile, butyronitrile, or mixture thereof, wherein the amount of acetonitrile is sufficient to coordinate and stabilize metal single-charged ions, e.g., $Cu^{+1}$, give a electropolishing efficiency of between one metal atom, e.g., one copper atom, per 1 to 1.99 electrons of current flow.

If, however, the low-conductivity fluid stabilizes Cu(I) ions, and the only stable configuration of copper in the electrolyte solution or gel is Cu(II), then copper may plate out on or in the membrane. In an experiment using pure acetonitrile as the low-conductivity fluid and a mixture of acetonitrile and tetramethylammonium hexafluorophosphate as the electrolyte, the electrolyte being separated from the low-conductivity fluid by a Nafion® membrane, the unit passed current to the work-piece, electropolished metal therefrom, and solvated the polished metal. This has utility especially if the work-piece comprises materials that are adversely affected by water, though the current density was low and adhesion, presumably due to "dehydration or "de-solventation" of the membrane, was severe.

In one embodiment the low-conductivity fluid comprises, consists essentially of, or consists of an alcohol having from 1 to 8 carbon atoms and at least one of acetonitrile, glycol, ethylene glycol, propylene glycol, diethlyene glycol, proplylene glycol monomethyl ether, propylene carbonate, ethylene carbonate, N,N-dimethlyacetamide, N-methylpyrolidone and dimethylformamide.

In one embodiment the low-conductivity fluid comprises, consists essentially of, or consists of a glycol and at least one of acetonitrile, proplylene glycol monomethyl ether, propylene carbonate, ethylene carbonate, and dimethylformamide. In one embodiment this low-conductivity fluid comprises, consists essentially of, or consists of a glycol and acetonitrile.

In one embodiment the low-conductivity fluid comprises, consists essentially of, or consists of propylene carbonate, ethylene carbonate, or mixture thereof.

In one embodiment the low-conductivity fluid comprises, consists essentially of, or consists of a non-polar organic solvent and at least one of acetonitrile, glycol, ethylene glycol, propylene glycol, diethlyene glycol, proplylene glycol monomethyl ether, propylene carbonate, ethylene carbonate, and dimethylformamide.

In one embodiment the low-conductivity fluid comprises, consists essentially of, or consists of a polar organic solvent. Generally, an amount of any component is a function of the solvating capacity, lubricating qualities, and conductivity of that component. Examples of polar organic solvents include substituted sulfoxides including dimethyl sulfoxide; glycols including glycol, ethylene glycol, diethlyene glycol, triethlyene glycol, ethylene glycol alkyl ether, diethylene glycol alkyl ether, triethylene glycol alkyl ether, propylene glycol, dipropylene glycol, propylene-ethylene glycols, and propylene glycol alkyl ether, e.g., proplylene glycol monomethyl ether, N-substituted pyrrolidone such as N-methyl-2-pyrrolidone (NMP), sulfolanes, substituted sulfones including 2,4-dimethylsulfone, substituted amides including dimethylacetamide, or any combination thereof. We found that certain solvents, e.g., toluene and dichloromethane, were inoperative. However, it is anticipated that these solvents can be used if combined with a sufficient quantity of other solvents and with acetonitrile or other R-nitrile group that is miscible with the non-operative organic solvents. In another embodiment the low-conductivity fluid comprises a polar organic solvent and at least one of acetonitrile, propylene carbonate, ethylene carbonate, and dimethylformamide.

In one embodiment, the low-conductivity fluid comprises, consists essentially of, or consists of a fluid that is substantially immiscible in the electrolyte. For example, the low-conductivity fluid may comprise a non-polar organic solvent, or a solvent with a substantial non-polar character, such as an alkyl-benzene, or an alcohol with greater than 8 carbon atoms. Advantageously, this organic-based low-conductivity fluid has a sufficient capacity to solubilize the metal ions. Alternatively, this low-conductivity fluid further comprises one or more compounds to coordinate with the metal ions, wherein said compound or compounds are present in an amount sufficient to solubilize the metal ions removed from the work-piece. One example of such compounds is surfactants, such as alkyl sulfonates where the alkyl group comprises for example more than six carbon atoms. Acetonitrile, proprionitrile, butyronitrile, and/or any R-nitrile (where R is a C1 to C9 alkyl or aryl moiety) compatible with the membrane and the work-piece, are another example. Other chelators soluble in the organic-based low-conductivity fluid can be included. An advantage of this embodiment is the membrane can more readily keep the electrolyte within the cathode half-cell, as the electrolyte can be selected to have negligible solubility in the organic-based low-conductivity fluid.

Another advantage of the organic-based low-conductivity fluid is that such fluids can have conductivities lower than even relatively pure water.

In one embodiment, the low-conductivity fluid and the electrolyte solvent can be only slightly miscible one with another. For example, 2,4-dimethylsulfolane is only slightly miscible with water and for such an embodiment, the electrolyte solvent can comprise or consist of 2,4-dimethylsulfolane and the low-conductivity fluid can comprise or consist essentially of water, or the electrolyte solvent can comprise or consist of water and the low-conductivity fluid can comprise or consist essentially of 2,4-dimethylsulfolane. Similarly, butyronitrile is only slightly miscible with water. The combination can comprise 2 or more nitriles, e.g., acetonitrile in one fluid and butyronitrile in the other fluid, for example.

In the above embodiments chelators can optionally be added. Alternatively, the low-conductivity fluid can be substantially free of chelators. In some cases, the chelators and/or chelated metal complexes have an electrical charge which helps the complex migrate toward the membrane, so long as the overall conductivity constraints of the low-conductivity fluid are met. Again, it is preferred for low-conductivity fluids to use chelators with low holding coefficients, e.g., dicarboxylic acids and the like. The chelator-metal complex is advantageously able to either release the metal ion to the membrane, or must be able to pass through the membrane. Chelators include those chelators normally found in the art, e.g., EDTA, DPTA, citric acid, di-functional organic acids including for example di- or multi-hydroxybenzene-type compounds, e.g., such as catechol, butylated hydroxytoluene ("BHT"), and the like; dicarboxylic acids such as oxalic acid, malonic acid, succinic acid, glutamic acid, adipic acid, maleic acid, fumaric acid, phthalic acid, isophthalic acid, terephthalic acid and the like; tricarboxylic acids such as citric acid, aconitic acid, trimellitic acid and the like; hydoxycarboxylic acids such as glycolic acid, gallic acid, lactic acid, 2-hydroxybuteric acid, tartaric acid, malic acid, salicylic acid, and the like; ketocarboxylic acids, such as acetoacetic acid, ketoglutaric acid and the like; aminocarboxylic acids such as aspartic acid, glutamic acid and the like; aminopolycarboxylic acids such as EDTA, DPTA, and the like; amino-carboxylic acids; diamines, e.g., such as ethylene diamine; or a combination of any such chelating agents. Generally, if chelators are present, it is preferred that the chelator-metal complex be able to pass through the membrane, or that the chelator readily release the metal ion to allow the metal ion to pass through the membrane. Of course, any acidic chelator can be present partially or completely as a salt, e.g., an ammonium salt. In some embodiments the chelator comprises one or more of salicylic acid, gallic acid, glycolic acid, citric acid, or mixture thereof.

Additionally or alternatively, in any of the above embodiments, between about 0.001% to 0.1% of viscosifying agents, which are typically polymeric, can be added. Alternatively, to reduce the viscosity, a low molecular acid may be added, for example. Very little is required to reduce viscosity of water, so for example 0.001% to 0.1% by weight of a small quantity a low molecular weight alcohol, can also be included.

Additionally or alternatively, in any of the above embodiments, a surfactant can also be included at for example 0.001% to 0.03% by weight. Specifically preferred are surfactants which coat and passivate the surface of the work-piece not contacted by the membrane. Such surfactants can be used to passivate the surface of the work-piece. Preferred surfactants can adhere to the work-piece surface, for example adhere to materials not to be polished, or adhere to materials to be polished and be wiped off by the mechanical action of the polishing. Generally, if the surfactant bonds primarily to metal, and is wiped off by the sliding action of the half-cell, then as the wafer becomes planarized the utility of the passivator is reduced. In one embodiment, the wafer is exposed to a passivating agent, e.g., a surfactant, before MMEP or in the early portion of the MMEP process, but then the passivating agent is reduced or eliminated as the MMEP process continues.

Figure 4A:
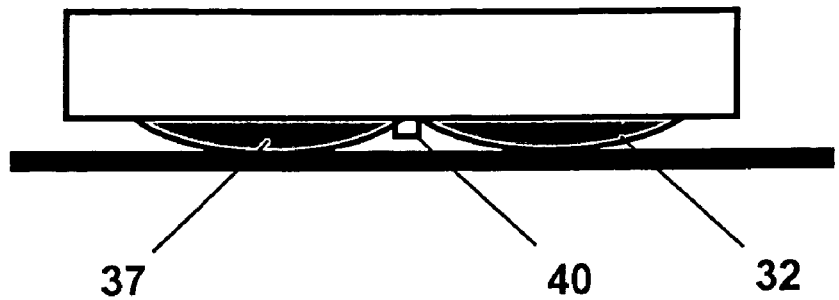
FIG. 4A is a side elevation of a cathode half-cell with a single membrane-sealed window partitioned by means of a bisecting window frame-like structure 40 and in contact with a work-piece.
Figure 4B:
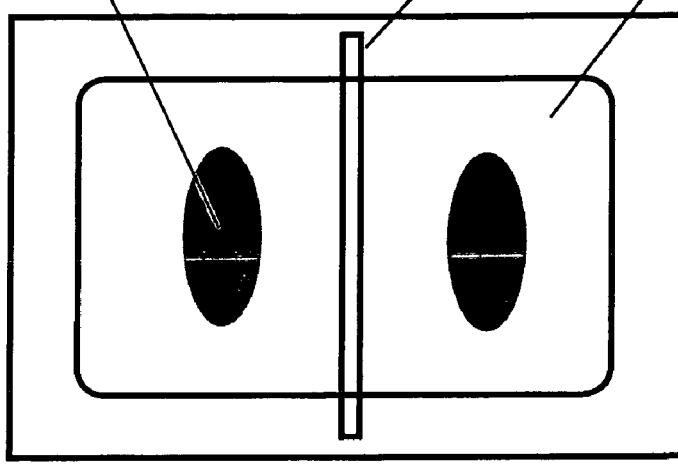
FIG. 4B is a plan view showing the bisected membrane-sealed window of FIG. 4A and indicating the areas of contact 37 between the membrane and the work-piece.

WINDOW FRAME-LIKE STRUCTURE: Another objective of the invention is to maximize the fraction of the total membrane surface area which contacts the work-piece. One way to increase the number of contact areas and to increase the net contact area is to partition a single membrane-sealed window 32 using thin sections of material which are sufficiently stiff to constrain expansion of the membrane. The cathode half-cell of the invention for use in membrane-mediated electropolishing will thereafter effectively comprise a plurality of windows or openings through which the charge-selective ion-conducting membrane external surface is wholly or partially accessible to contact the work-piece and a low-conductivity solvent or solution. To optimize the rate of polishing or planarization using the MMEP process it is desirable to increase the area of contact and/or the number of areas of contact between the work-piece and the cathode half-cell, or to simultaneously employ a multiplicity of cathode half-cells. As discussed infra, the membrane generally exhibits a curved shape, for example like a blister, in part resulting from internal pressure. For a cathode half-cell with a single membrane-sealed window such as that shown in FIG. 3 the contact area is determined by the natural contour of the expanded membrane and represents only a fraction of the total external surface area of the membrane. One way to increase the number of contact areas and to increase the net contact area is to partition a single membrane-sealed window 32 using thin sections of material which are sufficiently stiff to constrain expansion of the membrane, e.g., in a window-frame-type structure. See, for example, FIG. 39. FIGS. 4A and 4B show an example where a single partition 40 is used to bisect a single membrane-sealed window to create two separate contact areas 37 which utilize a larger fraction of the total membrane area than the same half-cell in the absence of the partition.

Figure 4C:
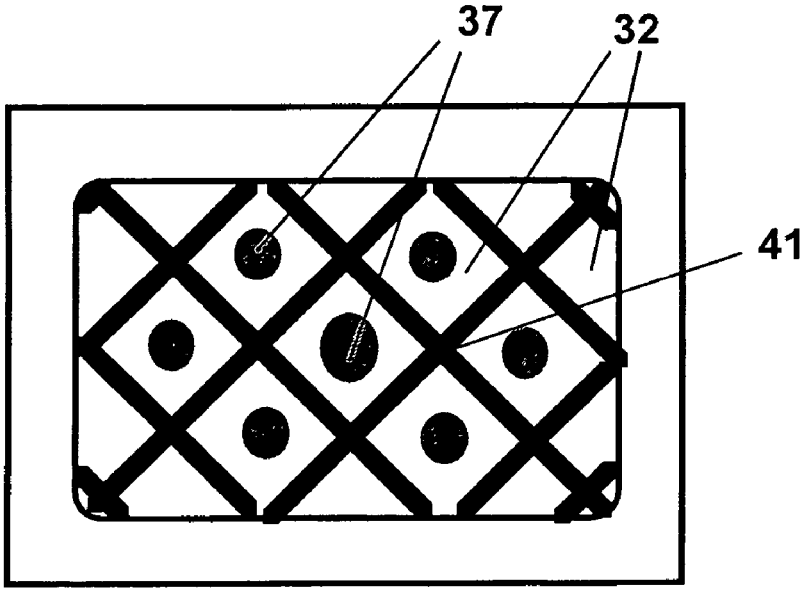
FIG. 4C is a plan view showing of a cathode half-cell with a single membrane-sealed window partitioned into a plurality of windows 32 by means of a window frame-like structure 41 and indicating the multiple areas of contact 37 between the membrane and the work-piece.

A window-frame-like structure can be a support between the charge-selective ion-conducting membrane and the work-piece, sub-dividing the membrane into a plurality of windows, and allowing very repeatable placement of areas of contact between the charge-selective ion-conducting membrane and the work-piece surface within each window. The window-frame-like structure can have the appearance of a window frame, a honeycomb, or the like, having holes therethrough of sufficient size that the ion-conducting membrane can contact the work-piece surface. An example of this strategy is shown in FIG. 4C where a window-frame-like structure 41 consisting of an open array of woven glass fibers coated with poly(vinyl chloride) is sealed into the cathode half-cell in front of the membrane. That is, the membrane can be restrained by a structure disposed between the membrane and the work-piece surface, and/or by a similar structure attached to the membrane on the inside of the half-cell, which constrains the outward expansion of the membrane. The openings in this window-frame-like structure provide multiple contact areas and utilize a larger fraction of the total membrane area than the same half-cell in the absence of the screen. The window-frame-like structure can be laminated to the ion-conducting membrane or can be separate from the membrane, if the structure is located exterior to the membrane. The structure alternatively be attached to the base of the half-cell, or it can be separate from and move independently of the half-cell.

The structure can advantageously be made of any material that is substantially inert and sufficiently stiff to constrain expansion of the membrane, and that is connectable to the membrane if located inside the half-cell volume, or is non-scratching and tough if it is located between the membrane and the work-piece. The structure can even be built into the membrane. For example, charge-selective ion-conducting materials can be fabricated into composite membranes by coating the membrane polymer onto a reinforcing web comprised of glass or polymer fibers (such reinforced membranes are available commercially), or a micro-porous polymer film. The window-frame-like structure can provide an abrasive or wiping function as the window-frame-like structure is swept across the surface of a work-piece. In one embodiment the window-frame-like structure is formed from a polymer comprising a perfluorocarbon polymer, providing chemical inertness and a slidable surface.

Figure 8A:
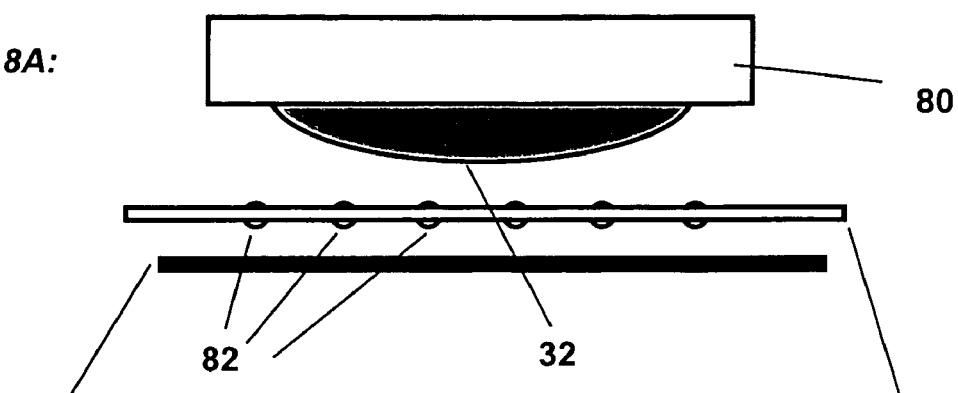
FIG. 8A shows a schematic elevation of a cathode half-cell 80 with single membrane-sealed window 32 separated from the work-piece by an independently supported roller frame (window-frame-type structure) 81.
Figure 8B:
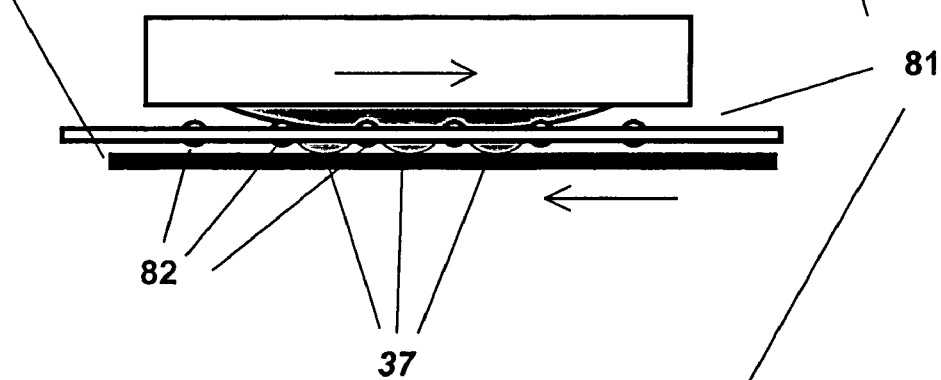
FIGS. 8B and 8C show a schematic elevations of the half-cell 80 and roller frame 81 of FIG. 8A pressed against the surface of a work-piece and having areas of contact 37 with half-cell and work-piece moving in opposite directions relative to the roller frame 81.
Figure 8C:
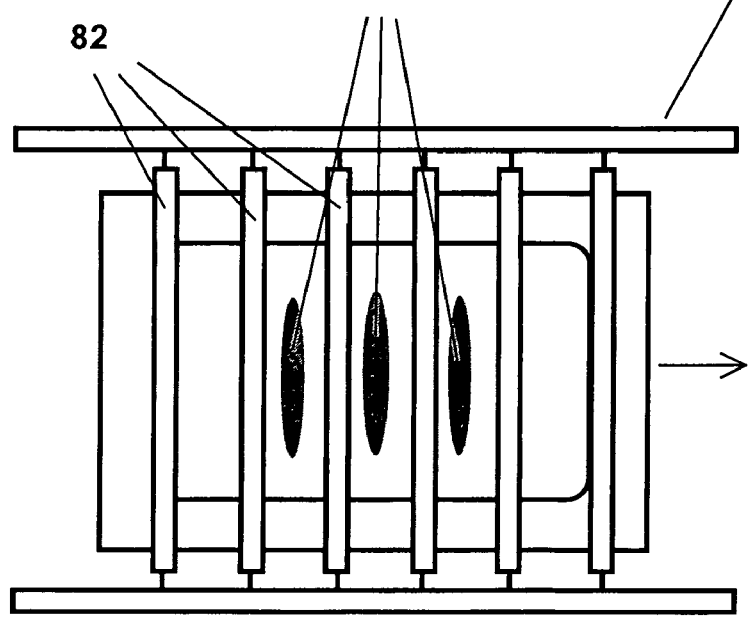

Yet another embodiment of the invention provides a way to optimize the utilization of membrane in the MMEP process and another means to move the area of membrane contact across the surface of the work-piece. As illustrated in FIGS. 8A-8C, cathode half-cells with a single membrane-sealed window 80, similar to that in FIG. 3, is provided together with an independent frame 81 comprising two rigid parallel support members across which are mounted a series of freely rotating rollers 82 at regular distances appropriate to provide partitions in the membrane-sealed window. As shown in FIG. 8C, these rollers must be mechanically stiff and thinner in diameter than the convex extension of the expanded membrane 32 and longer than the width of the membrane-sealed window. The rollers may be constructed of electrically non-conducting materials or else must be protected by an insulating coating and may comprise, for example, thin needle bearings or thin cylinders supported on tensioned steel wires. In operation, as illustrated in FIG. 8B, the rollers rest on the surface of the work-piece with no mechanical constraints in the directions indicated by the arrows, while the half-cell is pressed against the upper surface of the rollers so that the external surface of the membrane forms a series of parallel contact areas 37 between neighboring pairs of rollers. As in any embodiment of the MMEP process, the work-piece must be covered by a low-conductivity solvent or solution. During the process the half-cell is translated back and forth along an axis perpendicular to the rollers with no mechanical constraints on the roller frame. Friction causes the membrane to ride over the surface of the rollers and thereby continuously carry new areas of membrane into contact with the work-piece. At the same time the rotation of the rollers causes the areas of contact to move across the surface of the work-piece in the opposite direction.

Figure 37:
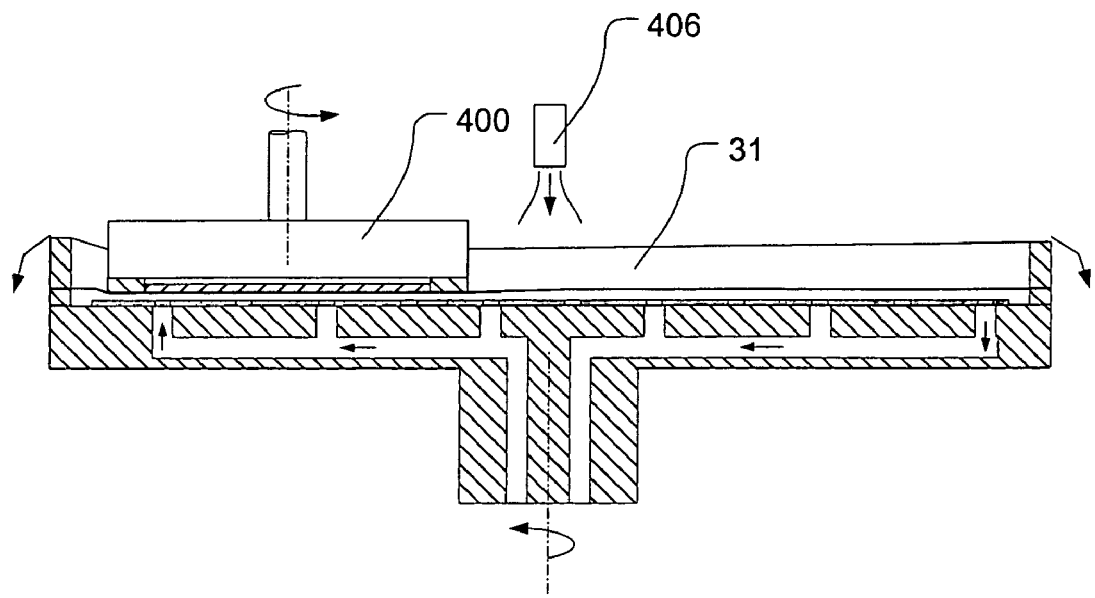
FIG. 37 shows a polishing assembly as in FIG. 34B, additionally containing sides holding in pool of a pre-selected depth of low-conductivity fluid 31, where the height of the low-conductivity fluid advantageously approximately equals the hydrostatic pressure within the half-cell.
Figure 38:
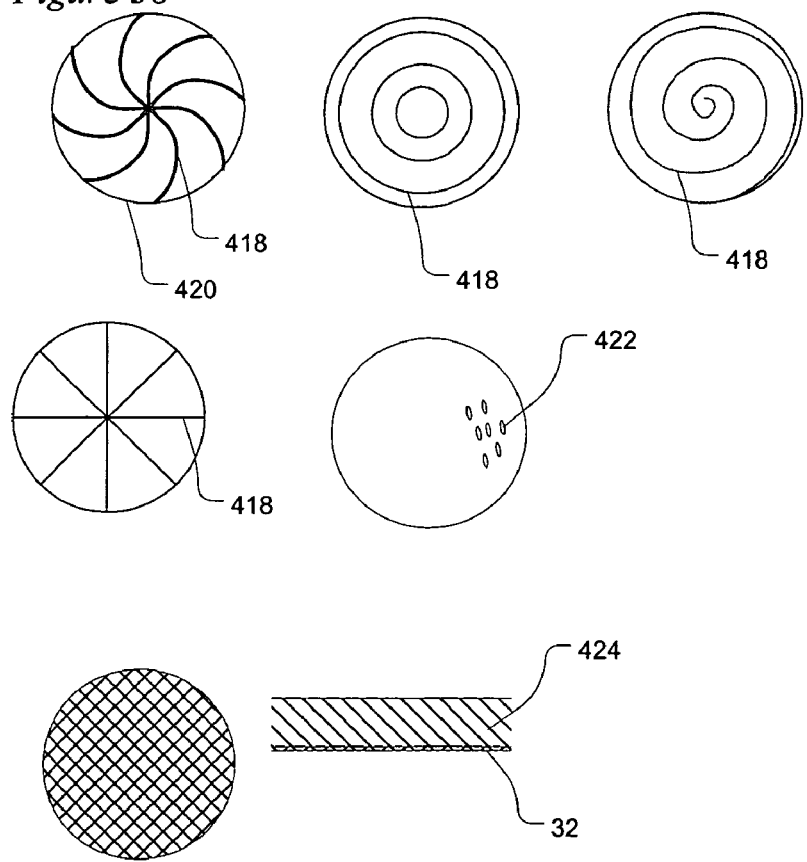
FIG. 38 shows a variety of designs for channels and/or window frame-like structures disposed over or under the membrane 418 to be made in a membrane and/or in a porous open structure disposed over the membrane 420, which will aid in distributing low-conductivity fluid, in removing oxygen gas, in providing an electrical connector from the positive terminal of the power supply to the work-piece surface, or combination thereof, where an open pad 424 is shown disposed over and laminated to pad 32, and also showing openings 424 where low conductivity fluid may be provided, by for example channels shown in FIG. 7.

In some embodiments of the invention, a window frame-like structure is disposed between the charge-selective ion-conducting membrane and the work-piece, wherein the window frame-like structure has holes of sufficient size to allow sensible contact between the membrane and the work-piece surface. Such an optional window frame-like structure may be extremely thin, e.g., on the order of about 0.01 microns to about 20 microns thick, typically from 0.01 microns to about 2 microns thick, for example between about 0.1 and 0.5 microns thick, such that the holes through which the membrane protrudes need not be large. This optional structure usually contacts the surface of the wok-piece, but it does not need to do so. The force exerted by such a structure on the membrane is not due to the strength of such a thin structure, but is generally due to the structure being disposed between the work-piece and the membrane pressing against the work-piece. Such a structure can provide predetermined areas where the membrane is raised away from the substrate, which can be areas of low or no current density. The optional structure generally extends over the entire lateral extent of the contact area between the charge-selective ion-conducting membrane and the work-piece. The optional structure can be separate from or laminated to the charge-selective ion-conducting membrane. The optional structure can be attached to or separate from the cathode half-cell. The optional structure can have the appearance of a window frame, honeycomb, or the like, providing support between the charge-selective ion-conducting membrane and the work-piece, but not completely covering the charge-selective ion-conducting membrane and the work-piece. In one such embodiment, the protective covering can have the appearance of a thin mesh. Other useful designs are shown in FIG. 38. Because the membrane is compliant, if the membrane is submerged in low-conductivity fluid such as is seen in FIG. 37, the complicated designs which incorporate gimbals and back pressure control are not necessary. Generally, the optional structure is formed from plastic and may incorporate a halo-carbon polymer, e.g., a fluorocarbon polymer, providing chemical inertness and a slidable surface. Any optional structure that is substantially inert and tough will suffice.

One problem with many systems that are proposed to bring in low-conductivity fluid into the area between the membrane and the work-piece is that the systems are all fixed in location relative to the membrane, and water depletion can also be rather regular, so there is always a possibility that an area is perennially dehydrated and is not polishing to the expected criterion. Generally, in one embodiment the low-conductivity fluid can comprise between about 0.5% to about 20% by weight of non-conductive polymeric beads having a particle size between about 0.1 microns to about 3 microns. The purpose of these beads is to form a plurality of random, moving, partially filled voids disposed between the membrane and the work-piece surface. Such beads as they pass between the membrane and the substrate surface will give up entrapped water in the partially filled void to a dehydrated area, and will gather up and help transport away small accumulations of gas.

In other polishing methods, where a membrane is held away from the work-piece surface by a small amount, then a thin partial covering, for example a non-woven porous sheet 0.4 to 5 microns thick that has the appearance of a cloth, will result in the membrane immediately adjacent to the thin covering being held substantially 0.4 microns from the surface of the work-piece, and will provide channels or pathways for low-conductivity fluid to be introduced between the membrane and the work-piece.

The protective covering can provide either an abrasive action or increased convection, as the textured surface of the protective covering is swept across the surface of a work-piece in a "squeegee-like" manner. Finally, of course, the protective covering can protect the charge-selective ion-conducting membrane from wear caused by contacting the work-piece.

FIG. 38 also shows patterns that can be made into a pad to facilitate introduction of low-conductivity fluid into the gap between the membrane and the work-piece. generally, this will create a weakness in the membrane, and therefore it is preferred to add a very thin layer of material over the membrane than to etch or cut very thin grooves into the membrane.

In one embodiment, a compliant porous, permeable pad may be incorporated between the cathode and the membrane. Any open-cell foamed polymer that is compatible with the electrolyte solution or gel.

Figure 6:
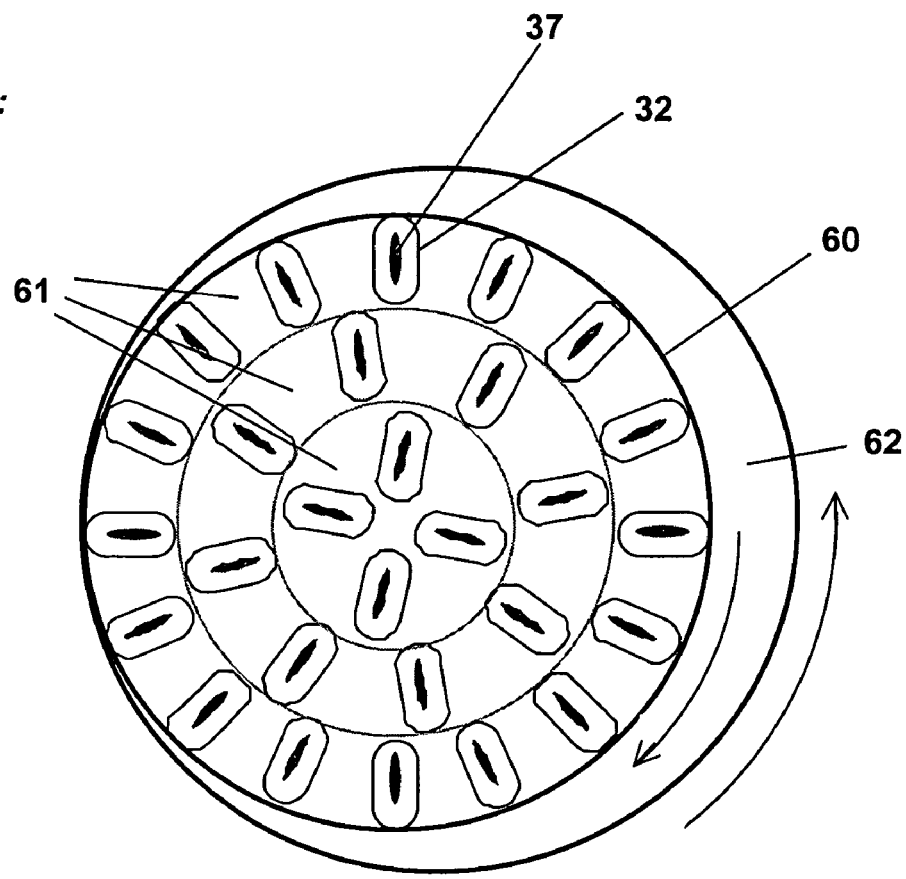
FIG. 6 is a schematic diagram showing a circular cathode half-cell 60 with multiple membrane-sealed windows 32 which have a plurality of areas 37 which contact the surface of a larger, counter-rotating circular work-piece 62.

Alternatively, the window frame-like structure can be thicker and have substantial strength. The window frame-like structure can cover substantial portions of a half-cell. For example, FIG. 6 shows an embodiment where a large window frame-like structure 61 covers a large disk-shaped half-cell 60, wherein the windows 32 allow the membrane 37 to protrude out at a plurality of points, giving a resulting structure with many properties of a conventional polishing pad used in CMP. The membrane provided in cathode half-cell illustrated in FIG. 6 can be a single circular section with a diameter equal to that of the faceplate. After a certain period of use it may become necessary to provide fresh membrane to the areas 37 which contact the work-piece, for example due to mechanical wear in these areas. For this purpose the electrolyte may be partially withdrawn from the half-cell and the face plate rotated relative to the membrane, so as to provide fresh membrane to the center of the window. By this means the utilization of the membrane may be increased several fold over that for a single usage and involves much less non-productive time than that required to completely re-assemble the cell with an entirely new membrane.

The window-frame-like structure can be designed to have several additional functions.

The window-frame-like structure can facilitate distribution of low-conductivity fluid between the work-piece and the charge-selective ion-conducting membrane contacting the work-piece, either via providing channels for fluid to flow within the structure (and having at least one outlet within the periphery of the contact area of the membrane to the work-piece) and/or by providing a recess within the bounds of the contact area between the membrane and the work-piece surface where some low-conductivity fluid can reside. This screen or window-frame-type structure can alternately or additionally have open or sealed channels extending from the pressurized source of low-conductivity fluid to one or more desired outlets disposed within the confines of the outer periphery of the contact area between the membrane and the work-piece.

Finally, the window-frame-type structure can additionally or alternatively function as a connector connecting the work-piece to the power supply. The conductors so located have an advantage in that electrical contact can be made with small islands of material that may otherwise be isolated from an external connector, a phenomenon typically encountered in later stages of polishing a semiconductor substrate. In this embodiment, the connector 20 comprises an element that is an electrically conductive window-frame structure disposed between the membrane and the work-piece surface, again having sufficiently large holes therethrough so that the membrane extends through the windows and contacts the surface of the work-piece. Various suitable electroconductive polymers are known, and include for example polypyrrole, polythiophene, polyaniline, polyacene, and polymers including the monomer ethylene [3,4-dioxythiphene], 3,4-polyethylenedioxythiopene/polystyrenesulfonate, and the like, and also polymers as described in U.S. Pat. No. 4,556,623 and in published U.S. application 2003/0052310. The conductive polymeric window-frame structure can optionally include a metal conductive core contacting the conductive polymer, to minimize voltage drop and heating. The electrically conductive screen can preferably include a non-conductive portion disposed between the electrically conductive part of the window frame structure and the membrane.

Generally, the low-conductivity fluid of this invention comprises very little metals, e.g., less than 20 ppm, typically less than 5 ppm, and often less than 1 ppm, even during polishing. Alternatively or additionally, the use of the window frame-like structure to introduce fresh low-conductivity fluid to the surface of the work-piece can be modified to make sure that any fluid between the conductive elements on the window frame-like structure and the work-piece is fresh fluid.

Preferably the source of low-conductivity fluid supplies low-conductivity fluid both outside and within any gaps, e.g., gaps formed by a window frame-like structure, within the outer periphery of the contact area between the membrane and the work-piece.

Figure 36A:
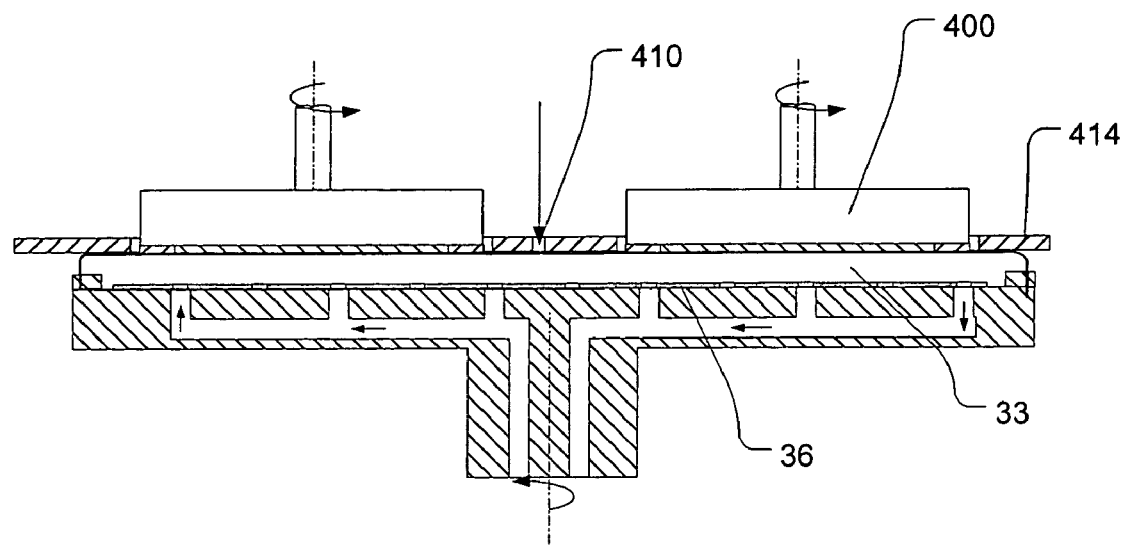
FIGS. 36A and 36B shows a side view and plan view of a large window frame-like structure 414 having two windows (shown in top view obscured by wafer carriers 400) adapted to allow the membrane to contact the work-piece, and also showing a plurality of low-conductivity fluid injection ports 410 provided by the structure, where low-conductivity fluid may enter in the center via opening 410 in 36A, and be transported to a plurality of low-conductivity supply openings 410 shown in FIG. 36B via conduits (not shown) within the structure 414 or via channels (not shown) in the structure 414.

As shown in FIG. 36, a substantially rigid window frame-like support structure may be disposed within the half-cell, and advantageously this structure is laminated to the membrane. Such a structure can stiffen the membrane, which will facilitate polishing at very low tool pressures. Such a structure is advantageously non-conductive, and it will maintain a minimum distance between the membrane and an underlying cathode. Additionally, if the window frame-like structure has substantial lateral dimensions, it can provide areas of the membrane where current flow is reduced or stopped, providing some of the benefits of intermittent pulsing of the voltage when polishing with a smaller wafer. The areas where current flow are blocked can be readily adjusted to provide optimum rehydration opportunity for the membrane. Additionally or alternatively, the window frame-like structure can comprise a series of sealed tubes carrying low-conductivity fluid, where the outlets are through a plurality of sealed holes that are similar to the single hole shown in FIG. 17A and/or 17D. Additionally, if the window frame-like structure comprises electrical connectors such as 107 in FIG. 17C to aid in forming a electrical connection with the work-piece, then such wiring 20 would have to be insulated from the electrolyte. However, a soft non-scratching electrical connection can be made by means of a connector 107 adapted to contact the work-piece surface, where the connector is located within a gap 106 and is surrounded by pure water, so metal plating will not take place. Also, though inefficient, the low-conductivity fluid exiting pipe 104 through opening 105 in FIG. 17D will also help the connector 107 form electrical contact with the work-piece surface.

In contrast, FIG. 37 show a more traditional large window frame-like structure disposed exterior to the membrane and advantageously fixed to the rotating base. Generally it is advantageous to have the window frame-like structure be fixed relative to space, or relative to the membrane, or relative to the base, to facilitate connecting low-conductivity fluid supply lines to a reserve supply.

One problem with large membranes is that they may seriously distend in the large areas where the membrane is not contacting the wafer. The distension is the result of the modest pressure maintained within the half-cell coupled with the very large unsupported areas of the membrane. As a result, a substantial disturbance in the planarity of the membrane will be experienced at the leading edge of the wafer, and membrane wear will be greatly accelerated. FIG. 37 shows an ingenious solution to this problem, where the membrane is submerged in water. The membrane can also be support in the center of the platen which substantially reduces the unsupported membrane length, as shown in FIG. 37. The pressure exerted by the head of water will at least partially counter-act the pressure within the half-cell, thereby reducing membrane distention from a plane. Additionally, such a structure provides a very efficient method of ensuring the membrane is completely rehydrated as it rotates.

Additionally or alternatively, the optional structure can be designed to gather and remove oxygen, which will be generated if n is substantially greater than 2. Depending on the current density and on the value of n, oxygen generation can be a rate-limiting problem. Generally, larger flow channels such as would normally bring low-conductivity fluid in from the outer boundaries of the membrane-substrate contact area will also be removing gaseous oxygen, either via 2 phase flow, or by having a supply of low-conductivity fluid flowing in a direction to help sweep water away from the contact area, or both, will be sufficient to remove oxygen for a membrane with a small area of contact.

Generally, much attention has been placed on fixed structures to facilitate bringing low-conductivity fluid in from the periphery of the contact area to the gap between the membrane of and the work-piece. FIGS. 17A, 17B, 17C, and 17D show embodiments where low-conductivity fluid is introduced within the periphery of the contact area between the membrane and the surface. The low-conductivity ingress plumbing is generally represented by a pipe 104 if available. The drawings are not to scale. On difference is that FIGS. 17A and 17D show tubing bringing the fluid to the opening 106, while FIGS. 17B and 17C show how a passage way can be formed by merely drawing the membrane back through a hole in the base, so long as a good seal is formed. The pipes 104 and the outlets 106 are generally very small, on the order of a thickness of a pin to the thickness of a small nail, for example. If low-conductivity fluid is introduced to opening 106 under some pressure, then rehydration of the membrane can be expedited. FIG. 17B shows a permeable thin cap 107 that can be disposed at the outlet of the opening 106. This cap can be used to collect gas, or it can be used as an auxiliary connector to connect the work-piece to the positive terminal of the power supply, as shown in FIG. 17C. As the layer of metal is progressively polished away, it becomes increasingly difficult to get current into the center of the wafer without experiencing significant voltage drop. If a cap 107 is used as an electrical connector, the a plurality of these can be incorporated into one membrane. The caps can be made of a metallic conductive core and a soft metal connector, e.g., a gold connector, or the connector can be one of many available conductive elastomers. Finally, while there is energy loss, even if the cap 107 only intermittently contacts the substrate, there will still be a small but steady flow of current from the cap 106 to the substrate surface, which may be transported by an extremely thin layer of water between the substrate surface and the cap 107.

Mechanical Apparatus For Membrane Mediated Electropolishing—The invention also includes the apparatus needed to perform the invention, the requirements of which are for the most part determined from the method and advantages described above.

Figure 34A:
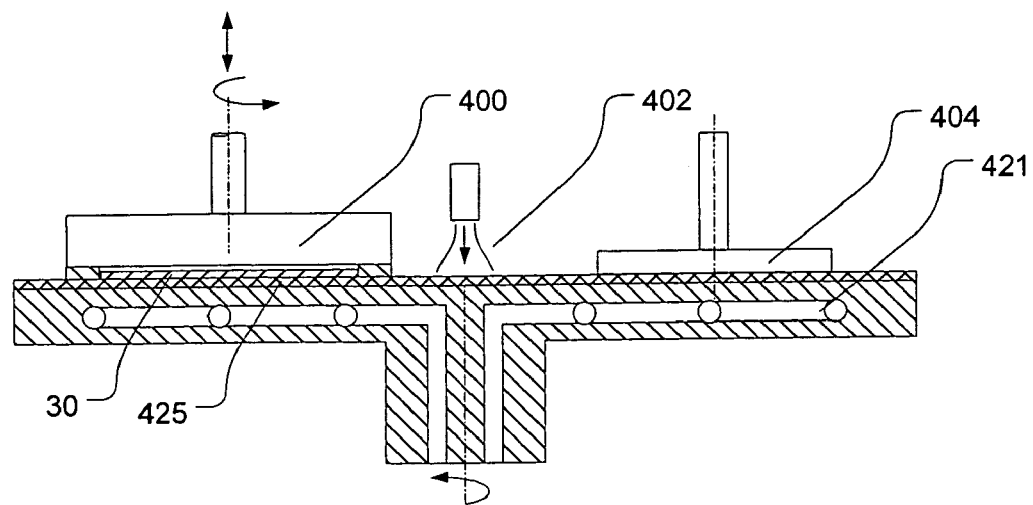
FIG. 34A shows a prior art rotary CMP platform having a slurry feed 402, a polishing pad 425 set on a platen, fluid channels 421 through the platen for transfer of coolant, vacuum, etc, a wafer carrier 400, and a pad conditioner 404.

Advantageously, an apparatus for use in membrane-mediated electropolishing of a metal work-piece comprises a mechanism for moving the membrane in contact with the work-piece and the low-conductivity solvent or solution along the surface of the work-piece. As shown in FIG. 34, many of the tools used in conventional CMP can be refitted to work with MMEP.

Supporting Elements: The ion-conducting membrane substantially and movably contacts the work-piece covered with a low-conductivity fluid. To do so, either the work-piece must be adapted to be moved toward the membrane and also to move in a direction substantially parallel to the surface 37, or the membrane must be so adapted, or some combination thereof. Generally, it is known in the art, e.g., the chemical mechanical polishing art, and the standard electropolishing art, to have a revolving or elliptically moving base 101 having ability to also be adjusted vertically. Such a base is adapted to retain and support the substrate, and may optionally further contain enclosures to retain polishing liquid, and enclosures to exclude air, as is known in the art.

Similarly, it is known in the art to have a polishing head 102 be rotating, and, optionally, to be moving in an elliptical manner. By rotating it is meant either rotating about an axis passing through the center of the base 101 and polishing 102, for example, but the membrane and work-piece each need not be and in many embodiments are removed from the center of rotation of the bases, allowing the membrane to extend over a greater area.

Any methods of providing controlled horizontal movement known in the art are applicable for this method. Alternatively or additionally, other devices are adapted to move the rotating base, polishing head, or both in directions perpendicular to the work-piece surface, as is known in the art. The motors and arms normally associated with this moving and rotating equipment are not shown. Such motors are generally continuous. However, there are some advantages that can be realized by intermittent movement, for example timed with pulses in the current, that provide increased efficiency. In such a case, stepper motors can be used in lieu of the normal rotary motors.

The half-cell base can be attached to a polishing head, which is simply another support adapted in its simplest form to support the polishing half-cell and connect the polishing half-cell to appropriate rotators, arms, or other supports.

Electrical Connectors: Obviously, the connector 20 connecting the work-piece to the power source can be routed independently, can be associated with the supporting base 101 insofar as the connector extends to the surface of the work-piece and makes electrical contact therewith or the base itself comprises part of the connector. The connector 20 can alternatively extend from the polishing head 102 to contact either the base 101 holding the work-piece, provided the base is electrically connected to the work-piece, or the work-piece itself. Such a combination is advantageous because then the base, having rotational, vertical, and/or elliptical movement capabilities, can be any base used for example in prior art chemical mechanical polishing apparatus, and all wiring can pass through the polishing head. Of course, the connector(s) 20 advantageously does not contact the work-piece in the working area, e.g., in the area needing electropolishing, as scratching would result.

Polishing head: The half-cell comprises a base, which may be attached to a polishing head. As discussed above, to make a modular half-cell including all ancillary equipment, the pump 22 used to circulate the half-cell fluid may be located on or in polishing head 102, as the fluid volume and pump are both very small, e.g., a few cc's of electrolyte fluid. Similarly, any filters, de-gassers, pressurizers, and heat exchangers can be located on the polishing head 102, making this part of the system compact and easy to change out. Of course, pressure and/or temperature sensors can be incorporated into the polishing head assembly. This unitary assembly is extremely advantageous if any part of the system, including the membrane, needed maintenance, as the polishing head having all supporting systems can be connected to the rotational and movable arms holding the polishing head by connecting as little as one or two electrical/fluid contacts.

Other normally included devises, for example a sensor to detect when the endpoint is being reached, can be placed on the base 1 or polishing head 102. It will be appreciated that the end-point for MMEP, as with other electrochemical polishing processes, may also be determined from the total amount of charge (current integrated over time) required to remove the desired amount of metal, or by noting the drop in current which occurs at constant voltage when areas of the surface first become free of metal. In such a case, this variable can be measured easily at the power source, so a sensor on the base may not be needed.

The various options regarding the components of the half-cell and associated materials needed for polishing will be discussed in subsections below.

Rolling Half-Cell: Yet another way in which the contact area may be moved across the surface of the work-piece is to rotate the cathode half-cell about an axis parallel to the work-piece in such a way that the area of contact at least partially rolls from one location to another. This has several advantages. First, greater uniformity of polishing action is achieved. In conventional CMP polishing processes, which utilize rotating disks, the linear velocity of the pad over the work-piece surface changes by the distance from the center of rotation of the pad squared. The portion of the conventional rotating disk-shaped polishing pad that is very near the center of rotation has very little velocity, while the portions on the exterior of the pad have great velocity. Conventional CMP attempts to average out the polishing by moving both the pad and the substrate with different centers of rotation, and may further use orbital motions instead of circular motions or add a linear movement in addition to the two rotating motions. This only partially addresses the problem. Some manufacturer utilize an endless belt system (much like a conveyor belt) to partially alleviate the problem of different velocities. A better process is to utilize a curved pad that rotatingly moves across the surface of the work-piece. In preferred embodiments, the shape of the membrane-sealed window of the cathode half-cell in a cylindrical or hemi-cylindrical external surface.

FIG. 9A shows a schematic cross-section for a cylindrical cathode half-cell where the membrane 32 comprises a cylindrical section sealed at both ends by plugs in which are mounted the cathode 36 and ports 34 and 35 for delivery and removal of electrolyte. Under hydrostatic pressure the electrolyte causes the diameter of the membrane to swell to a greater dimension than the seals at the end-caps. FIG. 9B shows in a side elevation how the swollen cylindrical membrane may contact the work-piece and the point of contact may be moved along the surface of the work-piece by rolling the entire half-cell. This system can provide uniform polishing conditions across an entire work-piece surface, and further inherently addresses the need in MMEP to lift the contact area of the pad from the surface to allow rehydration of the membrane. FIGS. 9C and 9D show schematic cross-sections for a hemi-cylindrical cathode half-cell comprised of a flat section of membrane sealed against the long sides and short hemi-cylindrical end-pieces of the cell. Both of these designs permit the contact area to be moved across the work-piece by rolling, or sliding and rolling, the entire half-cell back and forth. This rolling motion exposes a much larger area of the membrane for contact than would be obtained if the half-cell were maintained in a constant (e.g. parallel) orientation. If the length of the effective contact area of the half-cell membrane is the same or greater than a length of the work-piece, the process will be very efficient.

The rollable half-cell will beneficially have a base having at least one surface which is substantially parallel to the curvature of the half-cell, e.g., a cylinder or portion of a cylinder. The cathode can be rigidly attached to the base, and may be a plate or screen that follows the contours of the curved surface of the base, or may alternatively be one or more wires that run along the curved surface of the base, either circumferentially or axially.

The rotatable half-cell may incorporate a rigid structure, beneficially on at least both ends of the cylindrical or hemi-cylindrical half-cell, that is designed to contact the extremities of the work-piece or the base on which the work-piece sits, where such structures can provide a physical stop to prevent the half-cell from being pushed against the surface of the work-piece with such force that the membrane contacts the curved cathode (e.g., much like a flat tire is pushed against a rim). Such a curved half-cell can further or alternatively utilize a windowpane-like structure as described above. If a window frame-like structure is used, a preferred windowpane-like structure would be located within the half-cell cavity so as to provide a physical stop separating the membrane from the cathode as well as to restrain outward bulging of the membrane, and such structure would also inhibit circumferential movement of the membrane relative to the cathode.

To prevent dehydration and sticking of a membrane, it may be beneficial to use a rotatable membrane that has a smaller diameter, and causing the half-cell to rotate faster than would a larger diameter membrane to attain a preselected velocity relative to the work-piece surface. Additionally, smaller diameter cylindrical half-cells require less vertical clearance between a polishing head and a work-piece. However, smaller diameter cylindrical half-cells will have less surface area contacting the work-piece than would a larger diameter cylindrical half-cell. The smaller diameter half-cells are called "low-profile" cylindrical or rotatable half-cells." For example, a low-profile rotatable half-cell is described in Example 11 and is shown in FIG. 9. In one embodiment a plurality of rotatable cylindrical half-cells (or half-cells that are a portion of a cylinder, e.g., a hemi-cylindrical half-cells), can be mounted in parallel orientation on a frame, so that multiple half-cells contact a work-piece surface at any one time. The frame and rotatable half-cells may resemble the structure illustrated in FIGS. 8A-8C, showing frame 81 comprising two rigid parallel support members, across which are mounted a series of freely rotating half-cells 82 at regular distances, where the half-cell 80 and membrane 32 are deleted. The frame can also beneficially be used to carry the electrical connectors to the half-cells, and optionally also can support electrical connectors adapted to bring current to the surface of the work-piece, using for example electrically conductive rollers situated between rotatable half-cells or brushes made for example from electrically conductive plastics or from inert metals, e.g., gold. The frame can also be used to support distribution channels, nozzles, and the like for the low-conductivity fluid distribution system, and/or be used to mount sensors to evaluate the polishing process, and the like.

Low-Profile Half-Cell: A low-profile half-cell is typically very thin, e.g., less than 0.6 cm thick, for example between 0.1 and 0.3 cm thick for a flat half-cell. Low-profile half-cells are easier to install onto a plurality of polishing heads, and provide greater dimensional control during polishing than larger half-cell. Further, the low-profile half-cells can be more readily manufactured using automated facilities. The design of a low-profile half-cell is similar to the standard half-cell.

The thickness of the base is not particularly important. The term "low-profile" primarily refers to the distance from the cathode to the membrane. Low-profile half-cells advantageously have very close distance tolerances between the cathode and the membrane. The cathode in a low-profile half-cell is advantageously disposed within about 0.3 cm of the membrane, preferably within about 0.2 cm of the membrane, more preferably within about 0.1 cm of the membrane.

The base may also be thin, e.g., the base may also be a film (but is preferably not the same material as the membrane), or the base may be a thicker, more rigid structure. Advantageously the base comprises a plastic that is substantially inert to the electrolyte compositions. Advantageously, the base has one or more indentations or protrusions thereon which facilitate mounting the half-cell onto a polishing head.

One of the most labor-intensive tasks in MMEP is changing out or replacing a worn membrane. In some embodiments low-profile half-cells advantageously have the membrane welded (or glued) to the base, which implies the membrane and the base are made of weldable or glue-able polymeric materials, and also implies that the cost of construction of the half-cell is such that half-cells with worn out membranes are disposable. The base in this embodiment therefor advantageously has a small raised portion at least along the outer edges to provide an area to affix the membrane to the base.

The cathode may contact and in preferred embodiments is bonded or otherwise firmly affixed directly to the base. The cathode is preferably planar (or in the shape of a curved plane) and comprises a plate, film, screen, or wire, which beneficially extends over substantially an entire area equal to and laterally displaced from the "membrane contact area", defined as the area in which the membrane substantially contacts or is kept in close proximity to the work-piece. The lateral displacement can be exceedingly thin, for example, 0.1 cm or less, alternatively less than 0.05 cm from the membrane, e.g., even about 10 and about 100 microns from the membrane.

Generally, very close placement of the cathode to the membrane requires some intervening structural support to prevent the membrane from contacting the cathode. The support can be a windowpane-like structure that is located within the cavity of the half-cell, and which is advantageously welded to and supported by the base and/or the cathode. The windowpane-like structure may be welded (or glued) to the membrane, if the structure is intended to have a purpose of holding in the natural blister shape of the membrane under pressure. Of course, the windowpane-like structures can also be used on both sides of the membrane.

The windowpane-like support may be a non-conducting screen. The support may be a frame having fixed bars or rollers, similar in many ways to the windowpane-like structure illustrated in FIGS. 8A-8C, showing frame 81 comprising two rigid parallel support members, across which are mounted a series of freely rotating rollers 82 at regular distances, except where the length of the rollers is equal to or less than the length of the membrane. The rollers may be constructed of electrically non-conducting materials and may comprise, for example, thin needle bearings or thin cylinders supported on tensioned wires. The support, e.g., screen, rollers, or otherwise, should under normal circumstances not extend outward a sufficient amount so that they exert outward force on the membrane during polishing. The support, e.g., screen, rollers, or otherwise, may be a modestly conducting structure, such as a non-conductive structure coated with a layer of conductive polymeric electrolyte anions, e.g., polymeric polycarboxylic acids such as poly(meth)acrylate that has been at least partially neutralized with copper ions. Separation of the cathode and the membrane can be aided by use of higher viscosity electrolytes, for example, the electrolyte can be a gel or a very high viscosity formulation (grease-like).

The base advantageously comprises at least one inlet, which may be for example a septum, for introducing electrolyte after welding or gluing the base to the membrane. The base may also comprise a membrane for allowing hydrogen gas to escape, a non-leaking outlet for the electrical connector, and the like. The outlet for the electrical connector may be a filled via hole through the base, contacting on one side the cathode and forming on the other side a contact area on the exterior of the base.

Such cells can be manufactured in large quantities, for example by manufacturing a plurality of half-cells from a single continuous sheet of membrane material and backing material, where the individual half-cells can be separated or used as a bank of half-cells connected one to another.

Low profile half-cells can be utilized in any of the other embodiments. For example, a low-profile rolling half-cell is described in Example 11 and is shown in FIG. 9. A cathode of Cu wire screen (100×100 mesh) and a non-conductive spacer screen (PVC-coated fiberglass screen, 20×20 mesh) were sequentially wrapped around a base having a small diameter. The base in this instance was a small tube, e.g., a glass tube 1.3 cm in diameter. An aqueous solution of copper-neutralized polymer, poly(ammonium methacrylate), having a consistency of a grease was the electrolyte was applied at a thickness of about 0.1 cm. A piece of N115 Nafion® membrane was then wrapped around assembly, and this crude design was operable to polish a copper wafer. Such a low-profile rotatable half-cells are well suited for incorporation into a frame.

Similarly, uniform self-contained low profile flat half-cells are readily incorporated into a variety of frames to provide enhanced polishing, as described below.

Multiple Half-Cells Incorporated Onto Rotational Polishing Heads: In traditional CMP, polishing performance varies as a function of the rotational velocity of the pad against the substrate, which necessarily varies radially with distance from the center of rotation. In MMEP, polishing performance varies as a function of speed of the membrane relative to the work-piece surface, on the pressure exerted by the membrane against the work-piece (which affects the effective contact area), and also on the current and pulsing characteristics of the current. To achieve rapid, uniform polishing and planarization of a Cu damascene wafer, the location and motion of contact areas between membrane and work-piece must be adjusted so that the current density, integrated over the period of processing, is equal at all points on the surface of the work-piece.

Figure 5:
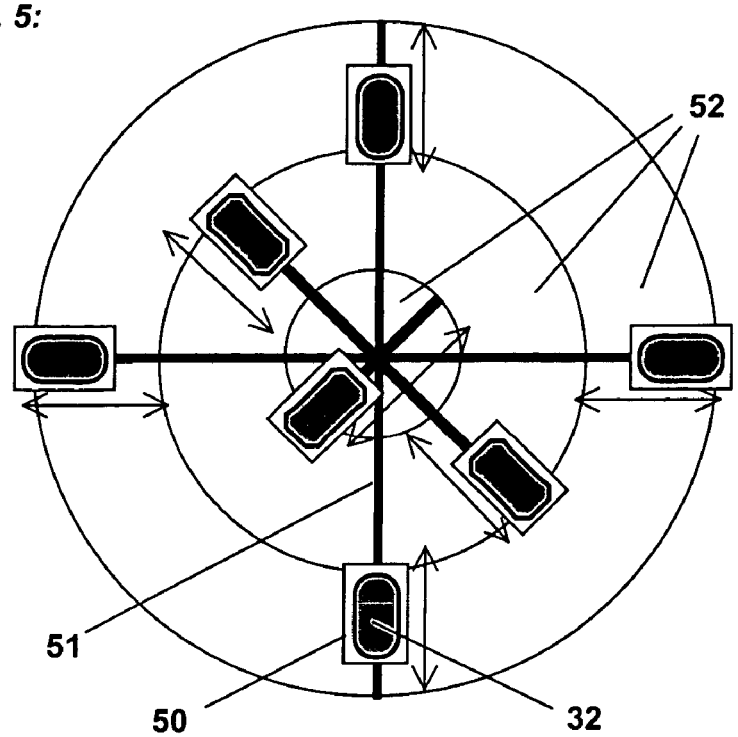
FIG. 5 is a schematic diagram of a polishing tool comprising seven cathode half-cells 50 with single membrane-sealed windows 32 mounted on four radial tracks 51 located above a circular work-piece.

The polishing tool illustrated schematically in FIG. 5 provides one way to achieve this. This polishing tool comprises an array of seven independently controlled cathode half-cells 50 mounted on four rails 51 positioned above a spinning Cu damascene wafer. All of the half-cell membranes simultaneously contact different areas of the wafer and are continuously moved back and forth along their respective rails over the range of radial positions indicated by the arrows in FIG. 5. Half-cell movement along rails can be controlled via stepper motors and worm-gear, for example, and rotation can likewise be controlled by stepper motor. At the same time the copper wafer is continuously rotated about an axis coincident with the mid-point of the polishing tool so that the membrane contact areas sweep out overlapping tracks 52 which cover the entire surface of the wafer. By suitable adjustment of the translational movement and current densities (e.g., time of current flow and/or voltage as controlled by the substantially DC power supply) for each half-cell, a highly uniform removal of Cu can be achieved. Similar results can be achieved with fewer half-cells and/or railing, but with higher polishing times. Similar polishing tools incorporating larger numbers of cathode half-cells and/or rails can provide higher uniform polishing rates.

Yet another means to uniformly polish and planarize a circular work-piece such as a Cu damascene wafer using MMEP is illustrated schematically in FIG. 6. In this embodiment of the invention, a single large cathode half-cell is comprised of hollow disk 60 whose cavity is subdivided into three concentric cylindrical zones 61 sealed by a faceplate containing 28 membrane-sealed windows 32 distributed in concentric rings corresponding to the channels in the half-cell. While the membranes can be separate smaller membranes each individually sealed against faceplate 52, in preferred embodiments the membrane is continuous circular shape and the faceplate 52 corresponds to a windowpane-like structure. The diameter of the faceplate is slightly less than that of the wafer 62. The half-cell 60 and wafer 62 are rotated in opposite directions about two different axes displaced from one another by a distance equal to the difference in diameters. The relative angular velocities are adjusted so that on each rotation of the wafer the faceplate completes at least one complete revolution. In this way the membrane contact areas 37 can be made to sweep out the entire surface of the wafer with equal residence times at all areas of the wafer. The rates of rotation may be adjusted so that <10 nm of Cu is removed during each orbital cycle, so the location and distances between contact areas will be averaged out over time and all areas of the wafer will experience substantially equal integrated current densities and an equal amount of polishing.

The membrane provided in cathode half-cell illustrated in FIG. 6 was described as a single circular section with a diameter equal to that of the faceplate. An additional degree of control may be achieved by providing three separate cathodes in the single half-cell, in the form of concentric rings disposed in each of the three channels 61, so that the current densities (e.g., time of current flow and/or voltage as controlled by the substantially DC power supply) in the corresponding sets of membrane-sealed windows may be independently adjusted via the electric power supply. After a certain period of use it may become necessary to provide fresh membrane to the areas 37 which contact the work-piece, for example due to mechanical wear in these areas. For this purpose electrolyte may be withdrawn from the half-cell and the face plate rotated so as to provide fresh membrane to the center of the window. By this means the utilization of the membrane may be increased several fold over that for a single usage and involves much less non-productive time than that required to completely re-assemble the cell with an entirely new membrane.

Instead of the one large half-cell, there may be three half-cells, the inner being a circular half-cell shape and the outer two having a shape like concentric rings. This allows the rotational velocities, and optionally also the pressure, of the three half-cells corresponding to faceplates 52 to be independently adjusted, as well as also allowing the current to be individually adjusted. Such a assembly is beneficial because again when it becomes necessary to provide fresh membrane to the areas 37 which contact the work-piece, the face plates may each be rotated so as to provide fresh membrane to the center of the window. By this means the utilization of the membrane may be increased several fold over that for a single usage and involves much less non-productive time than that required to completely re-assemble the cell with an entirely new membrane.

Finally, the faceplates 52 may be adapted to receive a plurality of modular half-cells, for example low-profile half-cells, in each of the three openings 50. The rotational velocity of the three groups corresponding to plates 52 are individually adjustable, while parameters like current density, pressure, and the like can individually be controlled.

Half-Cells Having Changeable Membrane: One goal is to adapt, modify or convert production tools designed for chemical mechanical polishing of damascene wafers for use with the MMEP process. Cu-damascene wafers are currently planarized by means of chemical mechanical polishing (CMP) whereby the wafer is mounted face-down on the surface of a rotating stage and is brought into contact with a rotating circular polishing pad of diameter at least twice that of the wafer. The surface of the pad is constantly flushed with slurry containing oxidizing agents and abrasive colloid particles. The two axes of rotation are located so that the outer edge of the wafer is just covered by the outer edge of the pad. The angular velocities of the two pieces are maintained equal in sign and magnitude, $\omega_{pad} \approx \omega_{wafer}$, such that the same interfacial velocity is maintained over the entire surface of contact. Polishing of rigid memory disks also uses similar apparatus. MMEP provides several intrinsic advantages over CMP. The MMEP process is expected to provide certain additional advantages over existing processes for polishing copper damascene wafers, namely increased productivity at reduced cost of operation, reduced tool pressure, reduced damage of fragile dielectrics, while at the same time eliminating contamination, waste and consumable reagents. MMEP could displace CMP as the preferred method of planarizing and polishing semiconductor, substrates particularly at this time including Cu damascene wafers. In order to expedite and to reduce the cost for this technological transition, it is desirable, in so far as possible, to incorporate the principles and components of MMEP into the tools and machinery already employed for CMP. This section describes cathode half-cells and structures comprising that may be substituted for conventional CMP pads in a co-rotating polishing tool.

While approximate dimensions are provided in the description below, the dimensions are not critical to the invention, but are representative of dimensions that can be "interchanged" with similarly-sized CMP apparatus.

FIG. 14 shows a schematic illustration of a disk-shaped cathode half-cell "pad" (52 cm in diameter) for planarizing and polishing 20 cm damascene wafers. The cathode half-cell comprises a substantially cylindrical cavity (e.g., 0.5 to 3 cm thick). The cathode consists of a flat Cu foil or mesh, or a series of concentric sections of these materials disposed near and substantially covering the bottom of the cavity. The cavity is filled with an electrolyte solution or gel and may be separated into two or more mutually insulating concentric zones. Optionally the cavity may be subdivided into two or more mutually insulated concentric zones, each zone containing a different cathode. Optionally the cavity may also contain a porous inert separator (or window frame-like support), such as an open-cell polymeric foam or fiberglass screen, to prevent the cathode from contacting the surface of the membrane. The upper surface of the cavity comprises a thin plate containing either 390 membrane-sealed windows (1×2 cm) distributed in 13 concentric rings at locations summarized in the table below, or alternatively a single large membrane may be used to seal all the windows.

|  | Track # | | | | | | | | | | | | |
|---|---|---|---|---|---|---|---|---|---|---|---|---|---|
|  | 1 | 2 | 3 | 4 | 5 | 6 | 7 | 8 | 9 | 10 | 11 | 12 | 13 |
| D(track), cm | 12 | 15 | 18 | 21 | 24 | 27 | 30 | 33 | 36 | 39 | 42 | 45 | 48 |
| N(windows) | 12 | 15 | 18 | 21 | 24 | 27 | 30 | 33 | 36 | 39 | 42 | 45 | 48 |
| φ |  | 30.0 | 24.0 | 20.0 | 17.1 | 15.0 | 13.3 | 12.0 | 10.9 | 10.0 | 9.2 | 8.6 | 8.0 | 7.5 |
| Zones | I | | | | | | II | | | | III | | |

N(total) = 65 (contact) + 325(non-contact) = 390
65 × 0.2 A/window = 5247 Angstrom/min N windows are distributed uniformly around each track of diameter D, displaced from one another by the angle φ. The tracks are separated uniformly by 3 cm, and in each successive track N is increased proportional to the increase in average diameter so that the number of windows per unit area remains constant. Therefore, Table 1 summarizes the distribution of 390 windows (1×2 cm) over 13 concentric tracks of diameter D within a 52 cm disk-shaped cathode half-cell pad as illustrated in FIG. 1, where N is the number of windows in each track, and φ is their angular separation in degrees. FIG. 14 illustrates only those windows in the vicinity of the wafer, though this distribution of windows would substantially cover the polishing structure. The minimum distance between windows is 1.14 cm within each track and 2.0 cm between tracks.

Embodiments are also contemplated wherein a plurality of half-cells can replace the single half-cell described above. The appearance of the polishing structure will be substantially as shown in FIG. 14. For example, 390 individual half-cells can replace the single half-cell having the effective area of the membrane divided by a window frame-like structure into 390 effective 1 cm×2 cm windows distributed in 13 concentric rings at locations summarized in Table 1. Many other subdivision can also be envisioned. One advantage of using a plurality of half-cells over a single half-cell with an extensive window frame-like structure is that unlike in the latter case, in the former case degradation or failure of a single cell may not require the polishing operation to cease. However, a plurality of cells requires a plurality of connectors and the like, and the possibility of failure for a variety of reasons increases with the number of half-cells.

The removal rate of Cu from the wafer may be estimated based on measured values of current and the stoichiometric number (e.g., n=3.3 e/Cu) for MMEP using a single membrane window of the same dimensions. The current is simply a measure of the number of electrons that pass a given point in a given time, and we have found that 0.2 amps per 2 cm$^2$ membrane is readily obtainable. The average of 65 windows contacting a wafer and providing 0.2 amps per wafer will provide 13 amps (or 13 coulombs per second) to the work-piece surface. At a coulombic efficiency of 3.3 e/Cu, and using a conversion factor of 96,485 coulombs per mole of electrons, about 4.1 E-5 moles or 93 angstroms per second (or 5580 angstroms per minute) of copper will be removed.

This 5500 angstroms per minute rate is near the optimum rate currently achieved by CMP formulations. There are four ways to increase the removal rate: increase the number of cells contacting the work-piece, increase the contact area of the membrane to the work-piece, increase the current expressed per unit of contact area, and increase the coulombic efficiency.

Assuming a constant current per window, the removal rate is a direct function of the number of windows contacting the wafer. Increasing the number of windows contacting the work-piece will increase the average removal rate proportionately. Significant increases can be achieved by suitable modifications of the cathode half-cell pad in FIG. 3. The table below summarizes an alternative distribution which increases the number of windows by ⅓ to a total of 520 while maintaining the same window dimensions and design criteria, i.e., 13 concentric tracks of diameter D within a 52 cm disk-shaped cathode half-cell pad similar to that illustrated in FIG. 3. Such a system would require and would have a copper removal rate of about 7400 angstroms per minute. In this distribution the minimum distance between windows in neighboring tracks remains 2 cm but decreases to 0.36 cm within each track. A more uniform separation may be achieved by tilting long axis of each window by 45 degrees. Still larger numbers of windows and higher removal rates may be achieved by reducing the distance between tracks. The maximum number of 2 cm$^2$ windows that can contact the 314 cm$^2$ wafer is about 157, so the maximum polishing rate for a polishing device giving 0.2 amps per 2 cm$^2$ window will be over 13000 Angstroms per minute.

|  | Track # | | | | | | | | | | | | |
|---|---|---|---|---|---|---|---|---|---|---|---|---|---|
|  | 1 | 2 | 3 | 4 | 5 | 6 | 7 | 8 | 9 | 10 | 11 | 12 | 13 |
| D(track), cm | 12 | 15 | 18 | 21 | 24 | 27 | 30 | 33 | 36 | 39 | 42 | 45 | 48 |
| N(windows) | 16 | 20 | 24 | 28 | 32 | 36 | 40 | 44 | 48 | 52 | 56 | 60 | 64 |
| φ | 22.5 | 18.0 | 15.0 | 12.9 | 11.3 | 10.0 | 9.0 | 8.2 | 7.5 | 6.9 | 6.4 | 6.0 | 5.6 |
| Zones | I | | | | | | II | | | | III | | |

N(total) = 87 (contact) + 433(non-contact) = 520
87 × 0.2 A/window = 7023 Angstrom/min As an alternative to, or in addition to, increasing the number of windows, the current flow per window can be increased. We have found that 0.5 amps per cm$^2$ of contact area of the membrane to the work-piece was obtainable. Further, if the window frame-like structure outlining each window is thin (e.g., less than about 300 microns, for example less than 200 microns, in height and width for example), and the pressure in the half-cell is low (less than 12 psi, for example), then at least 60% of a 2 cm² window should readily contact the substrate. Each 2 cm² window should be capable of conducting about 0.6 amps, and a 65 window average contact spacing will have a copper removal rate of about 16000 angstroms per minute, while an 87 windows on average contacting the wafer will remove about 22000 angstroms per minute.

These very large current values can be achieved only if current is supplied to the work-piece. Since a continuous layer of metal (blanket Cu and Ta barrier layer) is only present on the upper surface of the wafer, electrical contacts to the work-piece are beneficially established at a plurality of points along the periphery. Current supply can be a limiting factor at high polishing rates. If current is provided only at the periphery of the work-piece, there will be a voltage drop, and accompanying difference in voltage at the periphery of the work-piece compared to the voltage at the center of the work-piece can cause different rates of electropolishing. The problem becomes exacerbated as the conductive layers on top of the work-piece becomes thin. As discussed previously, the window frame-like structure can provide additional electrical contacts on the face of the work-piece, but preferably a combination of peripheral contacts and window frame-like structure contacts can be used. If only periphery electrical contacts are used, then the sheet resistance of the blanket Cu increases as this layer is removed until ultimately only a thin layer of Ta barrier remains to carry the current along the surface. The resulting growth in electrical resistance produces a systematic decrease in the anodic voltage at the center of the wafer relative to that at the periphery resulting in a gradient in the rate of Cu removal. This problem can be alleviated by dividing the cathode and electrolyte compartments in the half-cell pad into concentric, independently controlled zones, as indicated in Tables 1 and 2. In the course of its rotation all areas of the wafer are exposed to windows in the central zone II, however the center of the wafer never contacts the windows in zones I and III. By suitable adjustments to the voltage, current and/or duty cycle for zones I & III relative to those of zone II, compensation may be made for systematic differences in the removal rates between the center and periphery of the wafer. Still greater control may be achieved by increasing the number of zones. Moreover the zones need not be strictly concentric and may configured incorporate only a fraction of the windows within a given track. Thus the number of zones may exceed the number of tracks. The greatest control is exhibited when the windows are each individual half-cells that are each independently current-limited.

When the MMEP process is performed using deionized water as the low-conductivity fluid faradaic current is substantially restricted to areas where the membrane contacts the work-piece. Planarization efficiency is greatly enhanced by pulsed operation, whereby that electrical current is interrupted for brief periods of time. This phenomenon is understood to be associated with changes in the thickness of the effective boundary layer at the interfacial region between the membrane and the work piece. Interrupting the faradaic current prevents the boundary layer thickness from growing to its steady-state value. Using pulse programs in MMEP with equal polarization and recovery times <0.1 seconds, planarization efficiencies have been achieved equal to that of CMP. A disadvantage of electrically pulsed operation is that the productivity, or average removal rate, is reduced by the fractional length of the recovery cycle (fraction of time there is no current flow). The large polishing surface available in this embodiment provides a means to achieve the superior planarization associated with interrupted faradaic polarization of the membrane without interrupting faradaic current at the work-piece. During a single rotational cycle of the cathode half-cell pad, each window spends only a small fraction of the time in contact with the wafer. Consequently, even when the cathode behind these windows remains at a constant voltage relative to the wafer (work-piece), only the contacting membrane windows carry faradaic current and become partially dehydrated while the remaining membrane windows carry virtually no current and become re-hydrated. Therefore, windows not contacting the work-piece can rehydrate. By continuously exchanging contacting windows with non-contacting windows, rotation of the cathode half-cell pad mechanically can increase the time of polishing with less down-time than would be achievable with electrical pulsing of a single window held continuously in contact.

Because only a small fraction of membrane windows contact the wafer at any instant, each membrane window spends more time rehydrating out of contact than it does dehydrating under faradaic polarization. Synchronous co-rotation of the wafer, $\omega_{pad}=\omega_{wafer}$, assures that the relative surface velocities remains the same for all contacting windows. However, contact times vary systematically with the track diameter D. Provided that the longest contact times, namely those in zone II, are short enough to achieve the requisite planarization efficiency, this variation may be of no consequence. Should it be necessary to achieve uniform contact times electrical pulses may be applied to zone II corresponding to the contact periods in zones I and III. As with the compensation of electrical resistance, greater control may be achieved by increasing the number of independently controlled zones.

MEMBRANE POLISHING HEAD SIZED TO BE READILY RETROFIT INTO EXISTING CMP EQUIPMENT. In this embodiment, a standard size membrane is manufactured. Such a membrane can have a much lower rotational speed while still maintaining the desired polishing rates. Additionally, such an assembly facilitates retrofit of existing CMP tools. At the concept level, the CMP polishing pad is replaced with an ionic conductive membrane. Electrolyte is delivered to the back side (platen side) of the membrane and DI water (low-conductivity liquid) to the face. Under most conditions, the voltage necessary to maintain such a high current density, plus the conditions which will allow sufficient water to be present such that the membrane does not stick to the substrate surface, will also be sufficient to ensure than n is greater than 4, and is usually greater than 4.5. While such high n values do prevent copper oxide precipitates from forming, the oxygen generation at the work-piece surface can be severe. In some embodiments, it is preferred that n be below 5, for example where n is between about 3 and 4.5. This will allow require lower current densities, and to reach the targeted metal removal rates.

Figure 34B:
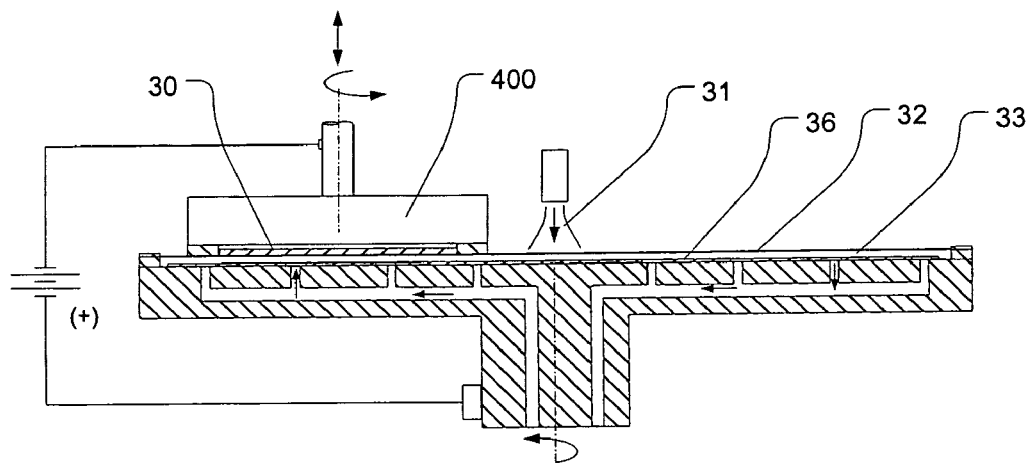
FIG. 34B shows how a prior art rotary CMP platform can be modified for use with MMEP, where the fluid channels are now used to feed and circulate electrolyte, where the cathode 36, electrolyte composition 33, and membrane 32 have dimensions similar to the prior art polishing pad 425 in the prior art, and the fluid dispenser provides low-conductivity fluid 31 in place of the prior art slurry 402.

For a tool design where $A_c/A_p=0.2$, the current density needed to maintain a metal, e.g., copper, removal rate of over 700 nm/min is only 240 mA/cm² at n=3. For a tool design where $A_c/A_p=0.8$, the current density needed to maintain a metal, e.g., copper, removal rate of over 700 nm/min is only 60 mA/cm² at n=3. In this alternate embodiment, the polishing membrane is a large membrane, typically larger than the work-piece. A 52 cm polishing membrane as shown in FIG. 34B and FIG. 35 is one such device. FIGS. 34B and 35 show a similarly sized pad which is primarily a large continuous pad, with some, perhaps about 10% to 20%, of the pad volume optionally containing channels and/or structures to introduce low-conductivity fluid and to remove oxygen gas that may be generated. The ratio $A_c/A_p$ may be 0.8 to about 1 for such an embodiment. Generally it is important that the cathode not contact the membrane, so one or more window frame-like structures, e.g., a porous backing to stiffen the membrane such as shown in FIG. 35 may be employed. A problem with over-sized membranes is that they will tend to distend out too far when there is no work-piece to contact. There may be a fixed plate which supports the membrane when not in contact with the work-piece. Such a plate, shown with low conductivity injection ports in FIG. 36B, may also have a surface to clean or condition the membrane. Alternately or additionally, the membrane may be operated under a head of water, as shown in FIG. 37. Alternately or additionally the membrane may comprise a compliant, porous backing pad, as shown in FIG. 39, that may be an open cell foam or may be a honeycomb-like structure having a plurality of small open channels leading from the cathode to the membrane. Grooves may be made in the membrane, or structures that lie over the membrane, can aid in providing low-conductivity fluid and to remove oxygen. Examples are shown in FIG. 38. These structures can also comprise electrical connectors to aid in connecting the work-piece to the power supply. Any combination of these strengthening devices may be used. Such a polishing membrane A) should be operated at very low pressure, e.g., below 1 psig, typically below 0.3 psig, often below 0.1 psig, so the water layer trapped between the membrane and the work-piece is thicker than for most experiments described here; and B) at low current density I, e.g., less than 500 mA/cm$^2$, for example between about 20 mA/cm$^2$ and about 200 mA/cm$^2$, and optionally but preferably with a pulsed current supply or other actions to keep n equal to about 2, thereby preventing oxygen generation between the substrate and the membrane. Under these conditions the water layer will not be depleted.

In the above-described embodiment, the polishing head or pad is substantially oversized, as is found in traditional CMP. It is not practical in traditional CMP to simultaneously polish more than one wafer at a time because significant areas of the pad must remain accessible to auxiliary equipment for pad conditioning and slurry delivery. Further, if more than one wafer were being polished with traditional CMP, then a wafer polished to endpoint before other wafers in the batch may be over-polished as the remaining wafers are polished to endpoint. On the other hand, MMEP does not require this pad conditioning and slurry delivery systems, but only requires a supply of de-ionized water or other low-conductivity solvent. The water source may be located near the center of a co-rotating cathode half-cell such as that shown in FIG. 37, leaving sufficient unimpeded area to polish two or three wafers simultaneously on different areas of the half-cell as shown in FIG. 15 and in FIG. 36B.

Such a pad can likely be operated at a considerably lower velocity than 20 cm/sec, for example half that velocity, which will help mitigate centripetal effects on the electrolyte fluid distribution. The pad can be subdivided into concentric rings to prevent the electrolyte fluid or gel from migrating toward the edge of the polishing membrane.

Additionally or alternatively, the low-conductivity fluid may be sprayed onto the pads in the intervals between the wafers. Finally, regarding control of polishing rates simultaneously on a plurality of wafers is simplified because as the end-point is reached in MMEP, the power connection to the surface of the work-piece will be interrupted, so no over-polishing will occur.

Figure 7A:
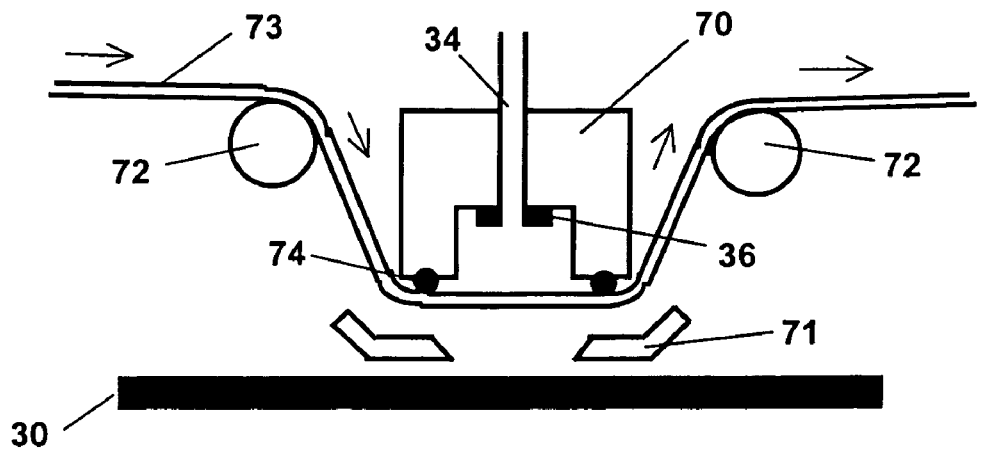
FIG. 7A is a schematic cross-section of a cathode-half-cell with a separable face plate 71 and continuous membrane 73 which may be advanced relative to the cell window.
Figure 7B:
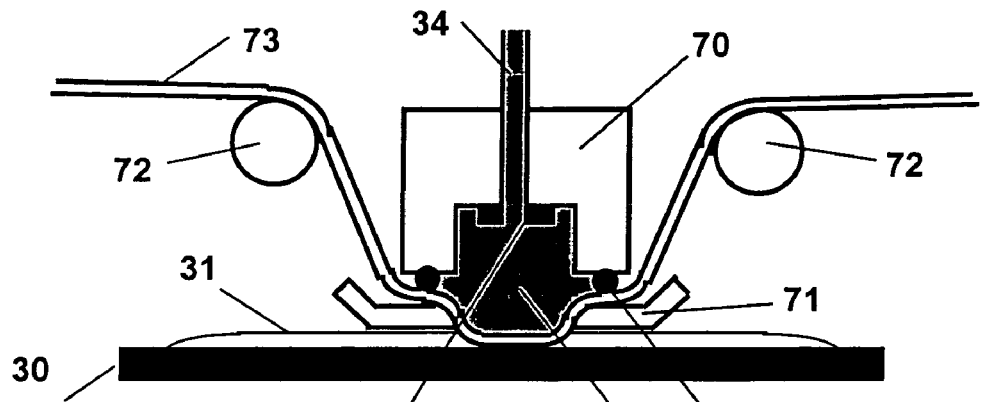
FIG. 7B is a schematic cross-section of the cathode half-cell of FIG. 7A when sealed, filled with electrolyte and brought into contact with the work-piece.
Figure 7C:
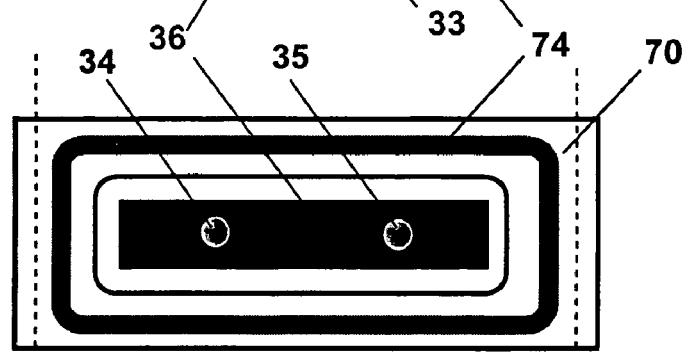
FIG. 7C shows a plan view of bottom of the half-cell cavity 70 of the half-cell depicted in FIG. 7B.
Figure 7D:
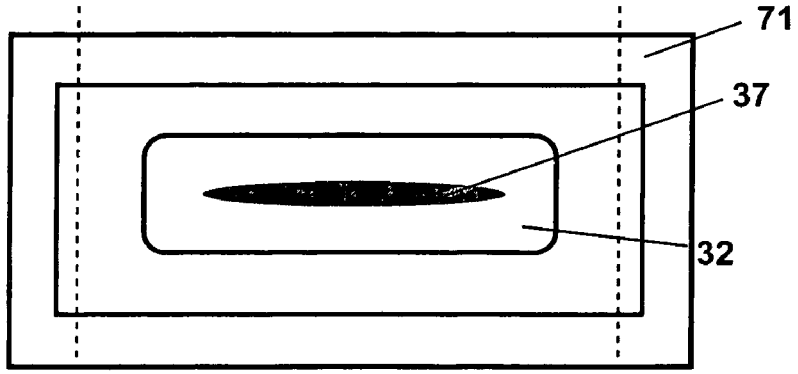
FIG. 7D shows a plan view of the bottom of the face plate 71, where the cross-hatched ellipse 37 indicates the area of contact between membrane and work-piece.

Quick-Change Membrane: Another way to optimize the utilization of the membrane and minimize the non-productive time required to provide fresh membrane to the contact areas is illustrated in FIGS. 7A-7B. In this embodiment of the invention, the cathode half-cell is comprised of three independent parts: a cell cavity 70 which includes the cathode 36 and ports 34 and 35 for delivery and removal of electrolyte, a face plate 71 which may be supported independently of 70, and a membrane 73 provided in the form of a continuous length of film whose width is indicated by the dashed lines in FIGS. 7C and 7D. As shown schematically in FIG. 7A, when the faceplate is separated from the empty cell cavity, the membrane may be advanced by means of transport rollers 72 across the area of the window 32. When fresh membrane surface is brought to the center of the window, the film transport is stopped and the cell cavity is clamped against the face plate, as shown schematically in FIG. 7B, so that the membrane seals the window by means of the O-ring 74.

The cell cavity is then filled with electrolyte 33 under sufficient hydrostatic pressure to expand the membrane into a convex extension which, in area 37, contacts the work-piece 30 under a layer of low-conductivity solvent 31.

In alternate embodiments the membrane may be a continuous ribbon, where parts that have been rotated away from the work-piece can be is partially reconditioned, by example soaking in acid to remove impurities, during the time it is not contacting the work-piece.

In another embodiment, the membrane takeup is substantially encased in a spill-resistant enclosure, so that electrolyte remaining on the membrane can not drip or be splashed on, and thereby contaminate the low-conductivity fluid.

MECHANISM FOR MOVING THE HALF-CELL ACROSS THE SURFACE OF THE WORK-PIECE: The ion-conducting membrane substantially and movably contacts the work-piece covered with a low-conductivity fluid. To do so, either the work-piece must be adapted to be moved toward the membrane and also to move in a direction substantially parallel to the surface 37, or the membrane must be so adapted, or some combination thereof.

The movement mechanisms are generally designed by one of ordinary skill in the art, The movement mechanisms are very dependent on the half-cell design. FIG. 34 shows an embodiment of a membrane half-cell that is sized to be directly retrofitted onto conventional CMP equipment, and in such case the movement mechanisms, e.g., the table, platen, etc, can closely match the counterpart components used in traditional CMP. This embodiment facilitates retrofit of existing CMP tools. At the concept level, the CMP polishing pad is replaced with an ionic conductive membrane. Electrolyte is delivered to the back side (platen side) of the membrane and DI water (low-conductivity liquid) to the face. FIG. 34 shows how many of the CMP tool functions can be utilized for the MMEP process, e.g., utilize same kinematics, utilize slurry feed system for low-conductivity fluid feed, and utilize in-platen cooling feeds or slurry feeds for electrolyte.

The tool pressure servers will not need to generate the force that this equipment was called on to do in traditional CMP, as the tool pressure will generally be much lower for MMEP than for traditional CMP. The tool pressure $P_T$, defined as $P_T = F_z/A_p$, is advantageously less than or equal to about 2 psi, and can be less than 1 psi or less. Indeed, high rate MMEP was demonstrated with a tool pressure less than 0.2 psi, and we see no reason to believe that tool pressures can not be extended to less than 0.1 psi, i.e., at least a factor of ten less than the pressures exerted by traditional CMP. Even with large contact areas, the force can be kept low. For comparison with chemical mechanical polishing, an important variable is the tool pressure $P_T$ (also referred to as the "down force"), which is defined as the normal force exerted by the pad onto the wafer (substrate) divided by the area of the wafer. In terms of our experiments this is represented by $F_z/A_p = P_c(A_c/A_p)$. In polishing a copper wafer, we achieved a current density I=1376 mA/cm² at a stoichiometric number n=5, where the contact pressure was $P_c$=2.5 psi. For a tool design with $A_c/A_p$=0.06 this provides a removal rate of 733 nm/min and a tool pressure Pt of about 0.15 psi. This compares favorably to tool pressures normally encountered in conventional chemical mechanical polishing processes which typically range from 2 psi to 6 psi. The above process is particularly useful to polish Cu interconnects on the surface of Cu-damascene wafer for the fabrication of integrated circuits.

Chemical mechanical polishing slurries for planarizing or polishing the surface of a substrate typically contain an abrasive material suspended in an aqueous oxidizer solution. Polishing of a surface is achieved by applying the slurry to a surface and movably contacting the slurry-covered surface with a polishing pad. The polishing pad exerts a pressure on the surface of the substrate. As substrate wafers have grown larger and as various low-k materials have been incorporated in increasing amounts, the pressure and drag exerted by the CMP polishing pad create increasing amounts of damage to the wafers. Industry targets for the next generation of planarization technology have specified copper RR in excess 800 nm/min for blanket planarization at a nominal tool (pad) pressure less than or equal to 5 psi, and further specifies an RR greater than about 400 nm/min for second step polishing at a nominal tool (pad) pressure less than or equal to 2 psi. Moreover, the introduction of new fragile low-K dielectrics, requiring tool pressures $\leq$2 psi, will introduce a major obstacle for chemical mechanical polishing to even maintain existing productivity.

MMEP can differ from CMP. In many embodiments of MMEP, Ac/Ap ranges from about 0.02 to about 0.3, more preferably from about 0.04 to 0.2. We define the tool pressure $P_T$ as the force exerted by the membrane normal to the wafer divided by the total area to be polished, equal to $F_z/A_p$. The contact pressure $P_c$ is the normal force exerted by the cathode half-cell on the substrate per unit area of contact, equal to $F_z/A_c$. Finally, the drag force $F_d$ is the drag force exerted by the membrane on the substrate and the coefficient of friction COF=$F_d/F_z$.

In all embodiments, the ratio $A_c/A_p$ is advantageously greater than or equal to 0.04, and the tool pressure $P_T$ for a 20 cm wafer is less than or equal to 5 psi, preferably less than or equal to about 2 psi, for example less than or equal to 1.5 psi, and most preferably less than or equal to 1 psi, for example between about 0.05 psi and about 0.5 psi, or alternately between about between about 0.2 psi and about 2 psi. It may be possible to establish full platen membrane contact if the tool pressure is on the order of 0.04 psi. In polishing a copper wafer, we achieved a current density I=1370 mA/cm² at a stoichiometric number n=5, where the contact pressure was $P_c$=2.5 psi. For a tool design with $A_c/A_p$=0.06 this provides a removal rate of 730 nm/min and a tool pressure $P_T$ of about 0.15 psi. For a tool design with $A_c/A_p$=0.18, as shown in FIG. 14, for example, this provides a removal rate of 2100 nm/min and a tool pressure $P_T$ of about 0.5 psi. These criteria result in different designs depending on the ratio $A_c/A_p$ that the tool will accomplish. If $A_c/A_p$ is greater than about 50%, the contact pressure will need to be less than a foot of water pressure, and it becomes increasingly difficult to maintain a flat surface. For this reason various support structures are used for these embodiments, as shown in FIGS. 35 to 39. The tool pressures used in MMEP are lower, often much lower, than tool pressures normally encountered in conventional chemical mechanical polishing processes which typically range from 2 psi to over 6 psi.

Figure 36B:
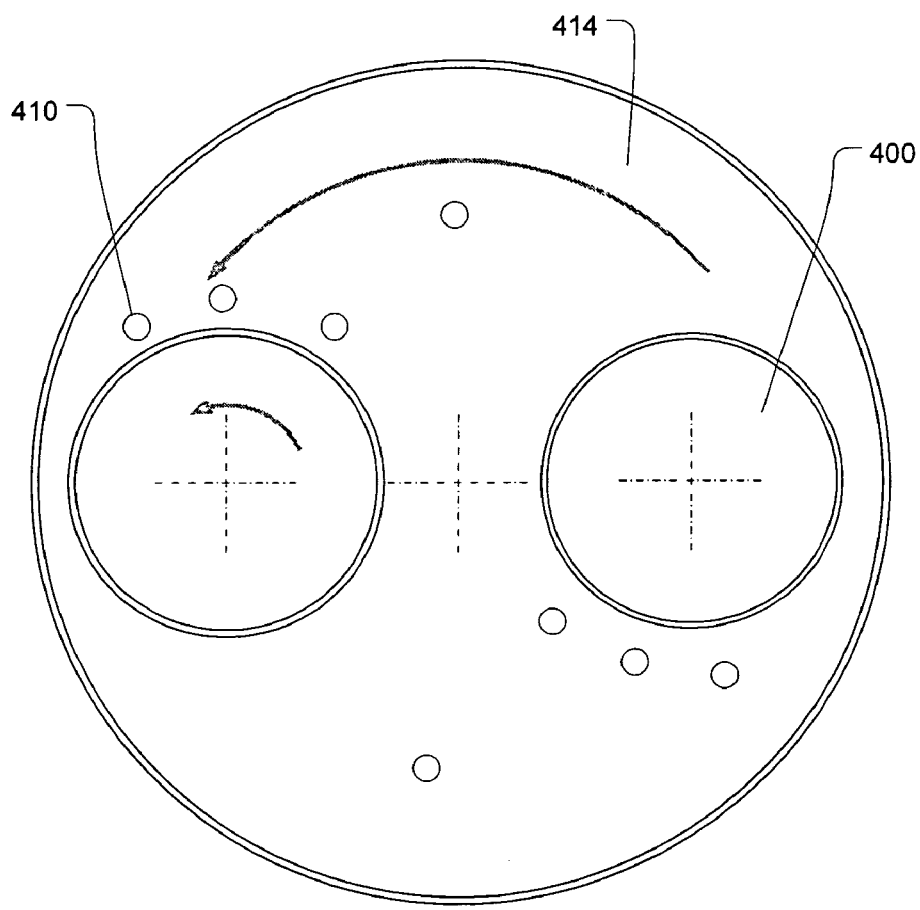

Its also preferred that the contact pressure $P_c$ be below 10 psi, typically below 5 psi, and in many preferred embodiments below 2 psi, for example from about 0.1 psi to about 1.5 psi. Additionally, the drag force $F_d$ of the membrane moving over the wetted substrate surface is less than one half the normal force, more preferably less than one quarter the normal force, for example less than one sixth of the normal force, and can range as low as between about 2% to about 10% of the normal force $F_z$ exerted by the membrane on the substrate. The lower contact pressures greatly reduce the total down force lessening the tool structural rigidity requirements. In addition, the pressurized compliant membrane insures good contact uniformity eliminating the need for complex wafer holder designs. Such a low drag force has an additional benefit, namely, that multiple wafers can be polished simultaneously, as shown in FIGS. 15 and 36B. Additionally, at very low tool pressures large membrane areas may be utilized with little support for the membrane.

Generally, it is known in the art, e.g., the chemical mechanical polishing art, and the standard electropolishing art, to have a revolving or elliptically moving base 101 having ability to also be adjusted vertically. Such a base is adapted to retain and support the substrate, and may optionally further contain enclosures to retain polishing liquid, and enclosures to exclude air, as is known in the art.

Similarly, it is known in the art to have a polishing head 102 be rotating, and, optionally, to be moving in an elliptical manner. By rotating it is meant either rotating about an axis passing through the center of the base 101 and polishing 102, for example, but the membrane and work-piece each need not be and in many embodiments are removed from the center of rotation of the bases, allowing the membrane to extend over a greater area. Any methods of providing controlled horizontal movement known in the art are applicable for this method. Alternatively or additionally, other devices are adapted to move the rotating base, polishing head, or both in directions perpendicular to the work-piece surface, as is known in the art. The motors and arms normally associated with this moving and rotating equipment are not shown.

The half-cell base can be attached to a polishing head, which is simply another support adapted in its simplest form to support the polishing half-cell and connect the polishing half-cell to appropriate rotators, arms, or other supports.

Figure 40C:
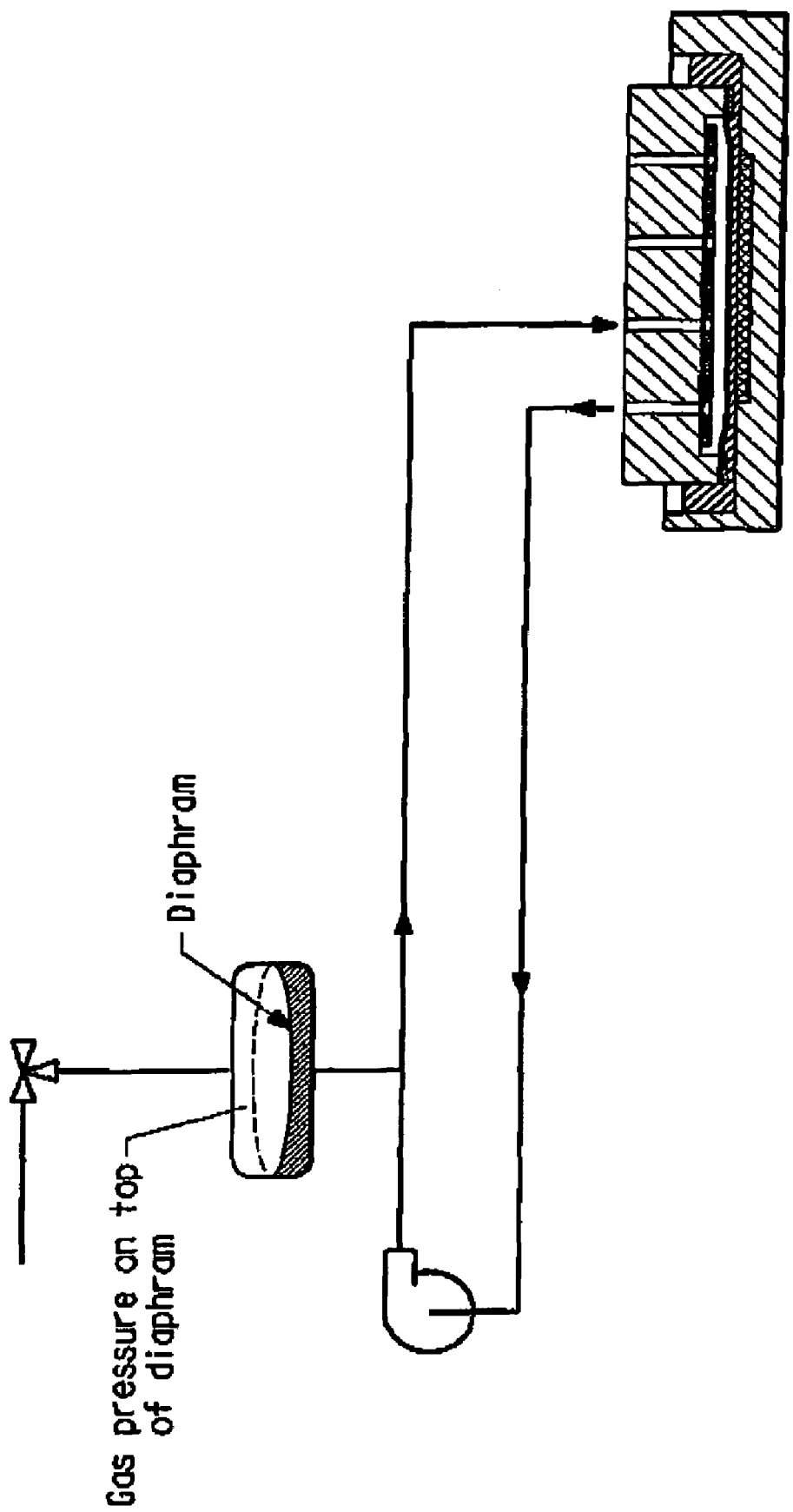
Figure 40D:
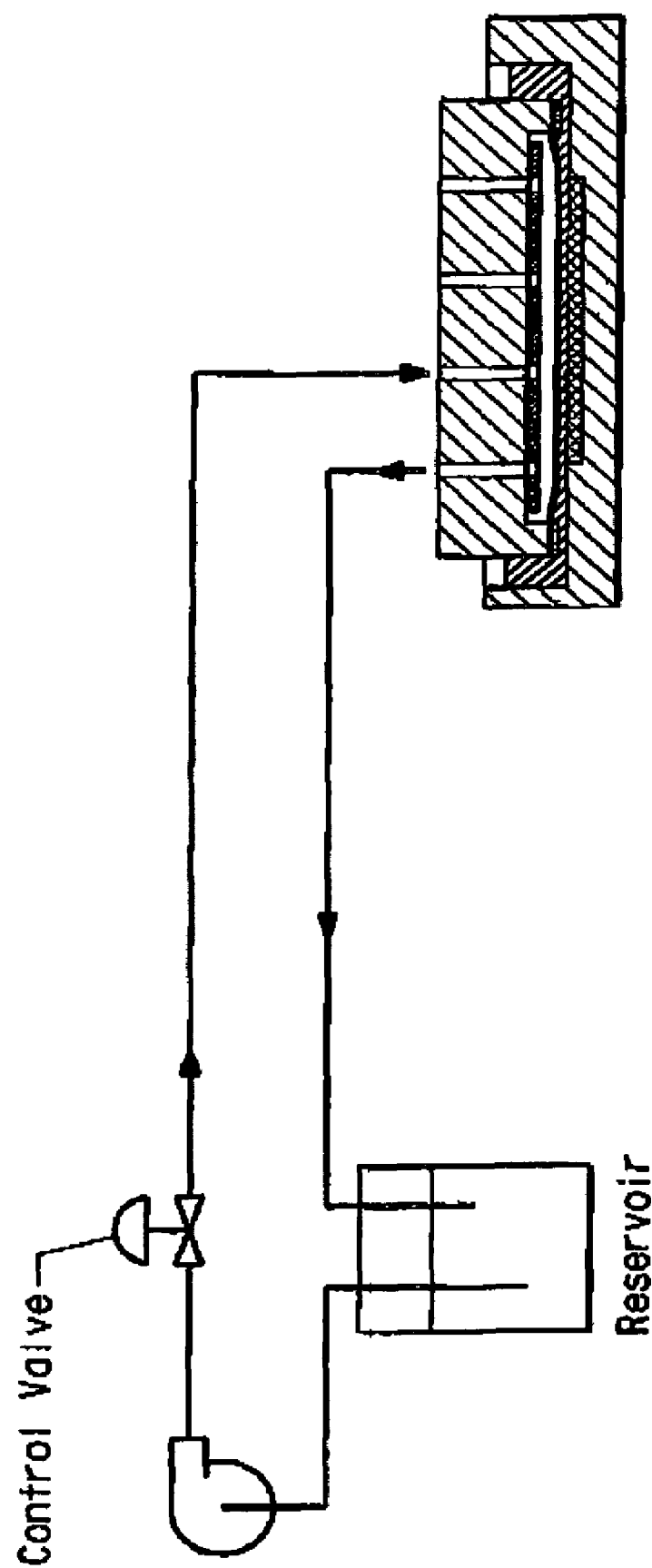
Figure 41:
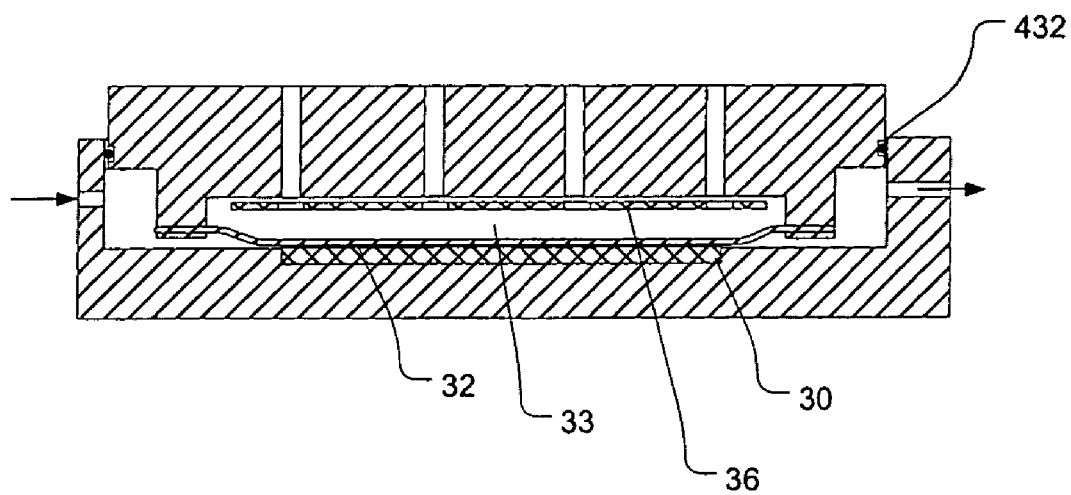
FIG. 41 shows a variation of the apparatus in FIG. 40, where there is a pressurized source of low-conductivity fluid 31 entering and exiting as shown by the arrows, the pressurized fluid being for example contained by sliding seal 432.
Figure 42:
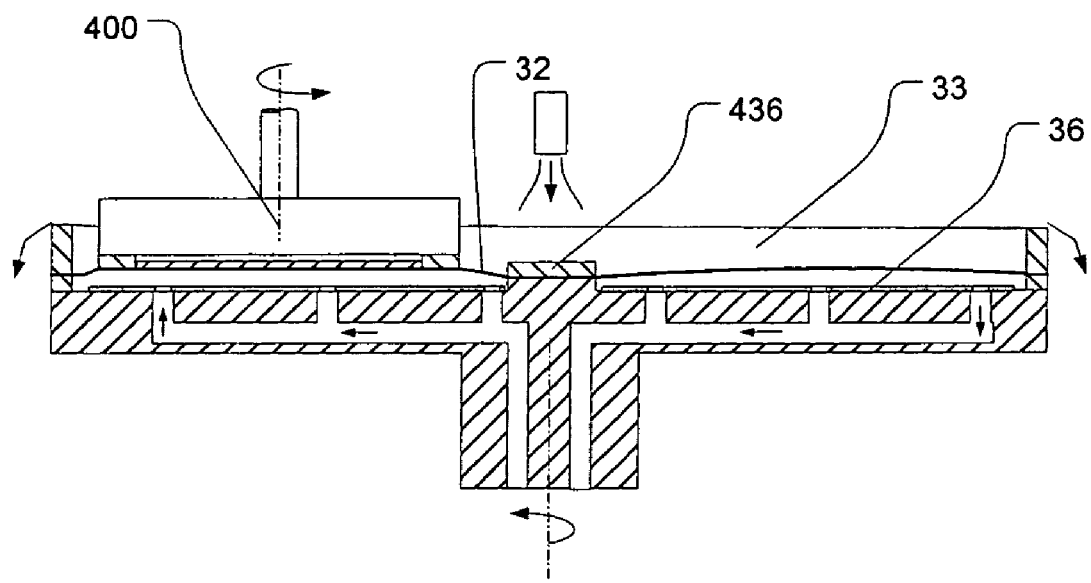
FIG. 42 shows a variation of the apparatus in FIG. 37.
Figure 43:
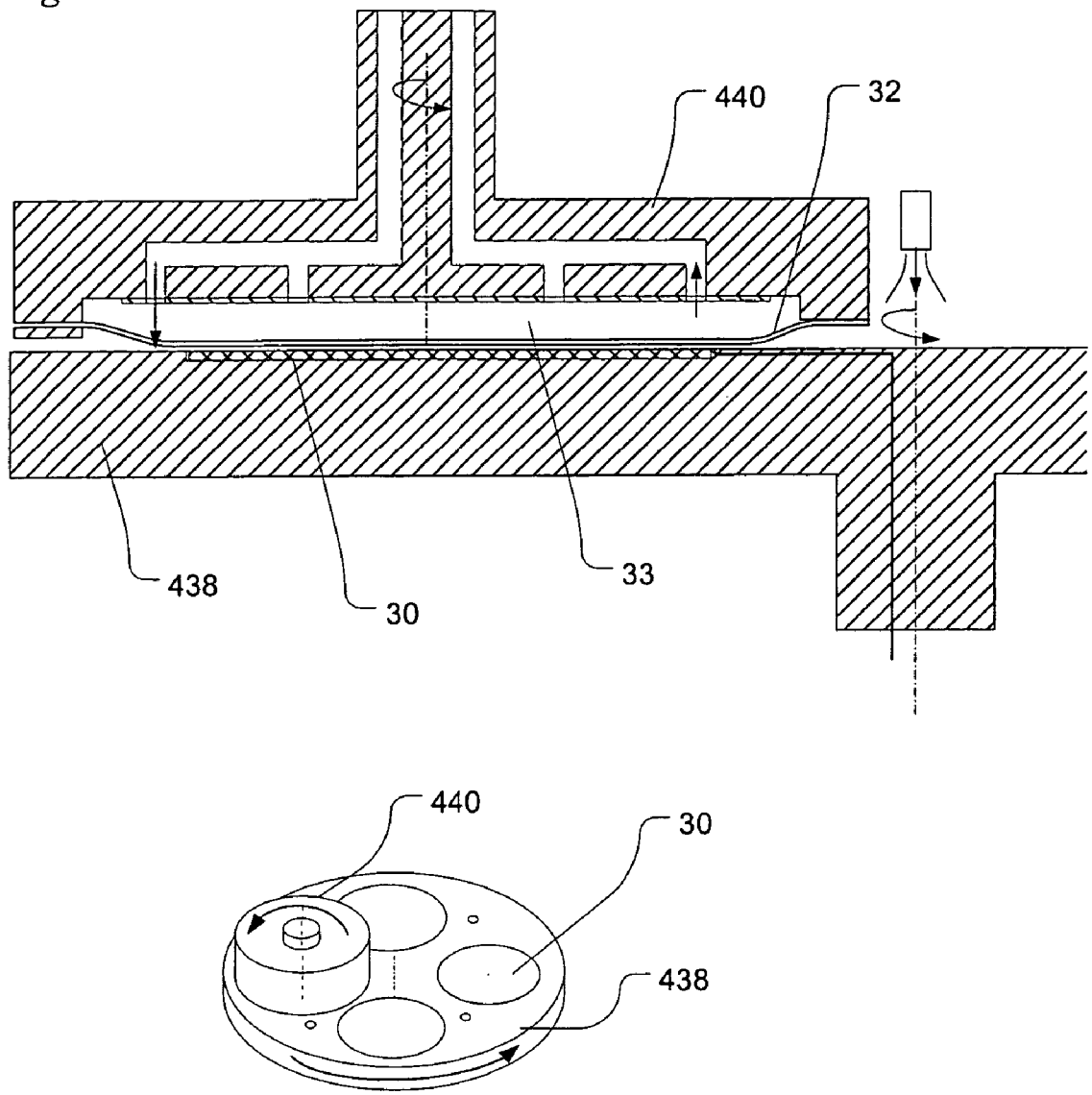
FIG. 43 shows a variation of the apparatus where as many as four wafers can be sequentially polished.

Non-Moving Membrane: We have previously explained that the half-cells can be removed from the substrate surface, providing a time for rehydration of a moving membrane. However, as shown in FIG. 40, if the membrane is sufficiently removed from the work-piece, then low-conductivity fluid can be introduced or injected into the gap. The thickness of the water layer will be subject to much more rigorous control. Further, as there is no movement, there is no polishing differences that might exist between say a front of an advancing web, which will see a thick layer of low-conductivity fluid, compared to the trailing edge of the same membrane, which may be experiencing severe dehydration of the membrane.

The wafer is mounted in a holder immersed in DI water. The membrane is held in contact with the wafer by the electrolyte pressure. As the dissolution proceeds the membrane may dehydrate. Membrane hydration is periodically replenished by opening the gap between the wafer and membrane causing water to flow into the interface. One way to retract the membrane is to withdraw a quantity of electrolyte from the cell. This could be accomplished using a diaphragm (commercially available pulse dampener) in the electrolyte fluid circuit. Another way to flex the membrane is to reduce the pressure in the membrane. Lower pressure will cause the membrane to deform less and begin to return to its unstressed flat shape. Alternately or additionally low-conductivity fluid can be allowed into the gap between the membrane and the work-piece under a positive pressure, which will further facilitate rehydration of a membrane. The membrane and wafer fixture could also be moved mechanically relative to one another to open up the gap. In this embodiment, it may be advantageous to allow a small amount of lateral sliding movement, for example an inch back and forth in one or two directions, of the membrane against the work-piece, to prevent minor defects in the membrane from being expressed on the wafer.

The invention may be further illustrated, but not limited, by the following examples.

EXAMPLES

While data from many experiments is discussed above, this section will present results of selected experiments that show specific aspects of the invention.

Nafion® PFSA membranes (N112, N115, N117, and NE1135, E.I. DuPont de Nemours and Company, Inc., Wilmington, Del.) are non-reinforced films based on Nafion® PFSA polymer, a perfluorosulfonic acid/PTFE copolymer in the acid (H+) form. Copper coupons (0.016" thick, 110 alloy, 99.9%) were obtained from McMaster-Carr Supply Co., P.O. Box 440, New Brunswick, N.J. 08903-0440. Cu damascene wafers with standard test patterns (Sematech 854AZ and 954AZ) feature patterns of contact pads and circuit lines of various dimensions etched into a dielectric layer (500 to 1000 nm thick), coated with a thin barrier layer, e.g., 200 nm of Ta/N and Ta, followed by ~800 nm of electroplated Cu. Examples of Cu damascene wafers 854 AZ and 954 AZ were obtained from International SEMATECH, 2706 Montopolis Drive, Austin, Tex. 7841.

EXPERIMENTAL PROCEDURES—Determining $A_c$, z and $F_z$.

Many parameters are given relative to the contact area $A_c$, and therefore it is advantageous to have a standard method to measure the contact area of a membrane on a surface. A cathode half-cell was constructed, typically with a Nafion® N117 membrane sealed over an oblong window 25 by 18 mm. FIG. 21-A is a photograph of a representative of this single-window half-cell configuration. Another configuration used was a 7/8" circle. Electrolyte solution (0.8 M $CuSO_4$ in 0.5 M $H_2SO_4$) was pumped through the half-cell by means of a variable speed peristaltic pump (Masterflex model 7021-24) and the hydrostatic pressure $P_h$ was measured by means of a pressure transducer connected before the inlet port of the half-cell. Several experiments were carried out with Cu coupons whose surface had been mechanically polished with 1000-grit abrasive. Other substrates were used, and are described as needed. The half-cell was, in later experiments, mounted over a flat Cu work-piece covered with de-ionized water by means of an adjustable stage incorporating a transducer calibrated to measure the normal force $F_z$ between the half-cell and the work-piece as a function of the vertical displacement z, which was measured with a micrometer. A simplistic drawing of the half-cell moving across a wetted substrate surface is shown in FIG. 22-A. The membrane assumes the form of a blister, and therefore the contact area $A_c$ can be varied by changing the vertical displacement z, which was varied by means of a micrometer. Once a distance z had been set, the normal force $F_z$ was measured. FIGS. 28-A and 28B show photographs of a portion of the apparatus. A brief period of electrolysis was then carried out under static conditions (v=0) producing an elliptical "footprint" of the anodic oxidation. $A_c$ was determined by measuring the area of the well-defined ellipse on the surface of the work-piece. In FIG. 22-B, the area of that surface polished at zero velocity for values of z ranging from 0 to −1.00 mm is clearly evident from the outlines left on the substrate. While there is little polishing within the contact area, a easily visible trench is formed around the periphery of the contact area. Only a fraction of the oblong 25×18 mm membrane contacts the substrate surface. The contact area at static conditions is presumed to not change significantly when the membrane is moving over the substrate surface.

FIG. 23-B shows measurements of the contact dimensions as a function of $F_z$ for a oblong 25×18 mm Nafion® N117 membrane single-window cathode half-cell having 6.2 psi hydrostatic pressure being exerted by the electrolyte on the membrane. The long and short axes of the elliptical contact increases approximately as $(F_z)^{1/2}$ so that $A_c$ increases linearly. The contact area $A_c$ is proportional to the product of long and short axes, and is therefore proportional to $F_z$. The initial point of contact is fixed at $F_z=0$, where the membrane blister just contacts the substrate surface, and $A_c$ was found to increase linearly with $F_z$ from about 0 to over 700 grams.

Another parameter used here is the total area to be polished. In many of the experiments described subsequently, the polishing path was circumferential. FIG. 22-B also shows the clear outline of a typical radial polishing path, which is shown schematically in FIG. 23-A. The interfacial velocity is given by $v=2\pi r\omega$, where $\omega$ is the angular velocity of the work-piece and r the radius of the track (approximately 1.7 cm). The polishing area $A_p$ was determined by the long axis of the contact and the circumference of the circular "track" covered in a single cycle of rotation. Anodic oxidation was carried out at either a fixed applied voltage or applied current. The respective dependent variable was measured once steady-state conditions were established (approximately 30 sec), and the total integrated charge passed was measured by means of digital coulometer. The removal rate RR was calculated by measuring the mass loss $\Delta m$ for any given processing time t over a given area of polishing $A_p$ using equation (5). Dwell time is the velocity times the length of the short axis of the contact area. (about one half of the long axis) or was the diameter of the area of contact if a circular window was used.

Example 1

Membrane-mediated Electropolishing of Cu Coupons

A cathode half-cell was constructed for membrane-mediated electropolishing (MMEP) whose cross-section is shown schematically in FIG. 3. The half-cell comprised a polypropylene base (1) bolted to a stainless steel faceplate (2) which framed an opening approximately 1.0 cm×2.5 cm. This opening was covered by a piece of Nafion® membrane (4) (NE1135, 3.5 mil thick) sealed against the faceplate by means of a silicone rubber gasket (approximately 0.5 cm thick. A piece of copper foil (6) was sealed to the base and electrically connected to a wire on the outside of the half-cell. The cavity (5) defined by base, gasket and membrane contained two ports (7) connected to Teflon® tubing (OD1/16") through which the electrolyte (0.2 M copper sulfate in 40% phosphoric acid) was continuously re-circulated by means of a peristaltic pump (not shown) from an external reservoir. Electrolyte was pumped through the half-cell at approximately 10 ml/min producing a positive pressure inside the half-cell that caused the membrane to expand (bulge) slightly, forming an liquid-filled elastic bubble or blister.

In operation, the copper foil served as the cathode and was connected to the negative terminal of the power supply (Princeton Applied Research Model 173 potentiostat/galvanostat, EG&G Instruments, P.O. Box 2565, Princeton, N.J. 08540). The work-piece (8) consisted of a flat piece of copper sheet metal (⅕"×3") whose surface had been uniformly milled with 600 grit carborundum abrasive. The work-piece was immersed in a shallow bath of deionized water and a voltage of 5.0V was applied between the anode and cathode. When the external surface of the half-cell membrane was brought into contact with the water bath only a small current was observed, zero to a few mA, depending on the distance from the work-piece. By contrast, when the convex external surface of the membrane was brought into contact with the work-piece, the current increased to at least 200 mA. Polishing was accomplished by rubbing the external (convex) surface of the membrane over a small area of the work-piece (~2 cm$^2$). During this process the current density converged to a steady value of approximately 150 mA and the surface of the work-piece was observed to become smoother and brighter.

The total amount of copper removed from the work-piece was determined by weighing the coupon before and after polishing. By comparing the weight loss with the total amount of charge passed it was computed that the number of electrons per Cu atom dissolved was 2.3±0.2, consistent with the production of Cu$^{+2}$ ions. (The slight excess over 2.0 may be tentatively ascribed to oxygen production). The change in thickness $\Delta\tau$ was calculated from the total charge passed per unit area (Q) and the density of copper (8.9 g/cm. The roughness of work-piece was measured by means of profilometry (Model P15, KLA Tencor 160 Rio Robles, San Jose, Calif. 95035) before and after the polishing operation. For each data point, 0.4 mm profilometry scans were made at five different locations on the sample and the standard deviation roughness (R) was calculated. The results, summarized in Table 1, show a dramatic decrease in roughness with very little loss of thickness.

TABLE 1

Changes in roughness R (0.4 mm scans) on milled Cu coupons, before and after polishing using MMEP.

| Sample | Q coul/cm$^2$ | R nm | $\Delta R$ nm | $\Delta\tau$ nm | $\Delta R/\Delta\tau$ |
|---|---|---|---|---|---|
| Milled | 0.0 | 310 | 0 | 0 | |
| 1A | 1.4 | 183 | 127 | 442 | 0.29 |
| 1B | 2.2 | 82 | 228 | 695 | 0.33 |
| Milled | 0.0 | 314 | 0 | 0 | |
| 1C | 3.0 | 53 | 262 | 948 | 0.28 |
| 1D | 3.1 | 41 | 274 | 980 | 0.28 |
| Milled | 0.0 | 300 | 0 | 0 | |
| 1E | 3.5 | 34 | 266 | 1106 | 0.24 |
| 1F | 3.7 | 8 | 292 | 1169 | 0.25 |

Example 2

Comparison of Membrane-mediated and Conventional Electropolishing

Two copper coupons (1.5"×2.0") were milled as in Example 1 and then masked with tape so that only an area of 0.71 cm$^2$ was exposed. One of these coupons was polished by MMEP using the same procedure as in Example 1. The second coupon was polished by the conventional electropolishing (EP) method. For EP a silicone rubber gasket ⅜" thick was used to separate the work-piece from a sheet of copper foil which served as the cathode. A cylindrical cavity in this gasket provided a volume between the work-piece and cathode filled by electrolyte solution that was continuously pumped through cavity. The area of work-piece exposed to electrolyte in the EP cell was the same as that polished by the MMEP process. The same electrolyte (0.2 M Copper sulfate in 40% phosphoric acid) and the same pumping rate was used in both sets of polishing experiments. The root-mean-square roughness $R_g$ was measured by profilometry and the results are summarized in FIG. 10. The polishing efficiency, represented by the ratio $\Delta R/\Delta\tau$. is seen to be much greater for MMEP (0.26) than for conventional EP (0.07).

We have found that at comparable polishing rates, MMEP can provide much higher planarization efficiency than EP. Moreover, for large features with $\lambda$=200 microns, the planarization efficiency of MMEP is much greater than that for the "ideal" EP process which would require extremely slow polishing with non-convected electrolyte.

Figure 10:
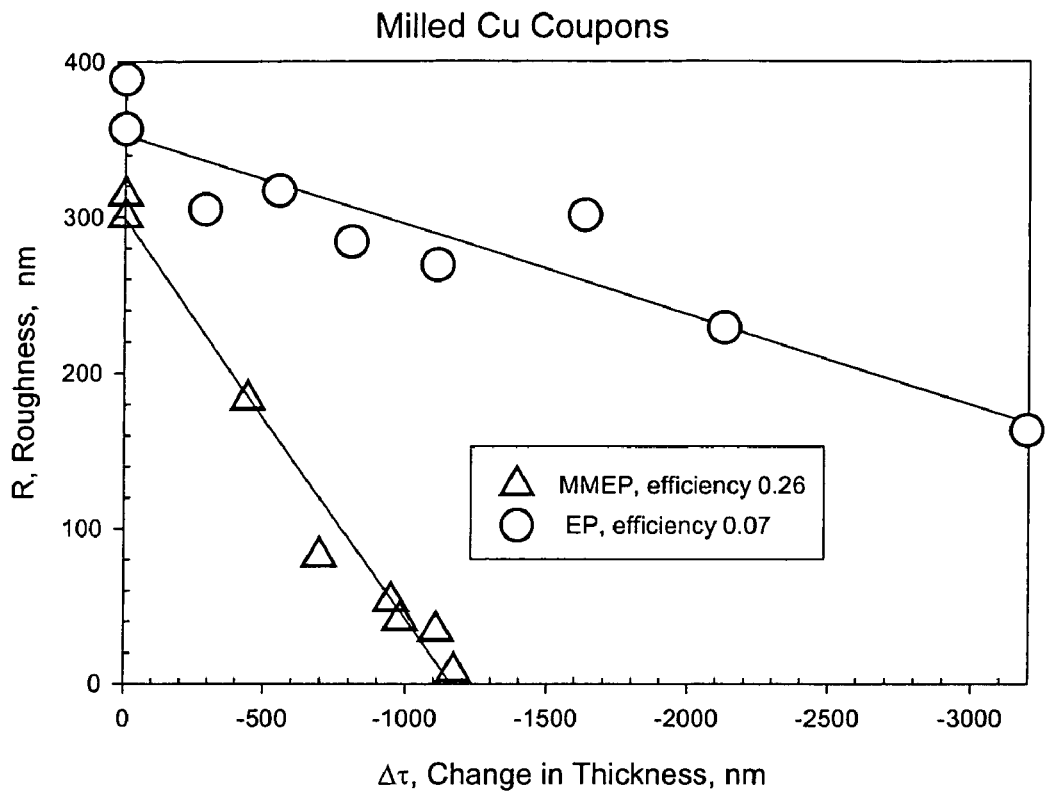
FIG. 10 shows a graph comparing the polishing efficiencies of MMEP and EP.

FIG. 10 shows the decrease in surface roughness R obtained by polishing milled Cu coupons using EP (prior art) and MMEP. The same voltage, electrolyte composition and pumping rate were used for both processes, and the resulting current densities were comparable (0.1 to 0.2 mA/cm$^2$). It is apparent that the planarization efficiency (reflected by the slope $\Delta R/\Delta\tau$), for MMEP is more than three times higher than for EP. Roughness R represents an average of the topographic amplitude a for many features with a wide range of lateral dimensions $\lambda$.

Example 3

Figure 11:
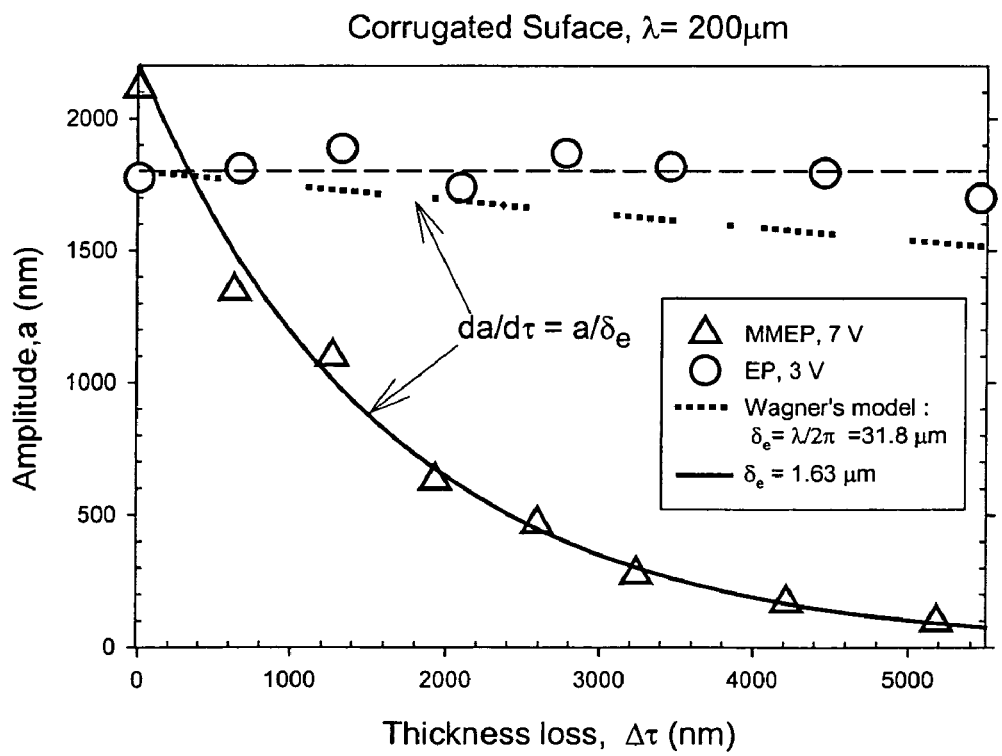
FIG. 11 shows a graph comparing the planarization efficiencies of MMEP and EP.

Comparison of Membrane-mediated and Conventional Electropolishing for Planarizing Surfaces with Large-$\lambda$ Features A copper coupon was polished to a mirror finish using jeweler's rouge, then laminated to a dry-film photoresist (Riston® 9415, E.I. Dupont de Nemours and Company, Inc., Wilmington, Del.). The photoresist film was covered with a lithographic negative patterned with 100 micron lines interspersed with 100 micron spaces, and then exposed and developed under conditions recommended by the manufacturer (DuPont Riston® Printed Circuit Materials, RD 1, New James St., Towanda, Pa. USA 18848-9784). The exposed areas on the coupon were etched for 1 minute in a 5% solution of sodium monopersulfate (Sigma-Aldrich, Milwaukee, Wis.), followed by conventional electropolishing at 2.0V and 1.5 coul/cm$^2$ (as described in Example 2). The resist mask was then removed by soaking in dichloromethane, leaving a corrugated surface with alternating 100 micron trenches and 100 micron plateaus. The coupon was masked with tape leaving two circular areas (each 2.3 cm$^2$) exposed. The amplitude of five corrugations in each of three different locations within each area was measured and averaged. One area was then polished via MMEP as in Example 1 at 7.0 V, and the other area was polished via conventional EP as in Example 2 at 3.0 V. Following each polishing session the amplitude of corrugations at the same location were re-measured and averaged. The results of polishing by EP (prior art) and by MMEP a work-piece with corrugated surface topography consisting of 100 micron ridges separated by 100 micron trenches are plotted in FIG. 11. For comparison, the dotted line represents Wagner's prediction for ideal (non-convected) EP when $\delta_c > \lambda$, and the dashed line shows Wagner's prediction for EP when $\delta_c < \lambda$. As expected for well-convected conditions, the data for EP conform to the latter limit. The solid line represents the best fit of the MMEP data to the function $a=a_o\exp(-\Delta\tau/\delta_e)$, wherein with $\delta_e$, the apparent boundary layer thickness, being 1.63 microns and $a_o$ being the initial topographic amplitude (2200 nm). See, e.g., FIG. 2. The close agreement between this function and the MMEP data demonstrate that MMEP is governed by a much smaller boundary layer than predicted by Wagner's model, and indicates that MMEP follows a qualitatively different mechanism than conventional EP.

The results for EP show no significant planarization, i.e., decrease in the topographic amplitude "a," consistent with Wagner's prediction for well-convected conditions, whereas the results for MMEP show a substantial decrease in "a" which conforms to the equation:

$$da/d\tau = a/\delta_e \qquad (7)$$

where $\delta_e$ is an empirically determined parameter. It should be noted that equation 7 is of the same form as Wagner's "ideal" EP process ($da/d\tau = 2\pi a/\lambda$), but also that the magnitude $\delta_e = 1.63$ micron, which describes the MMEP results, is much smaller than that predicted for the "ideal" EP process, namely: $\lambda/2\pi = 31.8$ micron (dotted line in FIG. 11). This demonstrates that the MMEP process is much more efficient than the "ideal" EP process for planarizing features of large $\lambda$ and is even capable of planarizing such features under well-convected conditions where EP is totally ineffective.

Example 4

Selective Removal of Copper from a Damascene Wafer

A 3"×3" section was cut from a Cu damascene wafer (20 cm in diameter, Sematech 854 pattern 1-63D) which was obtained from EKC Technology (Dupont Electronic Technologies, Hayward, Calif.). This wafer had been coated with a 0.5 micron layer of dielectric material into which a circuit pattern consisting of lines and contact pads had been lithographically etched. The surface had then been uniformly coated with a thin (<0.1 micron) layer of tantalum followed by a thicker layer (~1 micron) of electroplated copper. Under the optical microscope the underlying circuit pattern remained visible due to variations in surface topography. Surface profilometry measurements across large circuit features (>10 microns in lateral dimensions) showed depressions of approximately 0.5 microns, indicating that the topography of the copper blanketing these features conforms roughly to that of the underlying etched dielectric layer.

Following the procedures described in Example 1, an area of approximately 1 cm$^2$ of this copper damascene wafer was polished via MMEP at 6.0 V. The process was stopped after passing a total charge of 2 coulombs, corresponding to removal of 0.67 microns of copper, averaged over the treated area. The sample was dried and inspected under the optical microscope. In some regions of the treated area, copper had been completely removed. In some regions, residual copper remained in the etched circuit elements and on top of the dielectric layer. In another region, copper was completely removed from the surface of the dielectric, but remained in etched circuit elements with lateral dimensions ranging from <1 micron to 100 microns. This demonstrates the utility of MMEP for selective removal of copper from a typical damascene wafer.

Example 5

Use of Membrane-mediated Electropolishing for a Variety of Metals and Alloys

This example demonstrates the utility of MMEP for polishing various different metals. Polishing was carried out using the same half-cell and methods described in Example 1 but the electrolyte composition and voltages were varied as indicated in Table 2. In all cases, the work-piece consisted of a flat specimen of the metal whose surface was milled prior to polishing by abrasion with 600 grit sand paper producing an initial mean roughness of approximately 0.3 micron. The surface of the work-piece was visually compared before and after MMEP polishing and the detailed surface textures were compared by differential interference contrast (DIC) microscopy (Nikon Optiphot, Optical Apparatus Co. Inc., 136 Coulter Ave., Ardmore, Pa. 1900. After anodic dissolution of approximately 0.8 microns of material (0.6 mg/cm$^2$) via MMEP, all but the deepest milling scratches have been removed.

While none of the conditions summarized in Table 2 represent optimized conditions, these data show that different electrolyte compositions and voltages were required for successful polishing of different metals with MMEP. For example, whereas a CuSO$_4$/H$_2$SO$_4$ electrolyte was found to be effective for polishing nickel, the same electrolyte produced a black deposit with cobalt. Under these conditions, the stoichiometric number, n, was close to 1 electron/Co. However, addition of acetonitrile to the electrolyte completely eliminated deposit formation and the resulting value of n increased to nearly 2 electrons/Co. It is presumed that the black deposit represents colloidal cobalt produced from disproportionation of Co$^{+1}$, whereas coordination by acetonitrile favors direct oxidation to Co$^{+2}$. Similarly, MMEP of tin using the CuSO$_4$/H$_2$SO$_4$ electrolyte produced a dark grey matte finish and resulted in precipitation of a white solid on the inside surface of the membrane that was presumed to be amorphous SnO. Addition of HCl to the electrolyte prevented formation of the precipitate and produced a mirror-like finish. MMEP of both nickel and 316 stainless steel using water as the low-conductivity solvent produced a mirror-like finish, but the very high values of n (26 and 29 electrons/metal atom) indicated that most of the current must be carried by an anodic process other than metal oxidation. Both of these metals exhibit some catalytic activity for oxidation of water, and in fact gas bubbles were observed to form in the water bath near the MMEP cell consistent with the anodic evolution of O$_2$. It can be seen that the method is useful for a wide variety of metals.

TABLE 2

Membrane-mediated Electropolishing of Various Metals and Alloys

| M | Electrolyte | Low Cond. fluid | V | I mA/cm$^2$ | n e/M | Comments |
|---|---|---|---|---|---|---|
| Ag | 2M HNO$_3$ | H$_2$O | 3.5 | 700–630 | 0.99 | mirror-like finish |
| Ni | 0.3M CuSO$_4$ in H$_2$SO$_4$, H$_2$O, 1:2 | H$_2$O | 8.0 | 500–580 | 26 | mirror-like finish O$_2$ evolution |

TABLE 2-continued

Membrane-mediated Electropolishing of Various Metals and Alloys

| M | Electrolyte | Low Cond. fluid | V | I mA/cm$^2$ | n e/M | Comments |
|---|---|---|---|---|---|---|
| Co | 0.3M CuSO$_4$ in H$_2$SO$_4$, H$_2$O, 1:2 | H$_2$O | 4–10 | 50–500 | 1.09 | black deposit, (colloidal Co?) |
| Co | 0.15M CuSO$_4$ in H$_2$SO$_4$:H$_2$O:CH$_3$CN 1.0:1.5:2.5 | H$_2$O | 2.0 | 210–190 | 1.92 | bright, grainy |
| Sn | 0.3M CuSO$_4$ in H$_2$SO$_4$ H$_2$O, 1:2 | H$_2$O | 2.0 | 300–150 | 1.92 | dark grey matte |
| Sn | 0.2M CuSO$_4$ 4 M HCl in H$_2$SO$_4$ H$_2$O, 1:3 | H$_2$O | 1.0 | 300–140 | 1.99 | mirror-like finish |
| S. Steel type 316 | 0.3M CuSO$_4$ in H$_2$SO$_4$, H$_2$O, 1:2 | H$_2$O | 7.0 | 900–250 | 29 | mirror-like finish O$_2$ evolution |
| Al | 0.15M CuSO$_4$, 5 M HCl in H$_2$SO$_4$, H$_2$O, 1:4 | H$_2$O | 2–4 | 200–600 | 2.64 | hazy mirror-like |

The use of acetonitrile in copper polishing favors stabilization of copper(I) ions. If copper(I) ions pass through the membrane, and the electrolyte is not adapted to stabilize and solvate copper(I) ions, then 2 copper(I) ions will interact to form one solvated copper(II) ion and one copper metal atom, which will typically be in the form of a precipitate on or in the membrane.

Example 6

Ability of MMEP to Avoid Contamination of Work-piece

In every embodiment of the invention, a low-conductivity fluid is used to contact, e.g., cover, the work-piece. The low-conductivity fluid serves to solvate the metal ions and facilitate their transport through the membrane, and also to limit the anodic dissolution reaction to areas of the work-piece in contact with, or in close proximity to, the membrane. Traditional CMP slurries comprise an oxidizer fluid, abrasive particles, and typically a plurality of additives. The traditional CMP slurry must be continuously fed to the polishing pad, so the usage is substantial. Traditional CMP slurries are very expensive, are somewhat unstable over time, and are useful for only a single use. While only a fraction of the oxidizer and additives are consumed and only a fraction of the abrasive is degraded in the polishing, the slurry is not usable in subsequent polishing. The used CMP slurry, having oxidizer and metal ions and typically abrasives, is classified as a hazardous waste that is very expensive to treat or dispose of. One of the most substantial costs in manufacturing semiconductors and the like is the procurement and subsequent disposal of slurries.

Unlike conventional CMP formulations, there is no oxidizer in the low-conductivity fluid which can be consumed, and no abrasives which can be degraded or contaminated. Further, as the data presented here show, most metal ions electropolished from a substrate migrate through the membrane and into the half-cell. Therefore, the low-conductivity solution can in theory be endlessly re-cycled, the quantity being supplemented only to replace the very low quantities of low-conductivity fluid lost due to transport of metal ions through the membrane and to evaporation. Therefore, in addition to the polishing fluid not requiring hazardous waste disposal, the low-conductivity fluid can be recycled so that extremely small quantities are consumed.

A copper coupon was immersed in a bath containing 100 ml of deionized water and polished via MMEP at 7.0 V under conditions otherwise as described in Example 1. After passing 30 coulombs of charge, the weight loss was 8.9 mg, corresponding to n=2.2 e/Cu. The conductivity of the bath was found to have increased from 1.0 to 31.2 μS/cm and the pH had decreased from 7.0 to 4.8. The metal content of the bath was analyzed via inductively coupled plasma spectroscopy and found to contain 0.25±0.05 mg Cu (3.9×10−5 mole/l) and 0.65±0.05 mg P (2.1×10−4 mole/l). The P concentration and increase of conductivity reflect the small amount of electrolyte permeation through the membrane into the bath. The much lower concentration of residual Cu ions represents only 2.8% of the total amount of Cu anodically dissolved. Since some of the residual Cu may also have originated from electrolyte permeation, it follows that the efficiency of the MMEP in removing anodized Cu$^{+2}$ from the work-piece was at least 97.2%.

In the above experiment, after polishing 8.9 mg of copper from a copper coupon, about 0.25 mg of copper and 0.65 mg of P were found in the low-conductivity fluid. This suggests that 0.136 moles of copper migrated from the low-conductivity fluid, while 0.021 moles of aniom migrated from the electrolyte to the low-conductivity solution, giving a ratio of about 6.5 moles metal per mole of anion. The contamination appears to reflect a small amount of electrolyte permeation or leakage from the half-cell into the bath, as this was the only source of P. In recycling low-conductivity fluids, the concentration of metals can increase, thereby changing the conductivity of the fluid and eventually providing a source of contamination. Beneficially, if low-conductivity fluid is recycled, the low-conductivity fluid is treated to remove residual metal ions, by for example contacting the low-conductivity fluid with an electrode adapted to plate out metal ions or, preferably, by contacting the low-conductivity fluid with an active ion exchange resins prior to re-use.

Subsequent results, such as is described in Example 8, suggest the value of 97.2% of electropolished copper passing through the membrane and into the electrolyte solution or gel is low, and the true value is above 99%.

Example 7

MMEP Planarization of a Cu Damascene Wafer

A 3"×3" section cut from a Cu damascene wafer (20 cm in diameter, Sematech 854 pattern 1-63D) was obtained from EKC Technology (Dupont Electronic Technologies, 2520 Barrington Court, Hayward, Calif. 94545-116. The section was mounted facing up on a rotating mechanical stage (Headway Research, Inc., 3713 Forest Lane, Garland, Tex. 75042-6928) and the copper blanket layer was connected to the positive terminal of the potentiostat by means of a strip of copper foil taped at one edge. A MMEP cathode half-cell similar to that of Example 1 was fitted with a Nafion® N117 membrane and filled with electrolyte comprising 0.55 M $CuSO_4$ in 2.2 M $H_2SO_4$ under positive pressure via a re-circulating pump. The half-cell was mounted so that the external convex surface of the membrane was held in contact with the surface of the wafer and the area of contact was flooded by a continuous flow of deionized water (approximately 20 ml/min). The wafer was rotated at 100 revolutions per minute so that the area of contact with the half-cell membrane defined a circular "track" approximately 1 cm in width and 5 cm in diameter. Polishing was carried out using a continuously repeating sequence of 0.2 seconds at 7 V interrupted by 0.2 seconds at 0V. During each cycle the current density varied between approximately 150 mA/cm2 to 25 mA/cm2 respectively. Polishing was stopped when careful visual inspection indicated small areas of the surface had become free of blanket copper. This condition was reached at a point where coulometry indicated that the average thickness of copper removed over the area of the polishing track was $\Delta\tau=0.9$ micron.

Inspection of the wafer by optical microscopy showed that most of the polished area still retained a continuous layer of blanket copper while in certain areas copper was retained only in the circuit features and had been completely removed from the surface of surrounding barrier-coated dielectric features. Profilometry measurements on un-polished areas of the original copper blanket over patterns of 100 micron circuit pads separated by 50 micron dielectric spaces showed an initial topographic amplitude of $a_o=1.0$ micron. Profilometry measurements on the same patterns in polished areas which still retained a thin layer of blanket copper showed a final topographic amplitude a <15 nm. By reference to equation 2, these results correspond to an apparent boundary layer thickness of $\delta_e$<220 nm.

Figure 2:
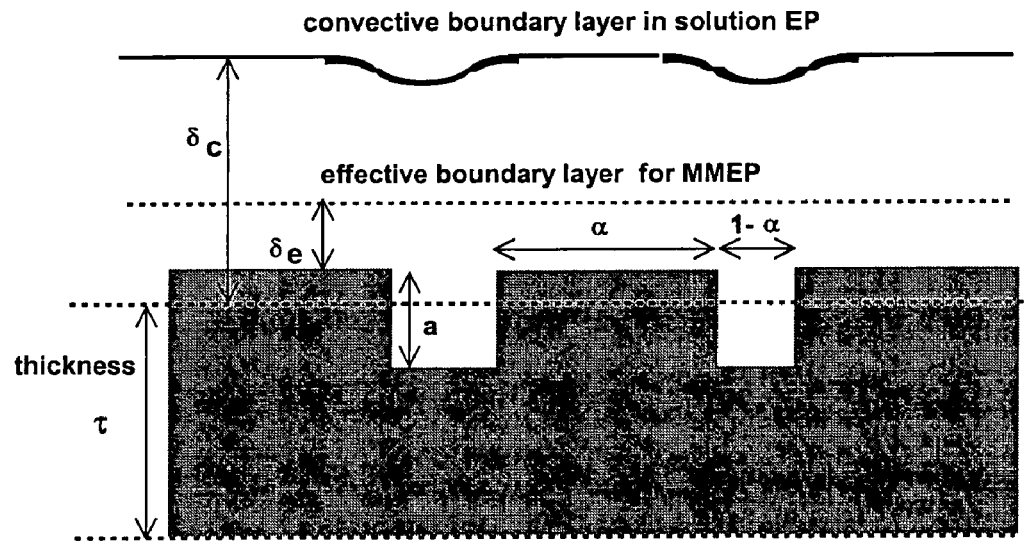
FIG. 2 is a schematic illustration of the various physical dimensions governing planarization efficiency for EP in a convected electrolyte solution versus MMEP.

A phenomenological model, illustrated schematically in FIG. 2 and in FIG. 22-C, was found to be useful for analyzing MMEP planarization efficiency for surfaces with regular topographic features consisting of flat plateaus separated by trenches recessed by amplitude a. The mean thickness of the sample is represented by $\tau$ and $\alpha$ is the fraction of surface area on the plateaus. For comparison, $\delta_c$ represents the convective boundary layer which governs the rate and efficiency of conventional EP in electrolyte solutions. In MMEP it is assumed that the fluxes for removal of metal respectively from plateaus and trenches are inversely proportional to the distance of those surfaces from an effective boundary layer which lies parallel to the sample at a distance $\delta_e$ from the high points. The following expression for planarization efficiency is derived from this assumption:

$$da/d\tau = a/(\alpha a + \delta e) \qquad (8)$$

or, after integrating over given change in thickness $\Delta\tau$:

$$a = a_o \exp(\Delta\tau/\delta_e - \alpha \Delta a/\delta_e) \qquad (9)$$

where $a_o$ is the initial amplitude. Comparison of these equations with experimental data showed good agreement and provided a means to empirically determine the value of $\delta_e$ to within ±15 nm under various polishing conditions. The fundamental differences between MMEP and conventional EP in liquid electrolytes are illustrated by the following comparison:

MMEP (eq. 8): $\alpha a >> \delta_e$, $da/d\tau = 1/\alpha$

EP (Wagner): $a, \lambda >> \delta_c$, $da/d\tau = 0$

MMEP (eq. 8): $\alpha a << \delta_e$, $da/d\tau = a/\delta_e$

EP (Wagner): $a, \lambda << \delta_c$, $da/d\tau = 2\pi a/\lambda$

In the limit of large a, the MMEP model predicts perfect planarization, where material is removed exclusively from the plateaus such that $\Delta a = \alpha \Delta \tau$, regardless of $\lambda$. By contrast, conventional EP becomes completely ineffective in this limit because the convective boundary layer conforms to the surface topography. In the limit of small a MMEP efficiency is inversely proportional to $\delta_e$ but independent of the lateral dimension $\lambda$, whereas Wagner's "ideal" EP efficiency is inversely proportional to $\lambda$. Processing conditions may be varied to minimize $\delta_e$ and thereby maximize the efficiency of MMEP.

Example 8

Ability of MMEP to Avoid Contamination of Work-piece

A cathode half-cell with a 1" diameter circular window fitted with N117 Nafion® membrane was filled with electrolyte comprising 0.40 M $CuSO_4$ in 1.32 M $H_2SO_4$ pumped under hydrostatic pressure $P_h$=6.0 psi. De-ionized water was delivered via two ports located on either side of the membrane window at a flow rate of 840 ml/min. The flow of de-ionized water was recovered prior to contact with the membrane and found to have a conductivity of 0.3 µS/cm. The same stream of de-ionized water was then allowed to flow across the surface of a flat copper work-piece, 200 mm in diameter, mounted on the polishing tool and rotating at 190 rpm. The effluent stream recovered from the surface of this work-piece was found to have a conductivity of 0.5 µS/cm. The cathode half-cell was then brought into contact with the moving work-piece with a contact area $A_c$=0.825 cm² so that the de-ionized water contacted the external surface of the cathode half-cell as well as the surface of the work-piece. The effluent stream recovered from the surface of this work-piece was found to have a conductivity of 0.9 µS/cm. A voltage of 18 V was then applied between the work-piece and cathode producing a current density of 630 mA/cm² and polishing was carried out over an area $A_p$=17 cm². The effluent stream recovered from the surface of this work-piece was found to have a conductivity of 0.8 µS/cm. Thus the conductivity of the de-ionized water effluent was not significantly increased by contact with the half-cell or by current flow during polishing of the work-piece. This example confirms that the membrane is an effective barrier against diffusion of electrolyte out of the half-cell and also that the MMEP process, at least under some polishing conditions, traps essentially all copper electropolished from the work-piece, and thereby prevents contamination of the de-ionized water and the work-piece. Moreover, the conductivity of the effluent is low enough that it becomes more practical to directly recycle this water through the de-ionizer rather than utilizing a fresh water supply. This procedure reduces the cost of generating de-ionized water and also eliminates a waste stream.

Example 9

Effects of Pulsed Voltage on MMEP Planarization Efficiency

Polished Cu coupons 3"×3" were lithographically patterned and etched as in Example 3 to provide corrugated surface topography consisting of 100 µm plateaus separated by 100 µm trenches with initial amplitudes $a_o$ ranging from 1 to 3 µm. Using the spin-polishing apparatus described in Example 7 and illustrated schematically in FIG. 16, each coupon was subjected to MMEP with variations in the operating parameters as summarized in Table 3. The applied voltage was 8V or pulsed between 0V and 8V for repeating time intervals indicated respectively by t(off) and t(on). Interfacial velocity was controlled by setting the angular velocity of the work-piece and the radius of the track over which the membrane contacted the work-piece. At regular intervals polishing was interrupted following passage of a given amount of charge Q, the mass of Cu removed m was measured and used to calculate the stoichiometric number n (e/Cu) and the change in thickness Δτ. Amplitudes of corrugations were determined by profilometry at all four quadrants of the polishing area and averaged to generate a plot of a versus Δτ. The value of $\delta_e$ in equation 2 was varied to obtain the best fit to the experimental data (see, for example, FIG. 11).

TABLE 3

Effects of MMEP operating parameters on stoichiometric number and planarization efficiency. The first entry represent a steady-state process in which the voltage was held constant at 8 V.

| SAMPLE | VELOCITY cm/sec | t(off), msec | t(on), msec | n, e/Cu | $\delta_e$, nm |
|---|---|---|---|---|---|
| a1  | 50 | 0   | ss  | 2.1 | 1300 |
| a2  | 50 | 500 | 500 | 4.6 | 300  |
| a3  | 50 | 200 | 200 | 4.3 | 250  |
| a4  | 50 | 50  | 250 | 4.0 | 35   |
| a5  | 50 | 20  | 100 | 3.4 | 45   |
| a6  | 50 | 50  | 100 | 3.6 | 50   |
| a7  | 50 | 20  | 200 | 3.4 | 90   |
| a8  | 13 | 30  | 200 | 2.6 | 50   |
| a9  | 25 | 30  | 220 | 2.8 | 50   |
| a10 | 75 | 30  | 220 | 3.8 | 90   |
| a11 | 20 | 10  | 100 | 2.4 | 90   |

The pulsed voltage conditions are seen to provide much greater planarization efficiency (smaller $\delta_e$) and larger values of n than steady-state conditions. These effects can be explained by a mechanism in which the boundary layer consists of a partially dehydrated region of the membrane. Water is inevitably removed from the interface because hydrated $Cu^{+2}$ ions carry several molecules with them as they migrate across the membrane. Moreover, it has been shown by M. Legras, et. al. (*Desalination*, 147, 351 (2002)) that the diffusion coefficient of water in Nafion® decreases more than 100 fold when the water content drops below a critical value. Consequently, when the faradaic flux of $Cu^{+2}$ ions is high enough in comparison with replenishment by diffusion of water into the membrane from surrounding areas, then a thin layer in the membrane may become sufficiently dehydrated that diffusion of water across this layer limits the overall rate. Since the membrane is constantly moving over the surface of the work-piece the thickness of this dehydrated boundary layer is not affected by variations in topography in the way that a convective boundary layer can be affected.

The data for constant voltage indicate that the thickness of the boundary layer evolves to a steady-state thickness 1300 nm. However, when the current is interrupted by intermittent pulses <0.5 seconds, apparently the boundary layer cannot grow to its steady-state value, and the interface becomes partially rehydrated during the off-cycle. It is likewise consistent that $\delta_e$ decreased systematically to values <100 nm with decreasing pulse times. The variations in n provide further support for this explanation. When the only anodic process is oxidation of Cu to $Cu^{+2}$, the value of n should be 2 e/Cu. Values greater than 2 are due to parallel oxidation of water. Under conditions where n>3 the generation of Oxygen bubbles was visible during $t_{(on)}$. From Table 3 it is apparent that the amount of water electrolysis varies systematically with $t_{(off)}$ and with the interfacial velocity v. FIG. 18 shows that the value of n increases proportionally with the logarithm of the product v with $t_{off}$ which represents the length of surface covered by the contact during the rehydration period of the pulse program. This relationship suggests that water is mechanically transported into the contact area by interfacial motion.

Example 10

Planarization of Cu Damascene Wafers with Pulsed Voltage Process

Cu damascene wafers with standard test patterns (Sematech 854AZ and 954AZ) were cut into 3"×3" sections. These wafers feature patterns of contact pads and circuit lines of various dimensions etched into a dielectric layer (500 to 1000 nm thick), coated with a thin barrier layer followed by ~800 nm of electroplated Cu. The samples were polished by MMEP using the apparatus described in Examples 7 and 9, and illustrated schematically in FIG. 16. A pulse program was employed to maintain $\delta_e$<100 nm. Polishing was interrupted at various intervals to measure the loss of Cu and changes of topographic amplitude a for several circuit features distributed over all four quadrants of the sample.

Two sets of results are shown in FIG. 19. The upper plot shows the planarization of circuit pads approximately 100 µm in width on a 954AZ wafer. The initial amplitude $a_o$=1000 nm was comparable to the dielectric thickness. The voltage was pulsed between 0V, $t_{off}$=8 ms, and 8V, $t_{on}$=55 ms. The end-point was reached at a mean change of thickness −Δτ=−760 nm leaving the Cu-filled circuit pads recessed by a=46 nm below the surrounding Cu-free barrier layer. The results agree with the MMEP model with a boundary layer thickness of about 50 nm. The lower plot shows results for 100 µm circuit pads and 10 µm lines/spaces on a 854AZ wafer (which has a thinner dielectric). In this experiment the amplitude of both lines and pads was reduced to a <1 nm prior to reaching the end point at Δτ=−720 nm. After the end-point was reached, at Δτ=−850 nm, the pads and lines were recessed by a=62 and 46 nm respectively below the surrounding Cu-free barrier layer. Despite a 10-fold difference in lateral dimensions for the pads and lines the planarization efficiencies were nearly the same for both features within experimental error. This further demonstrates the qualitative differences between MMEP and conventional EP, and the practical advantages of the former.

Example 11

A Low-Profile MMEP Half-Cell with Polymeric Electrolyte

Figure 20:
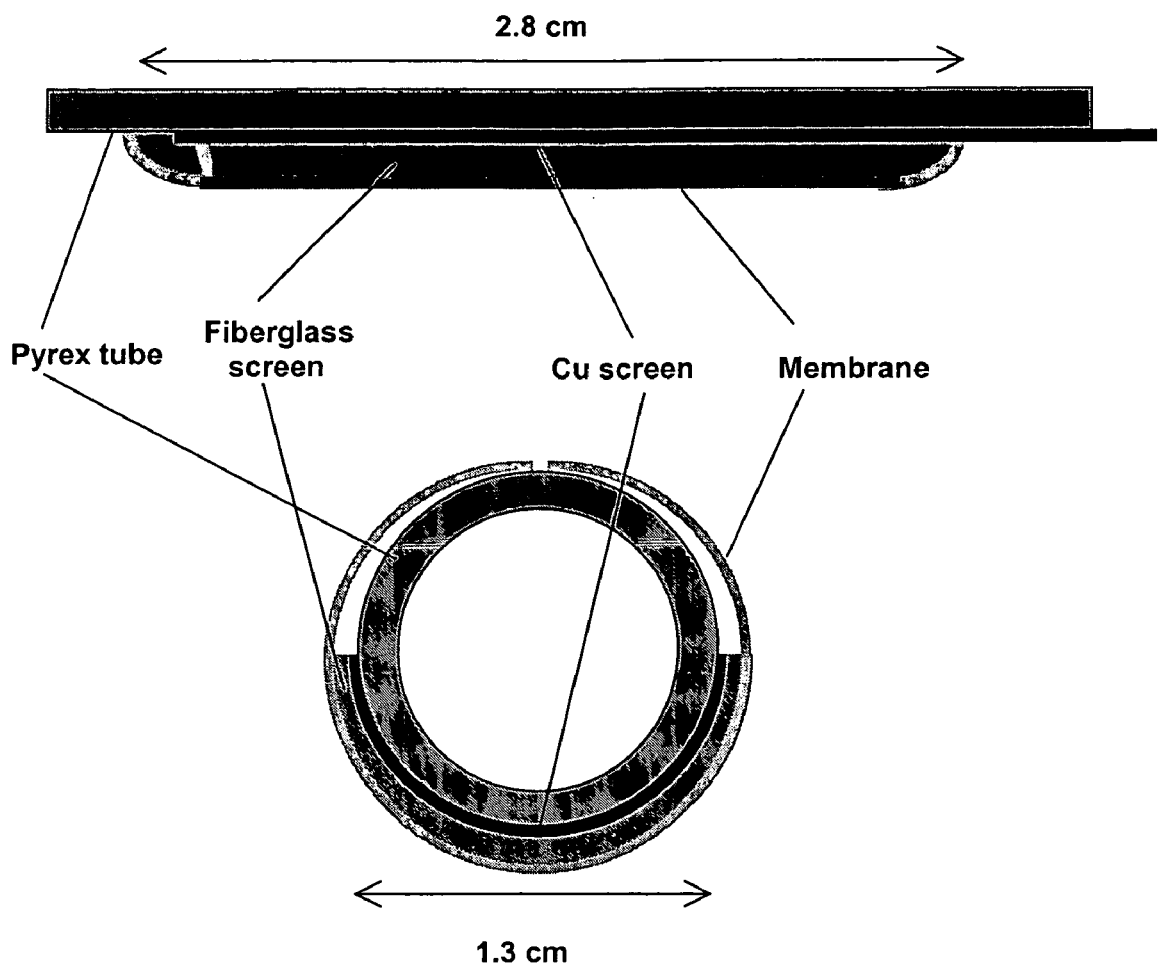
FIG. 20 shows a schematic illustration of a low profile cylindrical cathode half-cell.

A low-profile cathode half-cell was constructed as illustrated in FIG. 20. A piece of Cu wire screen (100×100 mesh), 3×1 cm, was covered by a piece of PVC-coated fiberglass screen (20×20 mesh, Phifer Engineered Products), 3.5×2 cm, and the two were fastened to the external surface of Pyrex® glass tube 1.3 cm in diameter and 10 cm by means of narrow strips of tape along the edges.

Cupric Acetate was dissolved in a 30% solution of poly (ammonium methacrylate) to obtain an homogeneous, deep blue electrolyte 1.0 M in $Cu^{+2}$ which highly viscous with the consistency of a grease. Approximately 0.2 ml of this electrolyte was spread over about a 2 $cm^2$ of the fiberglass so that it filled the openings in both fiberglass and underlying Cu screens. A piece of N115 Nafion® membrane 2.5×2.5 cm was then wrapped around the entire assembly as illustrated schematically in FIG. 20. A section of the Cu mesh extending beyond the end of the tube was connected to the negative terminal of the power supply as the cathode. A Cu coupon was attached to the positive terminal of the power supply at an applied voltage of +8V and was immersed in a shallow bath of deionized water. When the surface of the membrane was rubbed over the surface of the coupon a steady current of about 200 mA was obtained and after passage of 10 coulombs, the surface of the coupon was visibly polished. The high viscosity of the electrolyte prevented flow or leakage of the electrolyte outside of the cell. The polymeric nature of the poly(methacrylate) anion prevented any permeation of electrolyte through the membrane.

Example 12

Formation and Removal of Copper Oxide/Hydroxide/Carbonate Accumulation

During previous experiments with membrane mediated electropolishing, we had noted that when the voltages between about 4 V and 8 V were used, there would often be small particulates of material disposed on the polished surface. These were presumed to be copper oxides, though the particles could have also included copper hydroxides and copper carbonates. Such particles does not provide a satisfactory finished surface. Experience suggested these particles were minimized when lower voltages were used.

A copper substrate was membrane-mediated electro-polished using a single window half-cell similar to those described above. The velocity v was 21 cm/sec, Pc was 2.2 psi, the area of contact Ac was 0.96 $cm^2$, and the dwell time was about 0.04 seconds. Dwell time is the average length of the contact area measured in the direction of v, divided by v. The voltage was increased a sequentially from zero, using one volt increments. While we could not be certain when copper oxides/hydroxides/carbonates started to form, by the time the experiment had reached 7 volts the particulate residue was readily visible in the polished section. We continued to increase the voltage, and we surprisingly found that by 11 volts the copper oxide particles were no longer present. The current density at 7 V was about 80 $mA/cm^2$, and the current density at 11 V was 150 $mA/cm^2$. The polarization curve measured in this series of experiments is shown in FIG. 33-C.

Example 13

Effect of z and $A_c/A_p$ on I and RR

FIG. 23C summarizes the experimental results, showing the effects of z and $A_c/A_p$ on current density and removal rate at 10.00V, when a 25 by 18 mm Nafion® N117 membrane single-window cathode half-cell having 6.2 psi hydrostatic pressure was used to polish a copper substrate at velocity v=55 cm/sec. The dwell time varied from about 0.005 seconds at the lowest load (~150 grams) to about 0.029 seconds at the highest load (~750 grams), where velocity was constant and the change in dwell time reflects the change in the length of the short axis. The contact area, and the total area polished by the half-cell moving on the circular track, was changed by varying z. The current density averaged about 660 $mA/cm^2$ as the contact area was increased by a factor of 300%, and the current density did not change as $A_c/A_p$ by a factor of about 50%. FIG. 23-C shows that RR increases with ($A_c/A_p$) as z is systematically decreased.

Example 14

Effect of Hydrostatic Pressure on Normal Force Fz

Figure 30A:
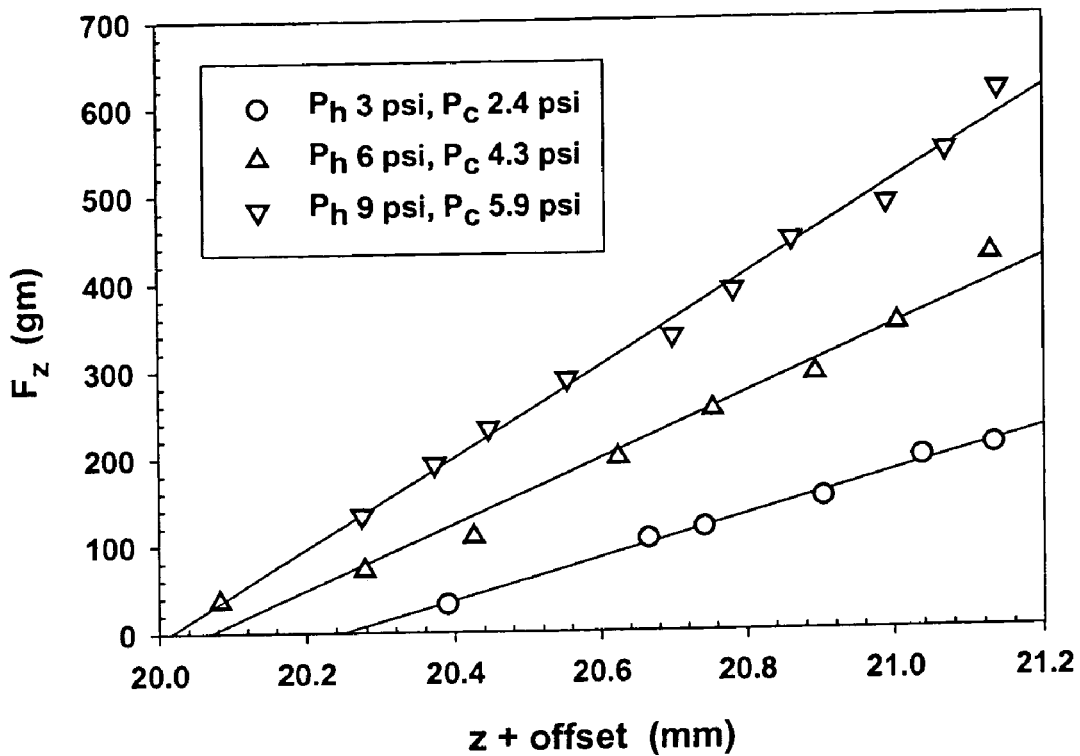
FIG. 30A shows the variation in the distance from a sensor on the half-cell to the substrate surface with normal load and hydrostatic pressure $P_h$ of the electrolyte.
Figure 30B:
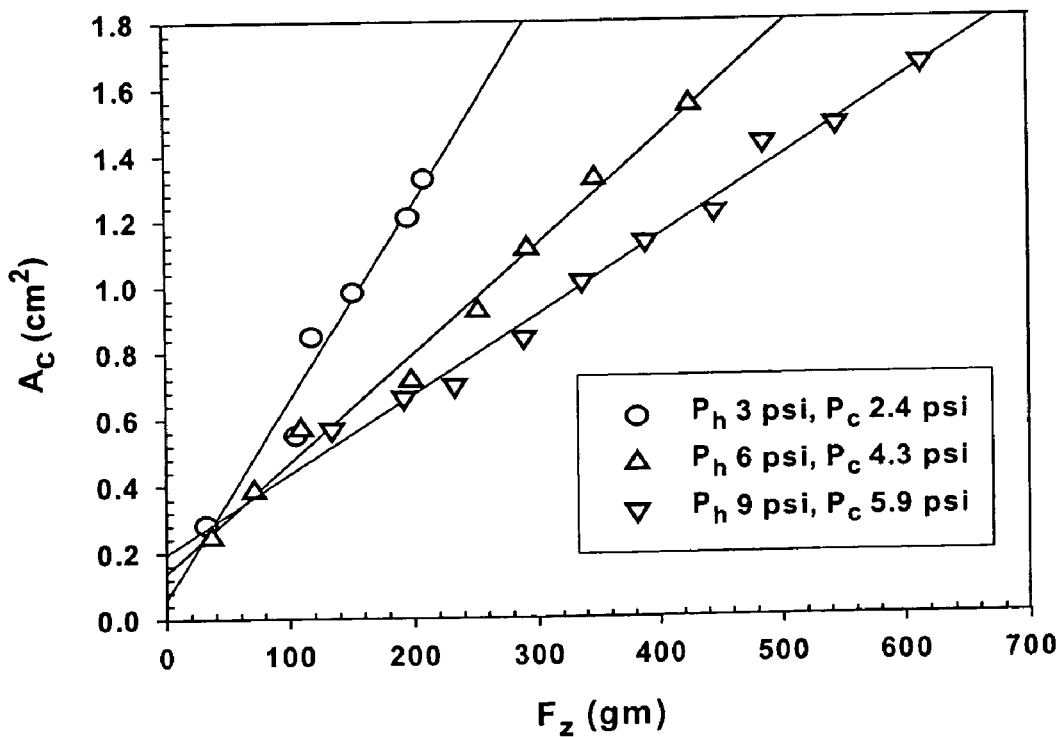
FIG. 30B shows the variation in contact area Ac with normal load and hydrostatic pressure $P_h$ of the electrolyte.

A single-window half-cell configuration was used here. A cathode half-cell was constructed with a Nafion® N117 membrane sealed over an oblong window 25 by 18 mm. Electrolyte solution (0.8 M $CuSO_4$ in 0.5 M $H_2SO_4$) was pumped through the half-cell by means of a variable speed peristaltic pump (Masterflex model 7021-24) and the hydrostatic pressure $P_h$ was measured by means of a pressure transducer connected before the inlet port of the half-cell. The half-cell was mounted over a flat Cu work-piece covered with de-ionized water by means of an adjustable stage incorporating a transducer calibrated to measure the normal force between the half-cell and the work-piece as a function of the vertical displacement z. FIG. 30A shows results of the measurements of normal force versus distance (a constant plus z) for three hydrostatic pressures $P_h$ of the electrolyte. FIG. 30B shows the calculated variation in contact area $A_c$ with normal load and hydrostatic pressure $P_h$ of the electrolyte. The normal load $F_z$ should equal the contact pressure $P_c$ times the contact area $A_c$. The values of $P_h$ in FIG. 30 included a pressure drop between the transducer and the half-cell. After correcting for this error the values of $P_c$ were found to be very close to the true hydrostatic pressure inside the half-cell. FIGS. 30-A and 30-B show the contact pressure, which is defined here as $P_c=F_z/A_c$, increases with increasing $P_h$.

Changing the distance z changed the total force exerted by the membrane on the surface $F_z$, because the area of contact increased as the half-cell is moved closer to the substrate surface. The data in FIG. 30-B show the contact pressure $P_c$ was substantially independent of the area of contact $A_c$. $F_z$ changed proportionally to $A_c$. The hydrostatic pressure $P_h$ in the half-cell was generated by the resistance to flow of electrolyte while pumping electrolyte into the half-cell at a constant rate. The resistance to flow was primarily due to the inlet and outlet, as the area within the cell was so large that we expect there to be very little pressure drop within the cell, and consequently very little change in the pressure when the dimensions of the half-cell are changed a small amount. So changing the distance between the base of the half-cell and the substrate surface would not increase the resistance of flow of electrolyte. Such a assembly will result in the half-cell advantageously self-correcting to the same pressure after movement toward the substrate surface (to increase the contact area between the membrane and the substrate surface). The pressure within the half-cell in such a system can be changed by varying the flow rate of electrolyte circulation through the half-cell, by altering the back-pressure at the at the cell outlet while maintaining constant flow rate, and/or by changing the size of a restricted opening at the point where electrolyte exits the cell.

In contrast, if the half-cell is enclosed like a sealed bag, then both $P_h$ and $P_c$ will become extremely sensitive to variations in z. Both will increase as the half-cell is moved closer to the substrate surface (to increase the contact area between the membrane and the substrate surface).

Comparative Example 15

While it seems reasonable to assume the polishing rate will be constant throughout the contact area of the membrane and the substrate surface, this is not always the case. polishing depends on the presence of water between the membrane and the substrate surface, and if movement is too slow, then there will not be sufficient replenishment of water beneath the membrane to replace that amount consumed by electrolysis and/or migration through the membrane. In the extreme case, polishing at static contact (v=0) resulted in the membrane beginning to adhere strongly to the surface of the work-piece, and it was difficult to obtain steady state current data. When extended electrolyses were carried out Cu removal was primarily restricted to the periphery of the contact, with little or no polishing over the center of the contact area. See, for example, the polishing pattern at zero velocity shown in FIG. 22-B. The outline of the contact area after static polishing shows the polishing was occurring only at the periphery of the membrane to surface contact, where sufficient water could presumably be obtained by diffusion and other weak forces drawing water into the point of contact of the membrane and the substrate surface. Under these conditions the current density is concentrated on the periphery of the contact area, so that the nominal current density $i/A_c$ does not represent the true current density. To show this, the same single-window half-cell configuration as used in Example 13 was used here. Polishing was done at v=0 cm/sec. The contact area was varied between about 0.05 cm$^2$ and about 0.6 cm$^2$ by changing z. As indicated by the open symbols in FIG. 24, the apparent current density I at v=0 declined with the contact area $A_c$.

Example 16

Effect of Velocity and Contact Area on Nominal Current Density

Figure 24:
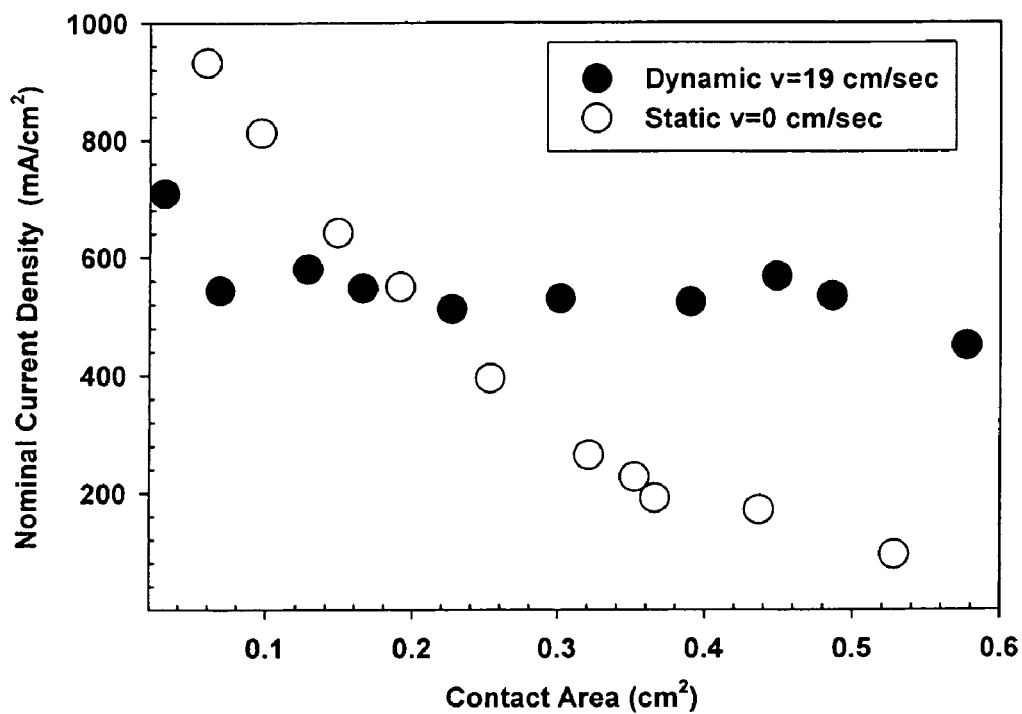
FIG. 24 shows the effect of interfacial motion of the membrane over the substrate surface (v=0 and 19 cm/sec) on the variation in nominal current density with contact area, at a low applied voltage of 7 V.

By contrast, when the contact area was kept moving across the surface of the sample (v=19 cm/sec) the adhesive force is suppressed and, when i is measured as a function of $A_c$ at constant V, the nominal current density I=i/$A_c$ is found to be constant. FIG. 24 shows the effect of interfacial motion of the membrane over the substrate surface (the v=0 data discussed in the comparative example compared with the v=19 cm/sec data) on the variation in nominal current density with contact area, at a low applied voltage of 7 V. The same single-window half-cell configuration as used in Example 13 and in Comparative Example 15 was used here. Polishing was done at v=19 cm/sec. The contact area was varied between about 0.05 cm$^2$ and about 0.6 cm$^2$ by changing z. The dwell time varied from about 0.008 seconds to about 0.036 seconds.

The relatively constant current density suggests that for a membrane moving over the substrate surface at v=19 cm/sec, where the dwell time varied from about 0.008 seconds to about 0.036 seconds, the current density at V=7 V was substantially uniformly distributed over the contact area and was given by I=i/$A_c$. Consequently, within the bounds of these experimental conditions, current is increased simply by increasing the contact area.

Example 17

Effect of Interfacial Velocity v on Polarization Curve

Figure 31:
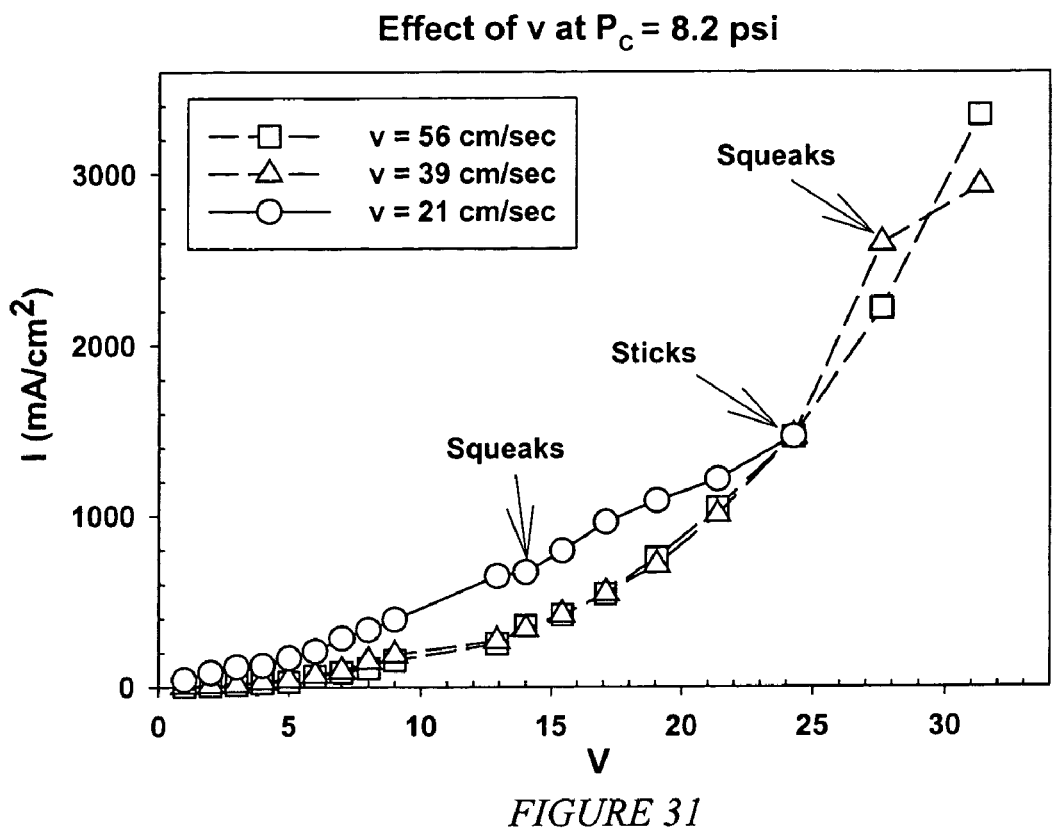
FIG. 31 shows MMEP polarization data at various interfacial velocities with N117 Nafion® membrane (⅞" round window) at $P_c$ 8.2 psi, and $A_c$ 0.319 cm$^2$.

Example 17 illustrates the effects of interfacial velocity v=21, 39, and 56 cm/sec on the MMEP polarization curve I versus V. A flat Cu work-piece was mounted on a rotating turntable in an MMEP apparatus with a cathode half-cell containing, for the data shown in FIG. 31, a Nafion® N117 membrane sealed over a round window ⅞" in diameter. The work-piece was flooded with de-ionized water of conductivity 1 µS/cm. Electrolyte was pumped through the half-cell at a constant hydrostatic pressure so as to maintain a contact pressure $P_c$=8.2 psi. The half-cell was held at a fixed vertical displacement relative to the work-piece so as to maintain a constant contact area $A_c$. The work-piece was rotated about an axis offset from the area of contact so as to establish various interfacial velocities. By interfacial velocity, we mean the average velocity of the membrane relative to, and substantially parallel to, the substrate surface, wherein the average velocity is the velocity seen by the membrane surface at the center of the membrane contact area with the substrate surface (within the contact area, points nearer or further from the center of rotation experience velocities slightly lower or higher respectively than the average velocity). As in the previous example, the contact area $A_c$ was measure following electrolysis at velocity v=0 to measure the contact area. Electrolysis was carried out at a series of applied voltages and the steady-state current I was measured at each voltage. In FIG. 31, the polarization curve, that is the nominal current density I=i/$A_c$ as a function of V, is shown for experiments where v was 21, 39 and 56 cm/sec (dwell times of about 26 milliseconds, 14 milliseconds, and 9.6 milliseconds, respectively. At >25V and v>39 cm/sec (dwell time <14 milliseconds), I is seen to increase steeply with V and water oxidation became increasingly important as indicated by a measured n of greater than 4.

It can be seen that for voltages <8V the values of I decrease systematically with increasing v. This effect is believed to reflect the introduction of an ohmic resistance due to dynamic introduction of a layer of water between the membrane and work-piece, where with other factors being unchanged the thickness of the water layer increases with increasing v (much like a hydroplaning phenomenon). On the other hand, ohmic resistance can also be introduced when the rate of water consumption between the membrane and the substrate surface exceeds the rate of water supply, which we believe leads to a reduction in n, a reduction of I, and eventually squeaking and sticking of the membrane to the substrate, with accompanying damage to both the membrane and the substrate.

The experiment run at 21 cm/sec showed a fairly linear increase in I versus V from about 5 volts to about 24 volts, averaging about 70 mA/cm$^2$ per volt in this range. Throughout this test, the slope of the polarization curve dI/dV did not increase, but remained relatively constant. At v=21 cm/sec, dwell time 0.050 seconds, voltage 14 V, and I=~700 mA/cm$^2$, the membrane began to squeak. At v=21 cm/sec, dwell time 0.050 seconds, voltage 24 V, and I=~1000 to ~1400 mA/cm$^2$, the membrane stuck.

Without being bound by theory, we believe the squeaking, audible sound is the result of intermediate sticking and releasing of at least a portion of the membrane to the substrate surface. We believe that with an sufficiently low dwell time, the value dI/dV should increase with V, and when it is not increasing, the lack of water is impairing polishing, and possibly causing undesired roughness, especially when squeaking. The portion that sticks may be, for example, that portion that is downstream of the direction of travel of the membrane, which therefore has proportionately longer time to dehydrate as the current flow results in water and proton transfer through the membrane. Squeaking is expected to result in a rough surface and in excessive membrane wear, and is therefore not desired.

The polarization curve was not substantially linear over this or any other voltage range at the two higher velocities. At v=39 cm/sec, the slope of the polarization curve started well below the slope of the curve at 19 cm/sec, but the slope kept increasing. The slope of the polarization curve eventually exceeded the 70 mA/cm$^2$ per volt obtained at the lower velocity, and above 24.5 volts the slope of the polarization curve was over 300 mA/cm$^2$ per volt. At v=39 cm/sec, dwell time 0.027 seconds, the slope of the polarization curve dI/dV exhibited a monotonic increase, which we believe is indicative of being within on of the most preferred polishing conditions for this invention, until about 27 V. At 27 V, dwell time 0.027 seconds, and I=~2800 mA/cm$^2$, the membrane began to squeak. Immediately thereafter, the slope dI/dV not only quit monotonically increasing, but it took a sharp drop. Again, this was interpreted as evidence that the dwell time is too large for the current, and that lack of water between the membrane and the substrate surface was impairing polishing.

Similarly, the slope of the polarization curve at v=56 cm/sec followed the same trend, albeit slightly more exaggerated, as did the slope of the polarization curve at 39 cm/sec, although no audible squeak was detected before the experiment was terminated (at 30 volts). At v=56 cm/sec, dwell time 0.019 seconds, the slope dI/dV of the polarization curve kept monotonically increasing, and no squeaking or sticking occurred to the experimental limits I=3300 mA/cm$^2$.

We emphasize that it is not merely the magnitude of dI/dV that is important, but additionally that many preferred embodiments include polishing at a voltage such that the slope dI/dV be increasing with increasing V (i.e., the polarization curve have a positive second derivative).

At static conditions, it is common to see apparent slopes d"I"/dV in excess of 150 mA/cm$^2$ per volt for a range of voltage between about 0 and about 2-3 volts, whereupon the slope turns down. Such polishing is not within the scope of embodiments of MMEP nor within the scope of embodiments of high rate MMEP, because there is no movement and no planarization of the substrate. MMEP requires that the membrane contact with a portion of the substrate be of short duration, and this is usually realized by sliding the membrane over the substrate surface.

Example 18

Effect of Interfacial Velocity v on Polarization Curve

Figure 13:
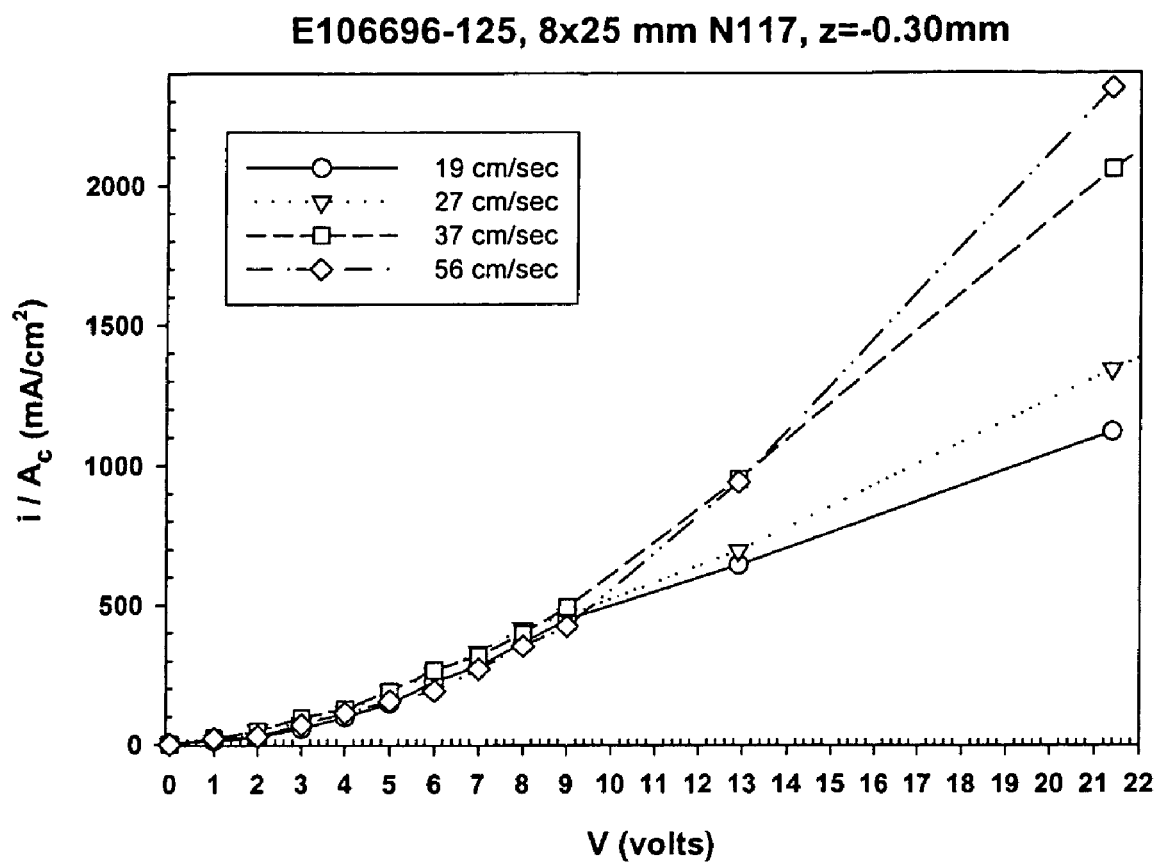
FIG. 13 shows the variation of nominal current density with voltage for a single-window half-cell using a N117 Nafion® membrane with a thickness of 7 mils, at a variety of interfacial velocities from 19 to 56 cm/sec, as described in Example 18.

A series of additional experiments were performed with other membranes and configurations to further define the relationship between v and the shape and slope of the polarization curve. The variation of nominal current density with voltage was measured for a single-window half-cell using an 18×25 mm N117 Nafion® membrane with a thickness of 7 mil at a variety of interfacial velocities of 19, 27, 37, and 56 cm/sec, as shown in FIG. 13. In these experiments, the distance z was held at −0.30 mm, where at z=0 the membrane just contacted the substrate surface.

For interfacial velocities of 19 cm/sec and 27 cm/sec, dwell times about 0.032 seconds and 0.022 seconds, the slope and magnitude of the polarization curve was similar to that observed at 21 cm/sec in Example 16. That is, the slope dI/dV of the polarization curve was substantially unchanging for the experiment run at 19 cm/sec and 27 cm/sec for the 8×25 mm N117 Nafion® membrane showed a fairly linear increase in I versus V from about 5 volts to about 21 volts, averaging about 55 mA/cm$^2$ per volt at v=19 cm/sec and about 70 mA/cm$^2$ per volt at v=27 cm/sec. This slope is reasonably consistent with the Example 17 data for 7/8" round N117 Nafion® membrane run at 21 cm/sec that averaged about 70 mA/cm$^2$ per volt.

Steady-state current densities could be sustained above 2000 mA/cm$^2$ for the higher velocity (v=37 or 56 cm/sec) experiments. At the higher velocities of 37 and 56 cm/sec, the polarization curves appeared to always have a positive increase in slope, though each curve exhibited only a small increase in the slope dI/dV after about 8 V. The slope of the polarization curve obtained at v=37 cm/sec, from 7 V to 21 V, was 120 mA/cm$^2$ per volt. The slope of the polarization curve obtained at v=56 cm/sec, from 7 V to 21 V, was over 150 mA/cm$^2$ per volt. The slope dI/dV of the polarization curve does not necessarily have to be monotonically increasing to provide high RR, though it often is in preferred embodiments of the invention, but if the slope is not increasing then advantageously for high-rate polishing the slope of dI/dV is greater than 100 mA/cm$^2$ and the voltage V is greater than about 10V, preferably greater than about 14V.

Example 19

Effect of Interfacial Velocity v on Polarization Curve

Figure 25:
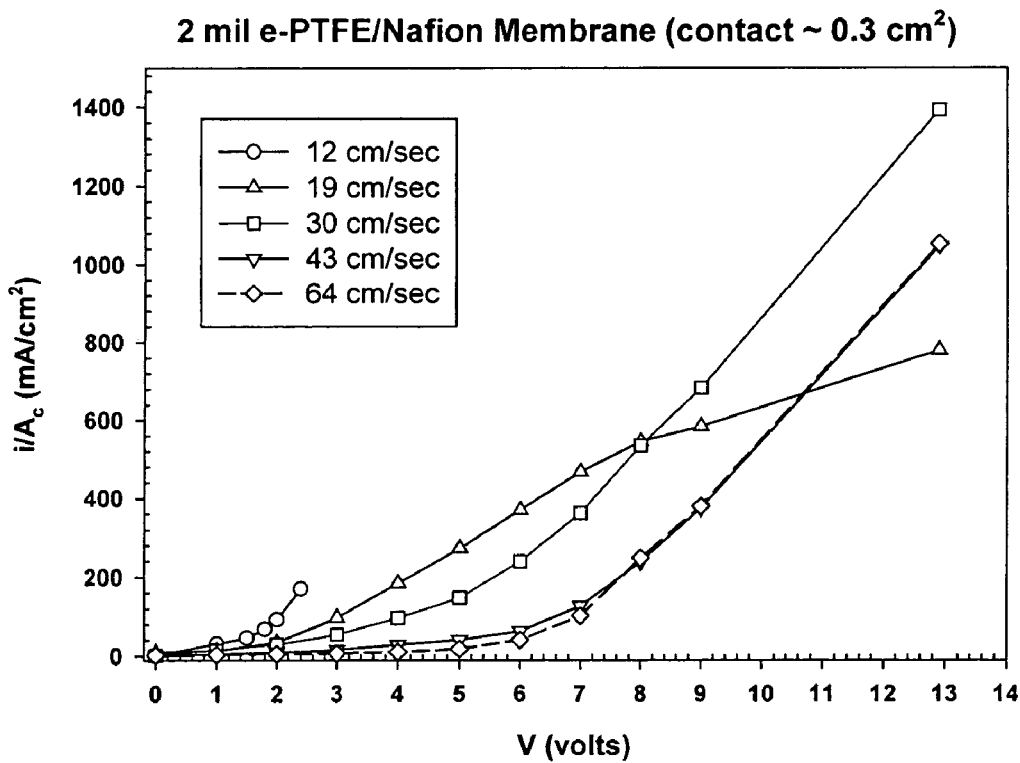
FIG. 25 shows the variation of nominal current density with Voltage for a single-window half-cell using a 2 mil experimental Nafion® type membrane supported on an expanded PTFE web, at a variety of interfacial velocities from 12 to 64 cm/sec.

FIG. 25 shows the variation of nominal current density with voltage for a single-window half-cell using a 2 mil experimental expanded PTFE web impregnated with perfluorosulfonic acid polymer material similar to that used in Nafion® type membranes. We believed the PTFE membrane would reduce friction, and would also increase wear, relative to Nafion® membranes. The membrane was only 2 mils thick, compared to the 7 mil Nafion® membranes we normally used. The z was controlled to give a modestly low contact area of about 0.3 cm$^2$. The polarization curves were determined at a variety of interfacial velocities from 12 to 64 cm/sec, i.e., dwell times from about 0.046 to about 0.008 seconds.

The 12 cm/sec experiment was the lowest constant velocity tested. While the slope dI/dV of the polarization curve monotonically increased, the 2 mil membrane developed sufficient adhesion at voltage V of only 2.4V to stop the rotor. The slope of the 12 cm/sec polarization curve between V=2 and V=2.4 was about 200 mA/cm$^2$ per volt. A velocity of 12 cm/sec or less, or a dwell time greater than about 0.046 seconds, does not provide sufficient water for the half-cell to operate at high current densities that are preferred. This conclusion is not directly applicable to the other examples described here, as the membrane used in this test was different than that used in other tests.

The polarization curve at 19 cm/sec (dwell time about 0.029 seconds) was at least facially similar with the polarization curves at similar velocities described for other membranes and conditions. Again, rather than being concave upward, the polarization curve was relatively flat between 5 volts and 13 volts, and the slope was about 70 mA/cm$^2$ per volt, the same as was observed for thicker membranes. However, the minor turndown at about 8 V suggests that lack of water was inhibiting the cell from reaching a higher I.

At higher velocities, the polarization curve was again characterized by a low slope that increased monotonically with increasing voltage, though again the increase after about 8V was very small. The initial slope at the intermediate velocity, v=30 cm/sec and dwell time is about 0.018 seconds, was greater than the initial slope at the higher velocities. While it appears that unlike other Examples described herein the slope at higher velocities did not eventually increase to provide a current density exceeding that for intermediate velocities, this may be partially the result of terminating testing at 13 volts, where other tests extended the voltage to over 20 volts. The slope of the polarization curve between about 7 volts and about 13 volts was for each of the three higher velocities tested was between about 150 mA/cm$^2$ per volt to about 180 mA/cm$^2$ per volt.

Very similar behavior was obtained with membranes 2 mil or 7 mil thick respectively, indicating that contributions from the bulk conductivity of the membrane are negligible. With increasing interfacial velocity, steady-state currents could be sustained to I>2000 mA/cm², but the curves were shifted to higher V, consistent with an increase in ohmic resistance. The apparent resistance appears to reach a limiting value at velocities greater than about 40 cm/sec, or dwell time less than about 0.013 seconds, at V less than 13 V.

Example 20

Effect of Contact Pressure $P_c$ on Polarization Curve

In order for the moving interface to introduce and maintain a layer of water between the work-piece and membrane, the sheared water layer must develop a hydrostatic pressure comparable to the contact pressure $P_c$. For a given interface velocity v, the thickness of the water interlayer should decrease as $P_c$ is increased. Further, the quantity of water maintained at the interface must reflect a balance between hydrodynamics of the moving contact and electro-osmotic removal of water. We investigated whether the stiffness of the membrane blister might play a role in the hydrodynamics by measuring the effects of electrolyte hydrostatic pressure on the polarization curve. At applied voltages below about 10 V, the higher pressure inside the half-cell provides a higher current density compared to lower pressures. This is consistent with the expectation that the hydrodynamic forces should produce a thinner water layer if swept with a harder, more rigid membrane blister, and a thicker water layer with a softer, more compliant membrane blister.

Figure 32:
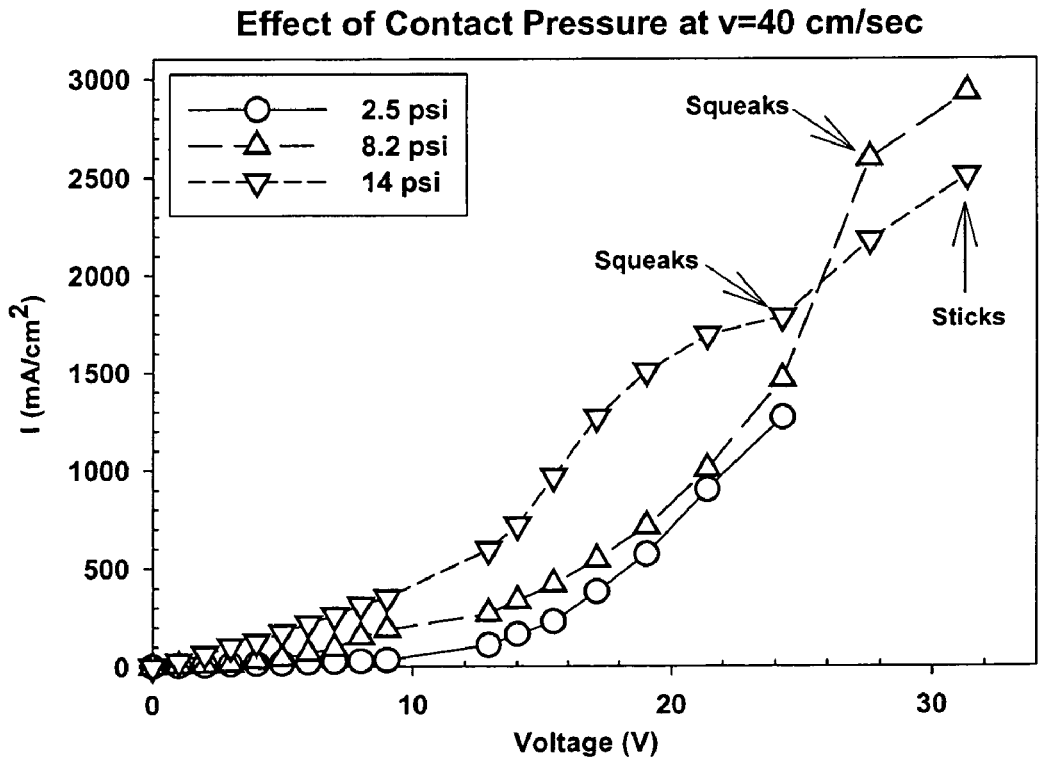
FIG. 32 shows MMEP polarization data at various $P_c$ with N117 Nafion® membrane (⅞" round window) at v=40 cm/sec.

FIG. 32 shows polarization curves similar to those the previous example, but in which $P_c$ was varied from 2.5 psig to 14 psig while v was maintained constant at 39 to 40 cm/sec. The shape of the polarization curves suggests that higher $P_c$, for example at 14 psig, has a similar effect to lower interfacial velocities, e.g., below about 20 cm/sec. Lower $P_c$, for example below 5 psi, gave a polarization curve similar to that observed in Examples 17 and 18 when the interfacial velocity exceeded about 40 cm/sec. The half-cell comprised a 7/8" round window N117 Nafion® membrane. At <10V, the magnitude of I is seen to increase significantly with $P_c$, consistent with decreasing ohmic resistance from thinner water layers.

It can be seen that the shape and magnitude of the polarization curve at high pressure, that is, at 14 psig, is similar to the shape of the polarization curve for the v=21 cm/sec example seen in FIG. 31. The onset of squeaking and sticking occurs at lowest I for $P_c$=14 psi, consistent with its greater resistance to the hydrodynamic forces, and consistent with the velocity tests where squeaking started at the lowest I for the lower interfacial velocity tests. The shape of the polarization curve at low pressure, that is, at 2.5 psig, is similar to the shape of the polarization curve for the v=56 cm/sec example seen in FIG. 31. Therefore, the effects of increased or decreased velocity should be at least partially counteracted by changing the contact pressure.

Example 20 illustrates the effects of contact pressure on the MMEP polarization curve. One method of envisioning the introduction of the low-conductivity fluid (e.g., water) layer between the membrane and the substrate surface is to presume that, in order for the moving interface to introduce and maintain a layer of water between the work-piece and membrane, the sheared water layer must develop a hydrostatic pressure comparable to the contact pressure $P_c$. Increasing the pressure exerted by the membrane on the surface will make the membrane more effectively sweep away the low-conductivity fluid, therefore generating a thinner initial layer of this low-conductivity fluid. For a given interface velocity v, the thickness of the water interlayer should therefore decrease as $P_c$ is increased, and as a result of the lower resistance I should increase. This effect is apparent from the influence of $P_c$ on ohmic resistance at V<14V and interfacial dehydration at >14V shown in FIG. 32.

At >24 V, the magnitude of I is much less sensitive to $P_c$, consistent with the hypothesis of drastic thinning of the water layer at high I, or of a substantial increase in the conductivity of the low-conductivity fluid at the areas where the membrane substantially contacts the substrate surface, or both. The onset of squeaking and sticking occurs at lowest I for the highest pressure investigated in this example, $P_c$=14 psi, which is consistent with its greater resistance to the hydrodynamic forces. Higher contact pressures therefore result, all things being equal, in lower maximum useful current density and lower polishing rates, provided the polishing is done at current densities near the maximum. On the other hand, at lower current densities, higher pressures result in greater polishing rates.

It is therefore preferable to use lower half-cell pressures and higher velocities to achieve the desired high current density and metal removal rate. A membrane having Pc of 14 psig stuck to the substrate at a velocity of 40 cm/sec while polishing at a current density of about 2500 mA/cm². A membrane having $P_c$ of 8.2 psig stuck to the substrate at a velocity of 21 cm/sec while polishing at a current density of about 1500 mA/cm². By lower pressure, we mean below 20 psig, for example below 15 psig, preferably below 10 psig, and more preferably below about 5 psig. While we polished copper substrates with a contact $P_c$ of 2 psig, we expect that a contact pressure of 0.5 psig or 1 psig will be operative. Generally, the higher the contact pressure Pc, the higher should be the interfacial velocity V. However, a half-cell operating at a low $P_c$, for example at 2.5 psig, can polish at high velocities or at low velocities.

Example 21

Dependence of Removal Rate and Stoichiometric Number on Voltage

Example 21 describes a set of experiments performed to determine the dependence of the copper removal rate RR and of the stoichiometric number n on voltage. A single-window cathode half-cell with a 17×25 mm single-window N117 Nafion® membrane half-cell was used to polish a Cu coupon secured on the turntable of the laboratory spin-polishing apparatus at z=−0.40 mm, $A_c$=0.29 cm², $A_p$=9.9 cm², and v=55 cm/sec. Electrolyte was pumped under a hydrostatic pressure of ~14 psi. Polishing was carried out under constant applied current, and the steady-state voltage was measured. Following each period of polishing, the mass loss from the substrate was compared with the total charge passed to calculate the removal rate RR and stoichiometric number n. The results are summarized in FIGS. 26A, 26B, and 26C. FIG. 26A shows the dependence of removal rate (RR) and stoichiometric number (n) on current density I, where the current density varied from about 600 mA/cm² to about 2800 mA/cm². FIG. 26B shows the dependence of I and n on voltage for the single-window half-cell experiment of FIG. 26A. FIG. 26C shows the variation of removal rate and current density versus voltage for the single-window half-cell experiment of FIG. 26A. At the high end of the polarization curve I is very sensitive to V, therefore experiments in this regime were carried out under applied current. Over this 4-fold range of I the voltage increased from 14.5 and 18V, while RR increased by about 250% (RR varies with the ratio I/n). The measurements of n confirm an increase of only about 50% beyond random error.

Both I and n increased with increasing V in the interval between 12 and 20V, but the proportional increase in I was much greater than that in n. There is a small decline in n at the very highest voltages, which may reflect an insufficient water supply, much as the audible squeaking at high rates is believed to indicate an insufficient water supply. FIG. 26A shows that RR also increased with V, consistent with the expectation that RR should vary with the ratio (I/n).

FIG. 26B clearly shows that, at voltages between about 13 V and about 19 V, that the n value ranges between about 4 to about 6. Values of n between about 2 and 3 were obtained in earlier experiments at voltages below 7V and I below 500 mA/cm². Under those conditions, it was not uncommon to find a thin layer of material believed to be CuO over the surface or 2-5 μm dark particles (again possibly CuO) embedded in the surface. We believe that having the stoichiometric number be substantially above 3, for example above 3.5 and preferably above 3.9, electrons per copper atom, is the key to not having CuO deposits form. The data from FIGS. 26A and 26B suggest that, for this system, n will be greater than 3.9 if either the current density is greater than about 1000 mA/cm², or if the voltage is greater than about 15 volts. Further, the data from FIGS. 26A and 26B suggest that, for this system, n will be greater than 5 if either the current density is greater than about 1500 mA/cm², or if the voltage is greater than about 16 volts.

In addition, it is seen from the data in FIGS. 26A and 26B that the removal rate will increase with increasing I and/or with increasing V, despite the increase in n. We note that this system was run at an interfacial velocity of 56 cm/sec, which would be expected to give an increasing slope of the polarization curve I versus V as V increases. This broad generalization may not hold in all cases, particularly at polishing tests run at low interfacial velocities such as 20 cm/sec that do not exhibit the increasing slope of the polarization curve with increasing V. For the system tested, and particularly where v is greater than 40 cm/sec, FIG. 26C clearly shows that both I and RR will increase almost linearly with increasing V between 13 V and 19V.

While the highest RR achieved in these experiments ~750 nm/min are certainly attractive for planarizing Cu interconnect, practical considerations, such as heat dissipation may preclude steady state operation at such high I.

Example 22

Figure 21B:
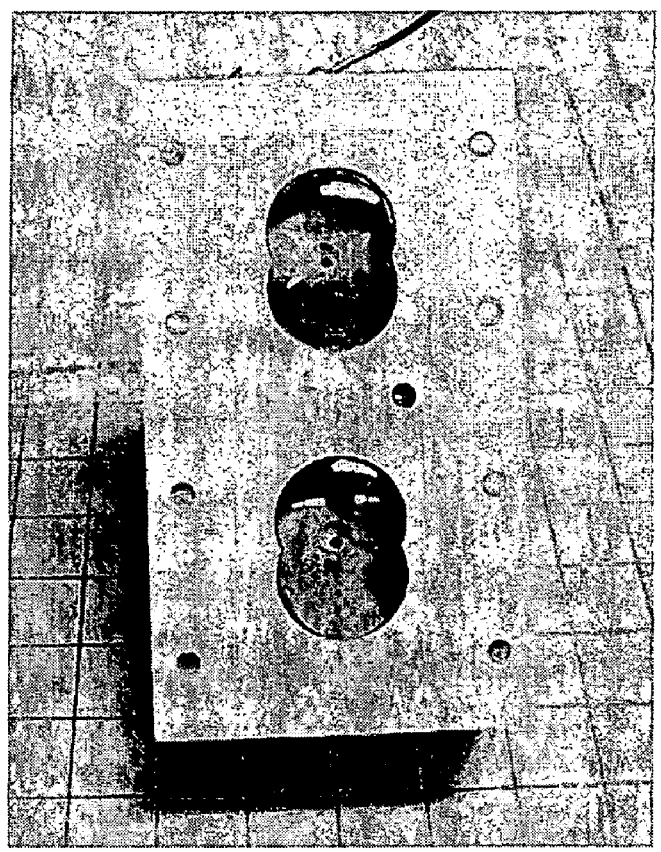
FIG. 21B shows a bottom view of a double-window cathode half-cell.
Figure 22C:
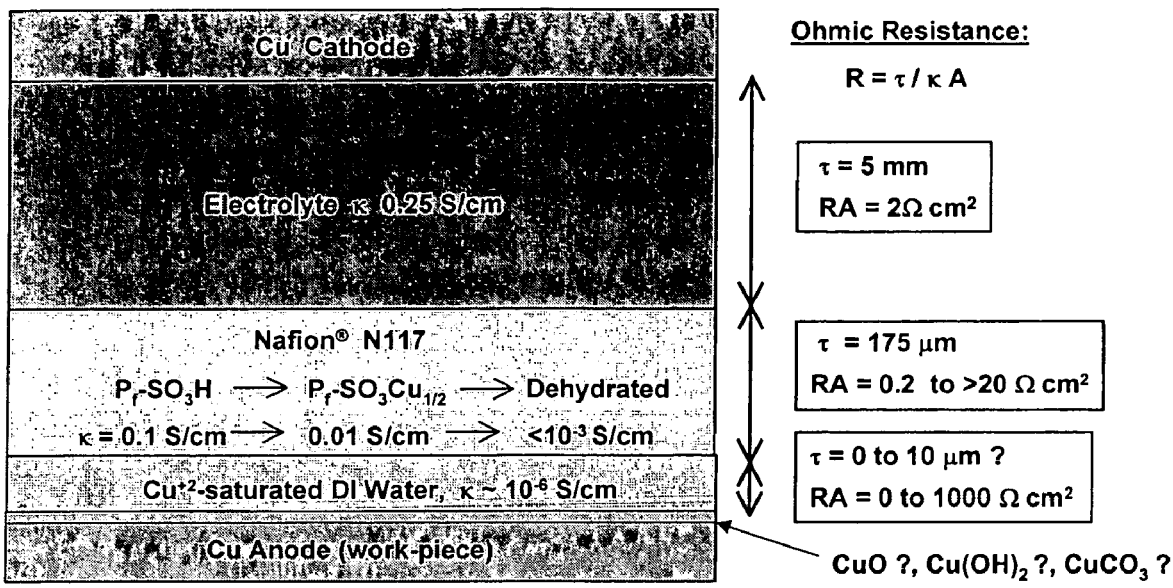
FIG. 22C shows a schematic of approximate ionic conductivity and thickness for phases intervening between the anode (substrate) and the cathode, where for each indicated layer thickness, the resulting ohmic resistance is calculated for a 1 $cm^2$ contact area.

Comparative Performance of Single and Dual-Window Half-Cells—Dependence of Area of Contact on Removal Rate and on Stoichiometric Number n FIG. 21B shows a dual window half-cell. A dual-window cathode half-cell with two 17×25 mm Nafion® membranes was used to polish a Cu coupon secured on the turntable of the laboratory spin-polishing apparatus. The tests described here compared the performance of a single window half-cell polisher of FIG. 21A with a dual window half-cell polisher of FIG. 21B. This example compared the key process performance parameters n and RR of a dual window polishing cell and compared these to the same parameters measured in Example 21 above. The process parameters for the single window and the dual window experiments are shown below for ease of comparison.

| Single Window Polisher | Double Window Polisher |
|---|---|
| z = −0.40 mm | z = −0.25 mm |
| $A_c$ = 0.29 cm² | $A_c$ = 0.617 cm² |
| $A_p$ = 9.9 cm² | $A_p$ = 10.5 cm² |
|  | normal load ~320 g |
| v = 55 cm/sec | v = 55 cm/sec |

FIG. 27 shows the results of a direct comparison of the performance of single and double-window half-cells operating in an overlapping region of I. At any given I, RR is seen to be roughly proportional to the total contact area. Most importantly, a removal rate of 850 nm/min was achieved with the double-window half-cell at less than 2000 mA/cm².

The normal force was independently measured to be 318 gm. Dividing by $A_p$ this corresponds to a tool pressure of 0.43 psi, or dividing by $A_c$ it corresponds to a contact pressure of 7.3 psi. For comparison, it has been estimated that for traditional chemical mechanical polishing the tool pressure of 5 psi the actual contact pressure is ~20 psi.

Example 23

The Relationship Between Normal Force $F_z$ Exerted on the Substrate Versus the Resultant Drag Force $F_d$ For comparison with chemical mechanical polishing, an important variable is the tool pressure $P_T$ (also referred to as the "down force"), which is defined as the normal force exerted by the pad onto the wafer (substrate) divided by the area of the wafer. However, much of the damage done to substrates is believed to be the result of drag forces operating in a direction substantially parallel to the direction of the interfacial velocity.

Figures 28A, 28B:
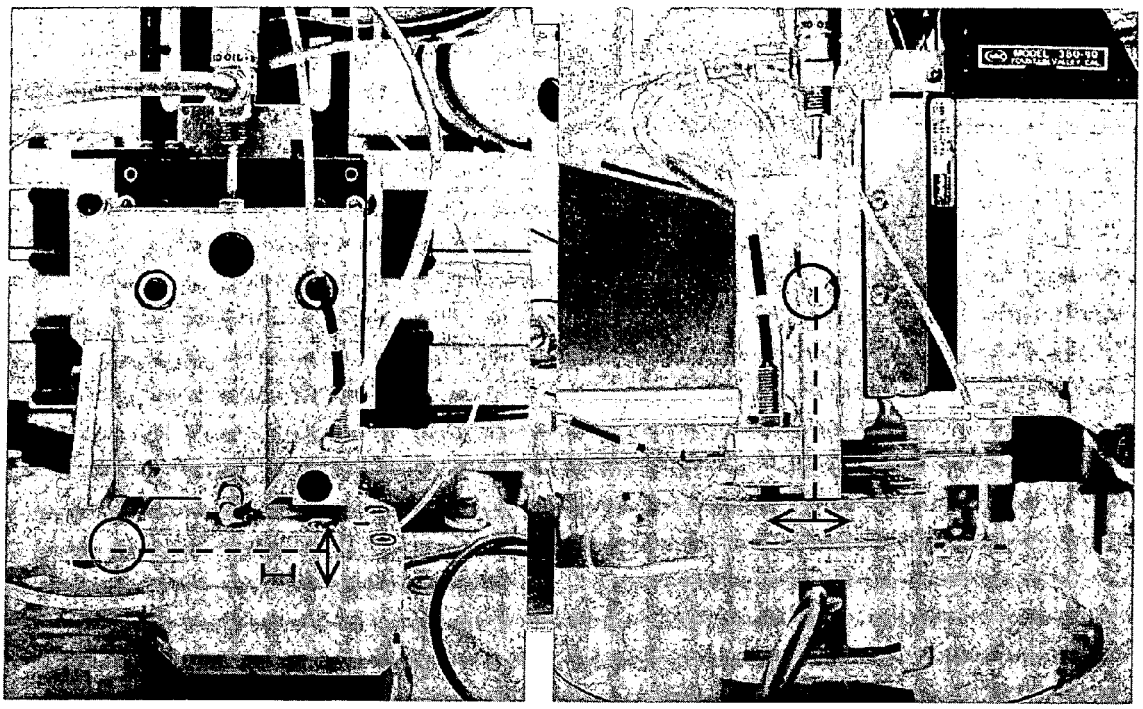
FIGS. 28A to 28C show an instrumented MMEP tool adapted for use on a 200 mm base and showing a cathode half-cell mounted on dual cantilever fixture, wherein displacements of the first cantilever are proportional to the z-axis (normal) force on the work-piece, while displacements of the second cantilever are proportional to the interfacial drag force.
Figure 28C:
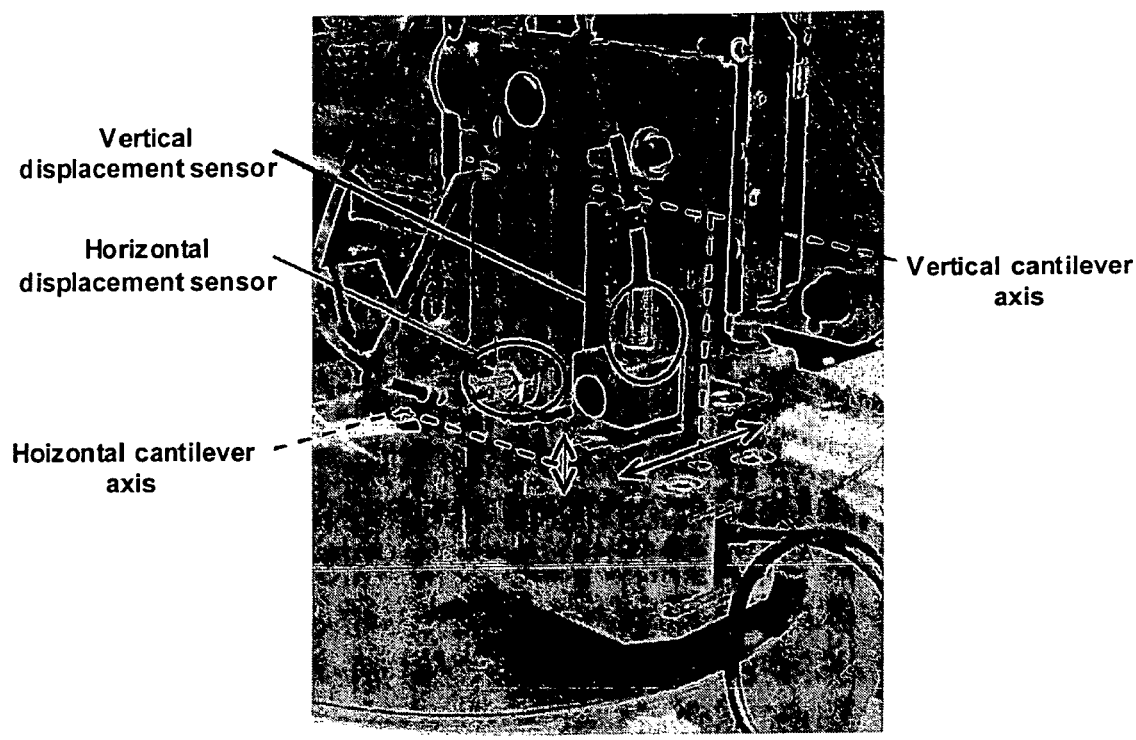
Figure 29:
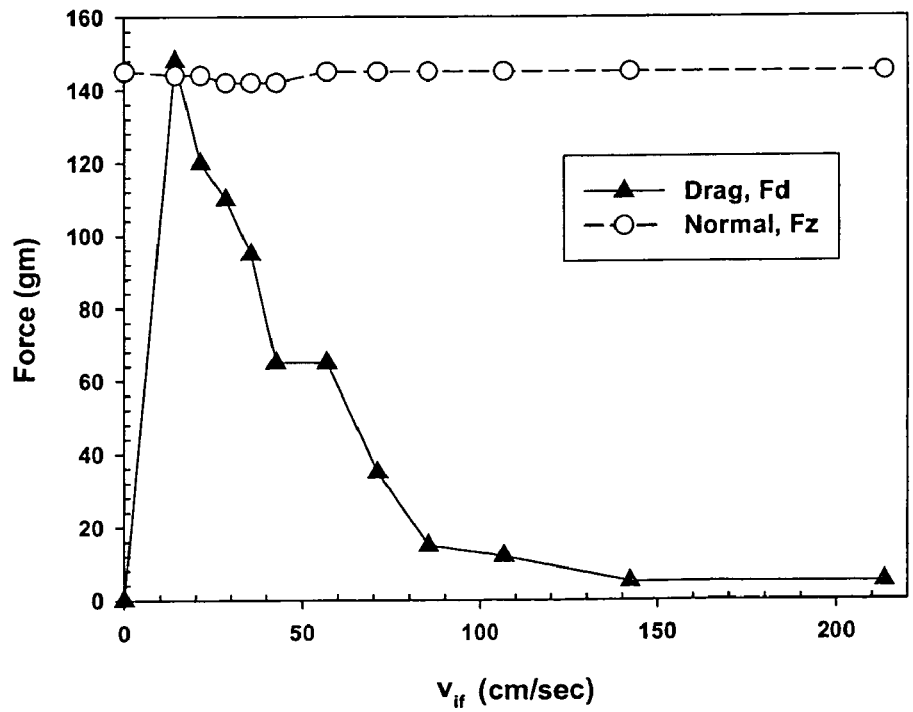
FIG. 29 shows measurements of normal and drag forces as a function of interfacial velocity for a single half-cell window where the static contact corresponds to z=−0.56 mm, Ac=1.05 cm$^2$.

In this experiment, we provided transducers to measure both the normal force and the drag force exerted by the membrane as it polished a copper substrate. FIGS. 28A, 28B, and 28C show an instrumented MMEP tool adapted for use on a 200 mm base and showing a cathode half-cell mounted on dual cantilever fixture, wherein displacements of the first cantilever are proportional to the z-axis (normal) force on the work-piece, while displacements of the second cantilever are proportional to the interfacial drag force. FIG. 29 shows the static and drag forces as a function of the interfacial velocity v, using a larger membrane surface having an area of contact of about 1.05 cm² at z=−0.56 mm. Measurement was made of the forces on a wet contact as a function of interfacial velocity in the absence of electrochemistry. There was no current flow during these tests. It can be seen that the drag forces are initially about equal to the normal forces at very low velocities, say from about 0 to about 13 cm/sec.

The results show a dramatic reduction in the drag force with increasing v. The drag forces quickly dropped off, and were less than one half the normal force at a velocity of about 50 cm/sec. There is potential of reducing drag forces to less than 20% of the normal force. This response suggests a hydrodynamic lubrication effect where interfacial shear carries a layer of water between the surfaces, and the thickness and corresponding normal stress increase with the strain rate. Of course, having a high current density will increase the drag force, as shown in the following Example.

Example 24

Variations in Coefficient of Friction with Voltage

Figure 33A:
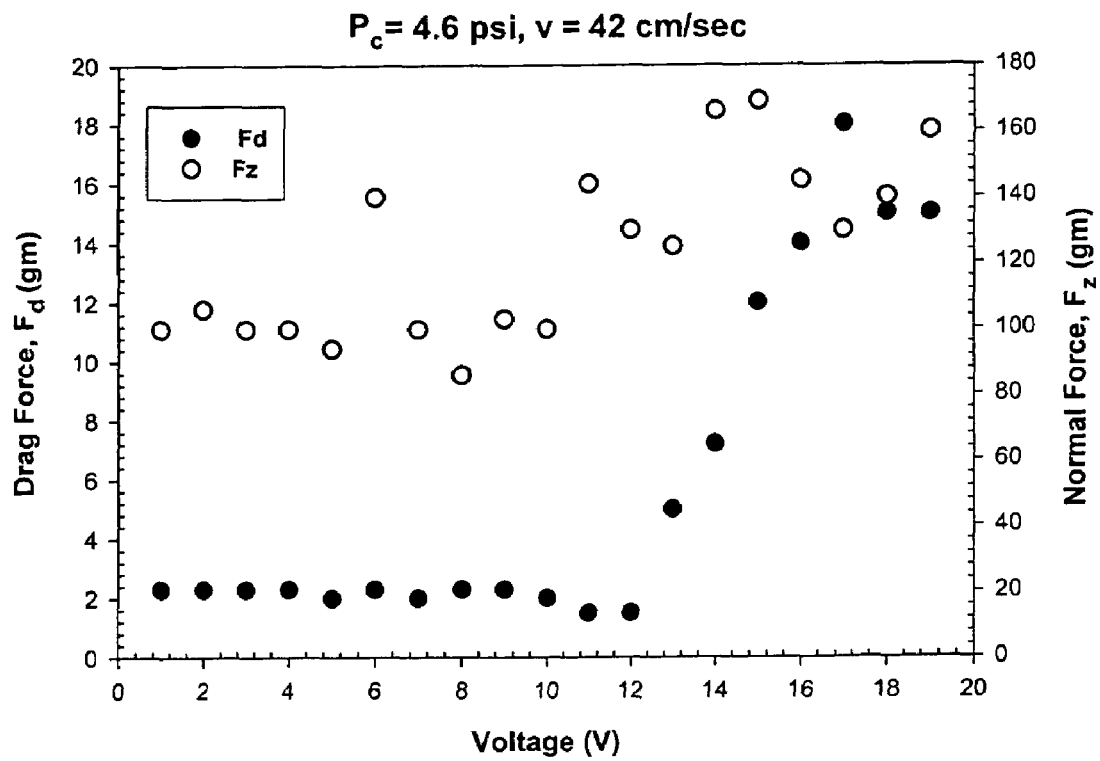
FIG. 33A shows the effects of electrochemical polarization and mechanical parameters on the normal force and drag force of a membrane having a contact pressure of 4.6 psi and a velocity of 42 cm/sec, where the normal force Fz was set at about 100 grams, and then the voltage was increased from 1 V to 19V.
Figure 33B:
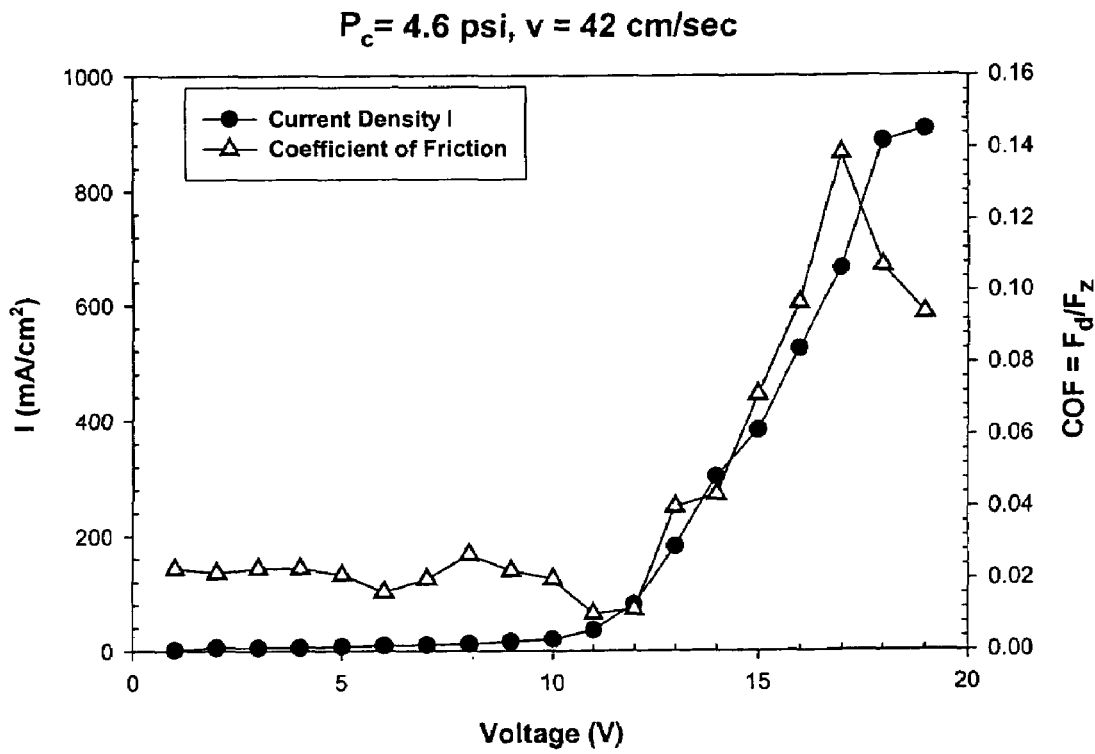
FIG. 33B shows the current density I and the coefficient of friction $F_d/F_z$ for the experiment shown in FIG. 14-A.

A Cu work-piece was mounted on the 200-mm tool and polished via MMEP at various combinations of voltage V, contact pressure $P_c$, and velocity v. For each set of polishing conditions the current density I, normal force $F_z$ and drag force $F_d$ were measured under steady-state conditions. Results are summarized in FIGS. 33A-C. FIG. 33A shows the measured normal force $F_z$ and drag force $F_d$ exerted on the substrate as a function of V for polishing at $P_c$=4.6 psi and v=42 cm/sec. $F_d$ remains very low until the voltage is increased to >12V where $F_d$ increases monotonically with V. We note that the formation of copper oxide-like particles and coatings does not take place at V>9V, preferably V is equal to or greater than 10V. The drag force increases substantially at V>12 V. With increasing $F_d$ fluctuations in $F_z$ become larger, presumably due to torsional effects from the drag. FIG. 33B shows that the coefficient of friction, defined by $COF=F_d/F_z$, remains very small until 12V, while at higher V the increase in COF correlates strongly with the increase in I.

The initial coefficient of friction values COF~0.02 are indicative of a fully lubricated hydrodynamic regime where solid surfaces are partially separated by a liquid lubricant, whereas the final value of COF~0.14 is more typical of boundary lubrication at a solid interface. This transition is consistent with a thinning of the interfacial water layer at V>110V, more so at V>12V, which is consistent with our hypothesis relating to the coincident steep increase in I discussed earlier.

Figure 33C:
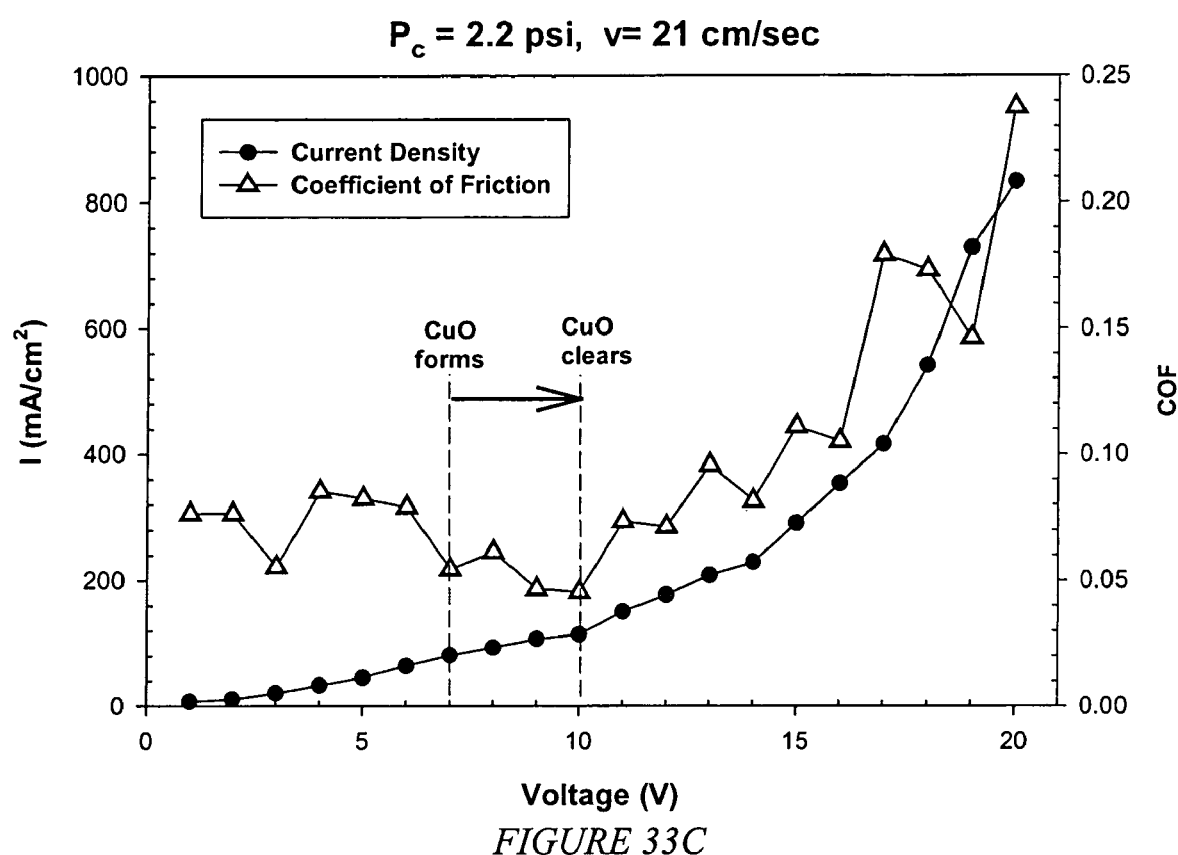
FIG. 33C shows the effects of electrochemical polarization and mechanical parameters on the current density I and the coefficient of friction $F_d/F_z$ for an experiment run at contact pressure of 2.2 psi and velocity of 21 cm/sec.

FIG. 33C shows the results of a similar experiment at $P_c$=2.2 psi, and v=21 cm/sec. The same trends and correlation between COF and I are seen here, but the initial value of COF (0.08) is higher than the 0.02 seen in 33-B, and the increase in both I and COF are more gradual than observed at $P_c$=4.6 psi, v=42 cm/sec. The rates of increase of I and COF are consistent with weaker hydrodynamic forces at lower v.

The experimental conditions results in another interesting effect. After several minute of polishing between 7 and 9V a uniform thin layer of dark CuO was observed to form on the surface of the work-piece. However, this layer disappeared after polishing at voltage ≧10V. This phenomenon is thought to be related to the increased rate of water oxidation above 10V, and the importance of the protons produced in that reaction for suppressing precipitation of CuO, as discussed previously and in Example 12. One embodiment of the invention involves polishing copper at a sufficiently high voltage such that copper oxides/hydroxides/carbonates do not form, but at a voltage below the voltage where the drag force exceeds 10%, preferably at a voltage where the drag force is 6% or less of the normal force.

These results are consistent with the foregoing analysis of the polarization curves and suggest that the contact mechanics of MMEP may be a much less aggressive than the abrasive mechanics of CMP. Such a low drag force, coupled with the low normal forces obtainable with the MMEP process, may eliminate substrate damage. Additionally, the data suggests that when the polishing is started or stopped, lower drag forces will be generated if the interfacial velocity is greater than 20 cm/sec, preferably greater than 40 cm/sec, before the membrane contacts the substrate. Alternately, startup can occur with the membrane disposed over a margin of the substrate that does not have a pattern of circuits disposed thereon.

Example 25

Non-Aqueous Low-Conductivity Fluid

In an experiment using pure acetonitrile as the low-conductivity fluid and a mixture of acetonitrile and tetramethylammonium hexafluorophosphate as the electrolyte, the electrolyte being separated from the low-conductivity fluid by a Nafion® membrane, the unit passed current to the work-piece, electropolished copper metal therefrom, and solvated the polished metal. This embodiment has utility especially if the work-piece comprises materials that are adversely affected by water, though the current density was low and adhesion, presumably due to "dehydration or "de-solventation" of the membrane, was severe. It may be that mixtures of nitrogen-containing solvents such as acetonitrile. ethylene diameine, ethanolamine, or mixtures thereof will be useful as a low conductivity fluid, and that the same compounds, plus optionally amino acids and the like, can be useful in the electrolyte, to solvate and electropolish copper in a system that uses a low-conductivity fluid that is water free so that has a limited amount of water, e.g., less than 50% by weight, alternately less than 25% by weight.

The apparatus described herein is particularly useful for electropolishing wafers used in the manufacture of integrated circuits, often called semiconductor substrates, including but not limited to wafers having circuits being formed via a copper damascene process. The MMEP process described herein is particularly suitable for performing single wafer processing steps, which are advantageously combined with other processing steps, because there is no particulate matter and harsh chemicals that need to be removed prior to going to the next step in the manufacturing process. a modification of MMEP can be used to clean wafers after etching and/or ashing, and the process is believed to be more efficient and easier to perform (as the distance between the cathode and the work-piece need not be exactingly controlled) than that disclosed in for example U.S. Pat. Nos. 6,368,493; 6,602,396; and published U.S. application 20030230493. The MMEP apparatus can be used for electrochemical machining such as is described in US published application 20040195109. Exemplary apparatus to hold and move the wafer relative to the MMEP membrane can be found in prior art CMP equipment and also in devices developed for electropolishing, such as that described in U.S. Pat. No. 6,743,349 and/or in published US applications 20040209560 or 20020042246. The MMEP process can be combined with electroplating processes, as for example described in U.S. Pat. Nos. 6,689,257; 6,632,335; 6,746,589; and/or in published U.S. applications 20020000379 and 20020033339. The MMEP assembly can advantageously be incorporated into a chamber or a sub-assembly with at least one electroplating apparatus. The manufacturer can advantageously take advantage of a combination of single wafer processing processes, and incorporate in addition to an MMEP sub-assembly (which may incorporate an electroplating assembly within the same chamber) one or more other substrate processing sub-assemblies including for example a loading/unloading sub-assembly for unloading a substrate from for example a cassette; a substrate-cleaning sub-assembly for cleaning and drying a substrate; a number of drying sub-assemblies; a number of feeding assemblies; a sputtering and/or an electroplating sub-assembly for putting metal on the substrate surface; an electroless plating sub-assembly such as described in U.S. Pat. No. 6,716,330; an etching, a bevel-etching and/or ashing sub-assembly for etching a substrate and ashing polymeric material; a traditional CMP sub-assembly for chemical mechanical polishing; a film-forming sub-assembly for forming a film as a portion to be processed; a cleaning sub-assembly for cleaning the substrate after said film-forming; a film thickness-measuring sub-assembly; other sub-assemblies such as are disclosed in for example published U.S. Applications 2003-0136668 and 20030132103, and one or more transfer robots sub-assemblies for transferring a substrate between the various substrate treating sub-assemblies.

Although the present invention is described with reference to certain preferred embodiments, it is apparent that modification and variations thereof may be made by those skilled in the art without departing from the spirit and scope of this invention as defined by the appended claims. In particular, it will be clear to those skilled in the art that the present invention may be embodied in other specific forms, structures, arrangements, proportions, and with other elements, materials, and components, without departing from the spirit or essential characteristics thereof. One skilled in the art will appreciate that the invention may be used with many modifications of materials, methods, and components otherwise used in the practice of the invention, which are particularly adapted to specific substrates and operative requirements without departing from the principles of the present invention. The presently disclosed embodiments are therefore to be considered in all respects as illustrative and not restrictive, the scope of the invention being indicated by the appended claims, and not limited to the foregoing description.

We claim:

1. An apparatus for use in membrane-mediated electropolishing of a work-piece having a surface comprising metal, said apparatus comprising:
   (a) a source of low-conductivity fluid adapted to supply low-conductivity fluid to at least a portion of the surface of the work-piece, wherein the conductivity of the low-conductivity fluid is less than about 2000 μS/cm;
   (b) a cathode half-cell comprising:
      (i) a fully or partially enclosed volume, cavity or vessel;
      (ii) a conductive electrolyte solution or gel which partially or essentially fills the fully or partially enclosed volume, cavity or vessel, wherein the conductive electrolyte solution or gel comprises positively and negatively charged ions, and has a conductivity greater than about 10 mS/cm;
      (iii) a cathode in contact with the electrolyte solution or gel; and
      (iv) an ion-conducting membrane which forms a surface of the fully or partially enclosed volume, cavity or vessel, wherein at least a portion of the internal surface of said membrane contacts the electrolyte solution or gel and the external surface of that portion of the membrane is accessible to contact a metal work piece, and wherein at least a portion of the conductive electrolyte solution or gel is interposed between the cathode and the internal surface of the ion-conducting membrane;
      (v) an inlet and an exit adapted to allow conductive electrolyte solution or gel to be circulated through the volume, wherein the inlet and exit are fluidly connected to a pump adapted to circulate the conductive electrolyte solution or gel between the partially or fully enclosed volume and the pump;
   (c) a DC electrical power source having a positive voltage terminal adapted to be electrically connected to the surface of the work-piece and having a negative voltage terminal electrically connected to the cathode;
   (d) a structure for movably contacting a portion of the external surface of the membrane to the work-piece; and
   (e) at least one of a filter, a de-gasser, a heat exchanger, and an apparatus to adjust the composition of the conductive electrolyte solution or gel, fluidly connected to the pump.

2. An apparatus for use in membrane-mediated electropolishing of a work-piece having a surface comprising metal, said apparatus comprising:
   (a) a source of low-conductivity fluid adapted to supply low-conductivity fluid to at least a portion of the surface of the work-piece, wherein the conductivity of the low-conductivity fluid is less than about 2000 μS/cm;
   (b) a cathode half-cell comprising:
      (i) a fully or partially enclosed volume, cavity or vessel;
      (ii) a conductive electrolyte solution or gel which partially or essentially fills the fully or partially enclosed volume, cavity or vessel, wherein the conductive electrolyte solution or gel comprises positively and negatively charged ions, and has a conductivity greater than about 10 mS/cm;
      (iii) a cathode in contact with the electrolyte solution or gel; and
      (iv) an ion-conducting membrane which forms a surface of the fully or partially enclosed volume, cavity or vessel, wherein at least a portion of the internal surface of said membrane contacts the electrolyte solution or gel and the external surface of that portion of the membrane is accessible to contact a metal work piece, and wherein at least a portion of the conductive electrolyte solution or gel is interposed between the cathode and the internal surface of the ion-conducting membrane;
   (c) a DC electrical power source having a positive voltage terminal adapted to be electrically connected to the surface of the work-piece and having a negative voltage terminal electrically connected to the cathode;
   (d) a structure for movably contacting a portion of the external surface of the membrane to the work-piece; and
   (e) a structure which exerts a force on the membrane, wherein the force substantially divides a single contactable surface area of the membrane if the structure was absent into a plurality of smaller contactable surface areas, and
      (i) the structure is joined to the exterior surface of the membrane; or
      (ii) the structure is movable relative to the exterior surface of the membrane; or
      (iii) the structure comprises channels adapted to distribute a low-conductivity fluid to the surface of the work-piece.

3. An apparatus for use in membrane-mediated electropolishing of a work-piece having a surface comprising metal, said apparatus comprising:
   (a) a source of low-conductivity fluid adapted to supply low-conductivity fluid to at least a portion of the surface of the work-piece, wherein the conductivity of the low-conductivity fluid is less than about 2000 μS/cm;
   (b) a cathode half-cell comprising:
      (i) a fully or partially enclosed volume, cavity or vessel;
      (ii) a conductive electrolyte solution or gel which partially or essentially fills the fully or partially enclosed volume, cavity or vessel, wherein the conductive electrolyte solution or gel comprises positively and negatively charged ions, and has a conductivity greater than about 10 mS/cm;
  (iii) a cathode in contact with the electrolyte solution or gel; and
  (iv) an ion-conducting membrane which forms a surface of the fully or partially enclosed volume, cavity or vessel, wherein at least a portion of the internal surface of said membrane contacts the electrolyte solution or gel and the external surface of that portion of the membrane is accessible to contact a metal work piece, and wherein at least a portion of the conductive electrolyte solution or gel is interposed between the cathode and the internal surface of the ion-conducting membrane;
  (c) a DC electrical power source having a positive voltage terminal adapted to be electrically connected to the surface of the work-piece and having a negative voltage terminal electrically connected to the cathode;
  (d) a structure for movably contacting a portion of the external surface of the membrane to the work-piece; and
  (e) a porous permeable compliant pad disposed between the cathode and the membrane or a porous backing, adapted to stiffen the membrane, disposed between the cathode and the membrane.

4. An apparatus for use in membrane-mediated electropolishing of a work-piece having a surface comprising metal, said apparatus comprising:
  (a) a source of low-conductivity fluid adapted to supply low-conductivity fluid to at least a portion of the surface of the work-piece, wherein the conductivity of the low-conductivity fluid is less than about 2000 µS/cm;
  (b) a cathode half-cell comprising:
    (i) a fully or partially enclosed volume, cavity or vessel;
    (ii) a conductive electrolyte solution or gel which partially or essentially fills the fully or partially enclosed volume, cavity or vessel, wherein the conductive electrolyte solution or gel comprises positively and negatively charged ions, and has a conductivity greater than about 10 mS/cm;
    (iii) a cathode in contact with the electrolyte solution or gel; and
    (iv) an ion-conducting membrane which forms a surface of the fully or partially enclosed volume, cavity or vessel, wherein at least a portion of the internal surface of said membrane contacts the electrolyte solution or gel and the external surface of that portion of the membrane is accessible to contact a metal work piece, and wherein at least a portion of the conductive electrolyte solution or gel is interposed between the cathode and the internal surface of the ion-conducting membrane;
  (c) a DC electrical power source having a positive voltage terminal adapted to be electrically connected to the surface of the work-piece and having a negative voltage terminal electrically connected to the cathode; and
  (d) a structure for movably contacting a portion of the external surface of the membrane to the work-piece;
wherein the membrane comprises a strip of membrane material that can be moved relative to the fully enclosed volume, so that on moving the strip a different area of the strip becomes the external surface accessible to contact the surface of the work-piece.

5. A cathode half-cell apparatus adapted for use in membrane-mediated electropolishing of a work-piece having a surface comprising metal, said cathode half-cell apparatus comprising:
  (a) a fully or partially enclosed volume;
  (b) a conductive electrolyte solution or gel having a conductivity greater than about 5 mS/cm disposed within the fully or partially enclosed volume;
  (c) a cathode at least partially disposed within the fully or partially enclosed volume; and
  (d) a charge-selective ion-conducting membrane which forms a surface of the fully or partially enclosed volume, wherein said membrane comprises an internal surface and an external surface, wherein the internal surface of said membrane contacts the electrolyte solution or gel and the external surface is accessible to contact the surface of the work-piece, and wherein the electrolyte solution or gel additionally contacts the cathode and wherein at least a portion of the conductive electrolyte solution or gel is interposed between the cathode and the internal surface of the charge-selective ion-conducting membrane, wherein the external surface of the membrane accessible to contact the surface of the work-piece is substantially curved to allow only a portion of the external surface to contact a flat work-piece surface at any one time, and the external surface accessible to contact the surface of the work-piece forms a cylindrical shape.

6. An apparatus for use in membrane-mediated electropolishing of a work-piece having a surface comprising metal, said apparatus comprising:
  (a) a source of low-conductivity fluid adapted to supply low-conductivity fluid to at least a portion of the surface of the work-piece, wherein the conductivity of the low-conductivity fluid is less than about 2000 µS/cm;
  (b) at least two cathode half-cells, each comprising:
    (i) a fully or partially enclosed volume, cavity or vessel;
    (ii) a conductive electrolyte solution or gel which partially or essentially fills the fully or partially enclosed volume, cavity or vessel, wherein the conductive electrolyte solution or gel comprises positively and negatively charged ions, and has a conductivity greater than about 10 mS/cm;
    (iii) a cathode in contact with the electrolyte solution or gel; and
    (iv) an ion-conducting membrane which forms a surface of the fully or partially enclosed volume, cavity or vessel, wherein at least a portion of the internal surface of said membrane contacts the electrolyte solution or gel and the external surface of that portion of the membrane is accessible to contact a metal work piece, and wherein at least a portion of the conductive electrolyte solution or gel is interposed between the cathode and the internal surface of the ion-conducting membrane;
  (c) a DC electrical power source having a positive voltage terminal adapted to be electrically connected to the surface of the work-piece and having a negative voltage terminal electrically connected to the cathode; and
  (d) a structure for movably contacting a portion of the external surface of the membrane to the work-piece, comprising:
    (i) a plurality of individual rods, and wherein different half-cells are adapted to move laterally along different rods during electropolishing of a work-piece; or
    (ii) at least two concentric rings each having at least one half-cell mounted thereon, and wherein the concentric rings are adapted to rotate about a center of rotation each at a pre-selected rotational velocity.

7. An apparatus for use in membrane-mediated electropolishing of a work-piece having a surface comprising metal, said apparatus comprising:

(a) a source of low-conductivity fluid adapted to supply low-conductivity fluid to at least a portion of the surface of the work-piece, wherein the conductivity of the low-conductivity fluid is less than about 2000 $\mu$S/cm;

(b) a cathode half-cell comprising:

(i) a fully or partially enclosed volume, cavity or vessel;

(ii) a conductive electrolyte solution or gel which partially or essentially fills the fully or partially enclosed volume, cavity or vessel, wherein the conductive electrolyte solution or gel comprises positively and negatively charged ions, and has a conductivity greater than about 10 mS/cm;

(iii) a cathode in contact with the electrolyte solution or gel; and (iv) an ion-conducting membrane which forms a surface of the fully or partially enclosed volume, cavity or vessel, wherein at least a portion of the internal surface of said membrane contacts the electrolyte solution or gel and the external surface of that portion of the membrane is accessible to contact a metal work piece, and wherein at least a portion of the conductive electrolyte solution or gel is interposed between the cathode and the internal surface of the ion-conducting membrane;

(c) a DC electrical power source having a positive voltage terminal adapted to be electrically connected to the surface of the work-piece and having a negative voltage terminal electrically connected to the cathode; and (d) a structure for movably contacting a portion of the external surface of the membrane to the work-piece; wherein the fully enclosed volume is subject to a positive hydrostatic pressure greater than the ambient atmospheric pressure, and the apparatus further comprises a vessel adapted to hold a volume of low-conductivity fluid, wherein the membrane and the surface of the work-piece are disposed within the volume of low-conductivity fluid at a point a predetermined distance beneath the surface of the volume of low-conductivity fluid.

* * * * *